(12) United States Patent
Hankey et al.

(10) Patent No.: US 10,979,796 B2
(45) Date of Patent: *Apr. 13, 2021

(54) IN-EAR WIRELESS LISTENING DEVICE

(71) Applicant: Apple Inc., Cupertino, CA (US)

(72) Inventors: M. Evans Hankey, San Francisco, CA (US); Emery A. Sanford, San Francisco, CA (US); Christopher D. Prest, San Francisco, CA (US); Way Chet Lim, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/915,431

(22) Filed: Jun. 29, 2020

(65) Prior Publication Data

US 2020/0336816 A1 Oct. 22, 2020

Related U.S. Application Data

(63) Continuation of application No. 16/681,749, filed on Nov. 12, 2019, which is a continuation of application
(Continued)

(51) Int. Cl.
*H04R 1/10* (2006.01)
*H01R 13/62* (2006.01)
(Continued)

(52) U.S. Cl.
CPC ....... *H04R 1/1025* (2013.01); *H01R 13/6205* (2013.01); *H02J 7/00* (2013.01);
(Continued)

(58) Field of Classification Search
CPC .. H04R 1/1025; H04R 1/1016; H04R 1/1041; H04R 2201/105; H04R 2402/07; H04R 2420/09
See application file for complete search history.

(56) References Cited

U.S. PATENT DOCUMENTS

| 4,020,297 A | 4/1977 | Brodie |
| 4,509,201 A | 4/1985 | Sekigawa et al. |

(Continued)

FOREIGN PATENT DOCUMENTS

| AU | 2008203892 | 7/2008 |
| AU | 2008239811 | 10/2008 |

(Continued)

OTHER PUBLICATIONS

US 10,231,044 B2, 03/2019, Hankey et al. (withdrawn)
(Continued)

*Primary Examiner* — Sunita Joshi
(74) *Attorney, Agent, or Firm* — Kilpatrick Townsend & Stockton LLP

(57) ABSTRACT

An apparatus for charging a portable wireless listening device including a housing having a socket to receive the portable wireless listening device; a battery; wireless circuitry that enables the apparatus to communicate wirelessly with a host device; power transmitting circuitry configured to provide power to the portable wireless listening device when the device is received in the socket to charge a battery within the portable wireless listening device; and a processor configured to configured to establish a wireless communication protocol between the portable wireless listening device and the host device.

20 Claims, 63 Drawing Sheets

Related U.S. Application Data

No. 16/212,623, filed on Dec. 6, 2018, now Pat. No. 10,516,931, which is a continuation of application No. 15/948,920, filed on Apr. 9, 2018, now Pat. No. 10,165,346, which is a continuation of application No. 15/590,970, filed on May 9, 2017, now Pat. No. 9,967,646, which is a continuation of application No. 15/071,177, filed on Mar. 15, 2016, now Pat. No. 9,854,343, which is a continuation of application No. 13/847,103, filed on Mar. 19, 2013, now Pat. No. 9,287,657, which is a continuation of application No. 11/824,444, filed on Jun. 28, 2007, now Pat. No. 8,401,219.

(60) Provisional application No. 60/879,177, filed on Jan. 6, 2007, provisional application No. 60/879,195, filed on Jan. 6, 2007.

(51) Int. Cl.
*H04R 25/00* (2006.01)
*H04M 1/05* (2006.01)
*H04M 1/60* (2006.01)
*H04W 52/02* (2009.01)
*H02J 7/00* (2006.01)
*H04M 1/02* (2006.01)
*H05K 1/14* (2006.01)
*H05K 1/18* (2006.01)

(52) U.S. Cl.
CPC ............ *H02J 7/0042* (2013.01); *H04M 1/05* (2013.01); *H04M 1/6066* (2013.01); *H04R 1/105* (2013.01); *H04R 1/1016* (2013.01); *H04R 1/1041* (2013.01); *H04W 52/0274* (2013.01); *H04M 1/0262* (2013.01); *H04M 1/0274* (2013.01); *H04M 1/0277* (2013.01); *H04M 1/6058* (2013.01); *H04M 2250/02* (2013.01); *H04R 25/556* (2013.01); *H04R 25/558* (2013.01); *H04R 25/602* (2013.01); *H04R 25/603* (2019.05); *H04R 2201/105* (2013.01); *H04R 2201/107* (2013.01); *H04R 2420/07* (2013.01); *H04R 2420/09* (2013.01); *H05K 1/147* (2013.01); *H05K 1/189* (2013.01); *Y02D 30/70* (2020.08)

(56) References Cited

U.S. PATENT DOCUMENTS

| | | |
|---|---|---|
| 4,637,022 A | 1/1987 | Burke et al. |
| 4,742,887 A | 5/1988 | Yamagishi |
| 4,845,419 A | 7/1989 | Hacker |
| 4,882,745 A | 11/1989 | Silver |
| 4,890,329 A | 12/1989 | Erbe |
| 4,901,355 A | 2/1990 | Moore |
| 5,245,269 A | 9/1993 | Tooley et al. |
| D345,141 S | 3/1994 | Lucey et al. |
| 5,385,478 A | 1/1995 | Niekawa |
| 5,448,646 A | 9/1995 | Lucey et al. |
| 5,455,859 A | 10/1995 | Gutzmer |
| 5,465,421 A | 11/1995 | McCormick et al. |
| 5,492,489 A | 2/1996 | Chavakula |
| 5,504,812 A | 4/1996 | Vangarde |
| 5,812,356 A | 9/1998 | O'Connor |
| 5,832,093 A | 11/1998 | Bernstein et al. |
| 5,836,790 A | 11/1998 | Barnett |
| 5,894,752 A | 4/1999 | Yano et al. |
| 5,949,896 A | 9/1999 | Nageno et al. |
| 6,051,964 A | 4/2000 | Brown et al. |
| 6,078,825 A * | 6/2000 | Hahn .............. H04B 1/3877 379/185 |
| 6,129,559 A | 10/2000 | Hirata et al. |
| 6,219,215 B1 | 4/2001 | Bertin et al. |
| 6,253,871 B1 | 7/2001 | Aceti |
| 6,267,602 B1 | 7/2001 | Mendelson et al. |
| 6,447,399 B1 | 9/2002 | Denham |
| 6,456,720 B1 * | 9/2002 | Brimhall ............... H04R 25/60 381/322 |
| 6,464,509 B1 | 10/2002 | Emberty et al. |
| 6,474,999 B1 | 11/2002 | Givens et al. |
| 6,542,614 B2 | 4/2003 | Renner |
| 6,744,236 B2 | 6/2004 | Capel et al. |
| 6,771,790 B2 | 8/2004 | Liu |
| 6,796,849 B2 | 9/2004 | Villain |
| 6,819,762 B2 | 11/2004 | Jones et al. |
| 6,942,906 B2 | 9/2005 | Sakata et al. |
| 7,094,086 B2 | 8/2006 | Teicher |
| 7,128,456 B2 | 10/2006 | Yamashita et al. |
| 7,133,708 B2 | 11/2006 | Park et al. |
| 7,246,750 B2 | 7/2007 | Cho |
| 7,289,640 B2 | 10/2007 | Tsai et al. |
| 7,311,526 B2 | 12/2007 | Rohrbach et al. |
| 7,351,066 B2 | 4/2008 | DiFonzo et al. |
| 7,354,315 B2 | 4/2008 | Goetz et al. |
| 7,443,759 B1 | 10/2008 | Rowlands et al. |
| 7,496,671 B2 | 2/2009 | Engel et al. |
| 7,517,222 B2 | 4/2009 | Rohrbach et al. |
| 7,589,536 B2 | 9/2009 | Terlizzi et al. |
| 7,626,643 B2 | 12/2009 | Ijzerman et al. |
| 7,641,477 B2 | 1/2010 | Difonzo et al. |
| 7,645,143 B2 | 1/2010 | Rohrbach et al. |
| 7,798,831 B2 | 9/2010 | Sanford et al. |
| 7,859,134 B2 | 12/2010 | Chi et al. |
| 7,863,906 B2 | 1/2011 | Terlizzi et al. |
| 7,875,996 B2 | 1/2011 | Nguyen et al. |
| 7,880,131 B2 | 2/2011 | Andre et al. |
| 7,884,315 B2 | 2/2011 | Andre et al. |
| 7,888,943 B2 | 2/2011 | Nguyen |
| 7,949,802 B2 | 5/2011 | Gallant et al. |
| 7,966,511 B2 | 6/2011 | Naveh et al. |
| 8,086,281 B2 | 12/2011 | Rabu et al. |
| 8,180,093 B2 | 5/2012 | Hankey et al. |
| 8,185,084 B2 | 5/2012 | Terlizzi |
| 8,311,255 B2 | 11/2012 | Hankey et al. |
| 8,401,219 B2 | 3/2013 | Hankey et al. |
| 8,650,925 B2 | 2/2014 | Hankey et al. |
| 8,712,071 B2 | 4/2014 | Terlizzi et al. |
| 8,867,748 B2 | 10/2014 | Posa |
| 8,867,758 B2 | 10/2014 | Terlizzi et al. |
| 9,118,990 B2 | 8/2015 | Hankey et al. |
| 9,287,657 B2 | 3/2016 | Hankey et al. |
| 9,294,830 B2 | 3/2016 | Terlizzi |
| 9,854,343 B2 | 12/2017 | Hankey et al. |
| 9,967,646 B2 | 5/2018 | Hankey et al. |
| 10,165,346 B2 | 12/2018 | Hankey et al. |
| 10,313,775 B2 | 6/2019 | Hankey et al. |
| 10,433,043 B2 | 10/2019 | Hankey et al. |
| 10,516,931 B2 | 12/2019 | Hankey et al. |
| 2002/0028701 A1 | 3/2002 | Satoh et al. |
| 2002/0030589 A1 | 3/2002 | Tabata et al. |
| 2002/0054686 A1 | 5/2002 | Tabata et al. |
| 2002/0063690 A1 | 5/2002 | Chung et al. |
| 2002/0090931 A1 | 7/2002 | Papineau et al. |
| 2002/0131585 A1 | 9/2002 | Jones et al. |
| 2002/0155754 A1 | 10/2002 | De'Longhi |
| 2002/0159228 A1 | 10/2002 | Emberty et al. |
| 2002/0181728 A1 | 12/2002 | Connors et al. |
| 2003/0006650 A1 | 1/2003 | Tang et al. |
| 2003/0038616 A1 | 2/2003 | Capel et al. |
| 2003/0059071 A1 | 3/2003 | Dunham |
| 2003/0130015 A1 | 7/2003 | McTaggart |
| 2003/0134591 A1 | 7/2003 | Roberts, Jr. et al. |
| 2003/0137286 A1 | 7/2003 | Kimball et al. |
| 2003/0139156 A1 | 7/2003 | Satoh et al. |
| 2003/0139207 A1 | 7/2003 | Yamazaki |
| 2003/0157972 A1 | 8/2003 | Bae |
| 2003/0211871 A1 | 11/2003 | Nassimi |
| 2003/0217246 A1 | 11/2003 | Kubota et al. |
| 2004/0023560 A1 | 2/2004 | Swoboda |
| 2004/0048640 A1 | 3/2004 | Bae |
| 2004/0063456 A1 | 4/2004 | Griffin et al. |

(56) References Cited

U.S. PATENT DOCUMENTS

| | | |
|---|---|---|
| 2004/0101244 A1 | 5/2004 | Archer |
| 2004/0121793 A1 | 6/2004 | Weigele et al. |
| 2004/0131220 A1 | 7/2004 | Liu |
| 2004/0136155 A1 | 7/2004 | Onishi et al. |
| 2004/0209489 A1 | 10/2004 | Clapper |
| 2004/0232248 A1 | 11/2004 | Cho |
| 2005/0030622 A1 | 2/2005 | Morita et al. |
| 2005/0059344 A1 | 3/2005 | Chang |
| 2005/0130593 A1 | 6/2005 | Michalak |
| 2005/0145004 A1 | 7/2005 | Vescovini |
| 2005/0148374 A1 | 7/2005 | Lin |
| 2005/0153750 A1 | 7/2005 | Gantz et al. |
| 2005/0200331 A1 | 9/2005 | Patino et al. |
| 2005/0202727 A1 | 9/2005 | Andre et al. |
| 2005/0233768 A1 | 10/2005 | Guo et al. |
| 2005/0239261 A1 | 10/2005 | Tai et al. |
| 2005/0261563 A1 | 11/2005 | Zhou et al. |
| 2005/0268134 A1 | 12/2005 | Park |
| 2005/0281425 A1 | 12/2005 | Greuet et al. |
| 2005/0283263 A1 | 12/2005 | Eaton et al. |
| 2005/0289375 A1 | 12/2005 | Ranganathan et al. |
| 2006/0024997 A1 | 2/2006 | Teicher |
| 2006/0026447 A1 | 2/2006 | Naveh et al. |
| 2006/0034477 A1 | 2/2006 | Lazzeroni et al. |
| 2006/0045303 A1 | 3/2006 | Akino |
| 2006/0140434 A1* | 6/2006 | Yang .............. H04R 1/1058 381/380 |
| 2006/0140435 A1 | 6/2006 | Sheehy et al. |
| 2006/0147078 A1 | 7/2006 | Neu et al. |
| 2006/0166715 A1 | 7/2006 | Van Engelen et al. |
| 2006/0211871 A1 | 9/2006 | Dai et al. |
| 2006/0227531 A1 | 10/2006 | Iou |
| 2006/0227532 A1 | 10/2006 | Ko et al. |
| 2006/0234780 A1 | 10/2006 | Ramsden et al. |
| 2006/0235873 A1 | 10/2006 | Thomas |
| 2006/0252284 A1 | 11/2006 | Marmaropoulos et al. |
| 2006/0268528 A1 | 11/2006 | Zadesky et al. |
| 2007/0072443 A1 | 3/2007 | Rohrbach et al. |
| 2007/0121974 A1 | 5/2007 | Nemirovski |
| 2007/0123296 A1 | 5/2007 | Chen |
| 2007/0132436 A1 | 6/2007 | Westwick et al. |
| 2007/0133836 A1* | 6/2007 | Lee .............. H04M 1/05 381/370 |
| 2007/0178771 A1 | 8/2007 | Goetz et al. |
| 2007/0280182 A1 | 12/2007 | Wisherd et al. |
| 2008/0024470 A1 | 1/2008 | Andre et al. |
| 2008/0033273 A1 | 2/2008 | Zhou et al. |
| 2008/0054721 A1 | 3/2008 | Frew et al. |
| 2008/0074084 A1 | 3/2008 | Lee et al. |
| 2008/0084404 A1 | 4/2008 | Andre et al. |
| 2008/0140887 A1 | 6/2008 | Gallant et al. |
| 2008/0163663 A1 | 7/2008 | Hankey et al. |
| 2008/0164770 A1 | 7/2008 | Terlizzi |
| 2008/0164825 A1 | 7/2008 | Terlizzi et al. |
| 2008/0164934 A1 | 7/2008 | Hankey et al. |
| 2008/0165982 A1 | 7/2008 | Hankey et al. |
| 2008/0166001 A1 | 7/2008 | Hankey et al. |
| 2008/0166004 A1 | 7/2008 | Sanford et al. |
| 2008/0166005 A1 | 7/2008 | Terlizzi et al. |
| 2008/0166006 A1 | 7/2008 | Hankey et al. |
| 2008/0166007 A1 | 7/2008 | Hankey et al. |
| 2008/0166907 A1 | 7/2008 | Sanford et al. |
| 2008/0166968 A1 | 7/2008 | Tang et al. |
| 2008/0167088 A1 | 7/2008 | Rabu et al. |
| 2008/0219486 A1 | 9/2008 | Goldstein et al. |
| 2008/0234780 A1 | 9/2008 | Smith et al. |
| 2008/0319562 A1 | 12/2008 | Forstall |
| 2009/0041284 A1 | 2/2009 | Tanaka et al. |
| 2009/0092269 A1 | 4/2009 | Nielsen et al. |
| 2009/0160256 A1 | 6/2009 | Nguyen et al. |
| 2009/0160421 A1 | 6/2009 | Nguyen et al. |
| 2009/0164035 A1 | 6/2009 | Zadesky et al. |
| 2009/0164807 A1 | 6/2009 | Chi et al. |
| 2009/0267613 A1 | 10/2009 | Terlizzi et al. |
| 2009/0273315 A1 | 11/2009 | Nguyen |
| 2009/0302826 A1 | 12/2009 | Kim et al. |
| 2011/0058702 A1 | 3/2011 | Saggio, Jr. |
| 2011/0158440 A1 | 6/2011 | Mei et al. |
| 2011/0211871 A1 | 9/2011 | Mori |
| 2011/0299713 A1* | 12/2011 | Moller .............. H04R 25/65 381/328 |
| 2012/0212063 A1 | 8/2012 | Terlizzi |
| 2012/0224710 A1 | 9/2012 | Terlizzi et al. |
| 2013/0051589 A1 | 2/2013 | Ide et al. |
| 2013/0217246 A1 | 8/2013 | Hankey et al. |
| 2017/0048604 A1 | 2/2017 | Hankey et al. |
| 2017/0094386 A1 | 3/2017 | Trainer et al. |
| 2017/0245040 A1 | 8/2017 | Hankey et al. |

FOREIGN PATENT DOCUMENTS

| | | |
|---|---|---|
| AU | 2008239811 | 12/2010 |
| AU | 2008203892 | 1/2011 |
| CN | 1231791 | 10/1999 |
| CN | 2511075 | 9/2002 |
| CN | 2524386 | 12/2002 |
| CN | 1471201 | 1/2004 |
| CN | 2646960 | 10/2004 |
| CN | 1625189 | 6/2005 |
| CN | 2718925 | 8/2005 |
| CN | 2731880 | 10/2005 |
| CN | 1725574 | 1/2006 |
| CN | 2750607 | 1/2006 |
| CN | 1742476 | 3/2006 |
| CN | 2762470 | 3/2006 |
| CN | 2836386 | 11/2006 |
| CN | 2847589 | 12/2006 |
| CN | 201207720 | 3/2009 |
| CN | 201238367 | 5/2009 |
| CN | 201243371 | 5/2009 |
| CN | 201252631 | 6/2009 |
| CN | 201263208 | 6/2009 |
| CN | 201267005 | 7/2009 |
| CN | 201336721 | 10/2009 |
| CN | 201365327 | 12/2009 |
| CN | 201365328 | 12/2009 |
| CN | 201365329 | 12/2009 |
| CN | 201383860 | 1/2010 |
| CN | 101689717 | 3/2010 |
| CN | 201478543 | 5/2010 |
| CN | 201490408 | 5/2010 |
| CN | 101809826 | 8/2010 |
| CN | 201540996 | 8/2010 |
| CN | 101689717 | 7/2012 |
| CN | 102547514 | 7/2012 |
| CN | 102738652 | 10/2012 |
| CN | 101809826 | 6/2014 |
| CN | 102547514 | 9/2014 |
| CN | 102738652 | 9/2014 |
| CN | 104202689 | 12/2014 |
| CN | 104362448 | 2/2015 |
| CN | 104202689 | 7/2018 |
| DE | 10036432 | 2/2001 |
| DE | 10333403 | 9/2004 |
| DE | 202004012084 | 10/2004 |
| DE | 202004009938 | 11/2004 |
| DE | 202008018654 | 8/2017 |
| DK | 2654270 | 12/2017 |
| EP | 0403701 | 12/1990 |
| EP | 0840396 | 5/1998 |
| EP | 0918357 | 5/1999 |
| EP | 1109147 | 6/2001 |
| EP | 1346483 | 9/2003 |
| EP | 1469671 | 10/2004 |
| EP | 1526716 | 4/2005 |
| EP | 1536615 | 6/2005 |
| EP | 1631044 | 3/2006 |
| EP | 1526716 | 3/2007 |
| EP | 1791335 | 5/2007 |
| EP | 2104967 | 9/2009 |
| EP | 2119197 | 11/2009 |
| EP | 2127033 | 12/2009 |
| EP | 2421101 | 2/2012 |
| EP | 2421115 | 2/2012 |

(56) References Cited

FOREIGN PATENT DOCUMENTS

| | | |
|---|---|---|
| EP | 2426825 | 3/2012 |
| EP | 2104967 | 4/2012 |
| EP | 2119197 | 7/2012 |
| EP | 2127033 | 8/2012 |
| EP | 2421115 | 8/2012 |
| EP | 2418740 | 6/2013 |
| EP | 1346483 | 8/2013 |
| EP | 2421101 | 9/2013 |
| EP | 2640170 | 9/2013 |
| EP | 2650611 | 10/2013 |
| EP | 2654214 | 10/2013 |
| EP | 2654270 | 10/2013 |
| EP | 3196551 | 7/2017 |
| EP | 2654270 | 11/2017 |
| EP | 3196551 | 5/2019 |
| GB | 2326062 | 12/1998 |
| HK | 1134716 | 1/2013 |
| HK | 1136423 | 3/2013 |
| HK | 1136698 | 3/2013 |
| IN | 2569KOLNP2009 | 12/2009 |
| IN | 273757 | 6/2016 |
| JP | 2003009271 | 1/2003 |
| JP | 2004120313 | 4/2004 |
| JP | 2006041787 | 2/2006 |
| JP | 2006229545 | 8/2006 |
| JP | 2006293565 | 10/2006 |
| JP | 2010516096 | 5/2010 |
| JP | 2012054974 | 3/2012 |
| JP | 4975111 | 7/2012 |
| JP | 5242754 | 7/2013 |
| JP | 2013153530 | 8/2013 |
| JP | 5638103 | 12/2014 |
| KR | 1020090108620 | 10/2009 |
| KR | 101113562 | 4/2012 |
| TW | 289802 | 11/1996 |
| TW | 499137 | 8/2002 |
| TW | 501326 | 9/2002 |
| TW | 522703 | 3/2003 |
| TW | 545839 | 8/2003 |
| TW | 557065 | 10/2003 |
| TW | 245709 | 10/2004 |
| TW | M248071 | 10/2004 |
| TW | M260974 | 4/2005 |
| TW | 200522720 | 7/2005 |
| TW | I242994 | 11/2005 |
| TW | M283425 | 12/2005 |
| TW | M293625 | 7/2006 |
| TW | M294173 | 7/2006 |
| TW | I260939 | 8/2006 |
| TW | 200843256 | 11/2008 |
| TW | 200847830 | 12/2008 |
| TW | 200849303 | 12/2008 |
| TW | 200849847 | 12/2008 |
| TW | 200849937 | 12/2008 |
| TW | 200850035 | 12/2008 |
| TW | 200850036 | 12/2008 |
| TW | 1364887 | 5/2012 |
| TW | 201218237 | 5/2012 |
| TW | I371898 | 9/2012 |
| TW | 201242211 | 10/2012 |
| TW | I393360 | 4/2013 |
| TW | I433524 | 4/2014 |
| TW | I435616 | 4/2014 |
| TW | I457964 | 10/2014 |
| TW | I462597 | 11/2014 |
| TW | I483625 | 5/2015 |
| TW | 201631859 | 9/2016 |
| TW | I548176 | 9/2016 |
| TW | I629847 | 7/2018 |
| TW | I679828 | 12/2019 |
| WO | 97016116 | 5/1997 |
| WO | 9813981 | 4/1998 |
| WO | 01043497 | 6/2001 |
| WO | 0178354 | 10/2001 |
| WO | 0186923 | 11/2001 |
| WO | 0239600 | 5/2002 |
| WO | 0239600 | 4/2003 |
| WO | 03090321 | 10/2003 |
| WO | 2004034756 | 4/2004 |
| WO | 2006013553 | 2/2006 |
| WO | 2006074369 | 7/2006 |
| WO | 2006099044 | 9/2006 |
| WO | 2006103269 | 10/2006 |
| WO | 2006113042 | 10/2006 |
| WO | 2006126881 | 11/2006 |
| WO | 2008085862 | 7/2008 |
| WO | 2008085863 | 7/2008 |
| WO | 2008085864 | 7/2008 |
| WO | 2008085866 | 7/2008 |
| WO | 2008085873 | 7/2008 |
| WO | 2008085863 | 9/2008 |
| WO | 2008085873 | 9/2008 |
| WO | 2008127488 | 10/2008 |
| WO | 2008130456 | 10/2008 |
| WO | 2008085862 | 1/2009 |

OTHER PUBLICATIONS

Article entitled "Akono Headset HBH-660/HBH-662 User Guide", Sony Ericsson, Available online at: http://phone.manualsonline.com/manuals/mfg/sony_ericsson_mobile_communications/sony_ericsson_bluetooth_akono_hbh_hbh660.html, 2004, 35 pages (of-record in parent application).

Article entitled "MacBook Pro User's Guide", Available online at : http://manuals.info.apple.com/en/macbook_pro_users_quide.pdf, 2006, 139 pages (of-record in parent application).

Non-Final Office Action issued in U.S. Appl. No. 11/823,922, dated Oct. 20, 2011, 13 pages (of-record in parent application).

Notice of Allowance issued in U.S. Appl. No. 11/823,922, dated Jul. 3, 2012, 7 pages (of-record in parent application).

Notice of Allowance issued in U.S. Appl. No. 11/823,922, dated May 22, 2012, 7 pages (of-record in parent application).

Non-Final Office Action issued in U.S. Appl. No. 11/824,180, dated Jun. 27, 2011, 14 pages (of-record in parent application).

Notice of Allowance issued in U.S. Appl. No. 11/824,180, dated Jan. 12, 2012, 7 pages (of-record in parent application).

Final Office Action issued in U.S. Appl. No. 11/824,203, dated Jan. 14, 2014, 18 pages (of-record in parent application).

Final Office Action issued in U.S. Appl. No. 11/824,203, dated Dec. 16, 2014, 20 pages (of-record in parent application).

Final Office Action issued in U.S. Appl. No. 11/824,203, dated Feb. 16, 2012, 31 pages (of-record in parent application).

Non-Final Office Action issued in U.S. Appl. No. 11/824,203, dated Jun. 14, 2013, 17 pages (of-record in parent application).

Non-Final Office Action issued in U.S. Appl. No. 11/824,203, dated Jul. 8, 2011, 18 pages (of-record in parent application).

Non-Final Office Action issued in U.S. Appl. No. 11/824,203, dated Jun. 18, 2014, 20 pages (of-record in parent application).

Notice of Allowance issued in U.S. Appl. No. 11/824,203, dated Mar. 6, 2015, 5 pages (of-record in parent application).

Final Office Action issued in U.S. Appl. No. 11/824,442, dated Sep. 2, 2010, 10 pages (of-record in parent application).

Final Office Action issued in U.S. Appl. No. 11/824,442, dated Nov. 26, 2012, 13 pages (of-record in parent application).

Non-Final Office Action issued in U.S. Appl. No. 11/824,442, dated Apr. 25, 2012, 14 pages (of-record in parent application).

Non-Final Office Action issued in U.S. Appl. No. 11/824,442, dated Mar. 8, 2010, 7 pages (of-record in parent application).

Notice of Allowance issued in U.S. Appl. No. 11/824,442, dated Jun. 28, 2013, 8 pages (of-record in parent application).

Notice of Allowance issued in U.S. Appl. No. 11/824,442, dated Oct. 4, 2013, 8 pages (of-record in parent application).

Restriction Requirement issued in U.S. Appl. No. 11/824,442, dated Oct. 8, 2009, 6 pages (of-record in parent application).

Final Office Action issued in U.S. Appl. No. 11/824,443, dated Jan. 17, 2012, 20 pages (of-record in parent application).

Final Office Action issued in U.S. Appl. No. 11/824,443, Jun. 17, 2013, 24 pages (of-record in parent application).

(56) References Cited

OTHER PUBLICATIONS

Non-Final Office Action issued in U.S. Appl. No. 11/824,443, dated Jun. 9, 2011, 16 pages (of-record in parent application).
Non-Final Office Action issued in U.S. Appl. No. 11/824,443, dated Sep. 10, 2012, 21 pages (of-record in parent application).
Notice of Allowance issued in U.S. Appl. No. 11/824,443, dated Nov. 20, 2013, 11 pages (of-record in parent application).
Final Office Action issued in U.S. Appl. No. 11/824,444, dated Aug. 30, 2012, 19 pages (of-record in parent application).
Non-Final Office Action issued in U.S. Appl. No. 11/824,444, dated Dec. 22, 2011, 16 pages (of-record in parent application).
Notice of Allowance issued in U.S. Appl. No. 11/824,444, dated Nov. 16, 2012, 9 pages (of-record in parent application).
Restriction Requirement issued in U.S. Appl. No. 11/824,444, dated Jul. 11, 2011, 7 pages (of-record in parent application).
Non-Final Office Action issued in U.S. Appl. No. 11/824,460, dated Feb. 16, 2011, 15 pages (of-record in parent application).
Notice of Allowance issued in U.S. Appl. No. 11/824,460, dated Aug. 23, 2011, 7 pages (of-record in parent application).
Notice of Allowance issued in U.S. Appl. No. 11/824,460, dated Jan. 20, 2012, 8 pages (of-record in parent application).
Restriction Requirement issued in U.S. Appl. No. 11/824,460, dated Oct. 20, 2010, 7 pages (of-record in parent application).
Non-Final Office Action issued in U.S. Appl. No. 13/460,228, dated May 21, 2015, 24 pages (of-record in parent application).
Notice of Allowance issued in U.S. Appl. No. 13/460,228, dated Nov. 10, 2015, 6 pages (of-record in parent application).
Notice of Allowance issued in U.S. Appl. No. 13/471,084, dated Apr. 7, 2014, 12 pages (of-record in parent application).
Restriction Requirement issued in U.S. Appl. No. 13/471,084, dated Dec. 27, 2013, 7 pages (of-record in parent application).
Non-Final Office Action issued in U.S. Appl. No. 13/847,103, dated Dec. 31, 2014, 10 pages (of-record in parent application).
Notice of Allowance issued in U.S. Appl. No. 13/847,103, dated Jun. 23, 2015, 8 pages (of-record in parent application).
Notice of Allowance issued in U.S. Appl. No. 13/847,103, dated Oct. 7, 2015, 9 pages (of-record in parent application).
Restriction Requirement issued in U.S. Appl. No. 13/847,103, dated Oct. 2, 2014, 7 pages (of-record in parent application).
Non-Final Office Action issued in U.S. Appl. No. 15/071,177, dated May 11, 2017, 15 pages (of-record in parent application).
Notice of Allowance issued in U.S. Appl. No. 15/071,177, dated Sep. 7, 2017, 10 pages (of-record in parent application).
Final Office Action issued in U.S. Appl. No. 15/169,563, dated May 24, 2018, 13 pages (of-record in parent application).
Non-Final Office Action issued in U.S. Appl. No. 15/169,563, dated Sep. 13, 2017, 11 pages (of-record in parent application).
First Action Interview Pilot Program Pre-Interview Communication issued in U.S. Appl. No. 15/590,970, dated Jul. 12, 2017, 7 pages (of-record in parent application).
Non-Final Office Action issued in U.S. Appl. No. 15/590,970, dated Jul. 20, 2017, 9 pages (of-record in parent application).
Notice of Allowance issued in U.S. Appl. No. 15/590,970, dated Jan. 10, 2018, 10 pages (of-record in parent application).
Non-Final Office Action issued in U.S. Appl. No. 15/948,920, dated Jul. 5, 2018, 8 pages (of-record in parent application).
Notice of Allowance issued in U.S. Appl. No. 15/948,920, dated Oct. 2, 2018, 9 pages (of-record in parent application).
Corrected Notice of Allowability issued in U.S. Appl. No. 15/948,968, dated Apr. 22, 2019 in 2 pages (of-record in parent application).
Corrected Notice of Allowability issued in U.S. Appl. No. 15/948,968, dated Apr. 3, 2019 in 2 pages (of-record in parent application).
Corrected Notice of Allowability issued in U.S. Appl. No. 15/948,968, dated Jan. 18, 2019 in 5 pages (of-record in parent application).
Non-Final Office Action issued in U.S. Appl. No. 15/948,968, dated Jul. 18, 2018 in 7 pages (of-record in parent application).
Notice of Allowance issued in U.S. Appl. No. 15/948,968, dated Nov. 7, 2018 in 9 pages (of-record in parent application).
Corrected Notice of Allowability issued in U.S. Appl. No. 16/183,533, dated Aug. 30, 2019 in 4 pages (of-record in parent application).
Non-Final Office Action issued in U.S. Appl. No. 16/183,533, dated Feb. 14, 2019 in 20 pages (of-record in parent application).
Notice of Allowance issued in U.S. Appl. No. 16/183,533, dated Jun. 26, 2019 in 10 pages (of-record in parent application).
Non-Final Office Action issued in U.S. Appl. No. 16/212,623, dated Mar. 15, 2019 in 15 pages (of-record in parent application).
Notice of Allowance issued in U.S. Appl. No. 16/212,623, dated Aug. 6, 2019 in 10 pages (of-record in parent application).
U.S. Appl. No. 60/878,852, dated Jan. 5, 2007, (of-record in parent application).
U.S. Appl. No. 60/936,965, dated Jun. 22, 2007, (of-record in parent application).
Examination Report issued in Australia Application No. AU2008203892, dated Jun. 21, 2010 in 2 pages (of-record in parent application).
First Examination Report issued in Australia Application No. AU2008239811, dated Jul. 7, 2010 in 2 pages (of-record in parent application).
Office Action issued in China Application No. CN200880001749.0, dated Mar. 7, 2011 in 6 pages (of-record in parent application).
Office Action issued in China Application No. CN200880001749.0, dated Nov. 29, 2011 in 8 pages (of-record in parent application).
Office Action issued in China Application No. CN200880001789.5, dated Dec. 10, 2012 in 10 pages (of-record in parent application).
Office Action issued in China Application No. CN200880001789.5, dated May 3, 2012 in 10 pages (of-record in parent application).
Office Action issued in China Application No. CN200880001789.5, dated Apr. 1, 2013 in 13 pages (of-record in parent application).
Office Action issued in China Application No. CN200880001789.5, dated Aug. 16, 2013 in 15 pages (of-record in parent application).
Search Report issued in China Application No. CN200920150110.0, dated Jan. 6, 2011 in 9 pages (of-record in parent application).
Office Action issued in China Application No. CN201210032702.9, dated Jan. 30, 2014 in 10 pages (of-record in parent application).
Office Action issued in China Application No. CN201210156120.1, dated Feb. 27, 2014 in 11 pages (of-record in parent application).
Notice of Decision to Grant issued in China Application No. CN201410319754.3, dated Mar. 16, 2018 in 2 pages (of-record in parent application).
Office Action issued in China Application No. CN201410319754.3, dated Feb. 6, 2017 in 25 pages (of-record in parent application).
Office Action issued in China Application No. CN201410319754.3, dated Nov. 29, 2017 in 3 pages (of-record in parent application).
Office Action issued in China Application No. CN201410560169.2, dated Mar. 10, 2016 in 10 pages (of-record in parent application).
Office Action issued in European Application No. EP08712956.5, dated May 12, 2010 in 7 pages (of-record in parent application).
Office Action issued in European Application No. EP08712959.9, dated Apr. 23, 2010 in 7 pages (of-record in parent application).
Extended European Search Report issued in European Application No. EP11188316.1, dated Apr. 23, 2012 in 15 pages (of-record in parent application).
Office Action issued in European Application No. EP11188316.1, dated Jan. 24, 2017 in 4 pages (of-record in parent application).
Partial European Search Report issued in European Application No. EP11188316.1, dated Jan. 25, 2012 in 6 pages (of-record in parent application).
Extended European Search Report issued in European Application No. EP11188332.8, dated Jul. 30, 2012 in 14 pages (of-record in parent application).
Office Action issued in European Application No. EP11188332.8, dated Dec. 2, 2015 in 3 pages (of-record in parent application).
Office Action issued in European Application No. EP11188332.8, dated Mar. 28, 2013 in 6 pages (of-record in parent application).
Extended European Search Report issued in European Application No. EP11188483.9, dated Jan. 24, 2012 in 5 pages (of-record in parent application).
Extended European Search Report issued in European Application No. EP11188493.8, dated Dec. 23, 2011 in 5 pages (of-record in parent application).
Extended European Search Report issued in European Application No. EP13171961.9, dated Nov. 18, 2013 in 13 pages (of-record in parent application).

(56) References Cited

OTHER PUBLICATIONS

Partial Search Report issued in European Application No. EP13171961.9, dated Sep. 10, 2013 in 5 pages (of-record in parent application).
Extended European Search Report issued in European Application No. EP13171968.4, dated Sep. 23, 2013 in 7 pages (of-record in parent application).
Extended European Search Report issued in European Application No. EP13171970.0, dated Jul. 26, 2013 in 7 pages (of-record in parent application).
Extended European Search Report issued in European Application No. EP13171972.6, dated Sep. 23, 2013 in 8 pages (of-record in parent application).
Extended European Search Report issued in European Application No. EP17153551.1, dated Jun. 27, 2017 in 11 pages (of-record in parent application).
Notice of Decision to Grant issued in European Application No. EP17153551.1, dated May 3, 2019 in 1 page (of-record in parent application).
Office Action issued in European Application No. EP17153551.1, dated May 16, 2018 in 5 pages (of-record in parent application).
European Search Report issued in European Application No. EP18208712.2, dated Feb. 15, 2019 in 6 pages (of-record in parent application).
Office Action issued in European Application No. EP18208712.2, dated Apr. 2, 2020, 6 pages (of-record in parent application).
Office Action issued in European Application No. EP18208712.2, dated Oct. 22, 2019 in 6 pages (of-record in parent application).
Office Action issued in European Application No. EP18208712.2, dated Mar. 4, 2019 in 7 pages (of-record in parent application).
Examination Report issued in India Application No. IN2569/KOLNP/2009, dated Aug. 29, 2014 in 2 pages (of-record in parent application).
Office Action issued in Japan Application No. JP2013-77925, dated Feb. 4, 2014 in 2 pages (of-record in parent application).
Article entitled: LEO , "MacBook Pro Mit Unsichtbarer iSight-Statusanzeige [Update]", Available online at: http://www.fscklog.com/2006/10/macbook_pro_mit_1.html, Oct. 28, 2006 in 4 pages (of-record in parent application).
Article entitled: NOBIHAYA , "MacBook Pro [2006/Fall]", Available online at: http://flickr.com/photos/nobihaya/279927592/, Oct. 26, 2006 in 3 pages (of-record in parent application).
International Preliminary Report on Patentability issued in PCT Application No. PCT/US2008/000080, dated Jul. 7, 2009 in 12 pages (of-record in parent application).
International Search Report issued in PCT Application No. PCT/US2008/000080, dated Nov. 28, 2008 in 5 pages (of-record in parent application).
Written Opinion issued in PCT Application No. PCT/US2008/000080, dated Jul. 6, 2009 in 11 pages (of-record in parent application).
International Preliminary Report on Patentability issued in PCT Application No. PCT/US2008/000081, dated Jul. 7, 2009 in 9 pages (of-record in parent application).
International Search Report and Written Opinion issued in PCT Application No. PCT/US2008/000081, dated Jun. 24, 2008 in 11 pages (of-record in parent application).
International Preliminary Report on Patentability issued in PCT Application No. PCT/US2008/000082, dated Jul. 7, 2009 in 9 pages (of-record in parent application).
International Search Report issued in PCT Application No. PCT/US2008/000082, dated Jun. 11, 2008 in 13 pages (of-record in parent application).
Written Opinion issued in PCT Application No. PCT/US2008/000082, dated Jul. 6, 2009 in 8 pages (of-record in parent application).
International Preliminary Report on Patentability issued in PCT Application No. PCT/US2008/000084, dated Jul. 7, 2009 in 9 pages (of-record in parent application).
International Search Report and Written Opinion issued in PCT Application No. PCT/US2008/000084, dated Jun. 18, 2009 in 10 pages (of-record in parent application).
International Preliminary Report on Patentability issued in PCT Application No. PCT/US2008/000098, dated Jul. 7, 2009 in 8 pages (of-record in parent application).
International Search Report issued in PCT Application No. PCT/US2008/000098, dated Jun. 2, 2008 in 11 pages (of-record in parent application).
Written Opinion issued in PCT Application No. PCT/US2008/000098, dated Jul. 6, 2009 in 7 pages (of-record in parent application).
International Preliminary Report on Patentability issued in PCT Application No. PCT/US2008/000099, dated Jul. 7, 2009 in 11 pages (of-record in parent application).
International Search Report and Written Opinion issued in PCT Application No. PCT/US2008/000099, dated Jun. 30, 2008 in 12 pages (of-record in parent application).
International Preliminary Report on Patentability issued in PCT Application No. PCT/US2008/000210, dated Jul. 7, 2009 in 9 pages (of-record in parent application).
International Search Report and Written Opinion issued in PCT Application No. PCT/US2008/000210, dated Jun. 2, 2008 in 11 pages (of-record in parent application).
Office Action issued in Taiwan Application No. TW097100440, dated Jul. 4, 2011 in 10 pages (of-record in parent application).
Office Action issued in Taiwan Application No. TW097100446, dated Nov. 9, 2012 in 5 pages (of-record in parent application).
Office Action issued in Taiwan Application No. TW097100456, dated Nov. 21, 2012 in 7 pages (of-record in parent application).
Office Action issued in Taiwan Application No. TW097100458, dated Jan. 19, 2012 in 12 pages (of-record in parent application).
Office Action issued in Taiwan Application No. TW097100488, dated Oct. 23, 2013 in 14 pages (of-record in parent application).
Office Action issued in Taiwan Application No. TW097100488, dated Nov. 20, 2012 in 6 pages (of-record in parent application).
Office Action issued in Taiwan Application No. TW097100493, dated Aug. 1, 2014 in 12 pages (of-record in parent application).
Office Action issued in Taiwan Application No. TW097100493, dated Oct. 3, 2013 in 15 pages (of-record in parent application).
Office Action issued in Taiwan Application No. TW097100493, dated Apr. 6, 2012 in 7 pages (of-record in parent application).
Office Action issued in Taiwan Application No. TW097100493, dated Dec. 27, 2012 in 8 pages (of-record in parent application).
Office Action issued in Taiwan Application No. TW10110684, dated May 14, 2014 in 7 pages (of-record in parent application).
Office Action issued in Taiwan Application No. TW101121637, dated Aug. 12, 2015 in 12 pages (of-record in parent application).
Office Action issued in Taiwan Application No. TW101121637, dated Sep. 26, 2014 in 7 pages (of-record in parent application).
Notice of Decision to Grant issued in Taiwan Application No. TW105115908, dated Mar. 28, 2018 in 3 pages (of-record in parent application).
Office Action issued in Taiwan Application No. TW105115908, dated Jun. 2, 2017 in 14 pages (of-record in parent application).
Office Action issued in Taiwan Application No. TW105115908, dated Dec. 20, 2016 in 4 pages (of-record in parent application).
Office Action issued in Taiwan Application No. TW105115908, dated Dec. 7, 2016 in 4 pages (of-record in parent application).
Office Action issued in Taiwan Application No. TW107114301, dated Dec. 19, 2018 in 17 pages (of-record in parent application).
Office Action issued in Taiwan Application No. TW107114301, dated Sep. 3, 2019 in 3 pages (of-record in parent application).
Office Action issued in Taiwan Application No. TW108136138, dated Apr. 6, 2020, 7 pages (of-record in parent application).
Notice of Allowance issued in U.S. Appl. No. 16/882,269, dated Jul. 9, 2020 in 11 pages.
Non-Final Office Action issued in U.S. Appl. No. 16/681,749, dated Sep. 17, 2020 in 15 pages.
Notice of Allowance issued in U.S. Appl. No. 16/681,749, dated Jan. 21, 2021 in 12 pages.
Non-Final Office Action issued in U.S. Appl. No. 16/915,759, dated Dec. 8, 2020 in 15 pages.

(56) References Cited

OTHER PUBLICATIONS

Corrected Notice of Allowability issued in U.S. Appl. No. 16/681,749, dated Feb. 18, 2021 in 2 pages.
Corrected Notice of Allowability issued in U.S. Appl. No. 16/681,749, dated Feb. 5, 2021 in 2 pages.
Notice of Allowance issued in U.S. Appl. No. 16/915,759, dated Feb. 8, 2021 in 11 pages.

\* cited by examiner

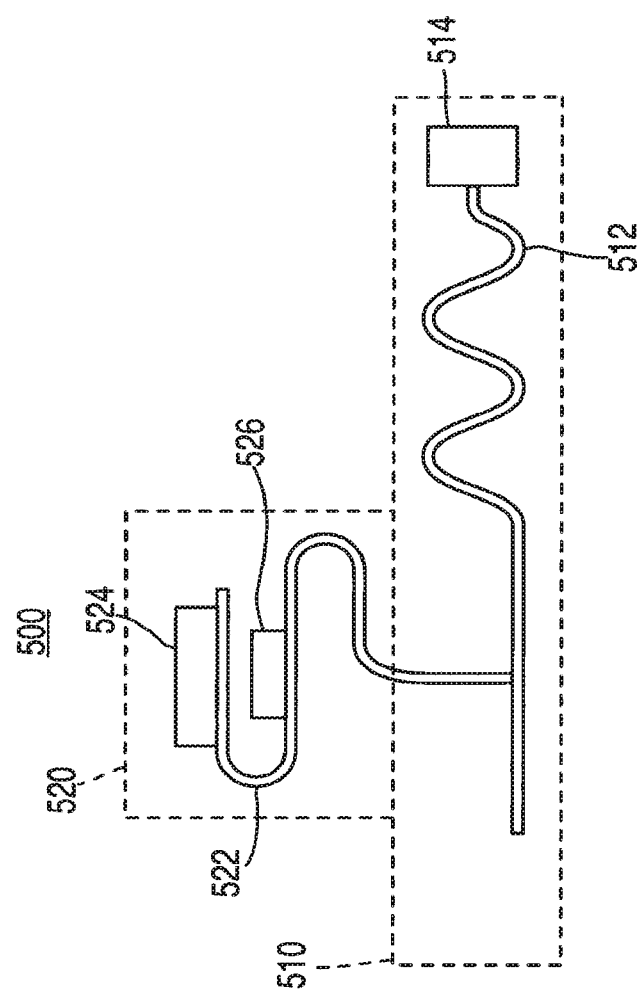

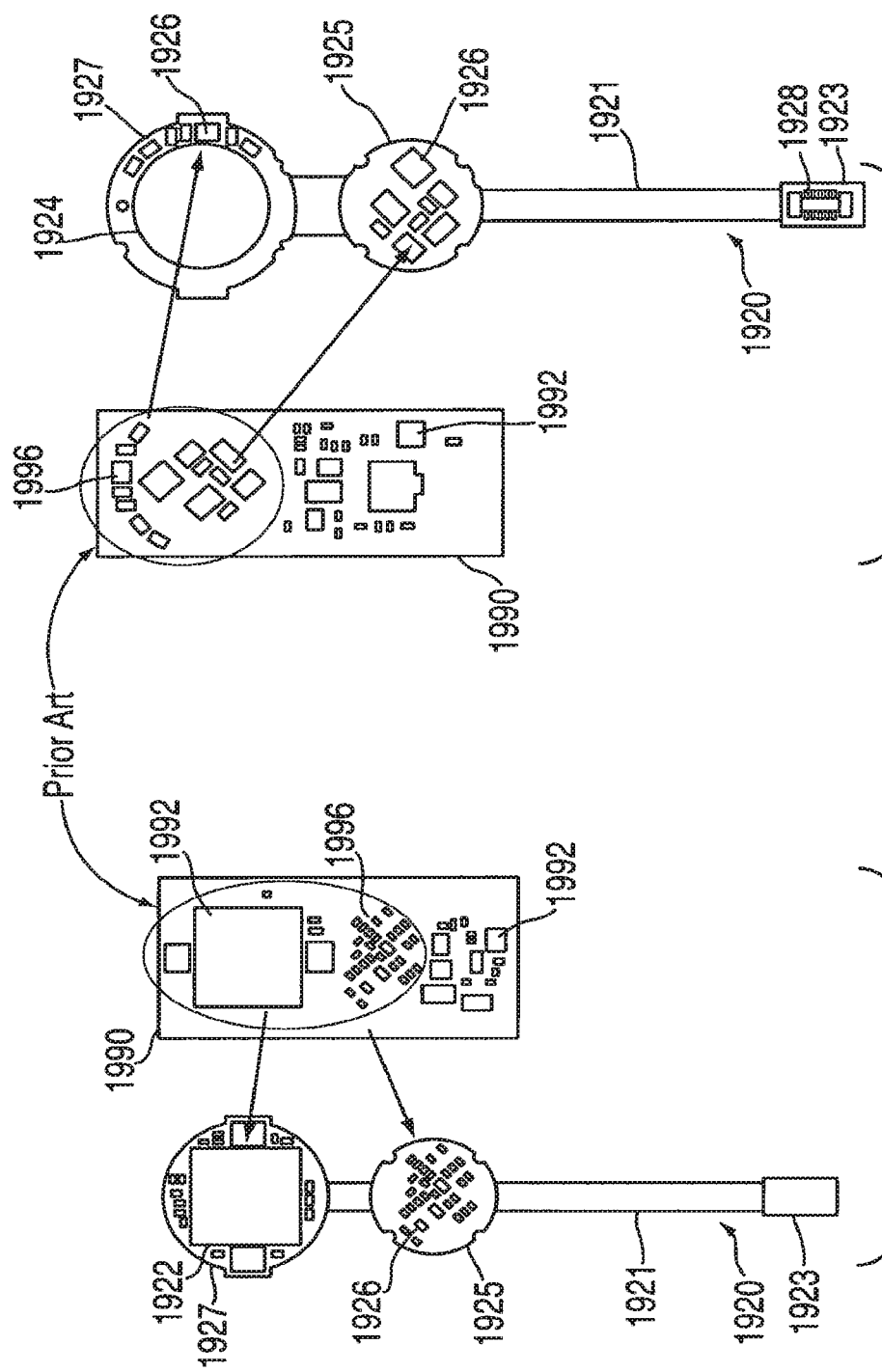

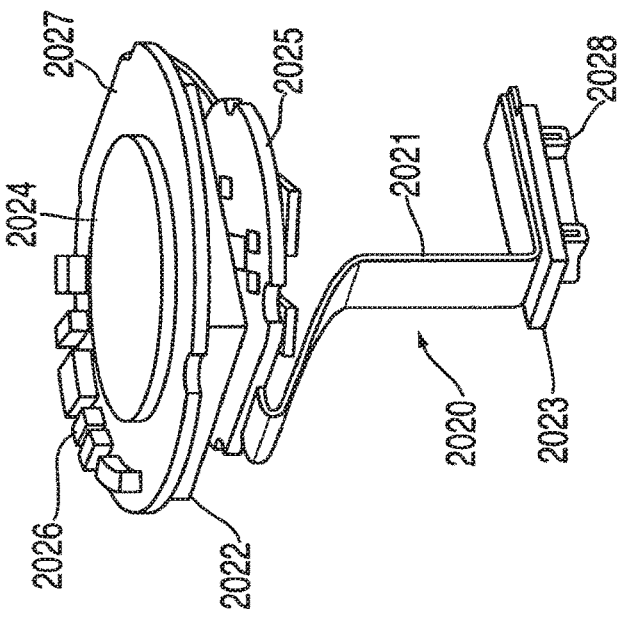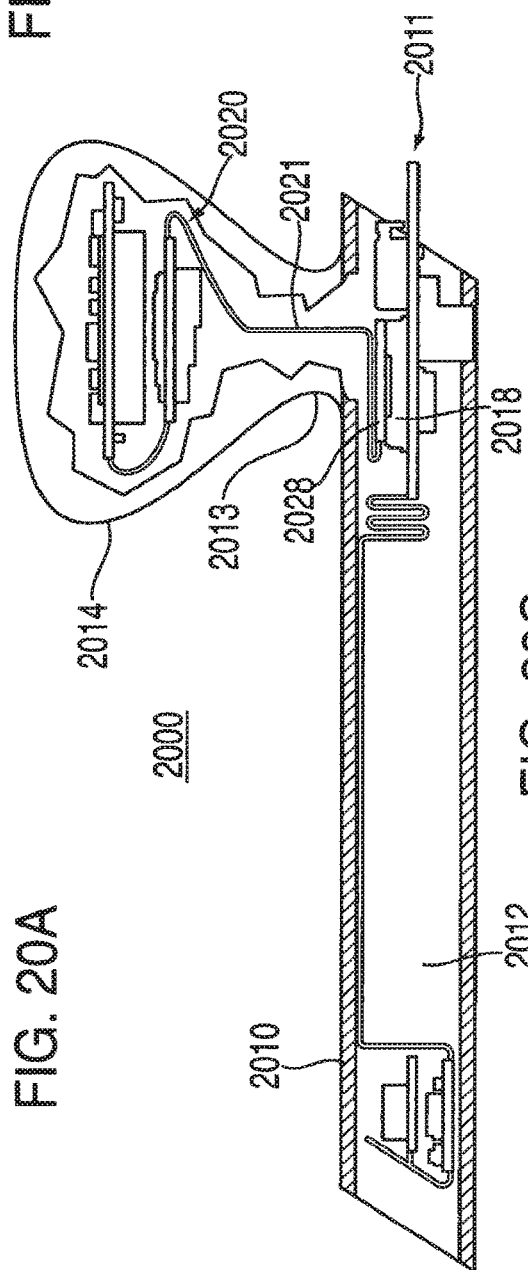

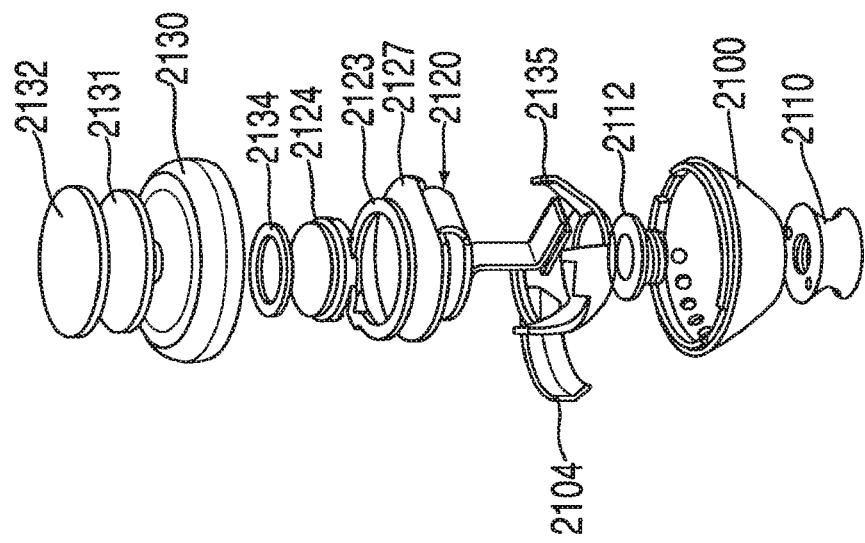
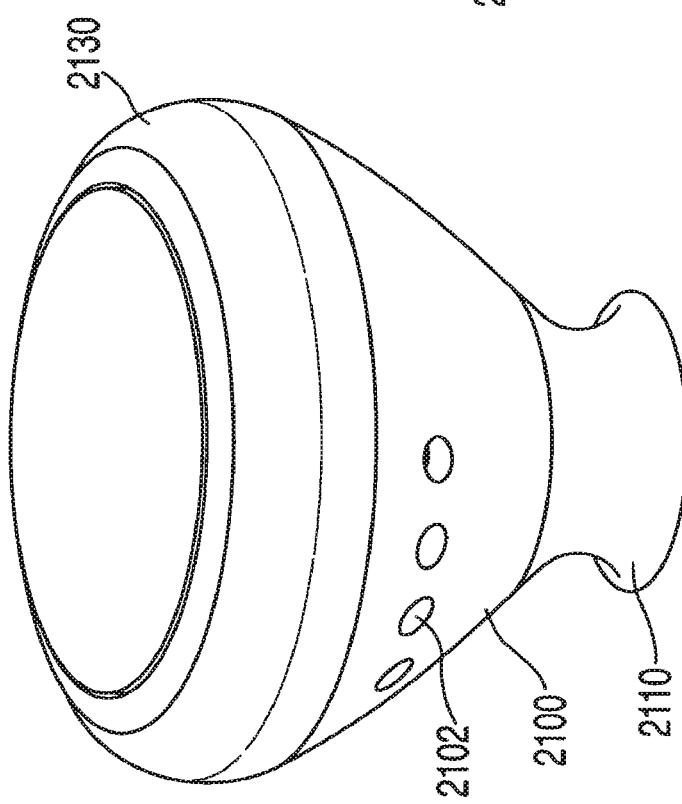
FIG. 21A
FIG. 21B

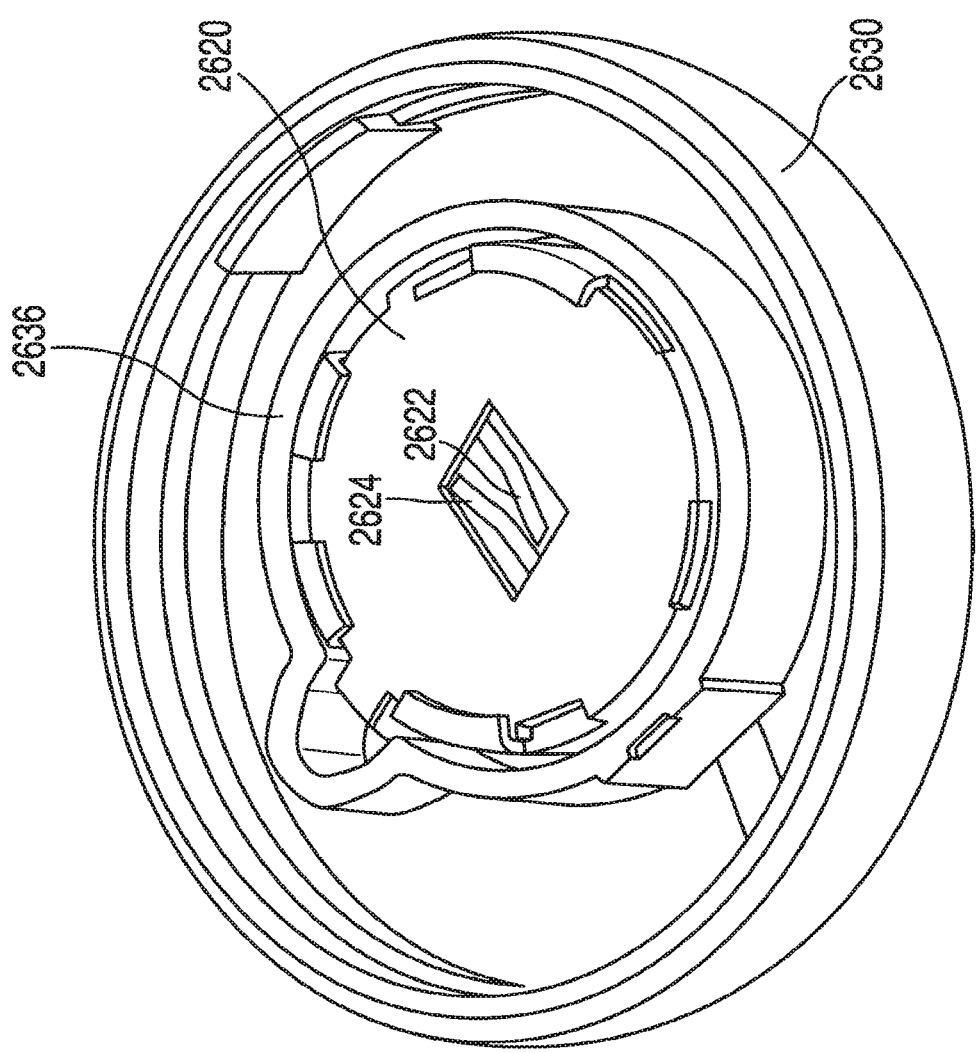

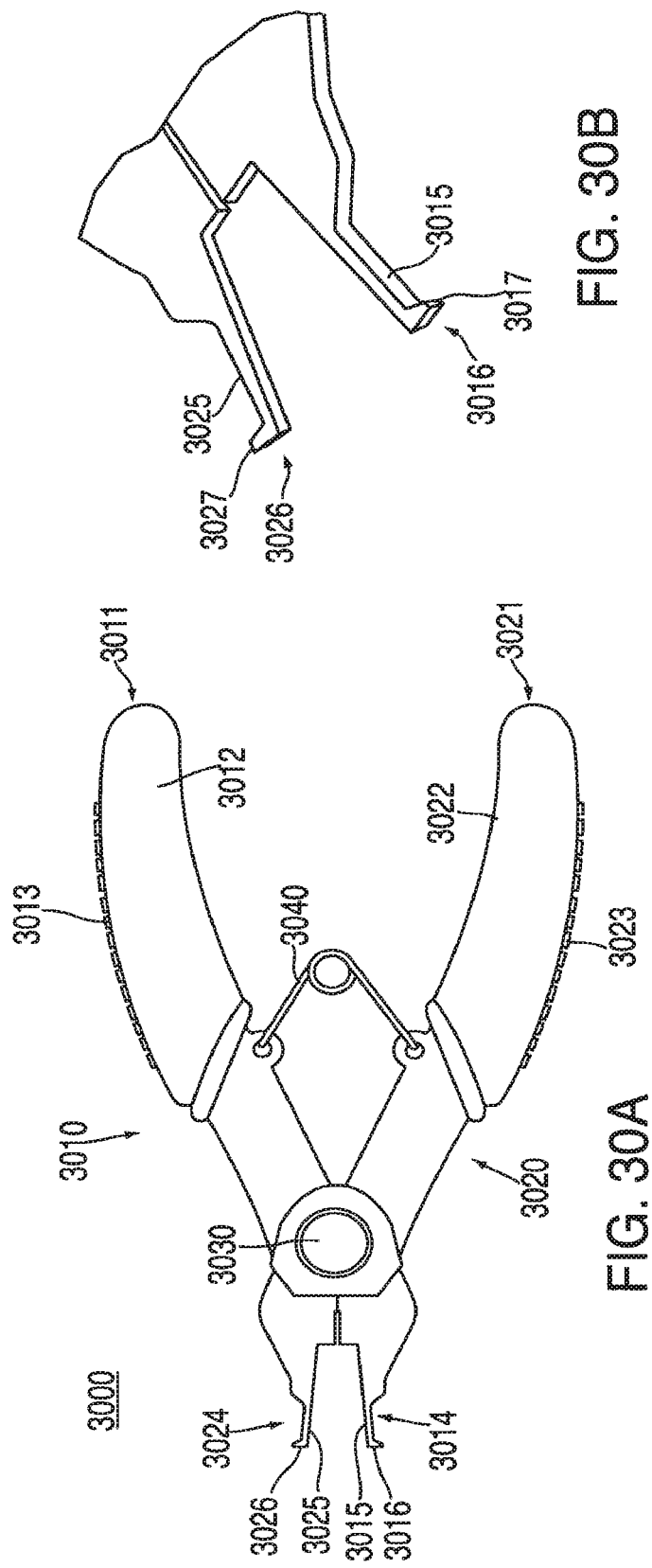
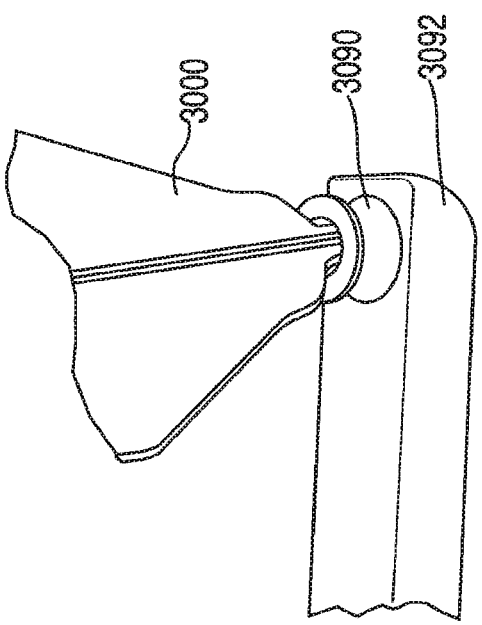
FIG. 30A
FIG. 30B
FIG. 30C

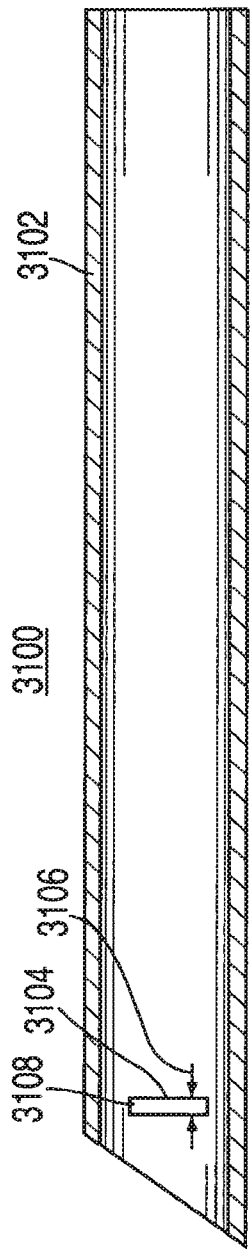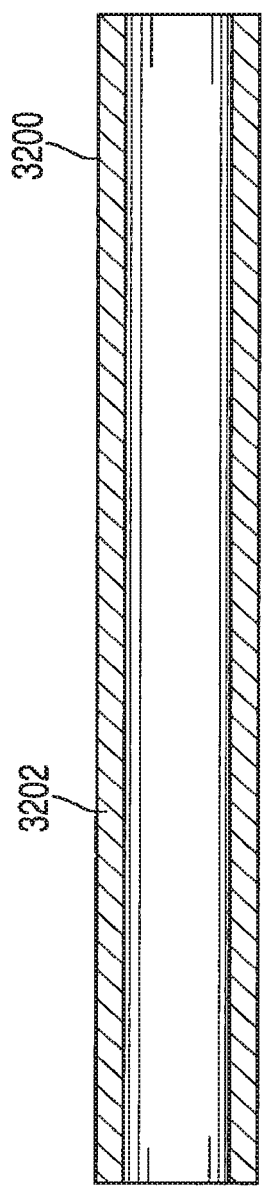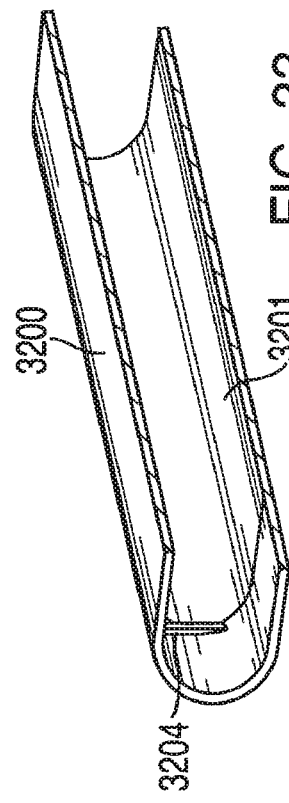

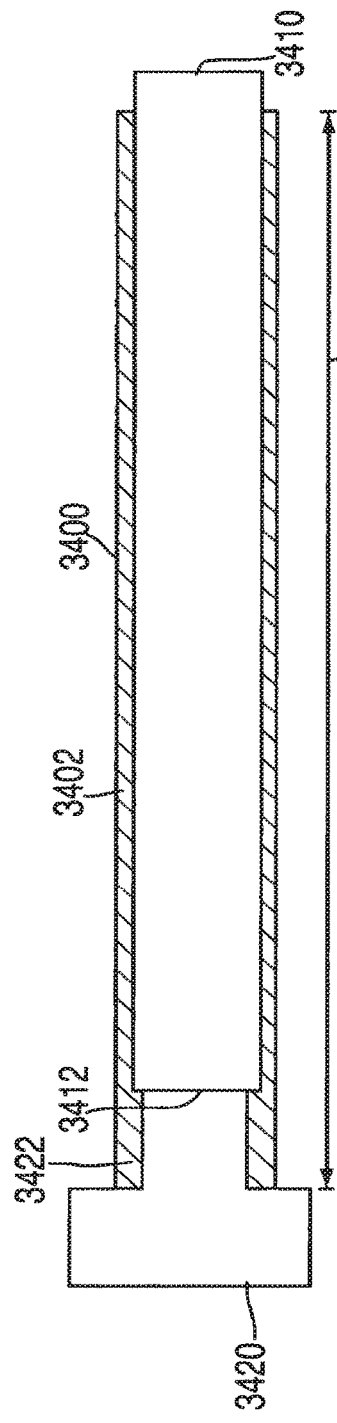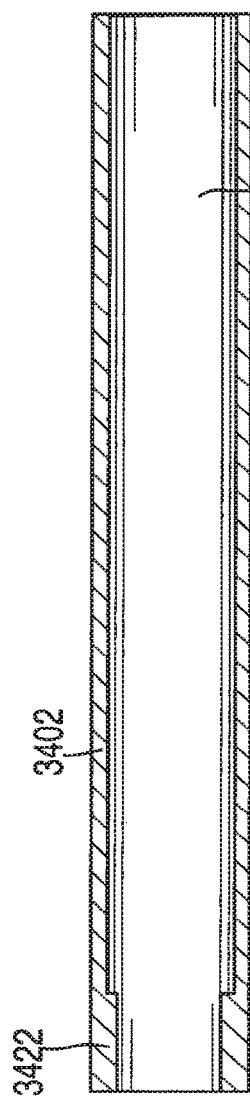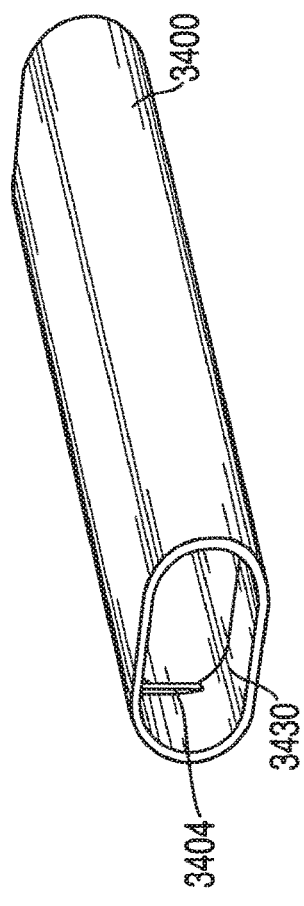
FIG. 34
FIG. 35
FIG. 36

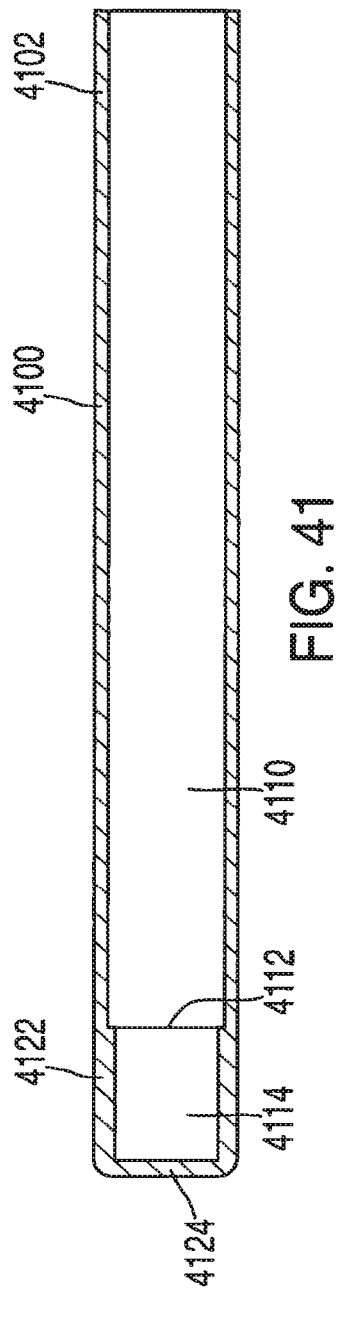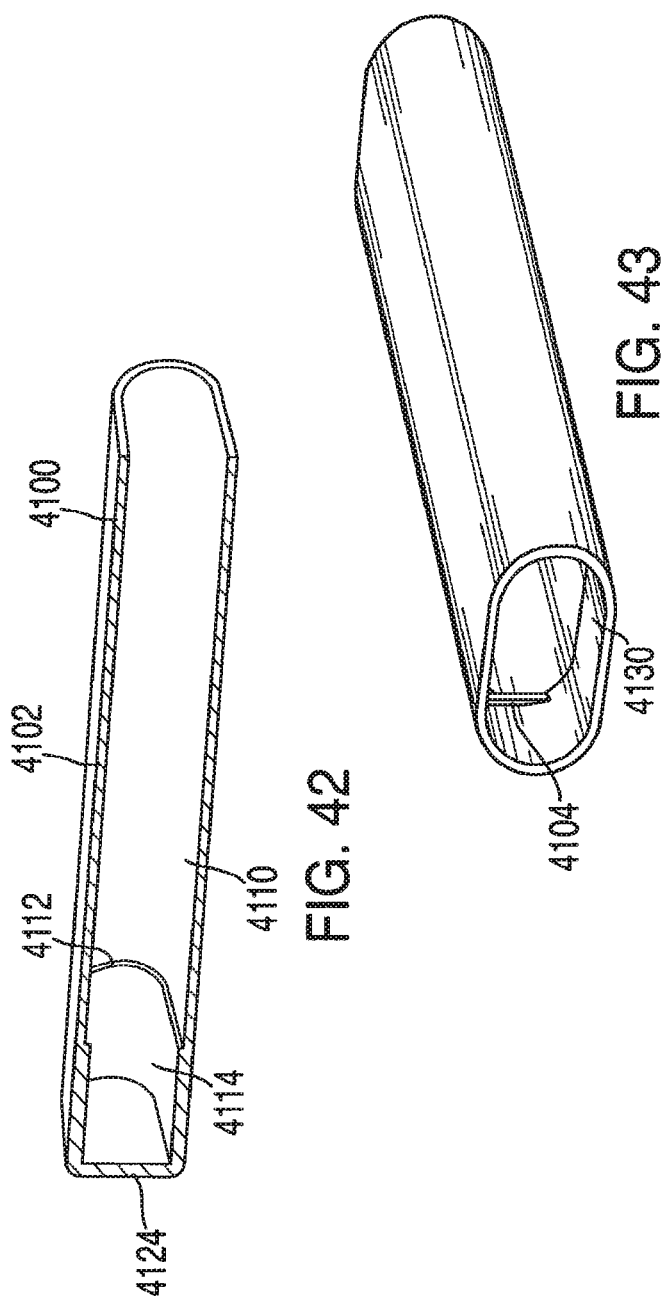

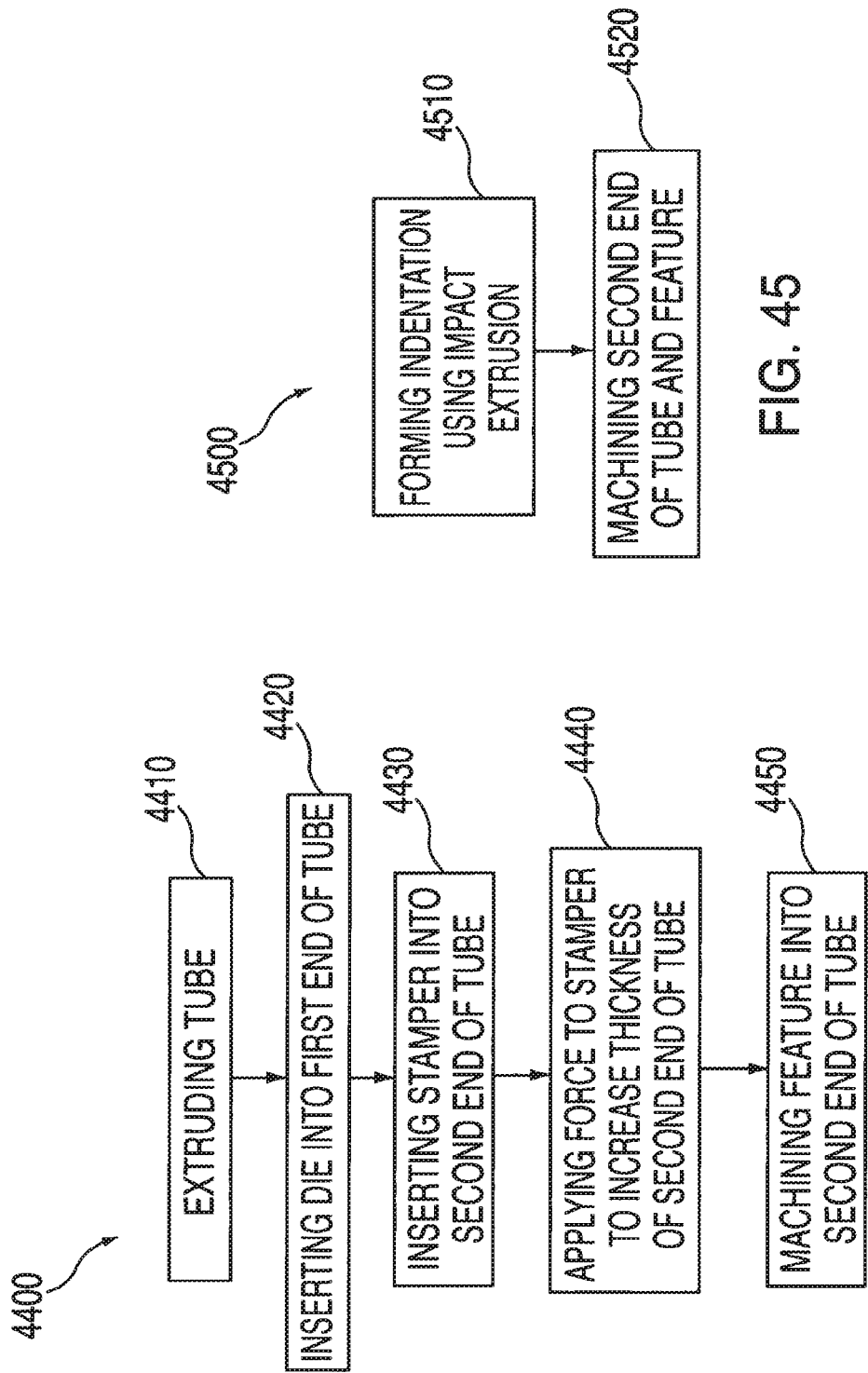

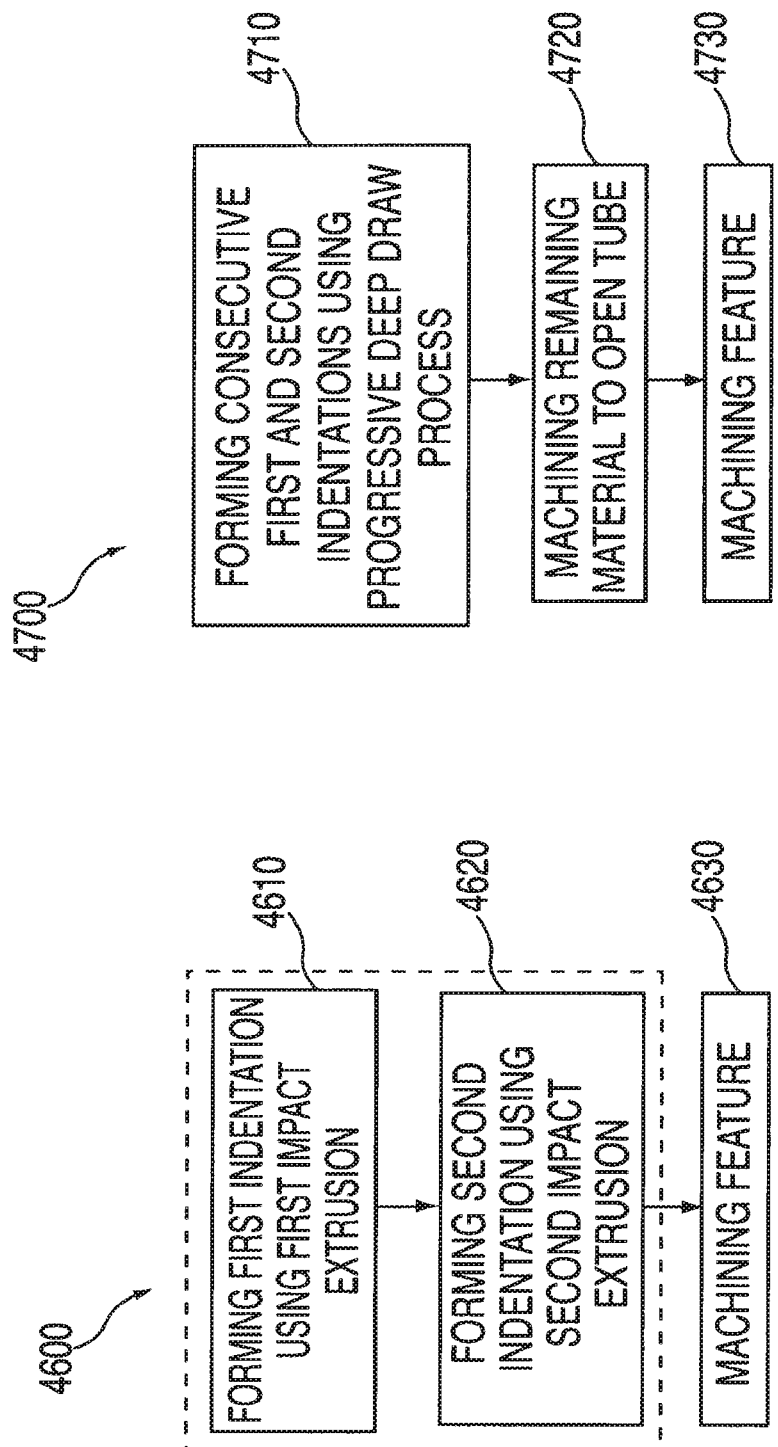

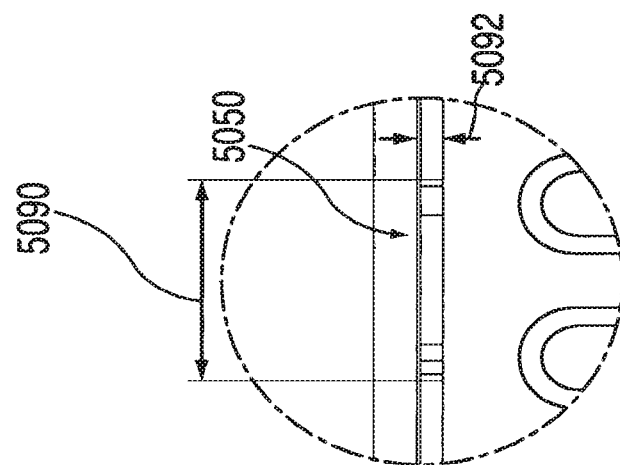
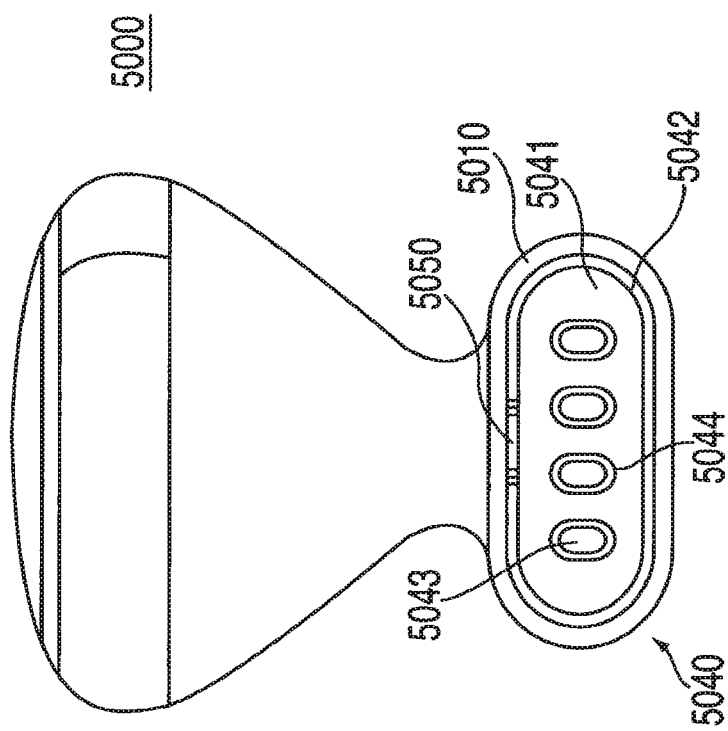

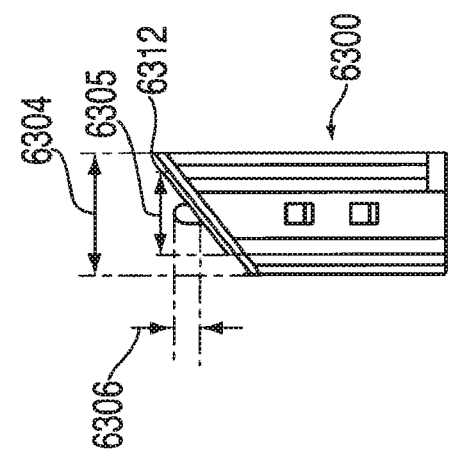
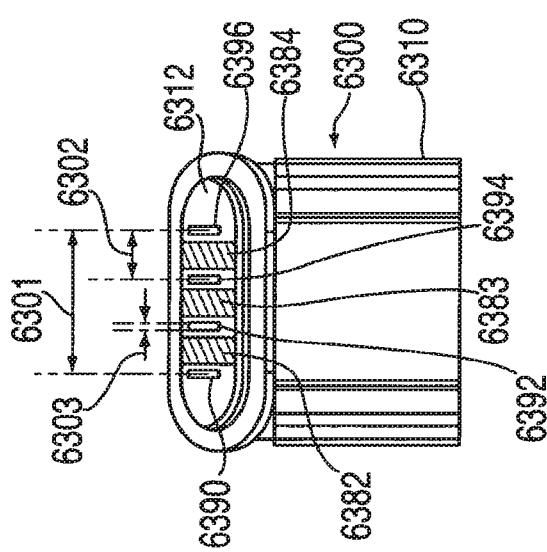
FIG. 63A
FIG. 63B

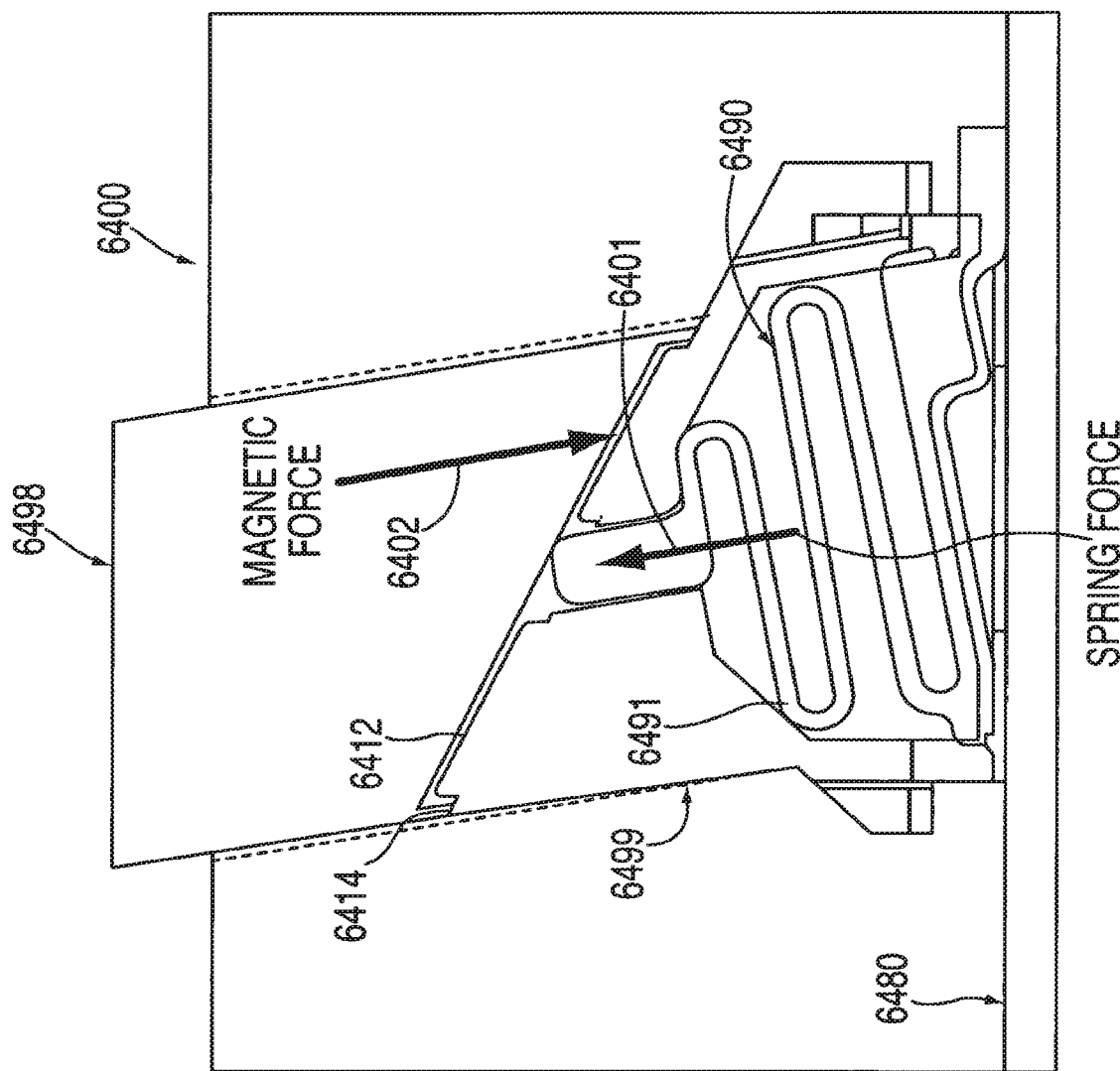

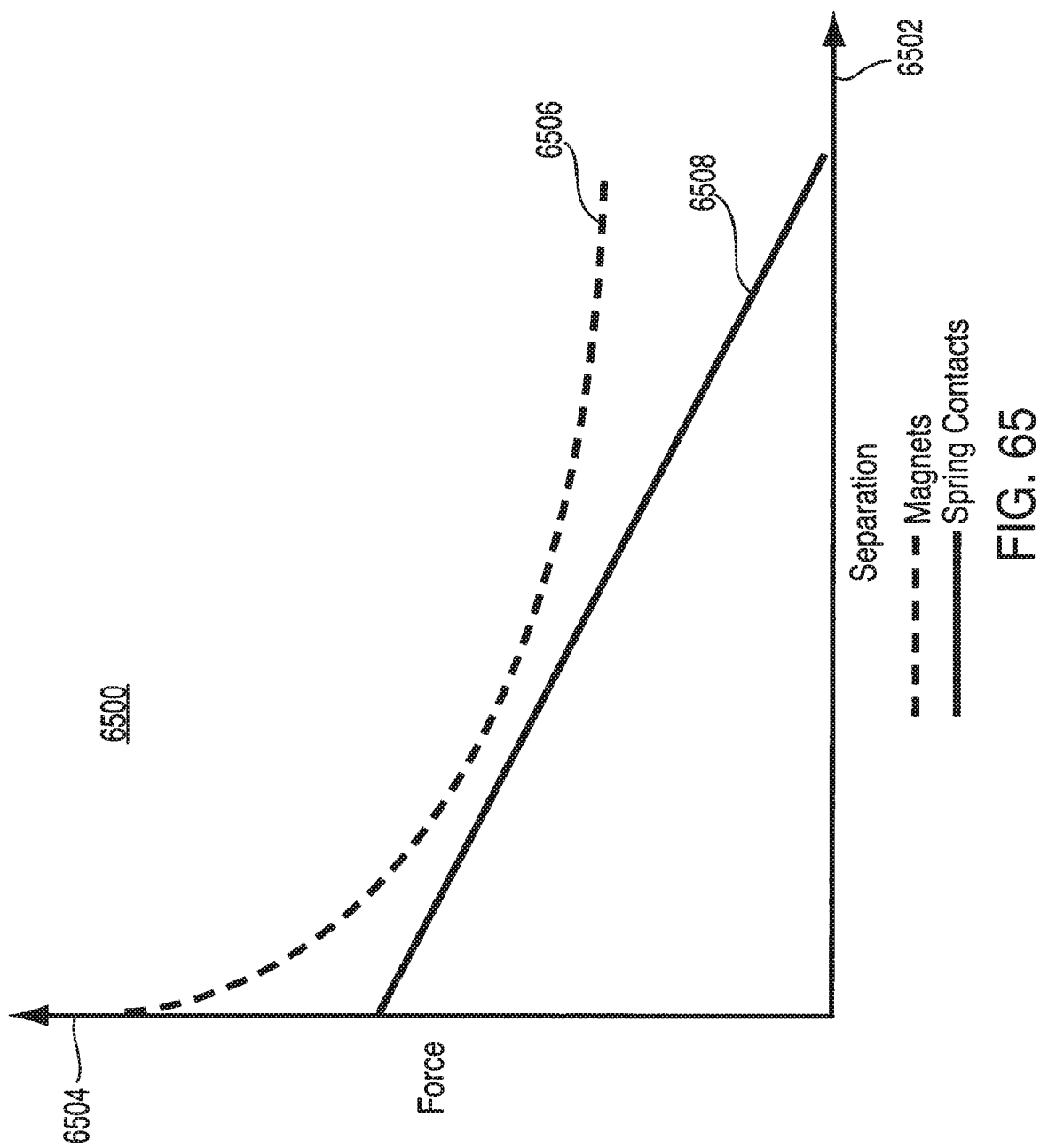

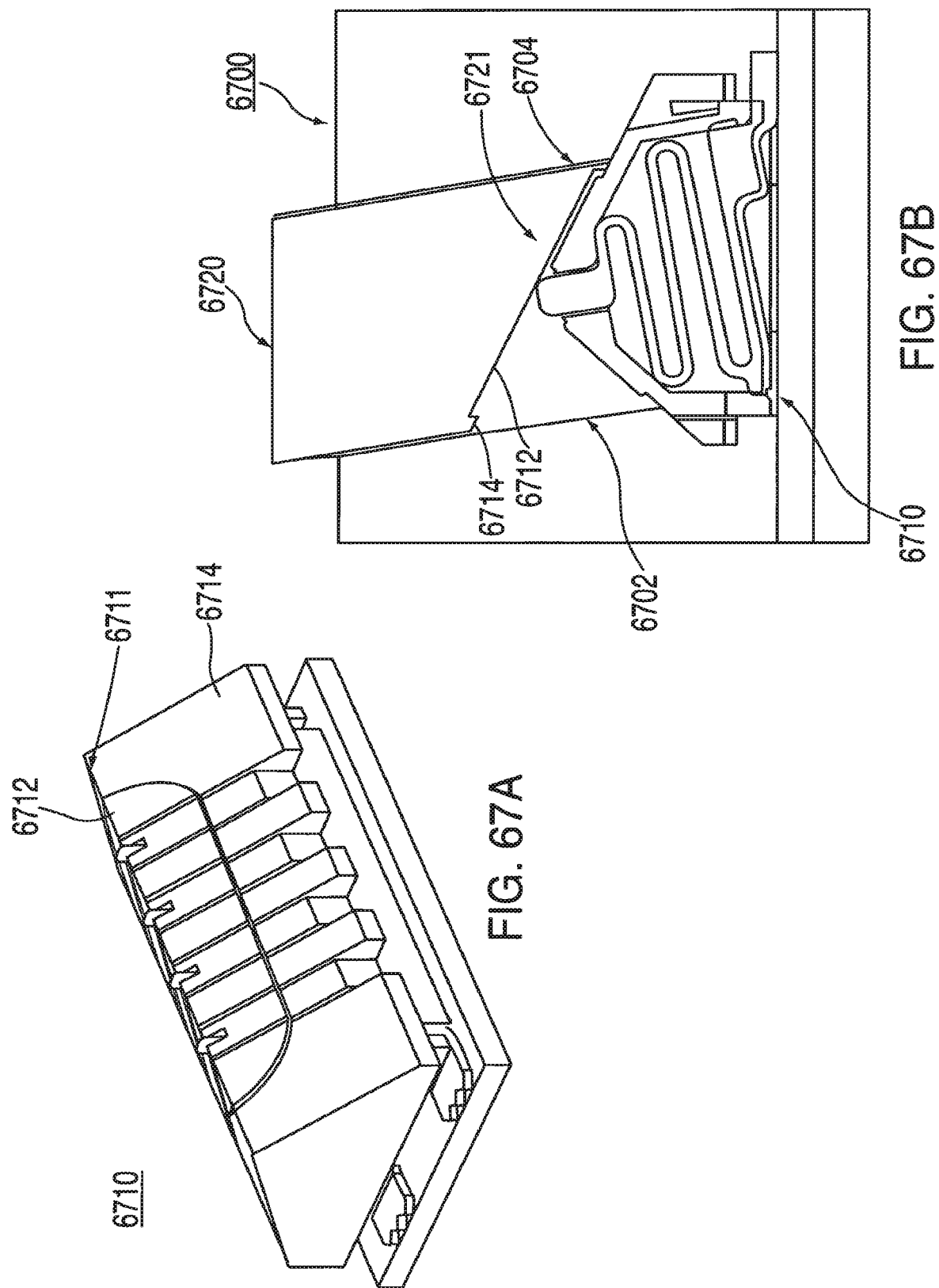

| MODE | FUNCTION | HEADSET BUTTON PRESS | HEADSET DISPLAY SYSTEM | HEADSET AUDIO | HOST DEVICE UI |
|---|---|---|---|---|---|
| HEADSET IN STANDBY | TURN HEADSET ON | VERY LONG PRESS (2.5 SEC) | GREEN | 4 RISING TONES | IF PAIRED, HEADSET ICON BECOMES BRIGHT |
|  | CHECK ON STATUS | SHORT TAP | — | NONE | HEADSET ICON ON SCREEN IS BRIGHT |
|  | HEADSET DISCOVERABLE/ PAIRING | VERY, VERY LONG PRESS (8 SEC) | GREEN UNTIL BUTTON RELEASE | SHORT BEEP | N/A |
|  |  |  | SOLID GREEN THEN FAST BLINKING GREEN | 4 RISING TONES THEN 5 HIGH BEEPS | WIRELESS COMMUNICATIONS SCREEN |
|  | TURN HEADSET OFF | VERY LONG PRESS (2.5 SEC) | GREEN THEN AMBER THEN OFF | 4 FALLING TONES | HEADSET ICON TURNS DARK |
| MISSED CALL |  | — | NONE | NONE | MISSED CALL INDICATOR SCREEN & ICONS |
| INCOMING CALL |  | — | SLOW BLINKING GREEN | TWO BEEPS | INCOMING CALL SCREEN |
|  | ANSWER CALL | SHORT TAP | GREEN UNTIL BUTTON RELEASE | SHORT LOW TONE THEN SHORT HIGH TONE | CALL ANSWER SCREEN |
|  | REJECT CALL | LONG PRESS, RELEASE (1 SEC) | GREEN UNTIL BUTTON RELEASE | SHORT DOUBLE LOW TONE | CALL REJECT SCREEN |
| HEADSET ON CALL |  | — | NONE | YES | CALL IN PROGRESS SCREEN |
|  | MUTE ON | N/A | NONE | NONE | MUTE ICON |
|  | CALL ON HOLD | N/A | NONE | SHORT DOUBLE LOW TONE | HOST DEVICE GENERATE AUDIO/TONE, CALL WAITING ALERT SCREEN |
|  | END CALL | SHORT TAP | GREEN UNTIL BUTTON RELEASE | DOUBLE LOW TONE (HANDSET DEPENDENT) | CALL ENDED SCREEN |
| INCOMING CALL WHILE ON CALL |  | — | NONE | SHORT DOUBLE LOW TONE | HOST DEVICE GENERATE AUDIO/TONE, CALL WAITING ALERT SCREEN |
|  | SWITCH CALL | SHORT TAP | GREEN UNTIL BUTTON RELEASE | SHORT DOUBLE LOW TONE | IN CALL SCREEN |
|  | END CALL ACTIVATE OTHER CALL | LONG PRESS (1 SEC) | GREEN UNTIL BUTTON RELEASE | SHORT DOUBLE LOW TONE | IN CALL SCREEN |
| LOST LINK |  | N/A | N/A | NONE | HEADSET OUT OF RANGE WARNING |
| LOW BATTERY |  | N/A | N/A | LONG HIGH BEEP | HEADSET ICON BLINKS THEN CHANGES COLORS |
| CONNECTED TO BATTERY |  | — | CHARGING - SOLID AMBER CHARGED - SOLID GREEN | NONE | BATTERY CHARGE SCREEN |

FIG. 68

IN-EAR WIRELESS LISTENING DEVICE

CROSS REFERENCE TO RELATED APPLICATIONS

This application is a continuation of U.S. application Ser. No. 16/681,749 filed Nov. 12, 2019, and entitled "In-Ear Wireless Listening Device", which is a continuation of U.S. application Ser. No. 16/212,623, filed Dec. 6, 2018, and entitled "Headset Connector", which is a continuation of U.S. application Ser. No. 15/948,920, filed Apr. 9, 2018, and entitled "Headset Connector", which is a continuation of U.S. application Ser. No. 15/590,970, filed May 9, 2017, and entitled "Headset Connector", now U.S. Pat. No. 9,967,646 which is a continuation of U.S. application Ser. No. 15/071,177, filed Mar. 15, 2016, and entitled "Headset Connector", now U.S. Pat. No. 9,854,343, which is a continuation of U.S. application Ser. No. 13/847,103, filed Mar. 19, 2013, and entitled "Headset Connector", now U.S. Pat. No. 9,287,657, which is a continuation of U.S. application Ser. No. 11/824,444, which was filed on Jun. 28, 2007, and entitled "Headset Connector," now U.S. Pat. No. 8,401,219, which application claims benefit under 35 U.S.C. § 119(e) to U.S. Provisional Application No. 60/879,177, which was filed on Jan. 6, 2007, and entitled "Wireless Headset," and U.S. Provisional Application No. 60/879,195, which was filed on Jan. 6, 2007, and entitled "Connector with Magnetic Detent". Wherein each and every one of the above applications is incorporated by reference herein in its entirety for all purposes.

Commonly assigned Terlizzi U.S. patent application Ser. No. 13/460,228, filed Apr. 30, 2012, entitled "Wireless Headset Having Adaptive Powering", is hereby incorporated by reference in its entirety.

Commonly assigned DiFonzo et al. U.S. patent application Ser. No. 11/235,873, filed Sep. 26, 2005, entitled "Electromagnetic Connector for Electronic Device", is hereby incorporated by reference in its entirety.

Commonly assigned Rohrbach et al. U.S. patent application Ser. No. 11/235,875, filed Sep. 26, 2005, entitled "Magnetic Connector for Electronic Device" is hereby incorporated by reference in its entirety.

Commonly assigned Andre et al. U.S. patent application Ser. No. 11/456,833, filed Jul. 11, 2006, entitled "Invisible, Light-Transmissive Display System", is hereby incorporated by reference in its entirety.

Commonly assigned Andre et al. U.S. patent application Ser. No. 11/551,988, filed Oct. 23, 2006, entitled "Invisible, Light-Transmissive Display System", is hereby incorporated by reference in its entirety.

Commonly assigned Sanford et al. U.S. patent application Ser. No. 11/651,094, filed Jan. 6, 2007, entitled "Antenna and Button Assembly for Wireless Devices" is hereby incorporated by reference in its entirety.

Commonly assigned Terlizzi et al. U.S. patent application Ser. No. 11/650,130, filed Jan. 5, 2007, entitled "Systems and Methods for Determining the Configuration of Electronic Connections" is hereby incorporated by reference in its entirety.

Commonly assigned Rabu et al. U.S. patent application Ser. No. 11/620,669, filed Jan. 6, 2007, entitled "Apparatuses and Methods that Facilitate the Transfer of Power and Information Among Electrical Devices" is hereby incorporated by reference in its entirety.

Commonly assigned Terlizzi et al. U.S. Provisional Patent Application No. 60/878,852, filed Jan. 5, 2007, entitled "Systems and Methods for Multi-State Switch Networks," is herein incorporated by reference in its entirety.

Commonly assigned Forstall U.S. Patent Application No. 60/936,965, filed Jun. 22, 2007, entitled "Single User Input Mechanism for Controlling Electronic Device Operations," is herein incorporated by reference in its entirety

FIELD

The present invention can relate to headsets. More particularly, the present invention can relate to headsets for communicating with an electronic device.

BACKGROUND

Headsets for providing hands-free communications are known in the art. Such headsets typically can be used in conjunction with a cellular telephone or a computer (e.g., Voice over IP). Some existing headsets include a microphone, a speaker (also referred to as a receiver), electronics for controlling the headset and communicating with another device (e.g., a cellular telephone), a battery and a connector for re-charging the battery.

There are many aspects involved in the design of headsets. For example, the size and weight of headsets can be key issues because of how they typically mount to a user's ear. A heavy or large headset can pull on a user's ear, creating an uncomfortable fit. The shape of headset earpieces (e.g., earbuds) may also be an important design consideration to take into account as it is desirable for earpieces to fit comfortably in, on, or over a wide range of different sizes and shapes of ears.

Additionally, the acoustic performance of headsets, such as receiver sound generation quality and microphone sound reception quality (e.g., ability to pick up a user's voice without undue background noise), can be important design considerations. Achieving desired receiver and microphone acoustic performance can become increasingly difficult as the size of a headset decreases.

Another example of an important design consideration can be the user interface of a headset. It may be desirable for a user interface to be intuitive for a first-time user, yet convenient for an experienced user.

Aesthetics may be yet another important design consideration for headsets.

Further still, ease of manufacturing headsets can be another design consideration. For example, it can be desirable to design a headset that can be mass produced in an affordable fashion.

In view of the foregoing, there is a need for an improved headset that addresses one or more of the above-identified considerations.

SUMMARY

In accordance with one embodiment of the present invention, a headset that includes a tube housing and a magnetic connector fixed within the tube housing is provided. The magnetic connector can include a mating face and a plurality of electrical contacts disposed within the mating face.

In accordance with another embodiment of the present invention, an engaging connector assembly that includes a housing, a magnetic array structure, and a plurality of spring biased contact members is provided. The housing can have a mating side. The magnetic array structure can be fixed within the housing and constructed to house a plurality of spring biased contact members. The plurality of spring biased contact members can be housed within the magnetic array structure. The spring biased contact members can include tips that extend out of the mating side.

In accordance with yet another embodiment of the present invention, a connector that includes at least one magnetic component, a mating face, at least two contacts, and circuitry is provided. The mating face can be proximal to the at least one magnetic component. The at least two contacts can be disposed in the mating face. The circuitry can be electrically coupled to the at least two contacts. The mating face can be angled with respect to a plane passing lengthwise through the connector.

In accordance with yet another embodiment of the present invention, a connector that includes at least one triangle shaped magnetic component and at least one contact disposed adjacent to the at least one triangle shaped magnetic component is provided.

In accordance with yet another embodiment of the present invention, a system that includes a headset connector and an engagement connector is provided. The headset connector can include at least one electrical contact housed within a connector plate having an angled headset mating surface. The engagement connector can include at least one spring biased connector member having a tip portion that is electrically coupled to the at least one electrical contact when the angled headset mating surface is in close proximity to an angled engagement connector mating surface.

In accordance with yet another embodiment of the present invention, a system that includes a headset assembly and a headset engaging assembly is provided. The headset assembly can include a magnetic connector having an angled mating face. The connector can include a plurality of electrical contacts disposed within the angled mating face. The headset engaging assembly can include a magnetic component. The magnetic component can include at least one angled surface and at least one spring biased contact member. Each contact member can include a tip that extends beyond the at least one angled surface.

BRIEF DESCRIPTION OF THE DRAWINGS

The present invention will be apparent upon consideration of the following detailed description, taken in conjunction with accompanying drawings, in which:

FIG. 5 is a simplified block diagram of a headset in accordance with an embodiment of the present invention;

FIGS. 19A and 19B are illustrations comparing the traditional circuit board of FIGS. 7A-7C to a circuit board with an improved distribution of electrical components in a headset in accordance with an embodiment of the present invention;

FIG. 20A-20C are illustrations of an improved distribution of electrical components in a headset in accordance with an embodiment of the present invention;

FIG. 21A is an illustration of a headset earbud in accordance with an embodiment of the present invention;

FIG. 21B is a simplified exploded view of a headset earbud in accordance with an embodiment of the present invention;

FIGS. 22-25 and FIG. 26A are simplified illustrations of a headset earbud in various states of assembly in accordance with some embodiments of the present invention;

FIGS. 30A and 30B are illustrations of a tool that can be used to assist in assembly of a portion of a headset in accordance with an embodiment of the present invention;

FIG. 30C is an illustration of the tool of FIGS. 30A and 30B being used in accordance with an embodiment of the present invention;

FIG. 31 is a cross-sectional view of a "finished" tube in accordance with an embodiment of the present invention;

FIG. 32 is a cross-sectional view of an initially manufactured tube in accordance with an embodiment of the present invention;

FIG. 33 is a perspective view of a cross section of the tube of FIG. 31 in accordance with an embodiment of the present invention;

FIG. 34 is an illustrative die and stamper for modifying the initially manufactured tube of FIG. 32 in accordance with an embodiment of the present invention;

FIG. 35 is a cross-sectional view of the tube of FIG. 34 once the stamper and die are removed from the tube in accordance with an embodiment of the present invention;

FIG. 36 is a perspective view of the tube of FIG. 35 once the tube is machined to create an internal wall in accordance with an embodiment of the present invention;

FIG. 41 is a cross-sectional view of an illustrative tube formed using a progressive deep draw process in accordance with an embodiment of the present invention;

FIG. 42 is a perspective view of a cross section of the tube of FIG. 41 in accordance with an embodiment of the present invention;

FIG. 43 is a perspective view of the tube of FIGS. 41 and 42 once the tube is machined to create an internal wall in accordance with an embodiment of the present invention;

FIG. 44 is a flow chart of an illustrative process for forming an extruded tube with a feature on the internal surface of the tube with using a die and stamper in accordance with an embodiment of the present invention;

FIG. 45 is a flow chart of an illustrative process for forming a tube with a feature on the internal surface of the tube using a single impact extrusion in accordance with an embodiment of the present invention;

FIG. 46 is a flow chart of an illustrative process for forming a tube with a feature on the internal surface of the tube using a impact extrusion on both ends of the tube in accordance with an embodiment of the present invention;

FIG. 47 is a flow chart of an illustrative process for forming a tube with a feature on the internal surface of the tube using a progressive deep draw process in accordance with an embodiment of the present invention;

FIGS. 50A and 50B are illustrations of a headset in accordance with an embodiment of the present invention;

FIGS. 63A and 63B are illustrations of a connector in accordance with an embodiment of the present invention;

FIG. 64 is an illustration of a headset coupling with a complementary connector in accordance with an embodiment of the present invention;

FIG. 65 is a simplified graph of magnetic and spring forces involved in the coupling of a headset with a complementary connector in accordance with an embodiment of the present invention;

FIG. 67A is an illustration of a connector in accordance with an embodiment of the present invention;

FIG. 67B is an illustration of a headset coupling with a complementary connector in accordance with an embodiment of the present invention;

FIG. 68 is a chart listing exemplary modes and functions of a communications system in accordance with an embodiment of the present invention;

DETAILED DESCRIPTION OF THE INVENTION

Figure 1:
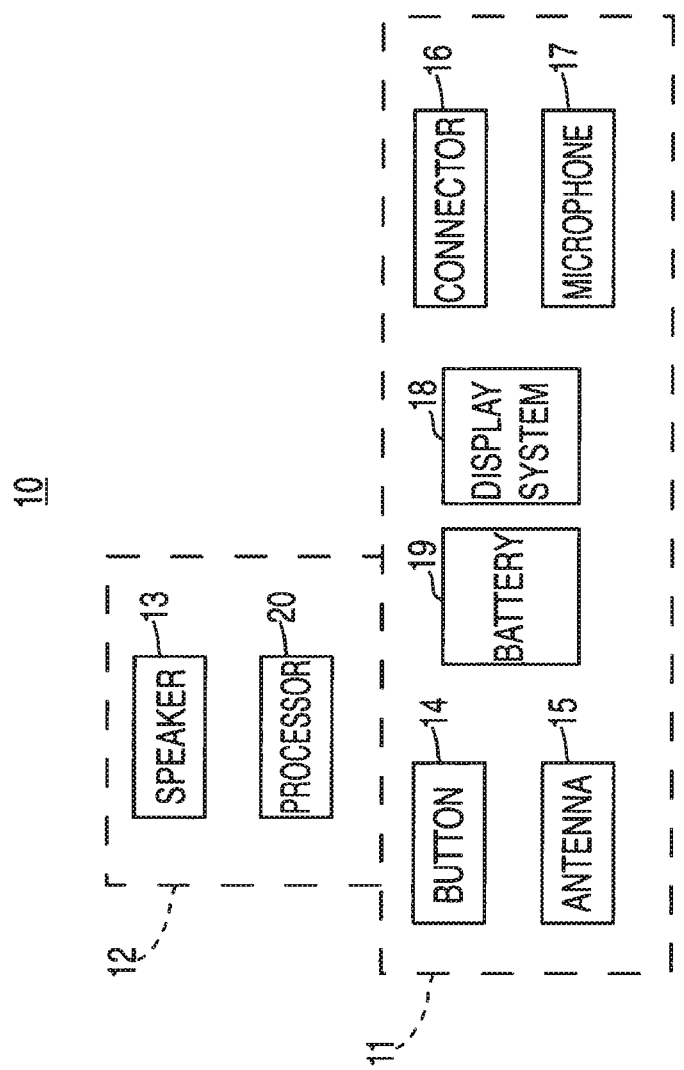
FIG. 1 is a simplified block diagram of a headset in accordance with an embodiment of the present invention.

The present invention relates to headsets and methods for manufacturing the same. Headsets are communication devices that are worn on a user's head in order to allow hands free data and/or voice communication with a host device such as a computer, phone handset, cellular phone, an automobile and/or the like. Headsets can include one or more speakers (in proximity to one or both ears) for audio output and/or one or more microphones for audio input.

Headsets can come in a variety of form factors or shapes. In some cases, headsets can be embodied as an earpiece that serves as the primary support mechanism for wearing the headset. For example the headset may be supported on the head by an earpiece worn over or in the ear. Alternatively, the headset may be supported by a frame or band that fits on or over the user's head. The headset may include a fixed or movable boom that places the microphone closer to the user's mouth (wraps around the face). Alternatively, the headset may be boomless such that the microphone is integrated with the earpiece thereby forming a more compact device (e.g., smaller, lighter, more aesthetically pleasing, etc.).

According to one aspect of the invention, the headset can be embodied as a small compact unit including a primary housing and an earbud member extending therefrom. The earbud member may be attached to or integrally formed with the primary housing. Various components can be placed at the surface of or within the confines of the earbud member and the primary housing. In fact, both of them can include one or more components depending on the needs of the device. The components contained within each of these can be widely varied. Examples of operational components can include speakers, microphones, antennas, connectors, buttons, displays, indicators, battery, and associated processors, controllers and circuitry. Generally, the earbud member includes at least a speaker while the primary housing includes at least a microphone (although this is not a requirement). Depending on their size, each of these members can include additional components of the headset. In one embodiment, the primary housing includes an antenna, user interface button, indicator or display (e.g., LEDs), battery, microphone, and/or a connector along with any accompanying circuitry while a speaker, a processor, and its accompanying circuitry can be located in the earbud. The button can be located on one end of the main housing. A user can interface with this button to perform various functions (e.g., terminating calls).

The shape and size and orientation of the earbud member and primary housing can be widely varied. In one embodiment, the earbud member is configured for insertion into the ear such that it supports the remaining portions of the headset (e.g., primary housing) proximate the user's head. In one embodiment, the primary housing can be configured as a longitudinal member (e.g., a tube). In one example, an earbud member, which contains a speaker, perpendicularly protrudes away from one end of a longitudinally extending primary housing, which includes a microphone at an opposite end of the longitudinally extending primary housing. Furthermore, the earbud member can expand outwardly and then inwardly from a neck portion that couples to the primary housing in order to form a bud that fits into an ear.

The primary housing can include a tube that forms a housing and receives internal components through an open end. The tube can be manufactured using one of several processes in order to reduce costs and increase speed and efficiency. In one embodiment, the tube can be manufactured to include features on the inner surface of the tube for supporting electronic components of the headset. Processes for creating such a tube can include applying a die and stamp to an extruded tube, single or double impact extrusion, or a progressive deep draw process.

The headset can include a hollow neck between the earbud and the primary housing in order to allow electrical wires to connect sets of discrete electronics disposed within the earbud and primary housing. In one embodiment, dual threaded inserts can be used to structurally reinforce the hollow neck without adding size to the device.

Small compact headsets have limited surface area for placing components. Therefore, one aspect of the invention relates to integrating multiple components into the same surface area of the headset in order to help form a small compact headset. Put another way, multiple components can be built into the same location on the headset in order to achieve the desired level of functionality without impacting a desired small size of the headset. The components may for example be selected from connectors, microphones, speakers, buttons, indicators, displays and/or the like. In one embodiment, an antenna and a button function at the same location of the headset. In another embodiment, a microphone and connector function at the same location of the headset. Other embodiments can also be realized. For example, a button can function at the same location of a speaker (e.g., at an earbud) or an indicator can function at the same location of a microphone.

Small compact headsets also have limited internal volume for placing internal components. Therefore one aspect of the invention relates to dividing/separating internal electronic assemblies into small multiple components that can be positioned at different locations (discretely) within the headset. By way of example, the electronics that would normally be embodied on a single large circuit board may be divided/separated out and placed on multiple smaller circuit boards, each of which can be positioned at different locations within the headset. The smaller circuit boards can be more easily placed within various small internal pockets found in a small compact device. Flexible wires and possibly wireless protocols can be used to operatively couple the electronics and/or discrete circuit boards together. In other words, a first portion of the electronics may be separated from a second portion of the electronics, and further the first portion may be positioned at a first location within the headset while the second portion may be positioned at a second location within the headset. Note that, two portions is not a limitation and the electronics can be divided into any number of smaller discrete portions.

Along a similar vein, another aspect of the invention relates to electronic assemblies that are partially flexible or bendable such that the assemblies can be folded into a small compact form in order to fit inside tightly spaced internal volumes. By way of example, the electronics that would normally be embodied on a single rigid circuit board may be placed on multiple rigid circuit boards that are interconnected by flexible or bendable circuit board portions that can be bent around various internal shapes and/or folded over itself while still functioning properly.

Another aspect of the invention relates to acoustical paths, ports and volumes that are built through a small compact headset in order to improve acoustical performance of the microphone and/or speaker (with limited impact on the form factor of the headset). In one embodiment, in order to control the flow of air through an earbud, acoustic ports can be integrated into one or more electronic components disposed therein and/or the earbud housing. In another embodiment, at least some of the ports that pass through the various housings are substantially hidden from view thereby enhancing the aesthetic appearance of the headset. For example, the ports may be positioned within a seam between two interfacing external surfaces of the headset. In one example, a first external surface is provided by the open end of a tube of the primary housing and the second external surface is provided by an end member disposed within the open end of the tube of the primary housing. The end member may for example include a connector assembly thereby integrating a connector with a microphone into the same surface area.

In accordance with one aspect of the invention, the connector assembly can include contacts for the transfer of power and data. The connector can be located on the end of the primary housing opposite a user interface button. The connector can have a symmetrical configuration so that it can be coupled with complementary connectors in more than one interface orientation (e.g., 90 degree symmetry, 180 degree symmetry, etc.). In one embodiment, switching circuitry can be included in order to accommodate this symmetry. Such circuitry can, for example, measure the polarity of data and/or power lines from the complementary connector to determine its interface orientation and route the data and/or power lines based on the determined orientation. In some embodiments, the connector assembly can be at least partially made of a ferromagnetic material, which can serve as an attraction plate for one or more magnets on a complementary connector in another device (e.g., a headset charger).

In accordance with another aspect of the invention, the headset can include an indicator that is hidden from view when inactive and that is in view when active. This can for example be accomplished with micrometer sized holes, called microperforations, that can be drilled into the wall of primary housing and/or earbud member. Through these holes, light sources on the inside of the primary housing and/or earbud member can create visual indicators for a user. A light diffuser can be used in combination with such microperforations so that the indicator can be illuminated with evenly distributed light.

Headsets may communicate with the host device via a wired and/or wireless connection. Wired connections may for example occur through a cable/connector arrangement. Wireless connections on the other hand can occur through the air (no physical connection is needed). The wired and wireless protocols may be widely varied. Wired protocols may for example be based on Universal Serial Bus (USB) interfaces, Firewire interfaces, conventional serial interfaces, parallel interfaces, and/or the like. Wireless protocols may, for example, be based on short range transmissions of voice and/or data. The wireless protocols may further be used to create personal area networks between the headset and a nearby host device such as a cellular phone. Some examples of wireless protocols that can be used include Bluetooth, Home RF, iEEE 802.11, IrDA, Wireless USB, and the like. The communication electronics may be embodied as a system on a chip (SOC).

Although other wireless protocols may be used, according to one aspect of the invention, the headset can include communication electronics based on the Bluetooth wireless protocol. The communication electronics may, for example, include or correspond to a Bluetooth System-on-a-Chip (SoC). The SoC can include circuitry for performing functions other than wireless communications. For example, in some embodiments, circuitry for communicating using wired Universal Serial Bus (USB) interfaces and conventional serial interfaces can be integrated into the SoC.

For increased functionality, according to one aspect of the invention, the headset can include power distribution circuitry. Such circuitry can operate the headset according to several different modes depending, for example, on the charge level of the battery or the availability of an external power source. In one mode, the power distribution circuitry can supply power to limited parts of the SoC while simultaneously charging the battery. The battery charging process can be further improved by using temperature detection circuitry (e.g., a thermistor) to monitor the battery temperature. This process can extend the battery life by charging it only when the monitored temperature is at, or below, a predetermined threshold. In another mode, the power distribution circuitry can selectively power various electronic components using the battery while other electronic components may be powered by an external power source.

Aspects and embodiments of the invention are discussed below with reference to FIGS. 1-68. However, those skilled in the art will readily appreciate that the detailed description given herein with respect to these figures is for explanatory purposes as the invention extends beyond these limited embodiments.

FIG. 1 is a simplified block diagram of headset 10 in accordance with one embodiment of the present invention. Headset 10 can be configured to be a small compact unit in the form of a simple earpiece that can be placed in the ear. The headset can include a primary housing 11 and an earbud 12 that extends from the primary housing. Earbud 12 can fit into an ear thereby placing the primary housing next to a user's face. Each of these members can surround and protect various internal components and can also support thereon various external components associated with operating the headset. The components may be a plurality of electrical components that provide specific functions for the electronic device. For example, the components may generally be associated with generating, receiving, and/or transmitting data associated with operating the device.

Headset 10 includes processor 20 for controlling the headset's functions. In the illustrated embodiment, processor 20 can be provided in earbud 12. In other embodiments, processor 20 can be located anywhere in headset 10. Processor 20 can be electrically coupled to the other components of headset 10 through circuit boards and/or cables. Processor 20 may facilitate wireless communications with a host device. For example, processor 20 can generate signals for wireless transmission and process received wireless signals. In addition to wireless communications, processor 20 may coordinate the operation of the various components of headset 10. For example, processor 20 may control the charging of a battery or the operation of a display system.

Headset 10 also includes speaker system 13 for distributing audio information from earbud 12. Speaker system 13 can include an audio port at the end of the earbud and a receiver (e.g., a speaker) disposed at the end of the audio port. The audio port may be covered with a grill. Speaker system 13 may also include various ports internal and external to the earbud. For example, speaker system 13 may include acoustical paths inside the earbud and acoustical paths that pass through the surfaces of the earbud.

Headset 10 also includes one or more input mechanisms for providing inputs to the headset. The input mechanism may be placed at the primary housing and/or the earbud. The input mechanisms may be widely varied and may include for example slide switches, depressible buttons, dials, wheels, navigation pads, touch pads, and/or the like. For simplicity purposes, the headset may only include a single input mechanism. Furthermore, for aesthetical reasons, the input mechanism may be placed at a select location. In other embodiments, two or more input mechanisms may reside on the headset.

In one embodiment, headset 10 includes single button 14 located at one end of primary housing 11. Placing button 14 at the end preserves the side surfaces of primary housing 11. This can also be accomplished by configuring earbud 12 as a button (e.g., the earbud is depressible relative to the primary housing). Earbud 12 may also be configured to tilt, rotate, bend and/or slide in order to provide inputs while preserving the side surfaces of primary housing 11.

Headset 10 also includes a communication terminal for communicating with a host device. The communication terminal may be configured for wired or wireless connections. In the illustrated embodiment, the communication terminal is antenna 15 that supports wireless connections. Antenna 15 may be located internal to the primary housing or earbud. If the primary housing or earbud is not formed from a radio transparent material then a radio transparent window may need to be provided. In the illustrated embodiment, antenna 15 is located at one end of the headset. Placing antenna 15 and the accompanying radiotransparent window at the end preserves the side surfaces of primary housing 11. In one embodiment, button 14 and antenna 15 are integrated at the same end.

Headset 10 may also include one or more connectors 16 for transferring data and/or power to and from the headset. A data connection allows data to be transmitted to and received from a host device. A power connection, on the other hand, allows power to be delivered to the headset. The connectors may for example connect to a corresponding connector in a dock or cable in order to connect to a power source for charging and/or a data source for downloads or uploads. Although the location of the connector can be widely varied, in the illustrated embodiment, connector 16 is located at one of the ends in order to preserve the side surfaces of the primary housing.

In some embodiments, connector 16 and corresponding connectors may be shaped such that the two connectors can mate in two or more different interface orientations. To compensate for this possibility, headset 10 can include switching circuitry that is coupled to connector 16. Such switching circuitry can determine how connector 16 is coupled with a corresponding connector (e.g., how the connectors are physically orientated). Switching circuitry can determine this by measuring, for example, the polarity of data and/or power lines from the complementary connector. Switching circuitry can then route the data and/or power from the connector to other circuitry in headset 10 appropriately. In some embodiments, at least a portion of connector 16 can be magnetic or magnetically attractive. For example, connector 16 may include a ferromagnetic material that biases it to magnetic connectors. Such magnetic interactions can assist a user in coupling connector 16 with corresponding connectors and help prevent the connectors from uncoupling.

Headset 10 also includes microphone 17 for capturing speech provided by a user. The microphone is typically located internal to the primary housing. One or more acoustical ports may be configured into the primary housing in order to provide an acoustical path from outside the primary housing to the microphone. The location of the acoustical ports can be widely varied. In one embodiment, the acoustical ports are located at one end of the primary housing in order to preserve the sides of the primary housing. In one embodiment, the connector assembly and acoustical ports are integrated at the same end. Furthermore, the acoustical port may be configured to be substantially hidden from view by selective placement of the ports. For example, the ports may be placed at the seam between the connector assembly and the primary housing.

Headset 10 also includes display system 18 for providing visual feedback. The display system may be a complex visual display system comprising an LCD or other related display device capable of displaying graphical information and/or it may be an indicator assembly that only provides simple visual feedback as for example via an LED assembly. In one embodiment, the display system only comprises an indicator assembly that provides visual feedback along the side walls of the primary housing. In order to preserve the side walls, however, the indicator assembly may be hidden when inactive. This can be accomplished, for example, through microperforations through the primary housing. The microperforations allow light to pass through, but are so small that they are undetectable to a user.

Headset 10 also includes battery 19. Battery 19 may provide electrical power to components of headset 10. Charging circuitry may also be provided to charge battery 19 when an external power supply is connected to headset 10.

Headset 10 can also include support circuitry for the aforementioned components. For example, this may include circuit boards, various electrical components, processors and controllers. The support circuitry can be placed inside the primary housing and/or the earbud. In one embodiment, the support circuitry can be split or divided between the two locations in order to make a more compact device, i.e., the various electronics are distributed among volumes as needed. In order to further save space, the electronics may be stackable. In one embodiment, the electronics are placed on a circuit board with one or more flexible portions so that a stack is created by folding or bending the circuit board.

Although earbud 12 and primary housing 11 can be integrally formed, in the illustrated embodiment, the primary housing and earbud are separate housing members that are attached together. Any suitable means can be used to attach the two parts together including but not limited to screws, glues, epoxies, clips, brackets, and/or the like.

The position of the earbud relative to the primary housing may be widely varied. For example, the earbud may be placed at any external surface (e.g., top, side, front, or back) of the primary housing. In one embodiment, the earbud is located on a planar front side near one of the ends of the primary housing. In one embodiment, the earbud may be configured to move relative to the primary housing so that its position can be adjusted.

Each of the earbud 12 and primary housing 11 can be configured to surround its internal components at a peripheral region thereof so as to cover and protect the internal components. They can also be configured to support components externally if needed. Each of earbud 12 and primary housing 11 help define the shape and form of the headset. That is, their contours embody the outward physical appearance of the headset. Such contours may be rectilinear, curvilinear or both. In one embodiment, earbud 12 is formed as an outwardly extending protruding member while primary housing 11 is formed as a longitudinally extending member. For example, earbud 12 may be coupled to primary housing 11 through a neck, which can be a portion of the primary housing, earbud or a separate piece altogether. The axis of earbud 12 and primary housing 11 can be transverse, and more particularly perpendicular. The shapes of earbud 12 and primary housing 11 may be widely varied. In one embodiment, earbud 12 is formed as a reverse rounded circular conical member and primary housing 11 is configured with a pill shaped cross section. It is understood however that these are not limitations and that the form, shape, and orientation may vary according to the specific needs or design of the headset. By way of example, earbud 12 and primary housing 11 may have various cross-sectional shapes including for example, circular, square, rectangular, triangular, oval, and/or the like. In addition, their form may be such that they do not have a typical straight axis.

Earbud 12 and primary housing 11 may be formed by one or more members. In one embodiment, primary housing 11 may include an integrally formed member. By integral, it is meant that the member is a single complete unit. By being integrally formed, the member can be structurally stronger than conventional housings, which include two parts that are fastened together. Furthermore, unlike conventional housings that have a seam between the two parts, the member has a substantially seamless appearance. Moreover, the seamless housing can prevent contamination and can be more water resistant than conventional housings. The primary housing may, for example, be formed as a tube that defines a cavity therethrough between a first open end and second open end located opposite the first open end. In order to seal the ends of the tube, the primary housing can additionally include a pair of end caps. Each of the end caps can be configured to cover one of the open ends thereby forming a fully-enclosed housing system. The end caps may be formed from similar or different materials as the tube. Furthermore, the end caps may be attached to the tube using a variety of techniques, including but not limited to, fasteners, glues, clips, brackets, and/or the like. The end caps can also be movably attached, and be configured to carry operational components of the headset.

It is understood that the inner cross sectional shape of primary housing 11 may be the same or different from the external cross-sectional shape of the primary housing. For example, it may be desirable to have a pill shaped external and a rectangularly shaped interior, etc. In addition, although not a requirement, the front and back surface of primary housing 11 may be substantially planar.

In one embodiment, primary housing 11 can be formed via an extrusion or related process. The extrusion process is capable of producing an integral tube without seams, crack, breaks, etc. As is generally well known, extrusion is a shaping process where a continuous work piece is produced by forcing molten or hot material through a shaped orifice, i.e., the extrusion process produces a length of a particular cross-sectional shape. The cross-sectional shape of the work piece is controlled at least in part on the shaped orifice. As the shaped work piece exits the orifice, it is cooled and thereafter cut to a desired length. The extrusion process is a continuous high volume process that produces intricate profiles and that accurately controls work piece dimensions (which can be a necessity for smaller parts). Furthermore, because extrusion has low tooling costs, it is relatively inexpensive when compared to other forming or manufacturing processes.

Primary housing 11 may be formed from a variety of extrudable materials or material combinations including but not limited to metals, metal alloys, plastics, ceramics and/or the like. By way of example, the metals may correspond to aluminum, titanium, steel, copper, etc., the plastic materials may correspond to polycarbonate, ABS, nylon, etc, and the ceramic materials may correspond to alumina, zirconia, etc. Zirconia may, for example, correspond to zirconia oxide.

Figure 2:
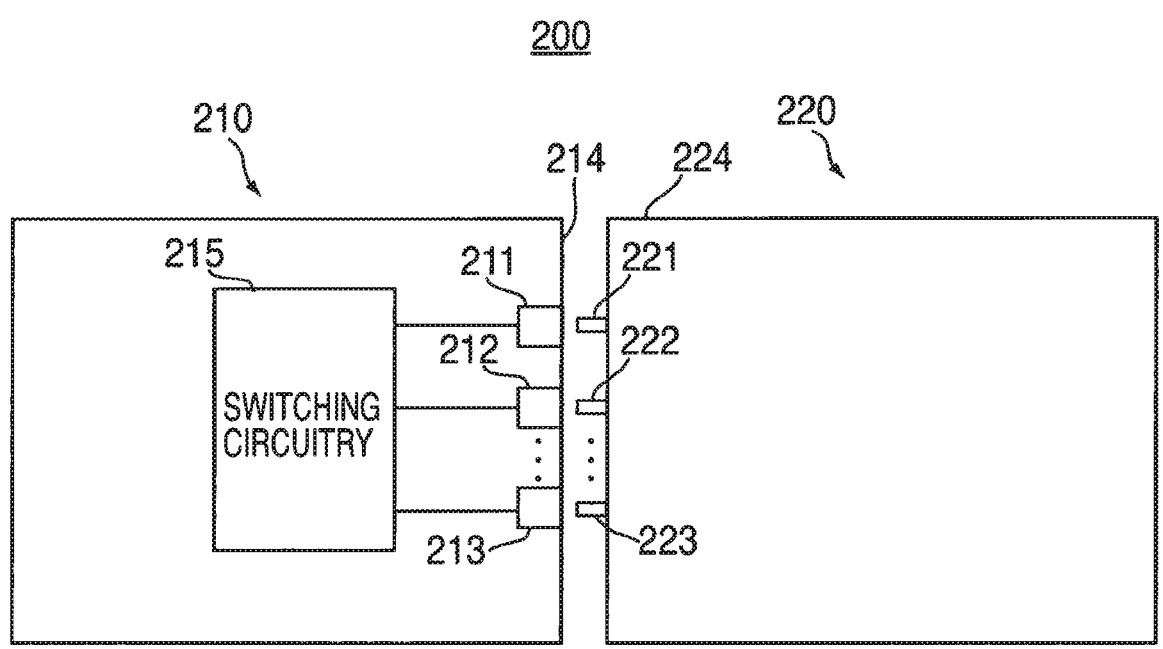
FIG. 2 is a simplified block diagram of a headset connector system in accordance with an embodiment of the present invention.

FIG. 2 shows headset connector system 200 in accordance with an embodiment of the present invention. System 200 can include headset 210 and headset engaging connector 220. In some embodiments, headset 210 may correspond to headset 10 of FIG. 1. Headset 210 can include any number of headset connector contact regions (see e.g., regions 211, 212 and 213) disposed within face 214 of the headset. Face 214 can mate with headset engaging connector 220 such that a corresponding number of headset engaging contact regions disposed in the headset engaging connector (see e.g., regions 221, 222 and 223) electrically couple with the headset connector contact regions. Moreover, headset 210 can include switching circuitry 215 that is electrically coupled with each of the headset connector contact regions. Switching circuitry 215 can be operative to determine an interface orientation between the headset connector contact regions and headset engaging contact regions. For example, switching circuitry 215 can determine the interface orientation in which headset 210 is mated with headset engaging connector 220. Switching circuitry 215 can determine this by measuring the polarity of data and/or power lines from headset engaging connector 220. After having determined the interface orientation, switching circuitry 215 can route signals received on the headset connector contact regions based on the determined orientation. It is understood that switching circuitry can be provided in connector 220 to provide functionality similar to switching circuitry 215. For example, switching circuitry in connector 220 can determine the interface orientation of headset 210 and route electrical signals to contact regions based on the determined orientation.

In some embodiments, at least a portion of headset 210 and/or headset engaging connector 220 (e.g., a portion or all of housing 224) can be magnetically attractive. Moreover, headset engaging contact regions (see e.g., regions 221, 222, and 223) may be biased to protrude from housing 224 of connector 220. In such embodiments, headset 210 can be magnetically attracted to headset engaging connector 220 such that the magnetic forces can cause the headset engaging contact regions (see e.g., regions 221, 222, and 223) to press against the headset connector contact regions (see e.g., regions 211, 212, and 213).

Figure 3:
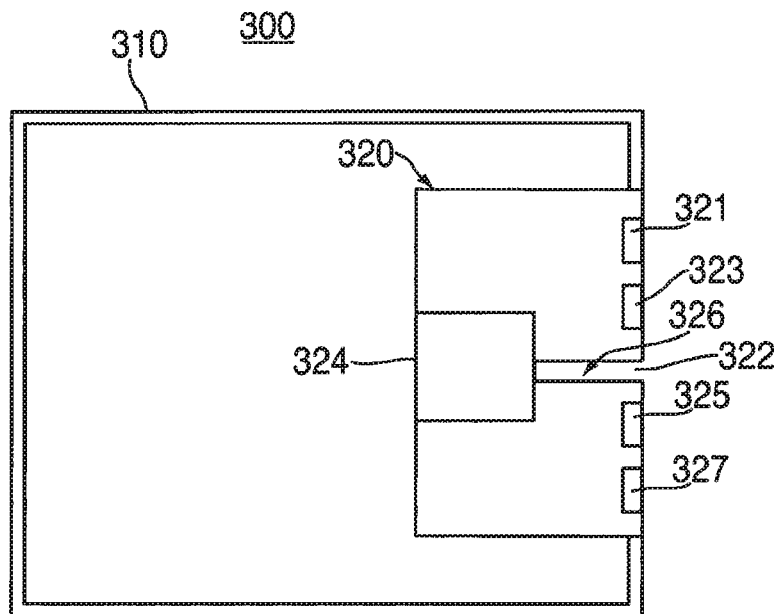
FIG. 3 is a simplified cross-sectional illustration of a connector assembly in accordance with an embodiment of the present invention.

FIG. 3 shows electronic device 300 in accordance with an embodiment of the present invention. In some embodiments, device 300 may be an electronic headset (see e.g., headset 10 of FIG. 1), but it is to be understood that device 300 is not limited to electronic headsets. Device 300 can include housing 310 and connector assembly 320. At least a portion of connector assembly 320 may be disposed in housing 310. Connector assembly 320 may include port 322, microphone 324 and channel 326 that fluidically couples the microphone to the port. Connector assembly 320 may also include one or more contacts (see e.g., contacts 321, 323, 325 and 327) for electrically coupling with another device. Port 322 may be provided in a location such that the contacts of connector assembly 320 are on the same exterior surface as the port or located nearby. In some embodiments, port 322 may be located between two contacts (see e.g., contacts 323 and 325).

Figure 4:
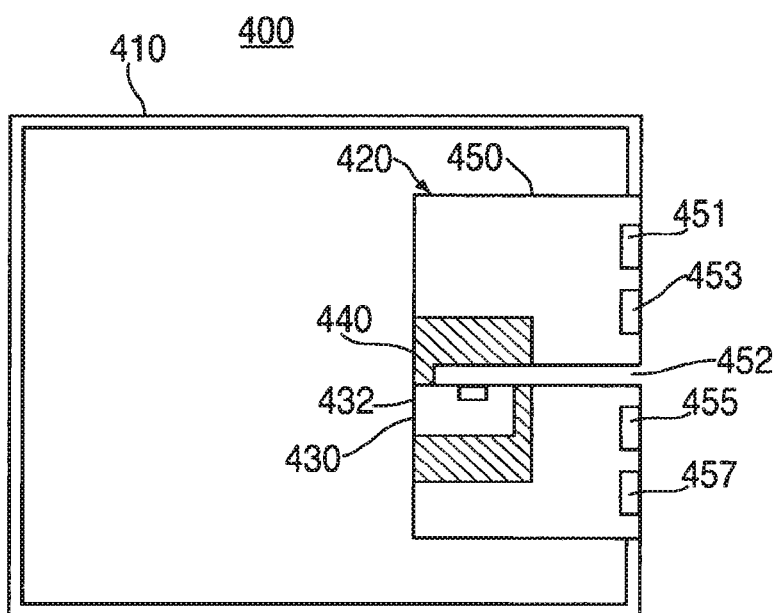
FIG. 4 is a simplified cross-sectional illustration of another connector assembly in accordance with an embodiment of the present invention.

FIG. 4 shows electronic device 400 in accordance with another embodiment of the present invention. Like device 300, device 400 may be an electronic headset in some embodiments (see e.g., headset 10 of FIG. 1) but it is to be understood that device 400 is not limited to electronic headsets. Device 400 can include housing 410 and joint connector and microphone assembly 420. Microphone 430, boot 440 and connector plate 450 may be provided in joint connector and microphone assembly 420. Microphone 430 may include one or more side surfaces and a top surface with microphone port 432. Microphone boot 440 may be mounted to the microphone such that the boot forms a seal with at least a portion of the top surface and the side surfaces. This seal can surround microphone port 432. Microphone boot 440 can further include a portion for sealing to connector plate 450 and an aperture for fluidically connecting microphone port 432 to connector port 452. Connector plate 450 may include one or more contacts (see e.g., contacts 451, 453, 455 and 457) for electrically coupling with another device. Connector port 452 may be provided in a location such that the port is in the same exterior surface as the contacts of connector assembly 420 or located near the contacts. In some embodiments, port 452 may be located between two contacts (see e.g., contacts 453 and 455).

FIG. 5 shows headset 500 in accordance with an embodiment of the invention. Headset 500 may correspond to an electronic headset (see e.g., headset 10 of FIG. 1) and may include primary housing 510 and earbud 520. Primary housing 510 may correspond to primary housing 11 and earbud 520 may correspond to earbud 12, for example. Earbud flexible circuit board 522 may be provided in earbud 520. Receiver 524 and processing circuitry 526 can be mounted on the earbud flexible circuit board 522. Earbud flexible circuit board 522 may be flexible such that it can fold upon itself or bend. Such flexibility may allow earbud flexible circuit board 522 to fit in smaller or less traditionally-shaped earbuds.

Primary housing 510 may be fixed to earbud 520. Primary housing 510 may include primary housing flexible circuit board 512 and microphone 514. Like earbud flexible circuit board 522, primary housing flexible circuit board 512 may be flexible such that it can fold upon itself or bend. Such flexibility may allow primary housing circuit board 512 to bend around other components in the primary housing (e.g., circuitry, antennas, or batteries) so as to conserve interior space inside the primary housing. For example, conserving interior space may result in more room to accommodate a larger battery. In another example, conserving interior space may result in a smaller primary housing. Earbud flexible circuit board 522 and microphone 514 can be electrically coupled to primary housing flexible circuit board 512. In some embodiments, such as the one shown in FIG. 5, earbud flexible circuit board 522 may extend into primary housing 510 such that it can couple with primary housing flexible circuit board 512. In other embodiments, primary housing flexible circuit board 512 may extend into earbud 520 such that it can couple with earbud flexible circuit board 522. It is to be understood that although primary housing flexible circuit board 512 and earbud flexible circuit board 522 are described as being flexible, one or both circuit boards may include both flexible and rigid portions. For example, each circuit board may include one or more rigid portions upon which electrical components (e.g., receiver 524, processing circuitry 526, or microphone 514) can be easily and stably mounted.

Figure 6A:
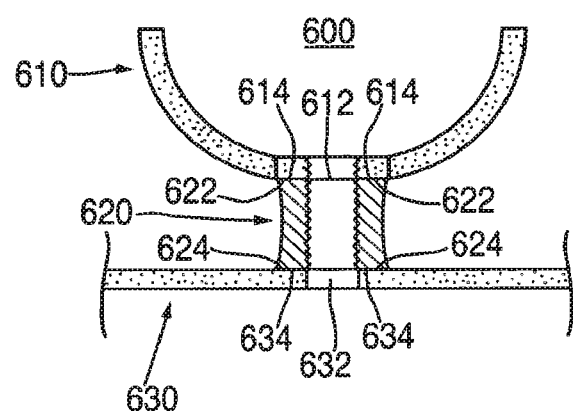
FIG. 6A is a simplified cross-sectional illustration of a portion of a headset in accordance with an embodiment of the present invention.

FIG. 6A shows headset device 600 in accordance with an embodiment of the present invention. Headset device 600 can include earbud housing 610, threaded neck 620, and primary housing 630. Headset device 600 can correspond to headset 10 of FIG. 1 such that, for example, earbud housing 610 corresponds to earbud 12 and primary housing 630 corresponds to primary housing 11. Earbud housing 610 can include earbud through-hole 612 and neck engaging surface 614. Threaded neck 620 can include first neck surface 622 that can mate with the earbud housing's neck engaging surface 614. First neck surface 622 and neck engaging surface 614 may include one or more features (e.g., protrusions, tabs, slots or notches) such that they can only be coupled in a certain orientation (with respect to each other).

Primary housing 630 can include primary housing through-hole 632 and neck engaging surface 634. Threaded neck 620 can further include second neck surface 624 that can mate with the primary housing's neck engaging surface. Second neck surface 624 and neck engaging surface 634 may include one or more features (e.g., protrusions, tabs, slots or notches) such that they can only be coupled in a certain orientation (with respect to each other).

Figure 6B:
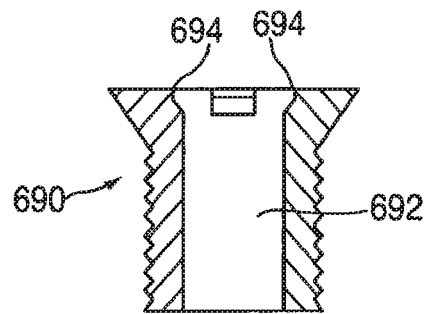
FIG. 6B is a simplified cross-sectional illustration of a screw in accordance with an embodiment of the present invention.

FIG. 6B shows screw 690 for use with headset device 600 in accordance with the present invention. Screw 690 can be used as both an earbud screw and a primary housing screw. Screw 690 can include hollow channel 692 running through the center of the screw. Screw 690 may also include features 694 (e.g., notches) such that a tool can interface with the features and rotate the screw. As an earbud screw, screw 690 can be inserted into earbud through-hole 612 and tightened such that it fastens neck engaging surface 614 to first neck surface 622. As a primary housing screw, screw 690 can be inserted into primary housing through-hole 632 and tightened such that it fastens neck engaging surface 634 to second neck surface 624.

Figure 7:
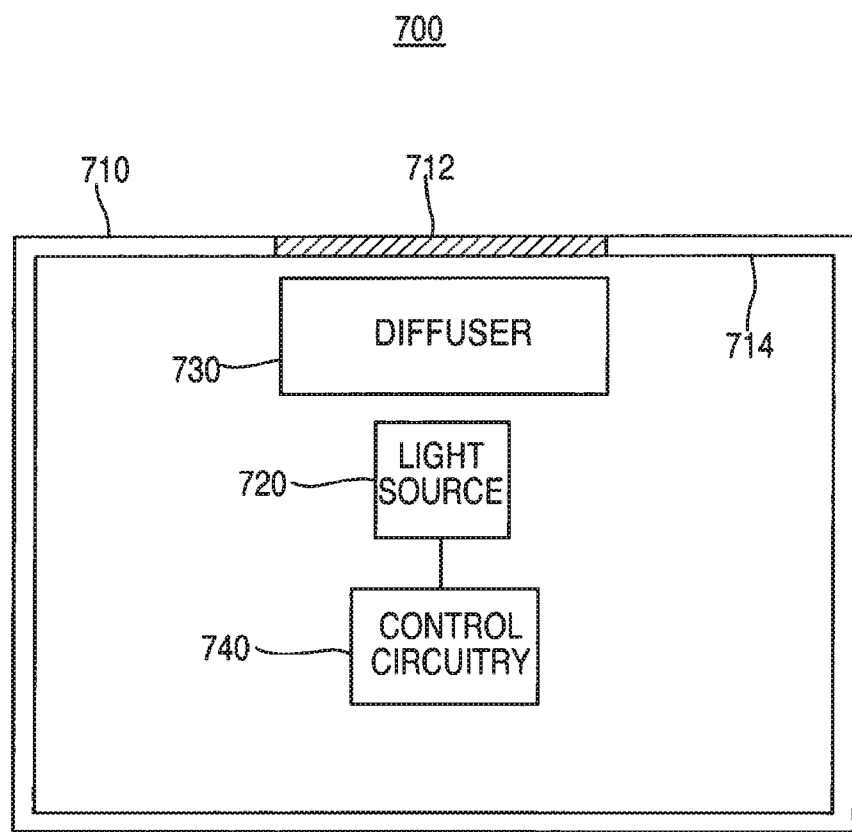
FIG. 7 is a simplified block diagram of a display system in accordance with an embodiment of the present invention.

FIG. 7 shows display system 700 in accordance with an embodiment of the present invention. Display system 700 can, for example, correspond to display system 18 of FIG. 1. System 700 can include housing 710, light source 720, diffuser 730 and control circuitry 740. Housing 710 can have signal indicator region 712 disposed therein. Signal indicator region 712 may be, for example, one or more apertures (e.g., microperforations) for transmitting light. Signal indicator region 712 may be configured to output a signal of a certain shape or form. Housing 710 can also include internal wall 714. Diffuser 730 can be located between light source 720 and internal wall 714.

Control circuitry 740 may be electrically coupled with light source 720 to control when light source 720 emits light.

Diffuser 730 may be operable to diffuse light from light source 720 such that all of the light exiting the diffuser has an equal intensity or brightness. For example, diffuser 730 may be operable to evenly illuminate signal indicator region 712 with the light from light source 720. Diffuser 730 may be composed of a mixture of different particles that cause light diffusion. For example, diffuser 730 can include mainly clear particles with translucent particles distributed throughout. The translucent particles can cause light to be deflected from its original course so that the light is distributed throughout the diffuser. Accordingly, light exiting from any portion of the diffuser will have substantially even illumination.

Figure 8:
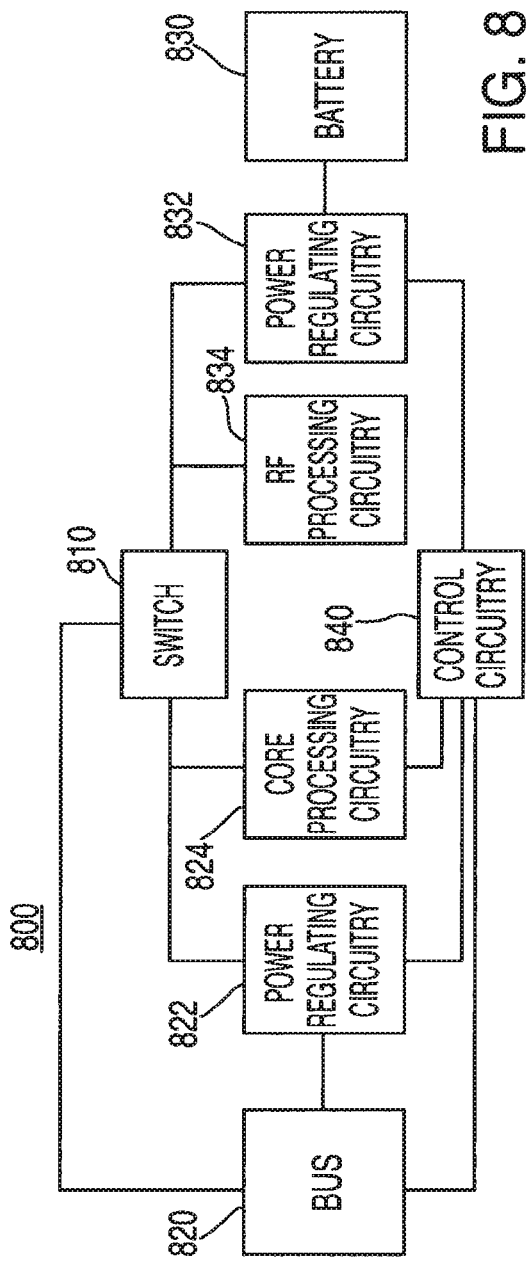
FIG. 8 is a simplified block diagram of a power distribution system in accordance with an embodiment of the present invention.

FIG. 8 shows power distribution system 800 in accordance with an embodiment of the present invention. Power distribution system 800 can be employed in an electronic device (see e.g., headset 10 of FIG. 1) and can include switch 810, bus 820, first power regulating circuitry 822, core processing circuitry 824, battery 830, second power regulating circuitry 832, RF processing circuitry 834, and control circuitry 840. Core processing circuitry 824 may include circuitry for handling low-level, core functions of the electronic device, and RF processing circuitry 834 may include circuitry for handling RF communications for the electronic device. To power core processing circuitry 824 and RF processing circuitry 834, power distribution system 800 can include both bus 820 and battery 830 as potential power sources.

Bus 820 can be coupled to receive power from a source external to the system. For example, bus 820 may be coupled to a connector such that the bus can receive power through the connector. First power regulating circuitry 822 may be electrically coupled to bus 820 and core processing circuitry 824. First power regulating circuitry 822 may be operable to, for example, convert power from bus 820 into a condition suitable for core processing circuitry 824 (e.g., by changing the voltage or regulating the current flow).

Battery 830 can be a device that stores chemical energy and makes it available in an electrical form. Battery 830 may be rechargeable. Second power regulating circuitry 832 may be electrically coupled to battery 830 and RF processing circuitry 834. Second power regulating circuitry 832 may be operable to, for example, convert power from bus 820 into a condition suitable for core processing circuitry 824 (e.g., by changing the voltage or regulating the current flow).

Switch 810 may be electrically coupled to both core processing circuitry 824 and RF processing circuitry 834. Switch 810 may be controlled by the presence of an external power source on bus 820. For example, switch 810 may be activated when the voltage of bus 820 goes below a predetermined threshold. When switch 810 is activated, first power regulating circuitry 822, core processing circuitry 824, RF processing circuitry 834, and second power regulating circuitry 832 may be electrically coupled such that both core processing circuitry and RF processing circuitry can share power.

Control circuitry 840 can be electrically coupled to bus 820, first power regulating circuitry 822, core processing circuitry 824, and second power regulating circuitry 832. Control circuitry 840 may be able to selectively active first power regulating circuitry 822 and second power regulating circuitry 832 based on bus 820, core processing circuitry 824, and/or any other signals in the electronic device.

Figure 9:
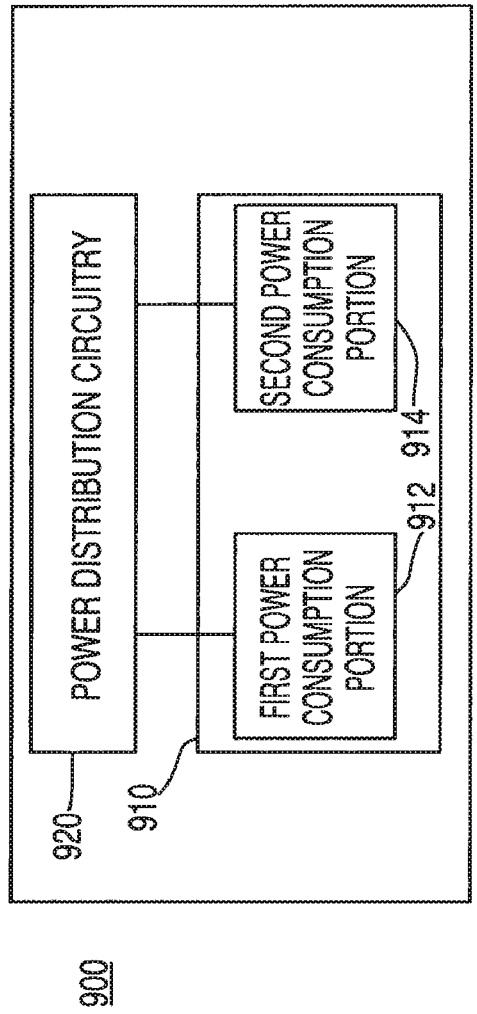
FIG. 9 is a simplified block diagram of another power distribution system in accordance with an embodiment of the present invention.

FIG. 9 shows wireless headset 900 in accordance with an embodiment of the present invention. Headset 900 can be an electronic headset for communications (see e.g., headset 10 of FIG. 1). Headset 900 can include processor circuitry 910 that has a first power consumption portion 912 and a second power consumption portion 914. First power consumption portion 912 can, for example, include the core circuitry of an electronic device (e.g., boot-up circuitry), while second power consumption portion 914 can include the device's auxiliary circuitry (e.g., circuitry for RF communications). Headset 900 can further include power distribution circuitry 920.

Power distribution circuitry 920 can selectively power first power consumption portion 912 independent of whether second power consumption portion 914 is powered. In some embodiments, power distribution circuitry 920 can selectively power any combination of first power consumption portion 912 and second power consumption portion 914 based on one or more monitored conditions of headset 900. For example, power distribution circuitry 920 can monitor if an external power source is present and/or the charge level of an internal battery in order to determine which power consumption portions to activate.

Figure 10A:
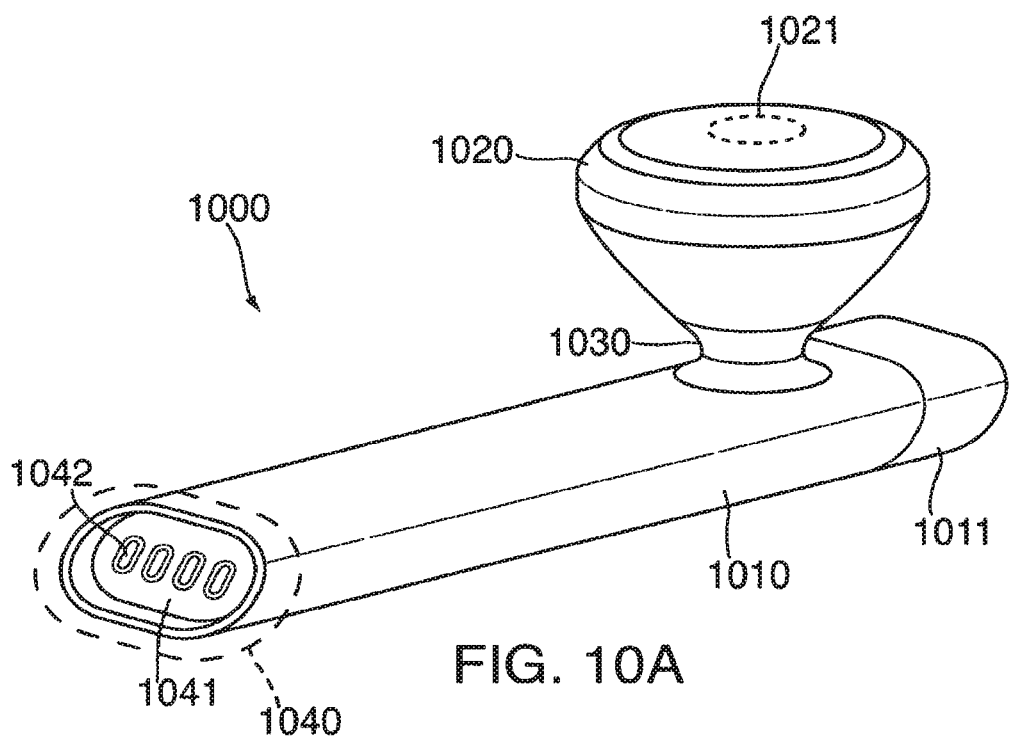
FIGS. 10A and 10B are illustrations of a headset in accordance with an embodiment of the present invention.
Figure 10B:
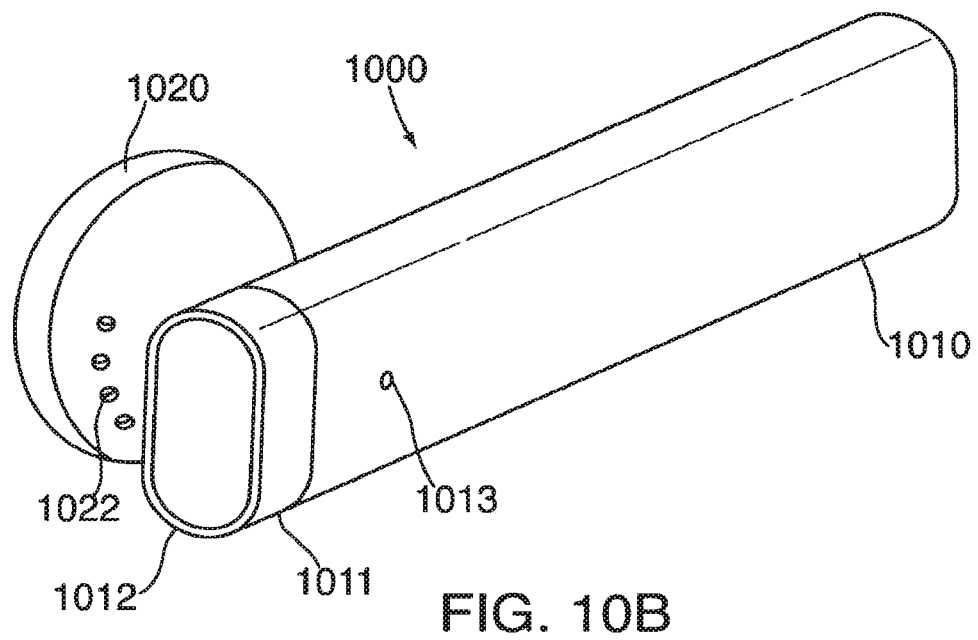

FIGS. 10A and 10B show perspective views of an illustrative headset in accordance with an embodiment of the present invention. Headset 1000 can correspond to headset 10 of FIG. 1. For example, primary housing 1010 can correspond to primary housing 11 and earbud 1020 can correspond to earbud 12.

Headset 1000 can include a housing that encloses the electronic and other elements of the headset. The housing can incorporate several pieces that are assembled using any suitable process (e.g., adhesive, screws, or press fit). In the example of FIGS. 10A and 10B, headset 1000 can include earbud 1020, neck 1030, primary housing 1010, antenna cap 1011 and connector 1040. Earbud 1020 can include perforations (e.g., acoustic ports) 1021 and 1022 for allowing air to pass into and out of the earbud 1020. Front port 1021 can allow sound waves from a receiver located in earbud 1020 to reach a user's ear and/or the outside environment. Side ports 1022 can provide a path for acoustic pressure to vent to the outside environment. Earbud 1020 can be attached to primary housing 1010 by neck 1030.

Attached to one end of primary housing 1010 is antenna cap 1011. Antenna cap 1011 can have button 1012 disposed at least partially therethrough. A user can interface with button 1012 to control the headset. Primary housing 1010 can include display 1013 which can correspond to display system 700 of FIG. 7 or display system 18 of FIG. 1. In some embodiments, display 1013 may include microperforations such as those discussed in more detail below in connection with FIGS. 48 and 49. Located at the connector end of primary housing 1010, connector 1040 includes at least one port (not shown in FIG. 10A) for enabling a microphone inside housing 1010 to receive acoustic signals (e.g., a user's voice), and at least one contact 1042 for receiving power, data, or both from an external source. Connector 1040 may correspond to contact regions 211, 212, and 213 of FIG. 2, for example.

Earbud 1020, neck 1030, primary housing 1010, antenna cap 1011 and connector 1040 can be constructed from any suitable material including, for example, metal, plastic, silicone, rubber, foam, or combinations thereof. For example, earbud 1020 can be formed from a plastic element surrounded by a silicone seal and primary housing 1010 can be formed from aluminum. Earbud 1020, neck 1030, primary housing 1010, antenna cap 1011 and connector 1040 can be manufactured using any suitable process (e.g., molding, casting or extrusion). In some embodiments, earbud 1020, neck 1030, primary housing 1010, antenna cap 1011 and connector 1040 can be post processed to provide texture and other features on the inner or outer surfaces of the bodies. For example, a bead blast and anodization process can be used to apply a desired surface texture to primary housing 1010.

Figure 11:
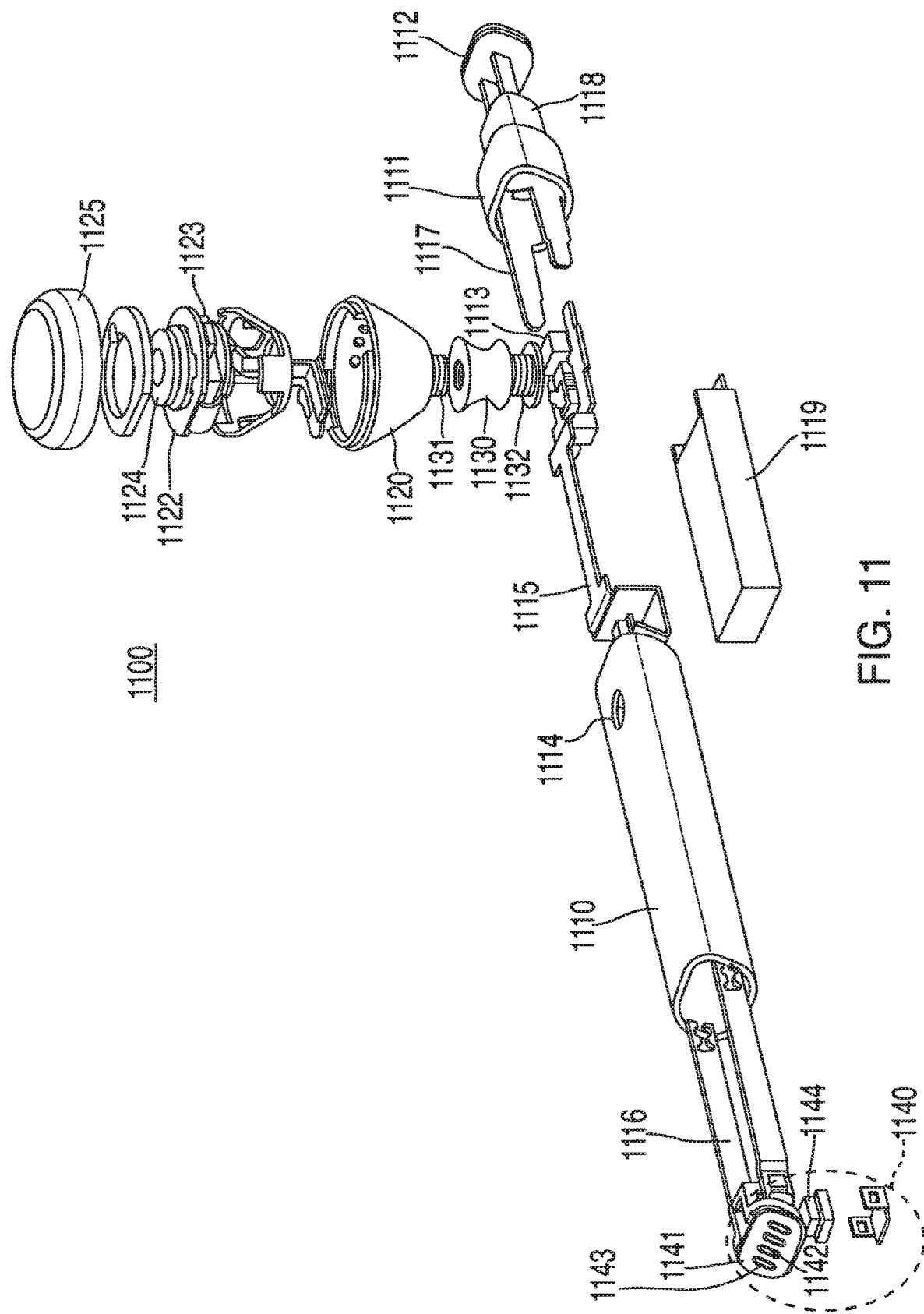
FIG. 11 is an exploded view of a headset in accordance with an embodiment of the present invention.

FIG. 11A is an exploded view of headset 1100 in accordance with an embodiment of the present invention. Headset 1100 can correspond to headset 10 of FIG. 1 or headset 1000 of FIGS. 10A and 10B, for example. In one embodiment of the present invention, earbud housing 1120 can contain earbud circuit board 1122. Earbud circuit board 1122 can, for example, correspond to earbud circuit board 522 of FIG. 5. Earbud circuit board 1122 can be a flexible circuit board on which one or more of the following components are electrically and/or mechanically mounted: processor 1123 (which can be used to control the functions of headset 1100), receiver 1124, and other circuitry and components. The flexible nature of earbud circuit board 1122 can enable it to be folded onto itself, providing layers of circuitry that can be packed into earbud housing 1120, thereby occupying space within earbud housing 1120 that may otherwise be empty and unused. The flexible portions of earbud circuit board 1122 can replace the need for separate wires connecting different circuit boards, which might cause a substantial increase in size because, for example, each wire might involve a pair of connectors. Additionally, the flexible nature of circuit board 1122 can advantageously reduce the area or footprint required by circuit board 1122. That is, compared to another circuit board having similar circuitry and components disposed thereon but in an unfolded layout, circuit board 1122 can occupy less area. In addition, circuit board 1122 further can reduce the footprint or size requirements of other components of headset 1100, such as primary housing 1110 and antenna cap 1111, by incorporating within earbud housing 1120 electronics and other components that traditionally are located elsewhere within a headset. Earbud housing 1120 and the circuitry and components contained therein are discussed in more detail below in connection with FIGS. 18-27B, for example.

Earbud housing 1120 can be coupled to primary housing 1110 by neck 1130. Earbud housing 1120, primary housing 1110, and neck 1130 can correspond, respectively, to earbud housing 610, primary housing 630, and neck 620 of FIG. 6. Neck 1130 can be constructed with a double threaded screw insert to receive screw member 1131 (associated with earbud housing 1120) and screw member 1132 (associated with primary housing 1110). Neck 1130 can connect earbud housing 1120 and primary housing 1110 in a manner that can reduce the likelihood of earbud housing 1120 and primary housing 1110 rotating independently of each other. That is, when headset 1100 is in use and the user adjusts its position by, for example, pulling primary housing 1110 down, the earbud housing 1120 can rotate in conjunction with primary housing 1110. However, in some embodiments, pulling primary housing 1110 down may cause the housing to rotate with respect to earbud housing 1120 so as to trigger a switch and signify a user input. A more detailed discussion of headset necks and their assembly can be found below in connection with FIGS. 28-30, for example.

In addition to earbud circuit board 1122, headset 1100 also can include primary housing circuit board 1115 on which additional electronic components 1113 can be electrically and/or mechanically mounted. Primary housing circuit board 1115 may, for example, correspond to primary housing circuit 512 of FIG. 5. Primary housing circuit board 1115 can be electrically coupled with the earbud circuit board by one or more wires, cables, flexible circuit boards, and the like. The arrangement of electronic components in both earbud circuit board 1122 and primary housing circuit board 1115 can advantageously reduce the size of headset 1100. The arrangement of the electronic components in headset 1100 will be discussed in more detail below in connection with FIGS. 18-20C, for example.

A user can control the functions of headset 1100 using button 1112, which can be electrically coupled with primary housing circuit board 1115. Button 1112 can extend from antenna cap 1111 such that it appears as a discrete user interface easily activated by a user. Button 1112 can be configured to move in any suitable manner including, for example, bending with respect to primary housing 1110, translating in and out of antenna cap 1111, rotating around an axis passing through connector plate 1141 and button 1112, or any combination thereof.

In one embodiment, button 1112 can include a switch such as a dome switch, which can be activated when a user depresses button 1112. Button 1112 can have a button guide structure. The button guide structure can have one or more guide channels to facilitate user actuation of the button with respect to the rest of headset 1100. In one embodiment of the present invention, the guide channel(s) can be provided in the form of a hole through the button guide structure. The switch actuation member can have a stem that is supported and guided by the guide channel. When pressed by a user, the switch actuation member moves along the guide channel towards the switch. Raised structures (e.g., ribs) can be used to ensure that the switch actuation member reciprocates smoothly within the guide channel.

Button 1112 and antenna cap 1111 can be constructed from a dielectric material such as plastic. Antenna 1118 can be formed by mounting an antenna resonating element within antenna cap 1111 (e.g., along an inner surface of antenna cap 1111) or on a portion of the button guide structure. Constructing button 1112 and antenna cap 1111 from a dielectric material can reduce or eliminate potential signal interference that can disrupt the proper operation of antenna 1118. In addition, a dielectric button 1112 can allow for smaller clearance between the antenna resonating element and conductive structures (e.g., primary housing circuit board 1115) in headset 1100.

Antenna 1118 can be electrically coupled with primary housing circuit board 1115 so that it can send and receive wireless (e.g., radio) signals.

Antenna 1118 can include any suitable antenna resonating element for communicating between headset 1100 and an electronic device (e.g., a cellular telephone or a personal media device). The antenna resonating element can be formed from a flex circuit containing a strip of conductor. The flex circuit can be attached to the button guide structure using, e.g., adhesive. For example, the flex circuit can contain registration holes that mate with corresponding registration bosses on the button guide structure. One or more of the bosses can be heat staked to the flex circuit.

Details about the operation and design of an antenna and button system similar to antenna 1118 and button 1112 can be found, e.g., in U.S. patent application Ser. No. 11/651,094 entitled "Antenna and Button Assembly for Wireless Devices," which is incorporated herein.

Appendages 1117 can be incorporated into antenna cap 1111 in order to mount the antenna cap to headset 1100. Appendages 1117 can, for example, fasten to primary housing 1110 or one or more brackets 1116 which will be discussed in more detail below.

Battery pack 1119 can be located within primary housing 1110. Battery pack 1119 can contain one or more suitable batteries including, for example, lithium ion, lithium ion polymer (Li-Poly), nickel metal hydride, or any other type of battery. Battery pack 1119 can be electrically coupled with circuit board 1115 for powering electronic components in headset 1100. Additionally, circuitry that is typically packaged within standard battery packs (e.g., charging or fuse protection circuitry) can be moved to primary housing circuit board 1115. Advantageously, the distribution of circuitry into earbud housing 1120 and the layout of circuit board 1115 can permit battery pack 1119 to occupy a substantial portion of the internal space of primary housing 1110. This can increase the energy storage capacity of headset 1100 (e.g., allow headset 1100 to operate for longer period of time in between charges) without increasing the size of primary housing 1110 and headset 1100.

Headset 1100 can include connector 1140 for enabling headset 1100 to electrically connect to other devices. An opening or port can be included in connector 1140 so that acoustic signals (e.g., speech from a user) can reach the microphone inside microphone boot 1144. Connector 1140 can, for example, correspond to assembly 320 of FIG. 3 or assembly 420 of FIG. 4, for example. The microphone can be electrically coupled with circuit board 1115 in any suitable manner. Microphone boot 1144 can be placed inside the end of primary housing 1110 that is farthest from earbud housing 1120. This end may be referred to herein as the microphone or connector end of headset 1100, and is also the portion of headset 1100 that is closest to the user's mouth when in use. The arrangement of the microphone boot 1144 with respect to connector 1140 and accompanying parts is discussed in more detail below in connection with the description accompanying FIGS. 50A-54.

Connector 1140 can include connector plate 1141 in which contacts 1142 and accompanying casing 1143 can reside. As such, contacts 1142 can facilitate the electrical coupling of headset 1100 with another device. Accompanying casing 1143 can be made from a non-conductive material (e.g., a polymeric material). Casing 1143 can surround contacts 1142 to prevent the contacts from electrically coupling with connector plate 1141. Contacts 1142 and casing 1143 can be substantially flush with the surface of connector plate 1141 so that the combination of the contacts, casing and plate creates a substantially flat surface for mating with other connectors. Connector plate 1141 can be made of a ferromagnetic material so that it is biased to magnetic connectors, such as those discussed in connection with FIGS. 62A-67B, for example. The design of connector plate 1141, contacts 1142, casing 1143 and complementary magnetic connectors will be described in more detail below in connection with the discussion of FIGS. 55A-67B.

Headset 1100 can include one or more brackets 1116 to couple connector 1140 with appendages 1117 of antenna cap 1111. Brackets 1116 can prevent connector plate 1141 and antenna cap 1111 from moving axially away from each other or separating from primary housing 1110. Alternatively, connector plate 1141 and antenna cap 1111 can be coupled to one or more brackets that are secured to the inner surface of primary housing 1110.

As a matter of design choice, a seam can be included in between the peripheral surface of connector plate 1141 and the inner surface of primary housing 1110. That is, in addition to the predefined port for providing an acoustic pathway between the microphone and the outside environment, gaps can exist. These gaps can advantageously enable the microphone to receive acoustic signals in the event the predefined acoustic pathway is blocked (e.g., by a foreign object such as dirt). In other embodiments, an adhesive may be applied to provide a substantially airtight seal between connector plate 1141 and primary housing 1110. In yet another embodiment, a gasket may be used to provide a seal.

Figure 12:
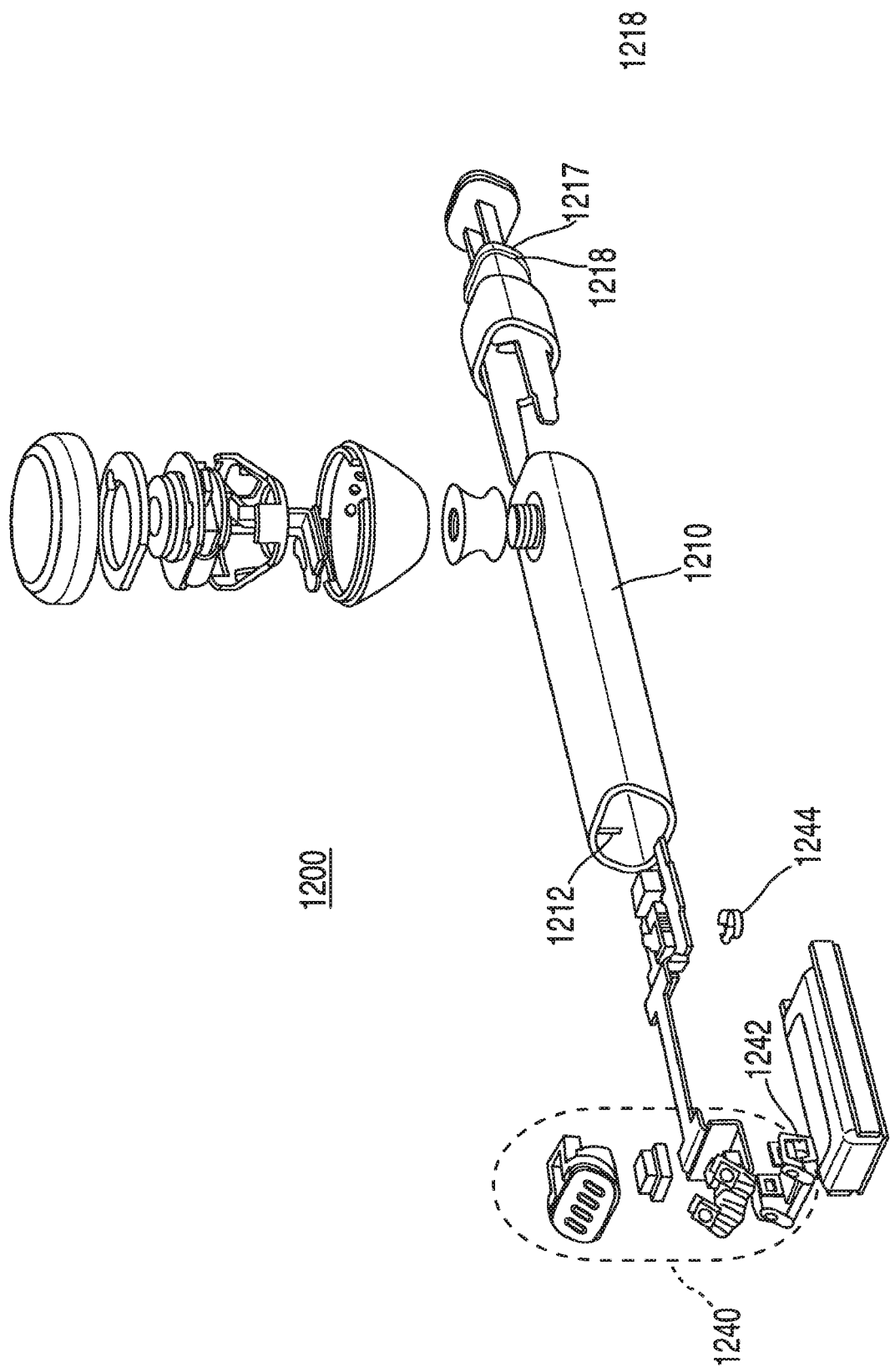
FIG. 12 is an exploded view of a headset in accordance with another embodiment of the present invention.

FIG. 12 shows a view of headset 1200 in accordance with another embodiment of the present invention. Headset 1200 can be similar to headset 1100, but with some substantial differences between the two. For example, headset 1200 can use a different attachment technique to couple connector 1240 to primary housing 1210. Connector 1240 can include tabs 1242 which can be used to couple with features (e.g., wall 1212) on an interior surface of primary housing 1210. Such a method might be advantageous to using the brackets 1116 in headset 1100. For example, the tabs 1242 can attach to the near end of primary housing 1210 which might provide connector 1240 with higher structural integrity than, for example, the method of using brackets to attach to a structure (e.g., antenna cap) on the other end of the primary housing. Headset 1200 can also include light diffuser 1244 which can be used in conjunction with a visual indicator system as discussed in connection with FIGS. 48 and 49. Additionally, headset 1200 can include antenna 1218 which can wrap around button guide 1217 in some embodiments.

The fundamental basics of the Bluetooth protocol are well known in the art, and discussed briefly below. For a more detailed discussion, please see Bluetooth Specification Version 2.0+EDR, Vol. 0, Nov. 4, 2004, which is hereby incorporated by reference in its entirety. Bluetooth wireless technology is based on an international, open standard for allowing intelligent devices to communicate with each other through wireless, low power, short-range communications. This technology allows any sort of electronic equipment, from computers and cell phones to keyboards and headphones, to make its own connections, without wires or any direct action from a user. Bluetooth is incorporated into numerous commercial products including laptop computers, PDAs, cell phones and printers, and is likely to be used in future products.

Bluetooth can be referred to as a frequency hopping spread spectrum (FHSS) radio system that operates in the 2.4 GHz unlicensed band. Bluetooth transmissions change frequencies based on a sequence which is known to both the transmitter and the receiver. According to one known standard, Bluetooth transmissions use 79 different frequencies ranging from 2.404 GHz to 2.480 GHz. Bluetooth's low power transmissions allow a typical range of about 10 meters or roughly 30-40 feet. This range can vary from about 1 meter to 100 meters depending on the amount of power used by the device for Bluetooth transmissions.

Bluetooth devices connect to each other to form networks known as piconets. A piconet includes two or more devices which are synchronized to a common clock signal and hopping sequence. Thus, for any device to connect to a given piconet, that device may need to have the same clock signal and hopping sequence. The synchronized clock and hopping sequence can be derived using the clock signal of one of the devices on the piconet. This device is often referred to as the "master" device while all other devices on the piconet are referred to as "slave" devices. Each piconet can include one master device and up to seven or more slave devices. Moreover, Bluetooth devices can belong to more than one piconet. The term "scatternet" is used to define Bluetooth networks which are made up of multiple, overlapping piconets. In the case where one Bluetooth device is on two or more piconets, all of the devices are on a single scatternet. Devices from one of the piconets can communicate with devices from another piconet by using the shared device to relay the signals.

When two Bluetooth devices initially connect, they first share some general information (e.g., device name, device type) with each other. In order to enhance the connection, the devices can establish a trusted relationship by using a secret passkey. This passkey is typically provided by a user or stored on memory in a device. According to a known Bluetooth standard, the process of establishing this trusted relationship is called pairing. Once two devices are paired, they typically share information and accept instructions from one another.

Bluetooth devices can operate with a maximum data throughput of approximately 2.1 Mbit/s (Megabits-per-second), but it is understood that such limitations change as technology advances, and that embodiments of the present invention may operate at other rates. This maximum throughput is shared among all devices on a piconet, meaning that if more than one slave device is communicating with the master, the sum of all communications is less than the maximum data throughput.

Figure 13:
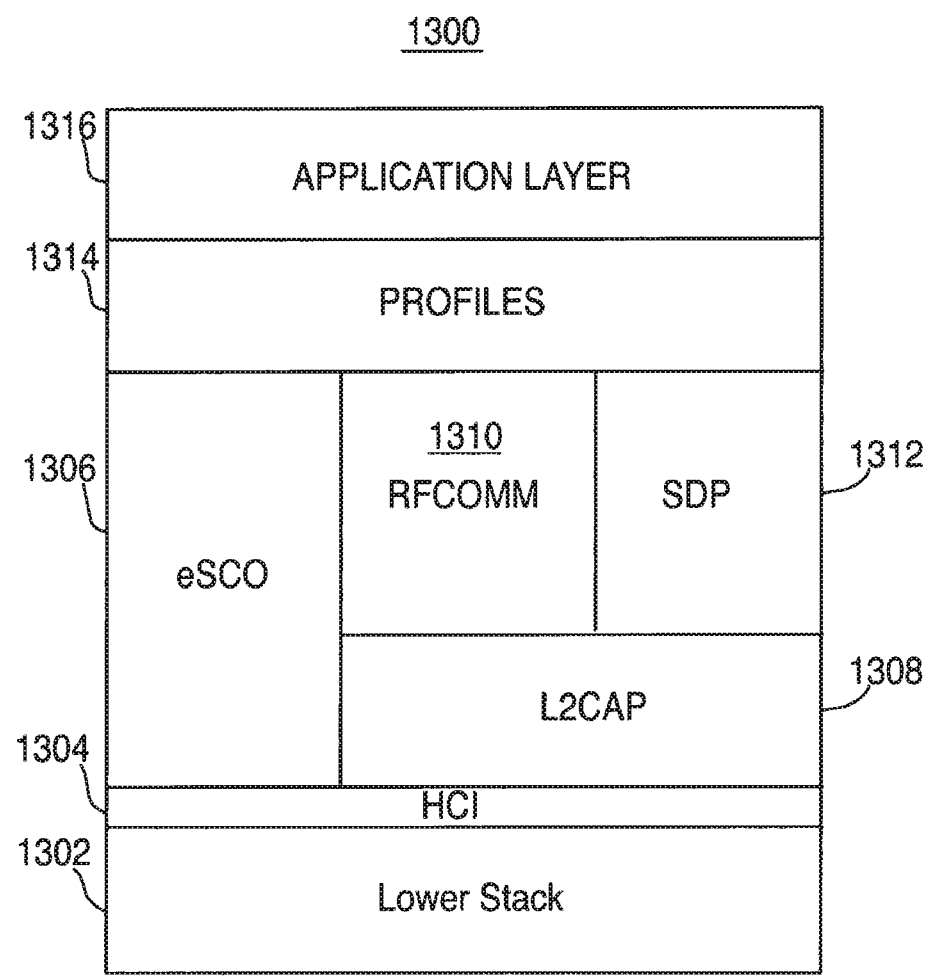
FIG. 13 is a simplified diagram showing how software in a Bluetooth device is organized in accordance with an embodiment of the present invention.

The Bluetooth standard includes a published software framework. The shared framework is called the Bluetooth Protocol Stack and includes different software applications to implement Bluetooth communications. FIG. 13 is a simplified schematic diagram of an exemplary Bluetooth Protocol Stack 1300 in accordance with an embodiment of the present invention. Low-level software is included in Lower Stack 1302. This section includes code to generate/receive radio signals, correct transmission errors and encrypt/decrypt transmissions, among other things. The Host Controller Interface (HCI) 1304 is a standardized interface between the low-level Bluetooth functions and applications. The HCI layer represents a division between the Lower Stack 1302 functions handled by a dedicated Bluetooth processor and the rest of the functions handled by an application-specific processor.

The Extended Synchronous Connection-Oriented (eSCO) 1306 layer is used to implement dedicated communication channels, commonly used for voice data, in between the Lower Stack 1302 and high-level applications. The Logical Link Control and Adaptation Protocol (L2CAP) 1308 layer combines and repackages the data transmitted and received by the multiple higher-level applications. The L2CAP 1308 layer combines all of these different communications into one data stream that can interface with Lower Stack 1302 The RFCOMM 1310 layer emulates the protocol used by serial connections. This allows software designers to easily integrate Bluetooth into existing applications which previously used a serial connection. The Service Discovery Protocol (SDP) 1312 layer is used by devices to provide information about what services (or functions) each device offers and how other devices can access those services through Bluetooth.

The Profiles 1314 layer allows a device to identify itself as a member of a generic group of devices with a predefined set of functions. For example, a device complying with the headset profile may support predefined methods relating to audio communications. The Application Layer 1316 contains programs that implement the useful tools created by all of the other layers. By writing different programs for Application Layer 1316, software developers can focus on new uses of the Bluetooth functionality without having to rewrite the code which controls the underlying communication tasks.

Figure 14:
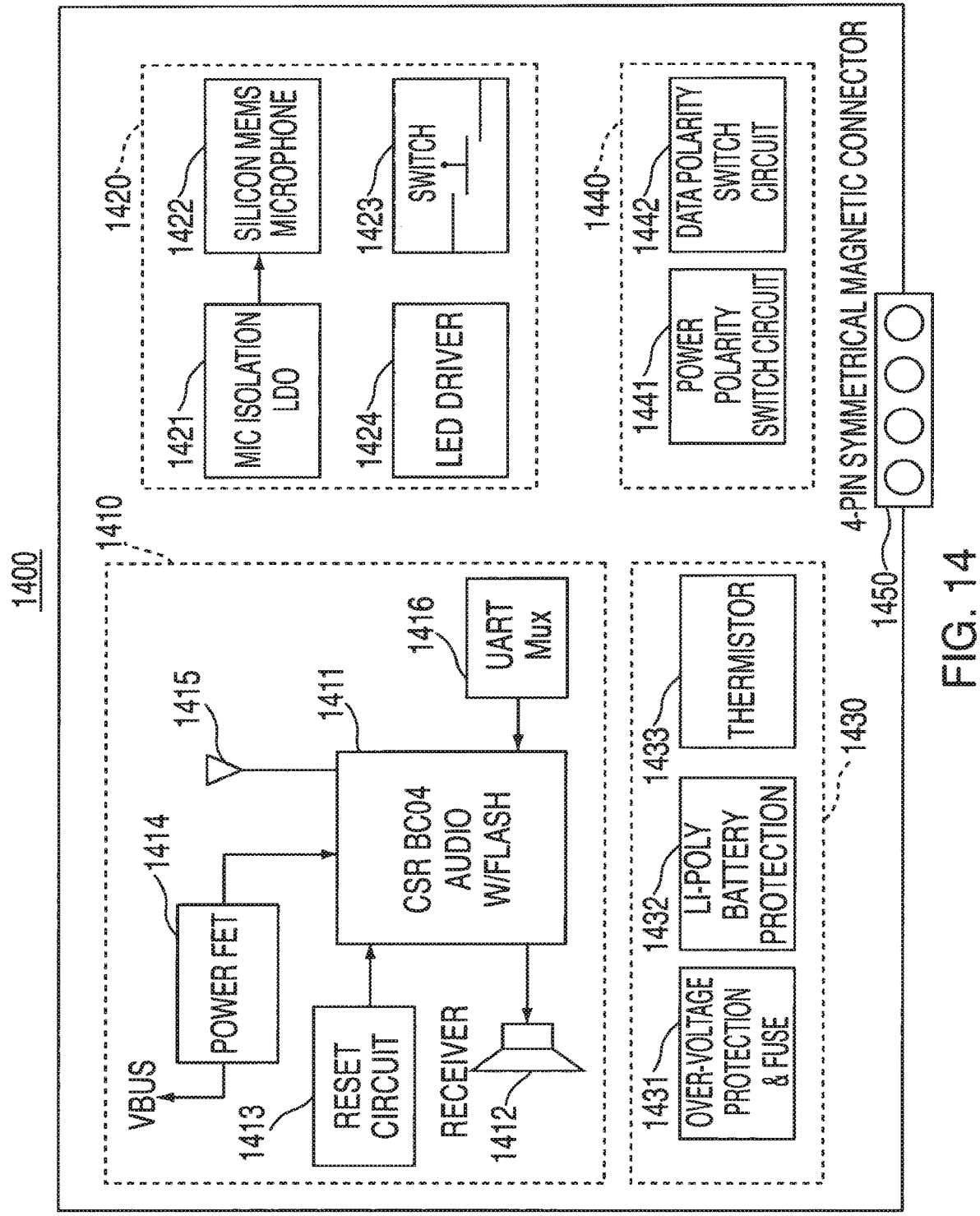
FIG. 14 is a simplified block diagram of the electrical system of a headset in accordance with an embodiment of the present invention.

FIG. 14 shows a simplified block diagram of exemplary electronic system 1400 of a headset in accordance with an embodiment of the present invention. The system of 1400 can be implemented in, for example, headset 10 of FIG. 1 or headset 1000 of FIGS. 10A and 10B. System 1400 can include processor circuitry 1410, interface circuitry 1420, power distribution circuitry 1430, switching circuitry 1440 and 4-pin symmetrical magnetic connector 1455.

Processor circuitry 1410 can include processor 1411 and auxiliary circuitry that operates in connection with processor 1411. Processor 1411 can coordinate all of the operations in system 1400, including, for example, Bluetooth transmissions, battery charging and processing (e.g., encoding and decoding) of acoustic signals. Processor 1411 can drive receiver 1412 to provide acoustic signals that may be heard by a user. Reset circuit 1413 can detect when system 1400 is connected to another device and subsequently instruct processor 1411 to reset. Power FET 1414 can be used with the power supply circuitry inside processor 1411 and will be discussed in more detail below in connection with the discussion of FIG. 15. Antenna 1415 can be used to send wireless signals to and receive wireless signals from another device (e.g., a phone or portable media device). UART multiplexer 1416 can be electrically coupled with processor 1411 and can route data signals to different parts of processor 1411. This routing can reduce unwanted effects, such as inductance, in unused data lines.

Interface circuitry 1420 can include a microphone isolation LDO 1421, a micro-electro-mechanical (MEMs) microphone 1422, LED driver 1424 and switch 1423. Microphone isolation LDO 1421 can be electrically coupled with MEMs microphone 1422. Microphone isolation techniques and MEMs microphones are well known, and a person of ordinary skill in the art will appreciate that these elements can be replaced by other equivalent microphone configurations without deviating from the spirit of the present invention. LED driver 1424 can be configured to drive a LED display unit based on one or more outputs of processor 1411. Details about the design and function of circuitry similar to LED driver 1424 can be found in U.S. Patent Application No. 60/878,852 entitled "Systems and Methods for Compact Multi-State Switch Networks," which is incorporated herein. Switch 1423 can represent the electrical behavior of button 1012 of FIG. 10B. A user can interface with this switch to input commands to the headset. For example, a user can depress switch 1423 to initiate a telephone call, terminate a call, or both. In one embodiment, switch 1423 can be a single-pole, single-throw switch with a spring to bias it to an open position.

Power distribution circuitry 1430 can include over-voltage protection and fuse 1431, battery protection circuitry 1432 and thermistor 1433. Over-voltage protection and fuse 1431 can protect system 1400 in the event that an unsafe amount of voltage is applied to one or more inputs. The fuse in the protection circuitry can be an over-current protection device which disconnects the inputs of the headset if an over-current condition is detected. Battery protection circuitry 1432 can include circuitry to prevent the malfunction of a battery (e.g., a li-poly battery) which could result in a dangerous overheating situation. Battery protection circuitry 1432, in contrast to conventional headsets which has such circuitry integrated into the battery pack, can be separated from the battery pack and located elsewhere within a headset according to the invention. Thermistor 1433 can be located in the proximity of a battery (see e.g., battery pack 1119 of FIG. 11) and may change its resistance based on the battery's temperature. One or more inputs of processor 1411 can be electrically coupled with thermistor 1433 to monitor the temperature of the battery. Processor 1411 can be programmed to charge the battery differently depending on the detected battery temperature. For example, processor 1411 may charge the battery at a faster rate when the monitored battery temperature is low than when the temperature is high. By regulating the charging in this manner, the time required to completely charge a battery can be decreased without damaging the battery.

Symmetrical magnetic connector 1455 can allow system 1400 to connect to other devices and systems for communicating data or transmitting power.

Connector 1455 represents the electrical behavior of connector 16 of FIG. 1, for example.

Switching circuitry 1440 can enable connector 1455 to connect and communicate with many different types of devices and in many interface orientations. Switching circuitry 1440 can, for example, correspond to switching circuitry 215 of FIG. 2. Switching circuitry 1440 can include power polarity switch circuit 1441 and data polarity switch circuit 1442. The two circuits can, for example, determine the type of communication interface being used and route the corresponding data and/or power lines to the correct pathways (e.g. internal electrical traces) for the detected interface. The two circuits can also determine the interface orientation of a connection with another device, for example, and route the corresponding data and/or power lines to the correct pathways (e.g., internal electrical traces) for the detected orientation. A detailed description of the design and function of exemplary circuits similar to switch circuits 1441 and 1442 can be found in U.S. patent application Ser. No. 11/650,130 entitled "Systems and Methods for Determining the Configuration of Electronic Connections," which is incorporated herein.

Figure 15:
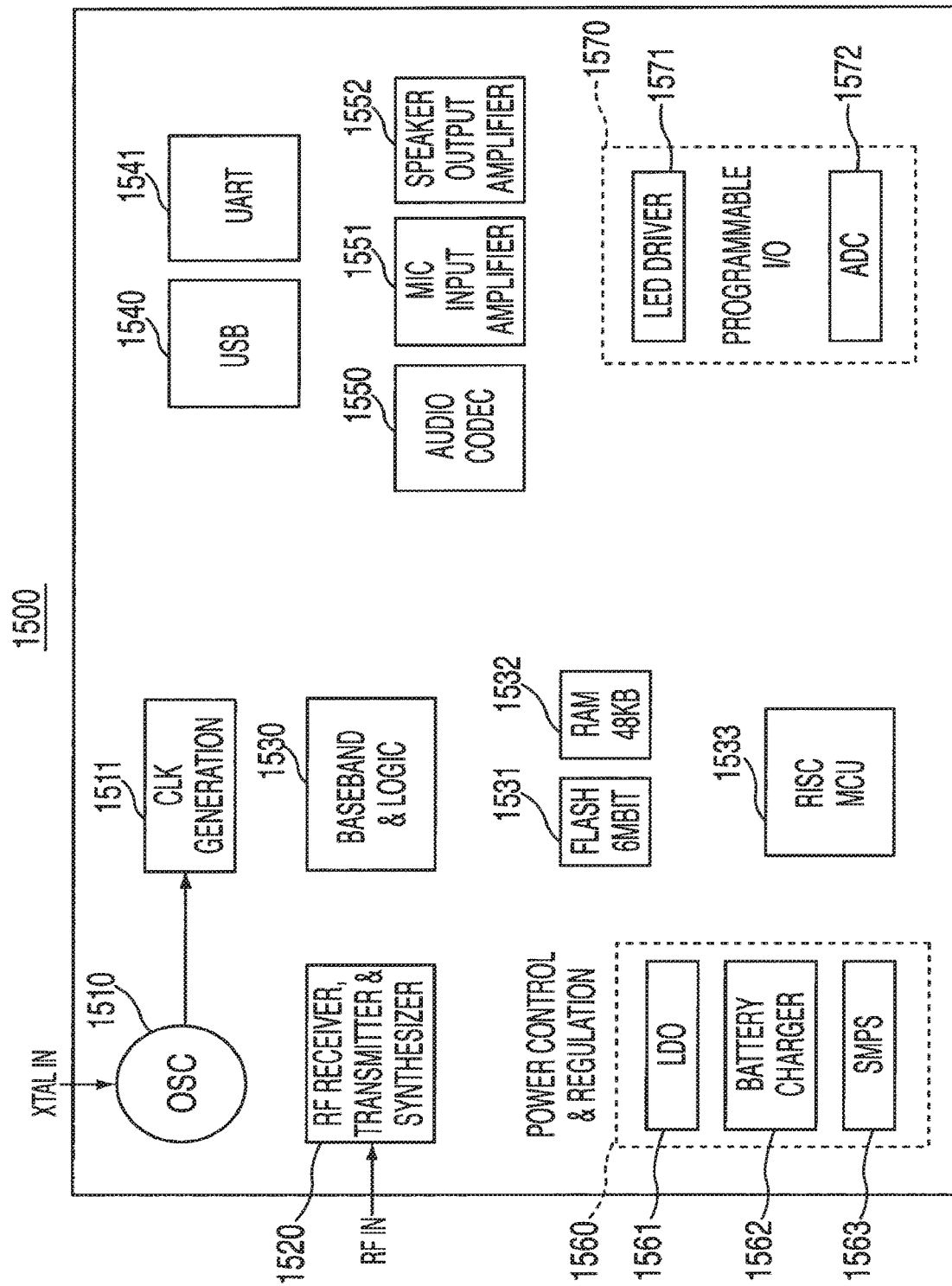
FIG. 15 is a simplified block diagram of the core processor of a headset in accordance with an embodiment of the present invention.

FIG. 15 shows processor 1500 which can be used as the core processor or application processor of a headset in accordance with an embodiment of the present invention. Processor 1500 can, for example, correspond to processor 20 of FIG. 1. Processor 1500 can also be referred to as a System on a Chip (SoC) because it can be a single integrated circuit capable of a diverse range of functions. Processor 1500 can be a CSR BC04 Audio Processor with integrated Flash Memory that fully supports the Bluetooth v2.0+EDR specification. An oscillator 1510 and clock generation circuitry 1511 can be used in conjunction with a timing crystal to establish a timing signal (or clock) which processor 1500 can use to coordinate its activities. RF circuitry 1520 can be used to input and output RF signals for wireless communications. Baseband circuitry 1530 can coordinate communications so that they conform with the a communications protocol (e.g., a Bluetooth protocol). Flash memory 1531 can store, for example, software and configuration information for processor 1500. Random access memory (RAM) 1532 can temporarily store data for Baseband circuitry 1530 and microprocessor 1533. RISC microprocessor 1533 can be programmed to perform various functions, such as monitoring a thermistor (see e.g., thermistor 1433 of FIG. 14) and coordinating battery charging as previously described, for example.

Full speed USE controller 1540 and UART circuitry 1541 can facilitate wired communication interfaces so that processor 1500 can share data with another device through a physical interface (e.g., connector contacts 1042 of FIG. 10A). In one embodiment, processor 1500 can support both full speed USE and simplified RS-232 serial interfaces. A simplified RS-232 interface can include, for example, three lines: transmit data, receive data, and ground. In order to accommodate more than one interface over a limited number of data lines, USB controller 1540 and UART circuitry 1541 can be coupled to a switch (e.g., UART Multiplexer 1416 of FIG. 14). This switch can route data lines to the circuitry, within processor 1500, that corresponds to the communication interface being used. A more detailed discussion of similar systems and methods for using more than one communications interface over a limited number of data lines can be found in U.S. patent application Ser. No. 11/650,130 entitled "Systems and Methods for Determining the Configuration of Electronic Connections," which is incorporated herein. Processor 1500 can also support other interfaces in addition to those discussed above without deviating from the spirit of the present invention. For example, processor 1500 can include circuitry for supporting a proprietary communications interface.

Processor 1500 can include differential microphone input amplifier 1551 and differential speaker output amplifier 1552. Both the input amplifier 1551 and the output amplifier 1552 can be electrically coupled with Audio CODEC 1550 to process (e.g., encode and decode) audio signals. Power control and regulation circuitry 1560 can include low-dropout regulator (LDO) 1561, battery charger 1562 and switch mode power supply (SMPS) 1563. The power needed for the various subsystems of processor 1500 can be regulated by LDO 1561 or SMPS 1563 depending on both the charge level of the battery and any external power sources that might be connected. This will be described in more detail below in connection with the discussion of FIG. 16. Battery charger 1562 can output a controllable current between 25 and 100 milliamps to charge a battery (see e.g., battery pack 1119 of FIG. 11). In accordance with an embodiment of the present invention, this controllable current can vary based on various factors (e.g., the detected temperature of the battery).

Programmable I/O 1570 can include LED driver 1571 and analog-to-digital converter (ADC) 1572. LED driver 1571 can use signals from other circuitry in processor 1500 to generate signals with sufficient current to illuminate one or more indicator LEDs. The design and operation of exemplary circuitry similar to LED driver 1571 can be found in U.S. Patent Application No. 60/878,852 entitled "Systems and Methods for Compact Multi-State Switch Networks," which is incorporated herein. Analog-to-Digital Converter (ADC) 1572 can accept inputs from analog circuitry and convert them to digital signals to be used by other circuitry in processor 1500. For example, ADC 1572 can monitor the current running through a thermistor (see e.g., thermistor 1433 of FIG. 14) to determine the temperature of a battery. Circuitry in processor 1500 can use this temperature information to determine an appropriate charging current for battery charger 1562 to provide. Moreover, it is understood that ADC 1572 can process multiple analog signals concurrently. For example, in addition to the temperature information above, ADC 1572 can also process voltage information about the current charge level of a headset's battery.

While the processor described above and shown in FIG. 15 is a CSR BC04 Audio Processor, other processors with other configurations and functionality can be used in a headset without deviating from the spirit of the present invention.

Figure 16:
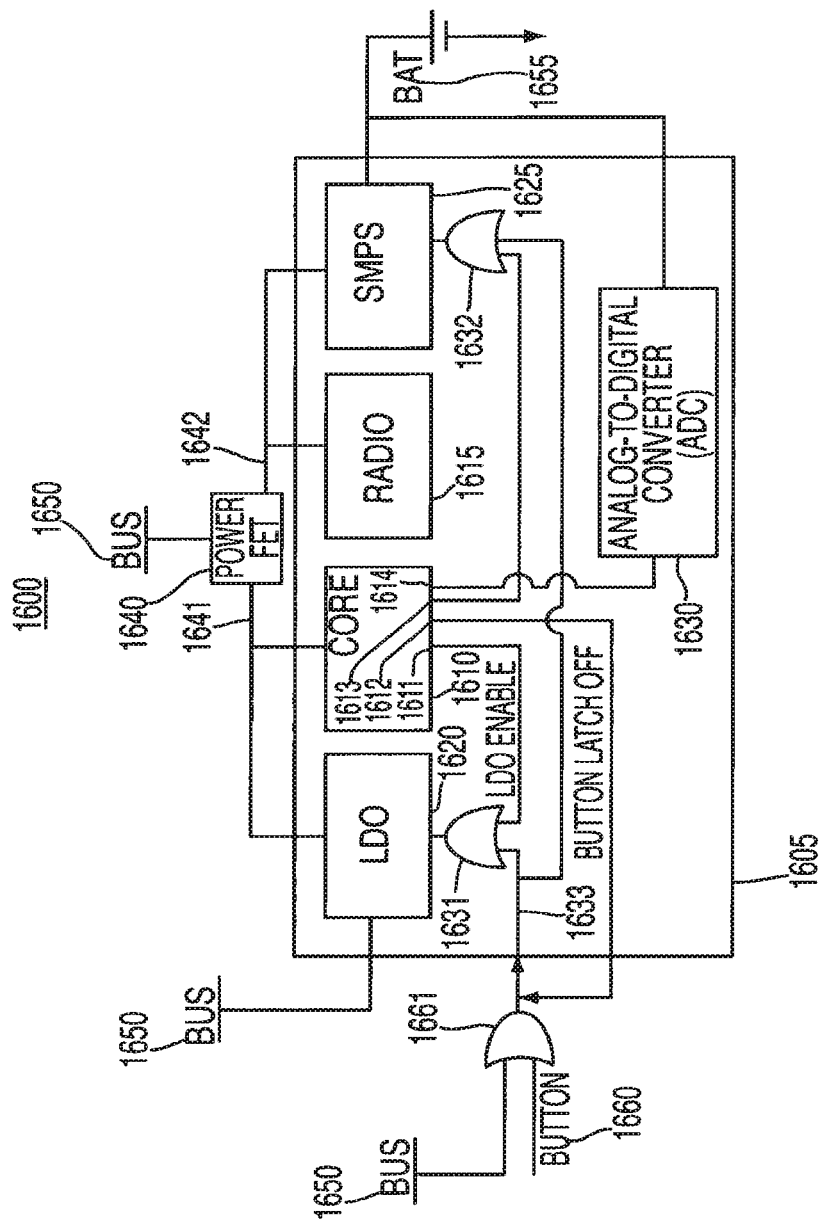
FIG. 16 is a simplified schematic diagram of a power distribution system in accordance with an embodiment of the present invention.

FIG. 16 shows a simplified schematic of power distribution system 1600 for the subsystems of processor 1605 in accordance with an embodiment of the present invention. System 1600 can, for example, correspond to system 800 of FIG. 8 and headset 900 of FIG. 8. Moreover, processor 1605 can correspond to processor 1500 of FIG. 15. Processor 1605 can include both low-dropout regulator (LDO) 1620 and switch mode power supply (SMPS) 1625 as options for regulating power for processor 1605. SMPS 1625 can output power with a higher efficiency than LDO 1620, but can require the installation of several additional components, such as a relatively large capacitor and inductor, which can increase the cost (and size) of system 1600. In addition, SMPS 1625 may require an input voltage that meets, or exceeds, a predetermined voltage level to operate. Therefore, it may be a matter of design choice as to which power supply is used. For example, in low voltage applications, it may be advantageous to use LDO 1620. In other embodiments, such as the one shown in FIG. 16, LDO 1620 and SMPS 1625 can both be used to provide functionality over a wide range of input voltages and high power efficiency.

FIG. 16 shows processor 1605 which includes core circuitry 1610 and radio circuitry 1615 in accordance with an embodiment of the present invention. Radio circuitry 1615 can include, for example, circuitry related to RF communications. Additional functions (e.g., low-level system functions, firmware updates) can be executed by core circuitry 1610. Additionally, core circuitry 1610 can monitor and control other circuitry in system 1600 using, for example, input line 1614 and output lines 1611, 1612 and 1613.

Power distribution system 1600 can include circuitry for interfacing with two power sources. In FIG. 16, an internal battery is represented by BAT 1655, and an external power supply is represented as BUS 1650. From herein, the voltage of BAT 1655 will be referred to as VBAT. BUS 1650 can, for example, represent the power provided by a battery charger that is connected to system 1600. BUS 1650 can be electrically coupled with LDO 1620 such that the LDO draws power from an external source through BUS. Therefore, LDO 1620 operates when an external power supply is connected to system 1600. Similarly, SMPS 1625 can be electrically coupled with BAT 1655 so that it draws power from the battery.

Other circuitry in power distribution system 1600 can include Power FET 1640, Analog-to-Digital Converter (ADC) 1630 and logic gates 1661, 1631 and 1632. Button 1660 can represent, for example, a signal from an on/off switch or other circuitry that can signal processor 1605.

An illustrative operation of system 1600, in which BAT 1655 is the only source of power, is now discussed. An absence of power on BUS 1650 prevents LDO 1620 from supplying power and causes FET 1640 to turn on, thereby effectively coupling nodes 1641 and 1642. System 1600 may be turned on when button 1660 is activated and outputs a high voltage. Activation of button 1660 can cause the button input of gate 1661 to go HIGH, which can cause the output of the gate 1661 to go HIGH. This HIGH signal can cause gate 1632 to assert a HIGH signal on its output. When gate 1632 outputs a high voltage, SMPS 1625 is activated and can begin providing power, if VBAT is at or above the predetermined voltage level (e.g., BAT 1655 has sufficient power to run SMPS 1625). Because power FET 1640 is on, the power provided by SMPS 1625 can be transmitted to radio circuitry 1615 and core circuitry 1610. As core circuitry 1610 begins to boot up, it can output a HIGH signal on line 1613 so that gate 1632 continues to output a HIGH signal after button 1660 is released. System 1600 can operate with full functionality at this point because both core circuitry 1610 and radio circuitry 1615 are receiving power. However, when VBAT drops below the predetermined voltage level (e.g., BAT 1655 is dead), SMPS may no longer be able to produce reliable power and system 1600 may begin to shut down.

An illustrative operation of system 1600 receiving power from an external power source on BUS 1650 is now discussed. The power on BUS 1650 can provide supply power to LDO 1620 and cause power FET 1640 to turn OFF or remain turned OFF, effectively decoupling nodes 1641 and 1642. Additionally, the power on BUS 1650 can cause gates 1661, 1631 and 1632 to output HIGH signals. When gate 1631 generates a HIGH signal, LDO 1620 can begin supplying power. Power from LDO 1620 may be provided to core circuitry 1610, but not to radio circuitry 1615, because power FET 1640 is not conducting. When core circuitry 1610 receives power, it can output a HIGH signal on line 1611 which causes the output of gate 1631 to maintain a HIGH signal so that LDO 1620 can continue operating.

SMPS 1625 may not be able to operate until VBAT has risen to or above the predetermined voltage level. Core circuitry 1610 can instruct battery charging circuitry (not shown) to begin using power from BUS 1650 to charge BAT 1655. Core circuitry 1610 can receive signals (e.g., digital signals) from ADC 1630 over line 1614. ADC 1630 can be electrically coupled with BAT 1655. ADC 1630 can convert a signal with a varying voltage (e.g., VBAT) into a digital signal that can be processed by core circuitry 1610. When VBAT has met or exceeded the predetermined voltage level, SMPS 1625 may now be able to operate and provide radio circuitry 1615 with power. Note that in some embodiments, SMPS 1625 may be powered ON substantially immediately when an external power service is connected to BUS 1650. Using ADC 1630, core circuitry 1610 can detect when SMPS turns on and coordinate the functions of processor 1605 accordingly. For example, when radio circuitry 1615 is powered, core circuitry 1610 can begin sending communications data to radio circuitry 1615. In this manner, processor 1605 can operate with full functionality before BAT 1655 is fully charged.

While BAT 1655 is charging, core circuitry 1610 can perform various other functions, regardless of whether VBAT has met or exceeded the predetermined voltage level. For example, core circuitry 1610 can run boot up processes, communicate over wired interfaces and run user interfaces.

In this manner, core circuitry 1610 can, for example, handle auxiliary processes (e.g., downloading firmware updates via a wired interface and installing the updates) before processor 1605 has full functionality.

Several benefits may be realized by power distribution system 1600 in the manner discussed above. For example, the core circuitry 1610 can turn ON before the battery has reached a minimum charge threshold. This enables core circuitry 1610 to handle boot up processes in advance, thereby enabling headset to begin working immediately once the battery is charged to the minimum level. In effect, certain components may be powered independent of BAT 1655 when an external power supply is connected to BUS 1650.

Additionally, system 1600 limits the unnecessary use of BAT 1655. Traditionally, known headset circuitry is powered through a battery even if an external power supply is present. The power drained from the battery is then recharged using power from the external power supply. This charging and recharging can shorten a battery's lifespan. System 1600 allows core circuitry 1610 to draw power independent of BAT 1655 and directly from an external supply (if present), extending the life of BAT 1655.

To provide additional functionality, output line 1612 can be included in core circuitry 1610 so that the core circuitry can shut down system 1600. Line 1612 can be coupled with node 1633 such that line 1612 can drive node 1633 to a LOW signal. Therefore, if core circuitry outputs LOW signals to lines 1611, 1612 and 1613, the output of gates 1631 and 1632 go LOW, turning off both LDO 1620 and SMPS 1625, which causes core circuitry 1610 and radio circuitry 1615 to turn off.

While the previous discussion described a method and system for separately powering on core and RF radio circuitries, the same techniques can be applied to other electronic subsystems which, for example, might be unrelated to RF communications.

Figure 17B:
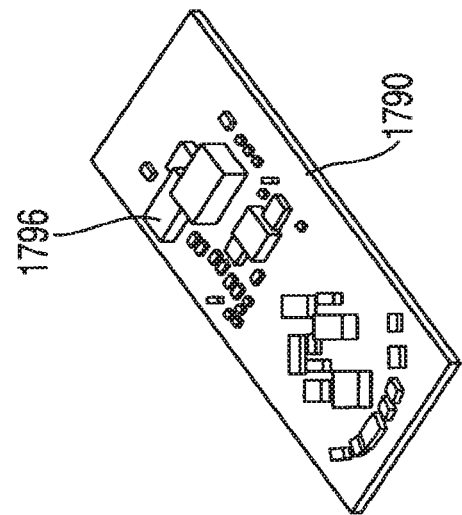
FIGS. 17A-17C are illustrations of a traditional circuit board and distribution of electrical components in a headset.
Figure 17C:
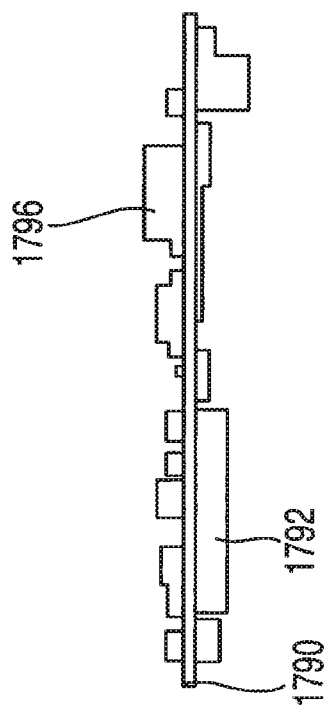
Figure 17A:
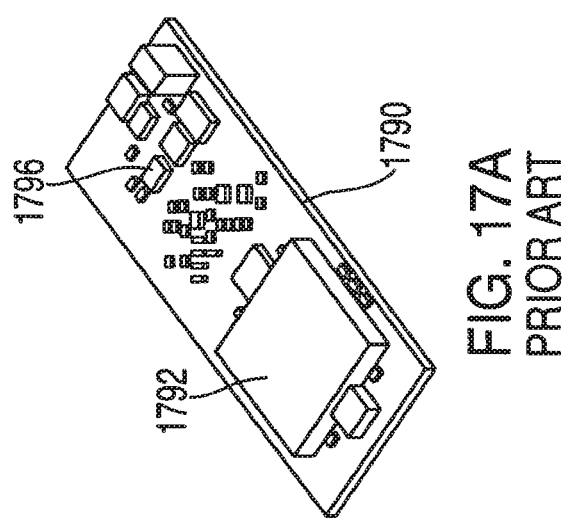

FIGS. 17A-17C show different views of known headset circuit boards, with particular emphasis on how circuitry and components are distributed therein. Electrical components 1796, including processor 1792, may be mounted on two sides of circuit board 1790. As can be appreciated by one of skill in the art, circuit board 1790 may occupy a relatively large, undistributed area. Such circuit boards can limit the amount that other components (e.g., batteries, buttons, antennas) are spatially integrated with the electronics. Thus, known headsets have to be relatively large to accommodate such boards and other components.

Figure 18:
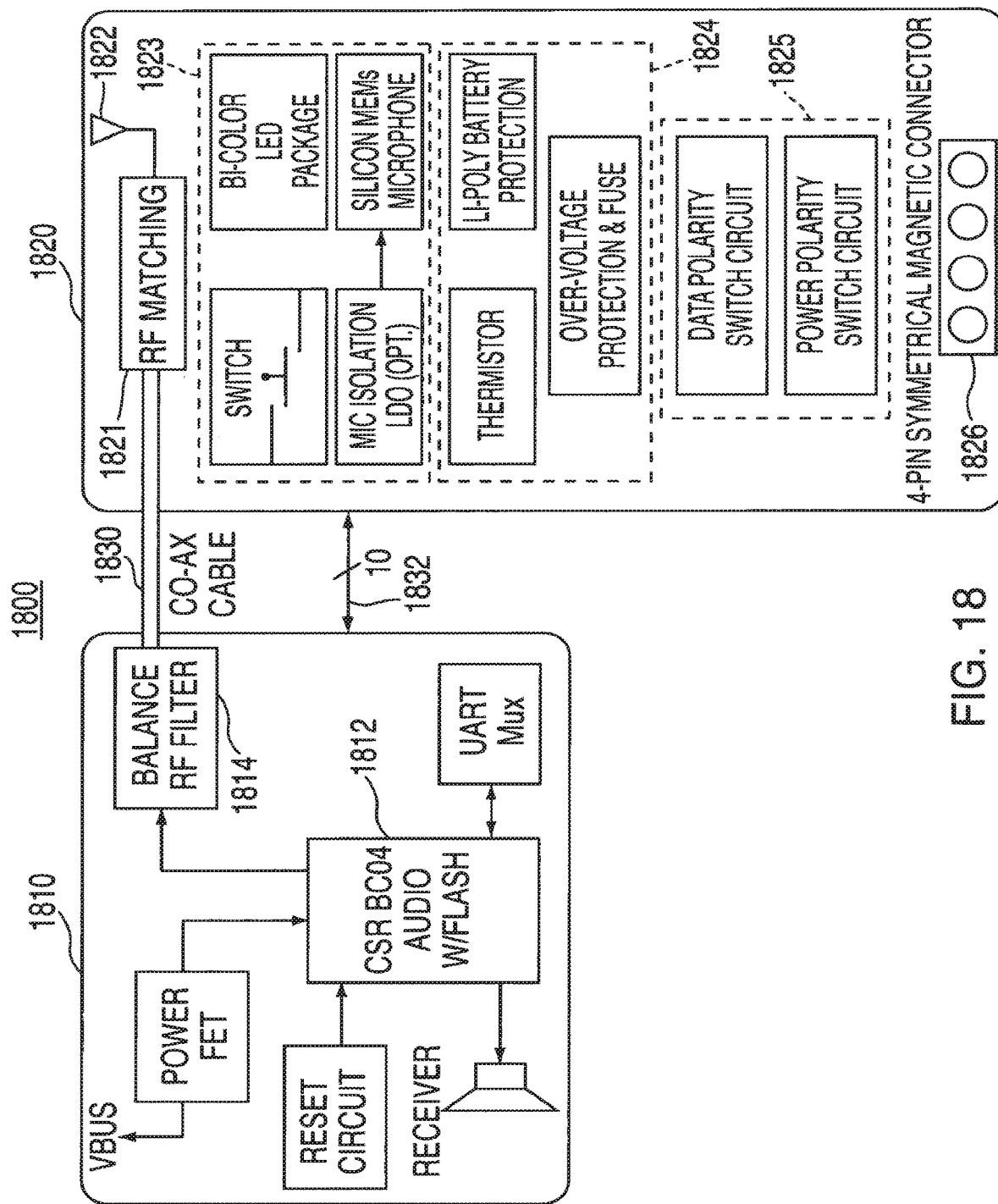
FIG. 18 is a simplified block diagram of a circuit board with an improved distribution of electrical components in a headset in accordance with an embodiment of the present invention.

FIG. 18 is a simplified schematic system diagram of a headset showing a circuit board arrangement in accordance with an embodiment of the present invention. System 1800 can correspond to headset 500 of FIG. 5, for example. System 1800 can be divided into two independent and separately arranged circuit boards 1810 and 1820. That is, when boards 1810 and 1820 are installed in a headset according to an embodiment of the present invention, the boards may be electronically coupled to each other, but the boards themselves are discrete. Circuit board 1810 corresponds to earbud circuit board 522 of FIG. 5 and earbud circuit board 1122 of FIG. 11A and can include, for example, Bluetooth processor 1812, circuitry that requires placement close to the processor, balance RF filter circuitry 1814 and coaxial connector (see e.g., connector 2752 of FIG. 27B). Examples of circuitry required close proximity to processor 1812 can include a timing crystal, charging inductors, capacitors, field effect transistors and resistors.

Figure 27A:
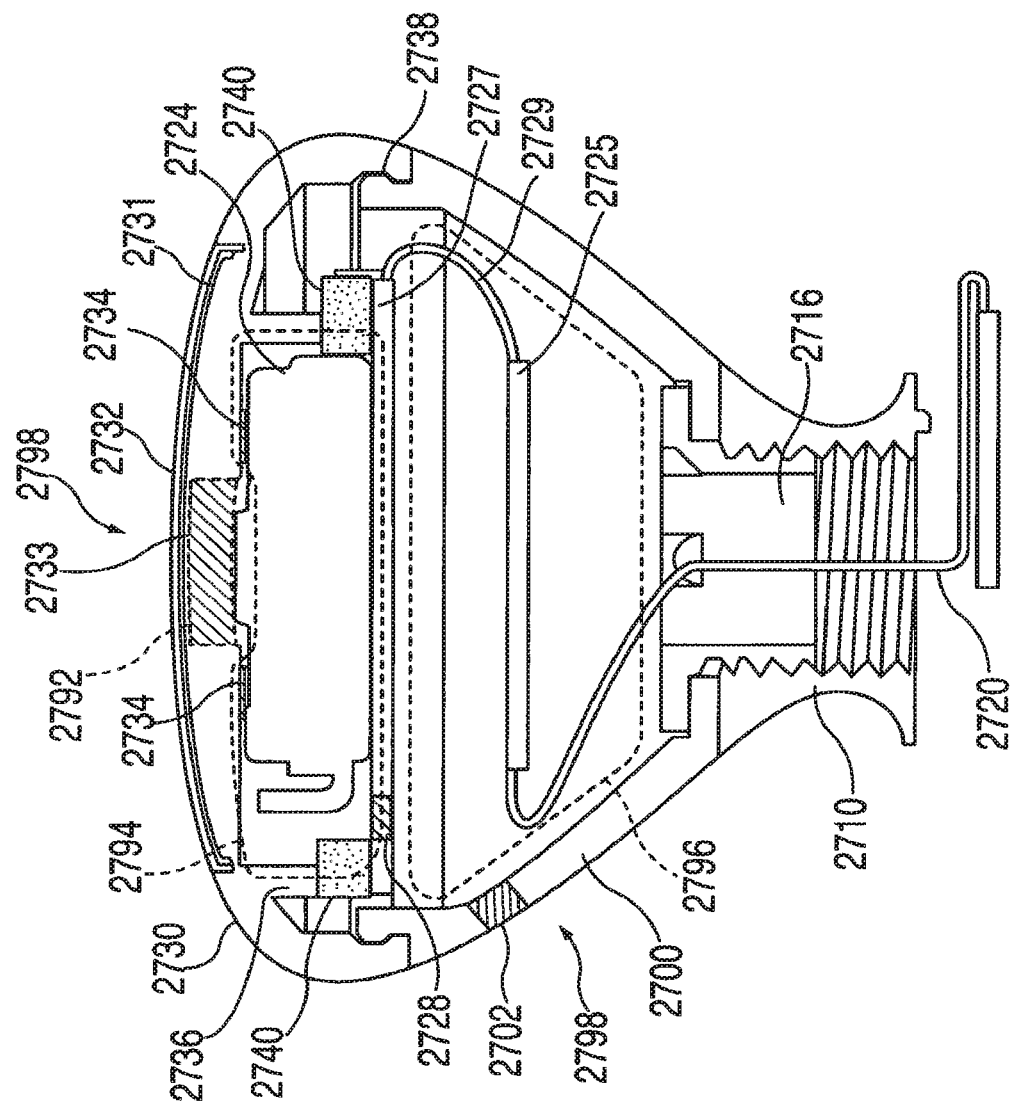
FIG. 27A is a simplified cross-sectional view of a partially assembled headset earbud in accordance with an embodiment of the present invention.
Figure 27B:
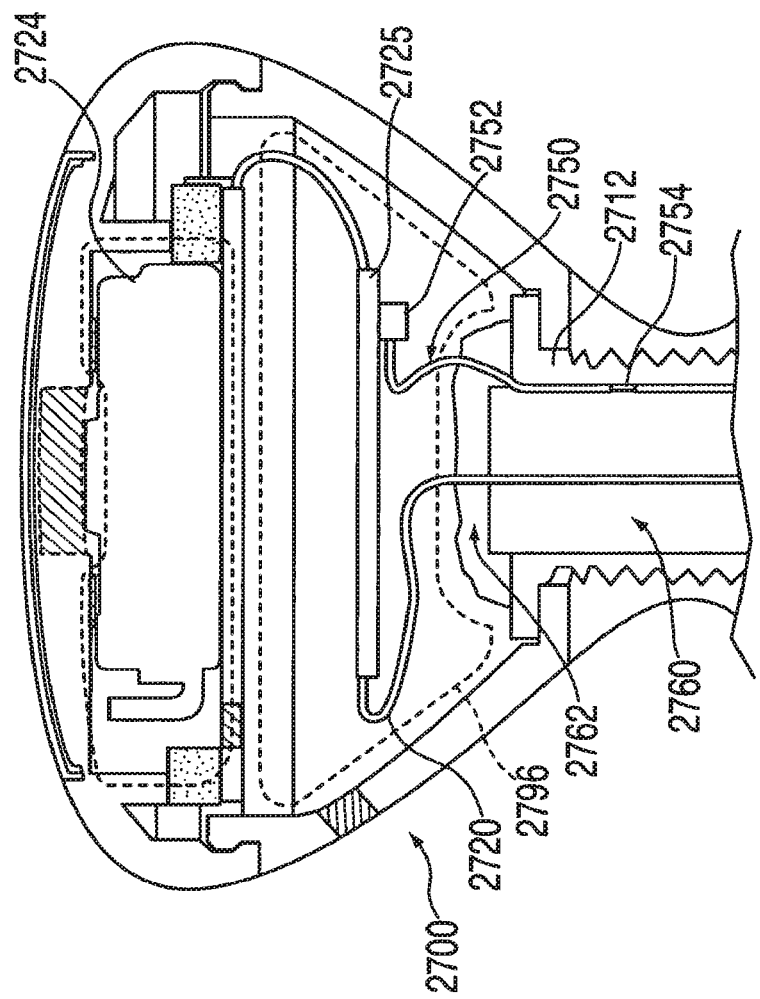
FIG. 27B is a simplified cross-sectional view of a fully assembled headset earbud in accordance with an embodiment of the present invention.

Circuit board 1820 corresponds to primary housing circuit board 512 of FIG. 5 and primary housing circuit board 1115 of FIG. 11A and can, for example, include RF Antenna 1822, interface circuitry 1823, power distribution circuitry 1824, switching circuitry 1825, 4-pin symmetrical magnetic connector 1826, RF matching circuitry 1821 and coaxial connector (see e.g., connector 2752 of FIG. 27B).

Circuit boards 1810 and 1820 can be electrically coupled using, for example, co-ax cable 1830 and bus 1832. In the embodiment shown in FIG. 18, bus 1832 includes ten lines, but one of ordinary skill in the art will appreciate that the number of lines in the bus can vary.

Balance RF filter circuitry 1814 and RF matching circuitry 1821 can adjust RF signals to compensate for the specific effects of circuit board 1810, co-ax cable 1830, circuit board 1820 and antenna 1822. The functions of elements of additional circuitry in circuit board 1810 and 1820 have been described in more detail in the above discussion relating to FIG. 14.

FIGS. 19A and 19B compare respective top and bottom views of earbud circuit board 1920 according to an embodiment of the present invention to respective top and bottom views of the known circuit boards shown in FIGS. 17A-17C. In addition, FIGS. 19A and 19B show that selected components of known circuit board 1990 can be arranged on earbud circuit board 1920. For example, as shown, the encircled circuit and components such as components 1996 and processor 1992 can be placed on one or more sides of earbud circuit board 1920. The remaining electronic components such as components 1996 can be placed on primary housing circuit board (see e.g., circuit board 1115 of FIG. 11) which may be located inside the headset's primary housing.

Earbud circuit board 1920 can include a layer made from a flexible substrate that enables circuit board 1920 to bend onto itself, thereby effectively reducing the area needed to install circuit board 1920 into a headset according to the invention. The flexible layer of circuit board 1920 can include one or more layers of electrical traces for electrically coupling processor 1922 and electronic components 1926, for example. The flexible layer of circuit board 1920 can, for example, extend over the entire footprint of the circuit board, or be limited to predetermined portions of circuit board 1920.

Circuit board 1920 can include relatively rigid sections 1923, 1925 and 1927 which have increased structural strength and are easier to mount electrical components to. Rigid circuit board sections 1923, 1925, and 1927 can be fabricated by attaching rigid circuit board pieces to one or more outer surfaces of the flexible layer of circuit board 1920. Rigid pieces can be attached to a flexible layer using any suitable process, such as applying an adhesive, for example. Contacts can be included on complementary surfaces of the rigid pieces and the flex layer so that electrical traces can be routed across the different layers. One or more layers of electrical traces can be included in the rigid circuit board pieces so that the combination of rigid and flex layers can provide two or more layers of electrical traces. In the embodiment shown in FIGS. 19A and 19B, a flex circuit layer with two levels of traces can be located in between two rigid, single-trace layers such that the resulting rigid sections of circuit board 1920 include four layers of traces. In flexible sections of circuit board 1920, such as connector lead 1921, the absence of rigid pieces can result in two levels of traces.

Rigid sections 1925 and 1927 can have substantially circular footprints with different radii. Various electrical components, such as capacitors and resistors, for example, can be mounted on both sides of rigid section 1925. Rigid section 1927 can have a larger footprint than section 1925 in order to accommodate the mounting of processor 1922 on a first side and receiver 1924 on a second side of section 1925. Connector 1928 can be mounted to rigid section 1923 to enable earbud circuit board 1920 to electrically couple with a primary housing circuit board (see e.g., circuit board 1115 of FIG. 11).

FIGS. 20A and 20B show side and perspective views of earbud circuit board 2020 in a folded configuration in accordance with an embodiment of the present invention. Earbud circuit board 2020 may, for example, correspond to earbud circuit board 1920. The folded configuration may correspond to the configuration of circuit board 2020 when installed within a headset, or more particularly, the earbud of the headset, as shown in FIG. 20C. Top rigid section 2027 can be folded over middle rigid section 2025 so that both sections can fit in the earbud of a headset. Processor 2022, receiver 2024 and various other electronic components 2026 may be mounted to earbud circuit board 2020. Electronic components 2026 can include resistors, capacitors, transistors, amplifiers and other types of both passive and active electronic components, for example. It is to be understood that the term electronic components, as used herein, does not include interconnect devices (e.g., wires, traces, connectors, etc.). Earbud circuit board 2020 can further include rigid section 2023 and connector 2028 mounted thereon. Connector 2028 can be used to electrically couple earbud circuit board 2020 with a circuit board in a headset's primary housing (see e.g., circuit board 1115 or circuit board 2011).

Referring now to FIG. 20C, which shows earbud circuit board 2020 and primary housing circuit board 2011 installed in a possible configuration within headset 2000 in accordance with an embodiment of the present invention. Circuit board 2020 can be folded in a configuration similar to that of FIGS. 20A and 20B and inserted into earbud 2014. Primary housing circuit board 2011 can include a combination of rigid and flexible sections that are similar, in composition but not necessarily shape, to the rigid and flexible sections of circuit board 2020. Circuit board 2011 can be folded to provide a cavity 2012 for a battery (see e.g., battery pack 1119 of FIG. 11). Circuit board 2011 can include connector 2018 which may connect to connector 2028 of earbud circuit board 2020. During installation, circuit board 2011 can be inserted through one of the open ends of primary housing 2010. Connector lead 2021 can be fed through headset neck 2013 so connector 2028 can mate with connector 2018 when circuit board 2011 has been inserted into primary housing 2010.

This distribution of electronics, where processor 2022 and other circuitry (e.g., receiver 2024 and other electronic components 2026) are located inside earbud 2014, advantageously allows for a generally smaller and more comfortable headset. Although the discussion above is related to an embodiment in which a certain distribution of electronic components is used, other distributions can be used without deviating from the spirit of the present invention. For example, a battery can be placed inside the earbud and a processor can be placed in the primary housing.

FIG. 21A shows a perspective view of earbud housing 2100 and neck 2110 in accordance with an embodiment of the present invention. Bezel 2130 can cover the top of earbud housing 2100. One or more acoustic ports 2102 can be located in the wall of the earbud to allow pressure to vent out of earbud housing 2100.

FIG. 21B shows an exploded view of earbud housing 2100 of FIG. 21A in accordance with an embodiment of the present invention. Screens 2131 and 2132 can be located on top of bezel 2130. Screens 2131 and 2132 can, for example, provide dust protection and acoustic resistance. Top gasket 2134 can be attached to the underside of bezel 2130 to create a seal with receiver 2124, and bottom gasket 2123 can be attached to section 2127 (a rigid section) of circuit board 2120. Bracket 2135 can be used to mount circuit board 2120 inside earbud housing 2100. Mesh can cover acoustic ports 2102 and can, for example, impose acoustic resistance on air passing through those ports. Screw 2112 can be used to mount earbud housing 2100 to neck 2110. Gaskets 2134 and 2123 can be made of, for example, foam, rubber, or any other compressible material so that the gaskets can form acoustic (e.g., substantially air-tight) seals with surrounding parts.

Figure 22:
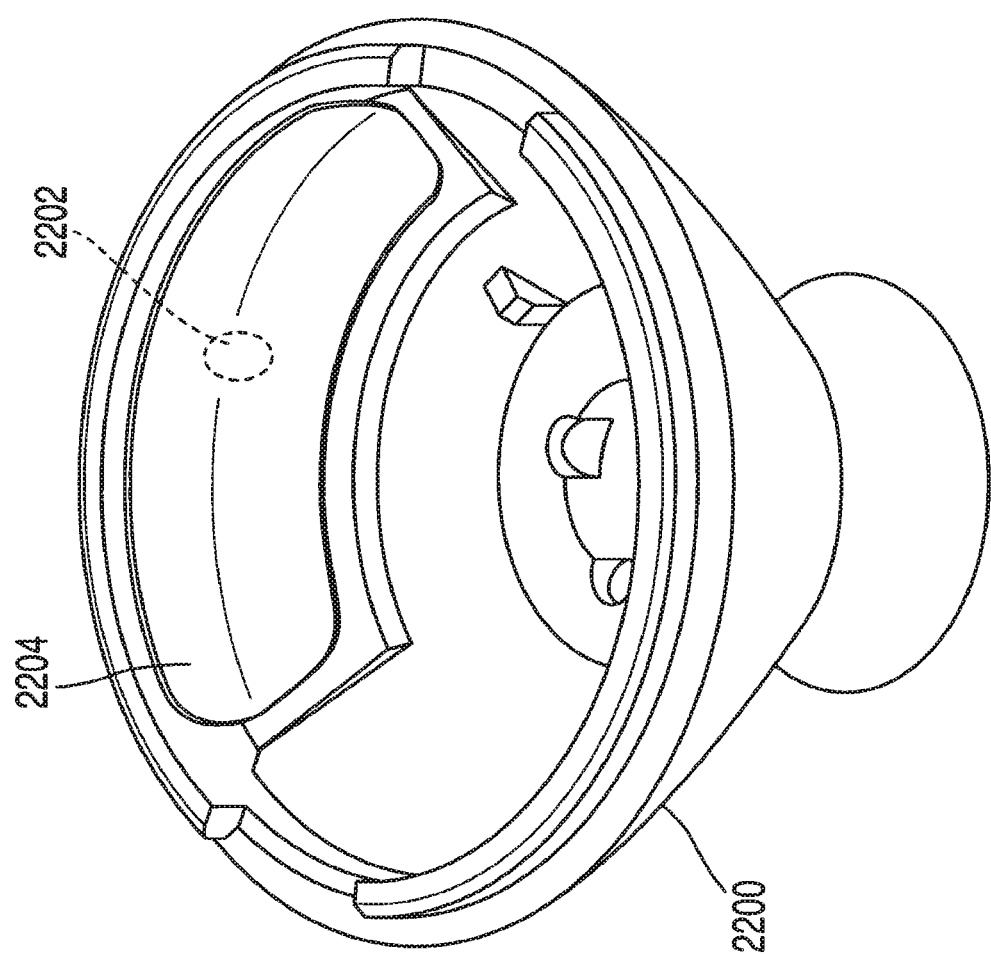

FIG. 22 shows an interior view of empty earbud housing 2200 in accordance with an embodiment of the present invention. Mesh 2204 can be located on the inner wall of housing 2200 to control the flow of air through one or more acoustic ports 2202 and prevent foreign objects (e.g., dirt) from entering housing 2200. Mesh 2204 can, for example, be affixed to housing 2200 using an adhesive. Mesh 2204 can be made of nylon, plastic, or any other suitable material. Mesh 2204 can provide acoustic resistance to the passage of air between an acoustic volume inside housing 2200 and the outside environment when the earbud is assembled. Even though only one acoustic port is shown in FIG. 22, any number of acoustic ports can be used in accordance with the principles of the present invention.

Figure 23:
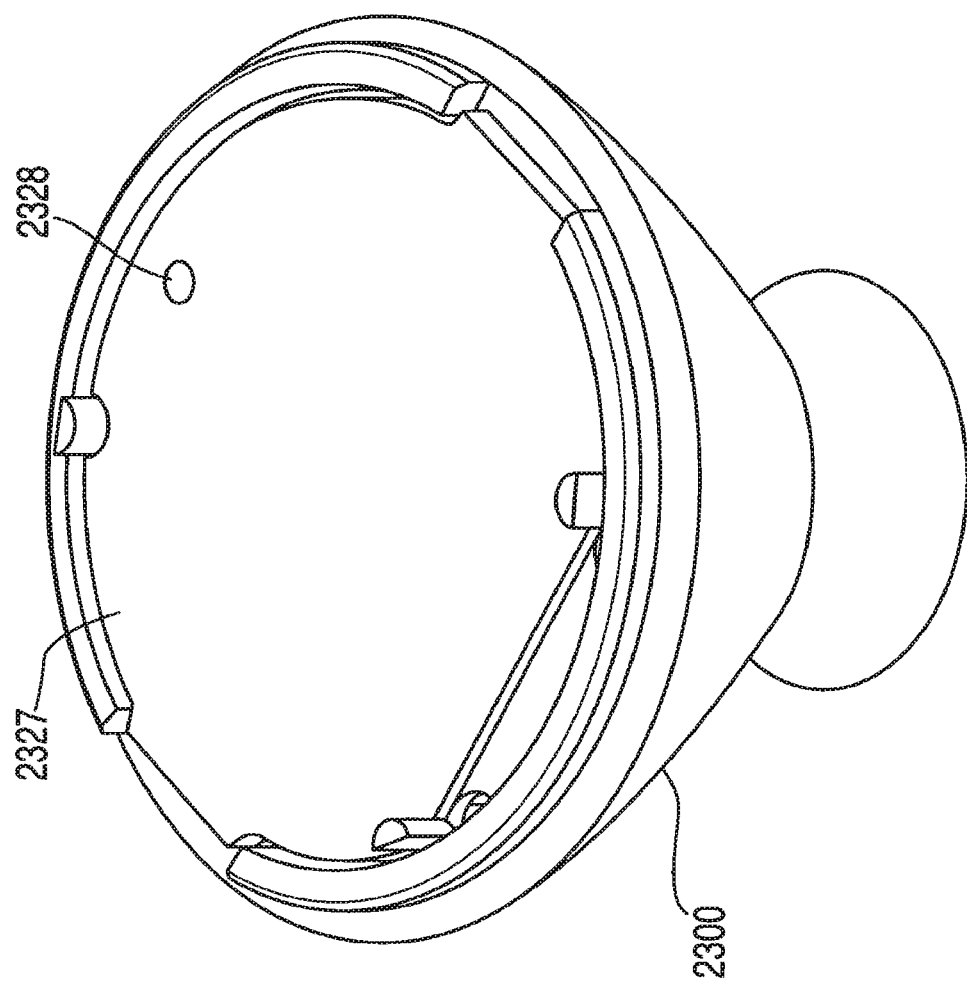

FIG. 23 shows rigid section 2327 of an earbud circuit board mounted inside earbud housing 2300 in accordance with an embodiment of the present invention. Acoustic port 2328 can be provided in circuit board section 2327 to permit air flow through the circuit board. The size, shape and location of acoustic port 2328 can vary depending on, for example, the acoustic properties of the earbud and the desired sound output. If desired, more than one acoustic port may be provided. Although not shown in FIG. 23, a second rigid portion of the earbud circuit board, such as rigid section 2025 of FIG. 20, may too include one or more acoustic ports. Though such port(s) may not be necessary if sufficient air gaps exist between the inside wall of housing 2300 and the second rigid portion.

Figure 24:
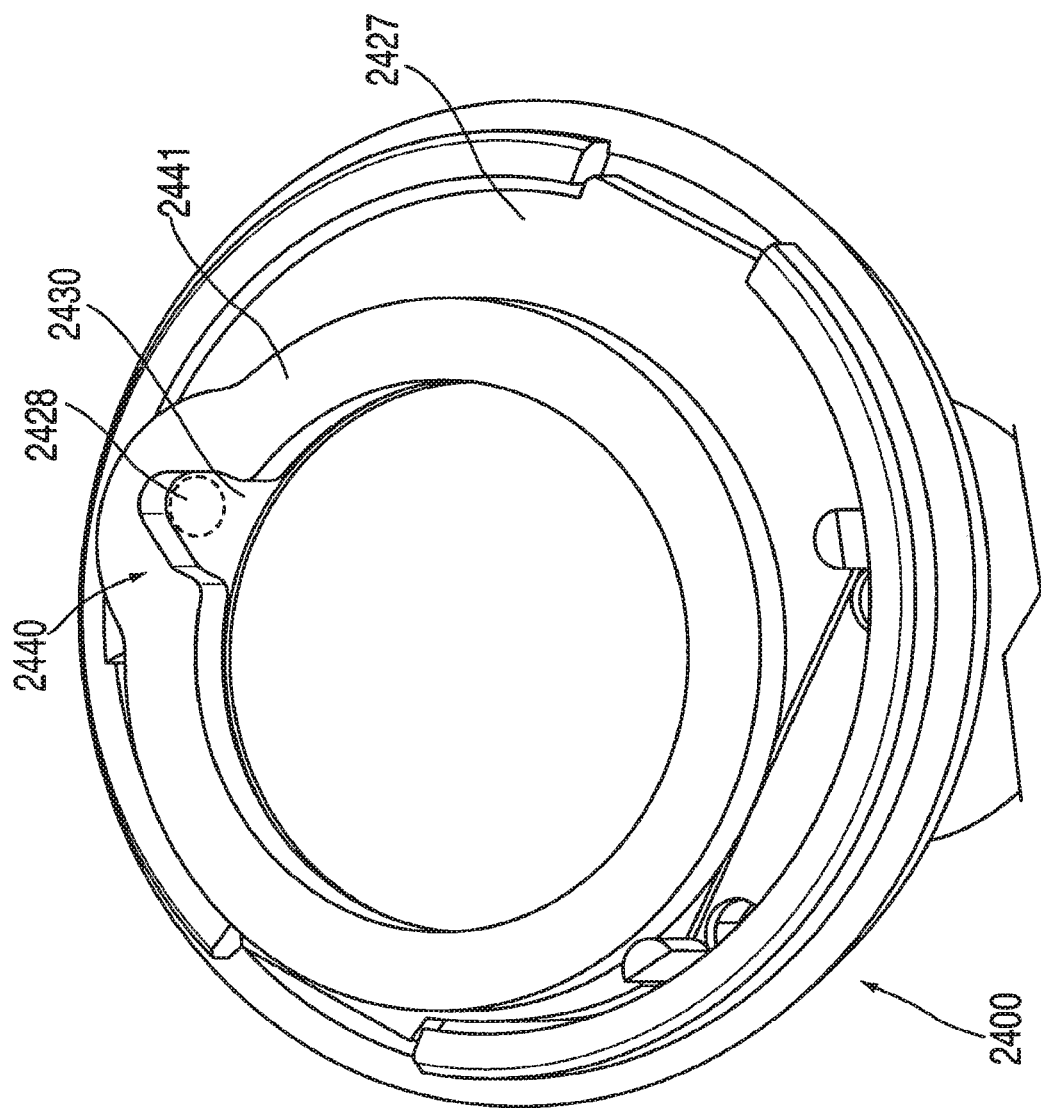

FIG. 24 shows bottom gasket 2440 mounted onto circuit board section 2427 in accordance with an embodiment of the present invention. Bottom gasket 2440 can include an combination of, for example, acoustic mesh 2430, adhesive, and foam 2441. Foam 2441 of gasket 2440 can be shaped to fit around receiver (see e.g., gasket 2740 and receiver 2724 of FIG. 27A) and acoustic port 2428. Mesh 2430 can be shaped to cover port 2428. In this manner, acoustic mesh 2430 can cover acoustic port 2428 even though foam 2441 does not. Mesh 2430 can be made of nylon, plastic, or any other suitable material that can provide acoustic resistance to the passage of air through port 2428 which couples the acoustic volume under circuit board section 2427 (see e.g., acoustic volume 2796 of FIG. 27) with the acoustic volume where the receiver is located (see e.g., acoustic volume 2794 of FIG. 27).

Figure 25:
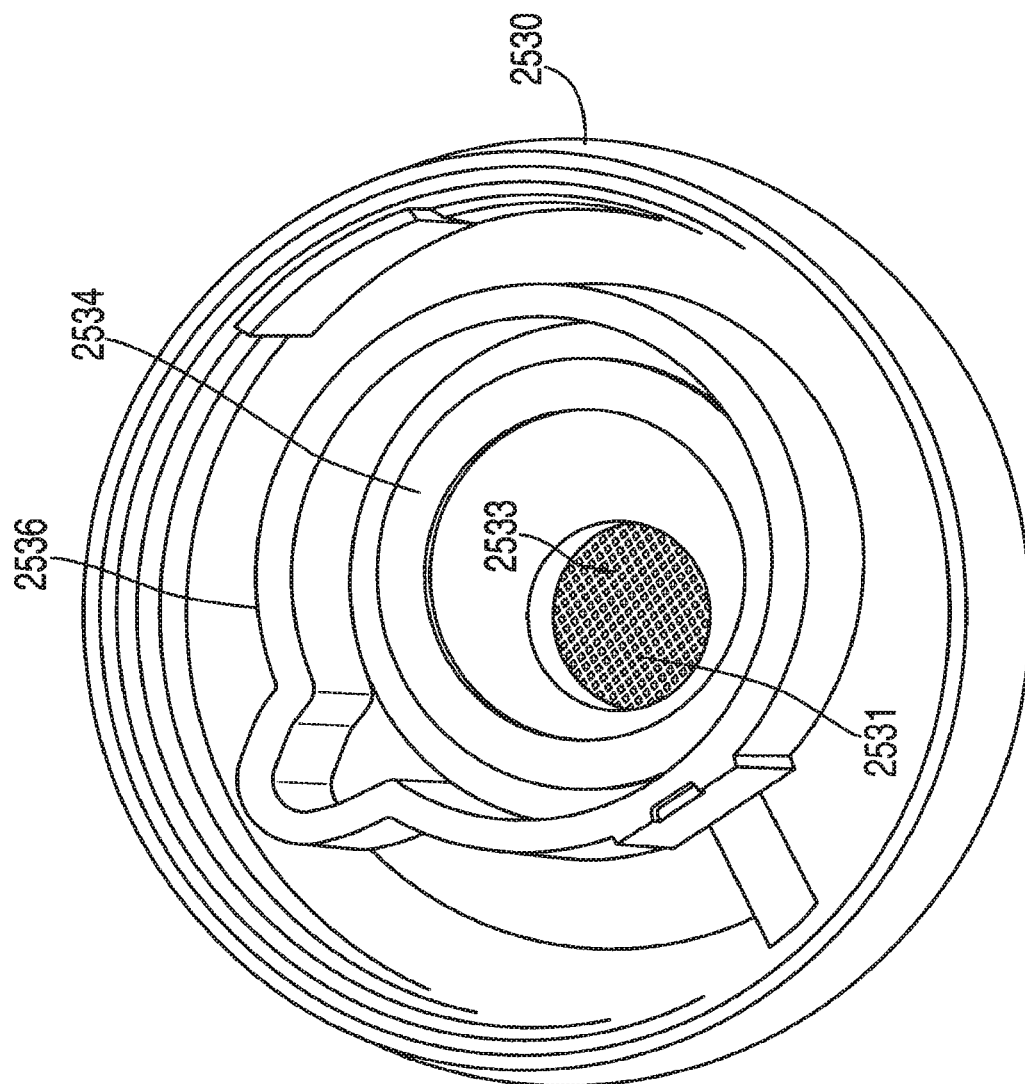

FIG. 25 shows the underside of bezel 2530 in accordance with an embodiment of the present invention. Bezel 2530 can include rim 2536 which extends from the bottom of bezel 2530. Rim 2536 can be of sufficient height to compress bottom gasket 2440 of FIG. 24 against circuit board section 2427 of FIG. 24 when bezel 2530 is mounted to the top of the earbud housing, thereby creating an acoustic seal between the rim and the circuit board. Gasket 2534 can be, for example, a layer of foam that is affixed to the underside of bezel 2530 using adhesive. Gasket 2534 can be shaped so that it can form a seal with the top of the earbud's receiver when bezel 2530 is mounted to the earbud. Bezel 2530 includes acoustic port 2533 for sound to exit an earbud. Screen 2531 can be located on the topside of bezel 2530 so that the screen completely covers acoustic port 2533. Screen 2531 can apply an acoustic resistance to air passing through acoustic port 2533.

FIG. 26A shows the underside of bezel 2630 with receiver 2620 installed in accordance with an embodiment of the present invention. Receiver 2620 can be placed inside rim 2636 so that the front output of receiver 2620 is encircled by the seal formed between the top of the earbud's receiver and the top gasket (see e.g., top gasket 2134 of FIG. 21B). Receiver 2620 can include spring contacts 2622 and 2624. Spring contacts 2622 and 2624 can, for example, be made from a metal or an alloy. Springs contact 2622 and 2624 can electrically couple with circuitry in a headset in order to input audio signals to receiver 2620.

Figure 26B:
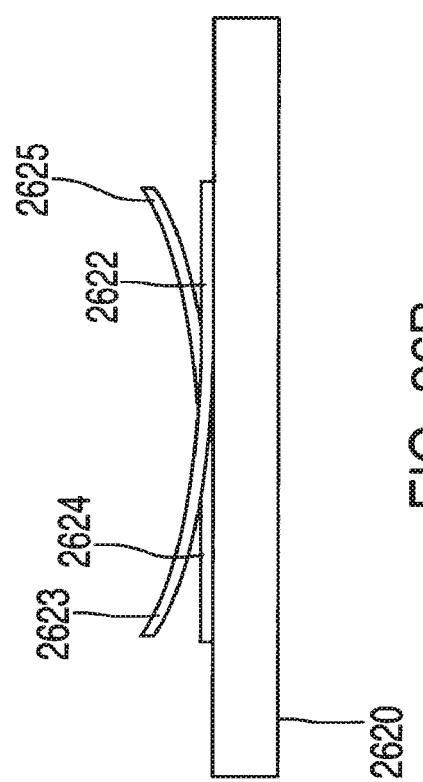
FIG. 26B is a simplified cross-sectional view of an audio receiver in accordance with an embodiment of the present invention.

FIG. 26B shows a cross-sectional view of receiver 2620 in accordance with an embodiment of the invention. Receiver 2620 can include spring contacts 2622 and 2624 which can connect receiver 2620 with a source of electrical signals (e.g., earbud circuit board 1115 of FIG. 11). Contacts 2622 and 2624 can include tips 2623 and 2625 to facilitate the physical contact with a contact on a circuit (e.g. a flex circuit board).

FIG. 27A shows a cross-sectional view of earbud housing 2700 with receiver 2724 and circuit board 2720 installed in accordance with an embodiment of the present invention. Bezel 2730 is mounted on top of earbud housing 2700. Bezel 2730 can be attached to housing 2700 using a notch and rib configuration 2738 or any other suitable method of attachment, such as adhesive, for example. In an alternative embodiment of the present invention, bezel 2730 can be integrally formed with earbud housing 2700. Neck 2710 can be coupled to the bottom of earbud housing 2700. Earbud circuit board 2720 can be located inside the earbud and extend through lumen 2716 of neck 2710.

Located on the top of bezel 2730, screens 2731 and 2732 can cover audio port 2733. Audio port 2733 can allow air to pass between the external environment 2798 and front volume 2792 of receiver 2724. Top gasket 2734 and bottom gasket 2740 can create acoustic seals around receiver 2724 so that receiver volume 2794 is created. Acoustic port 2728 can allow air to pass through top rigid section 2727 of circuit board 2720 so that a port between receiver volume 2794 and rear earbud volume 2796 is created. Acoustic port 2702 can be located in earbud housing 2700 so that air can pass between rear earbud volume 2796 and the external environment 2798. Mesh (see e.g., mesh 2204 of FIG. 22) can be applied to the inner wall of earbud housing 2700 to cover acoustic port 2702 such that some resistance is applied to air passing through the port.

In one embodiment of the present invention, receiver 2724 can form at least part of a wall defining front volume 2792 and at least part of a wall defining receiver volume 2794. Rim 2736 of bezel 2730 can extend from the bezel into the interior of the earbud and compress against bottom gasket 2740, thereby also forming at least part of a wall defining receiver volume 2794. In one embodiment of the present invention, top rigid section 2727 of circuit board 2720 can be disposed between receiver volume 2794 and rear earbud volume 2796, thereby forming at least part of a wall defining receiver volume 2794 and at least part of a wall defining rear earbud volume 2796. To ensure the desired acoustic seal between receiver volume 2794 and rear earbud volume 2796, top rigid section 2727 of circuit board 2720 can be rigidly coupled to earbud housing 2700, directly or indirectly. In contrast, in one embodiment of the present invention, middle rigid section 2725 of circuit board 2720, which can be disposed within rear earbud volume 2796, can be flexibly coupled to the earbud housing, directly or indirectly (e.g., via top rigid section 2727 and flexible section 2729 of circuit board 2720). As used herein, when a component forms part of a wall defining an acoustic volume, the component can do so directly or indirectly. For example, the component can directly form part of a wall defining an acoustic volume when part of the component is open to the acoustic volume. The component can indirectly form part of a wall defining an acoustic volume when the component is incorporated into another component open to the acoustic volume.

In order to prevent sound from exiting rear earbud volume 2796 through lumen 2716, a substance, such as silicon glue, can be used to fill the inside of neck 2710. It is advantageous to prevent sound from receiver 2724 leaking into the headset's primary housing (see e.g., primary housing 11 of FIG. 1) because the microphone is located therein. If sound from the receiver is picked up by the microphone, a potentially undesirable echo may be created.

FIG. 27B shows a cross-sectional view of earbud housing 2700 with coaxial cable 2750 and conductive stopper 2760 installed in accordance with an embodiment of the present invention. Coaxial cable 2750 can couple to rigid section 2725 of circuit board 2720 using connector 2752, for example. Coaxial cable 2750 can be used to couple a processor in earbud housing 2700 with an antenna provided in a headset's primary housing (see e.g., antenna 1218 in primary housing 1210). Coaxial cable 2750 can include, for example, an insulated wire surrounded by a conductive shield and an outer insulator. In some embodiments, the outer insulator may be removed from at least a portion of cable 2750. For example, insulator can be removed to create exposed portion 2754 of the cable such that the insulator can be electrically coupled with (e.g., grounded to) insert 2712. Insert 2712 can be grounded to neck 2710 through the insert's threads and the neck can be grounded to a headset's primary housing (see e.g., housing 11 of FIG. 1). By grounding the insulator of cable 2750, electromagnetic interference and other negative effects may be reduced thereby increasing the wireless performance of a headset.

Conductive stopper 2760 can be installed in the lumen 2716 of insert 2712. In some embodiments, conductive stopper 2760 can be made of silicone and filled with silver. Conductive stopper 2760 can include a slit for circuit board 2720 and coaxial cable 2750 to pass through lumen 2716. Providing conductive stopper 2760 in neck 2710 can have several benefits. For example, conductive stopper 2760 can help isolate any sounds in acoustic volume 2796 from a headset's primary housing. In some embodiments, conductive stopper 2760 can also press exposed portion 2754 of cable 2750 against the wall of insert 2712 such that the cable's insulator is always electrically coupled with (e.g., grounded to) the insert. In other embodiments, stopper 2760 can be made from a conductive material such that the stopper can electrically coupled exposed portion 2754 of the cable with insert 2712.

Figure 28:
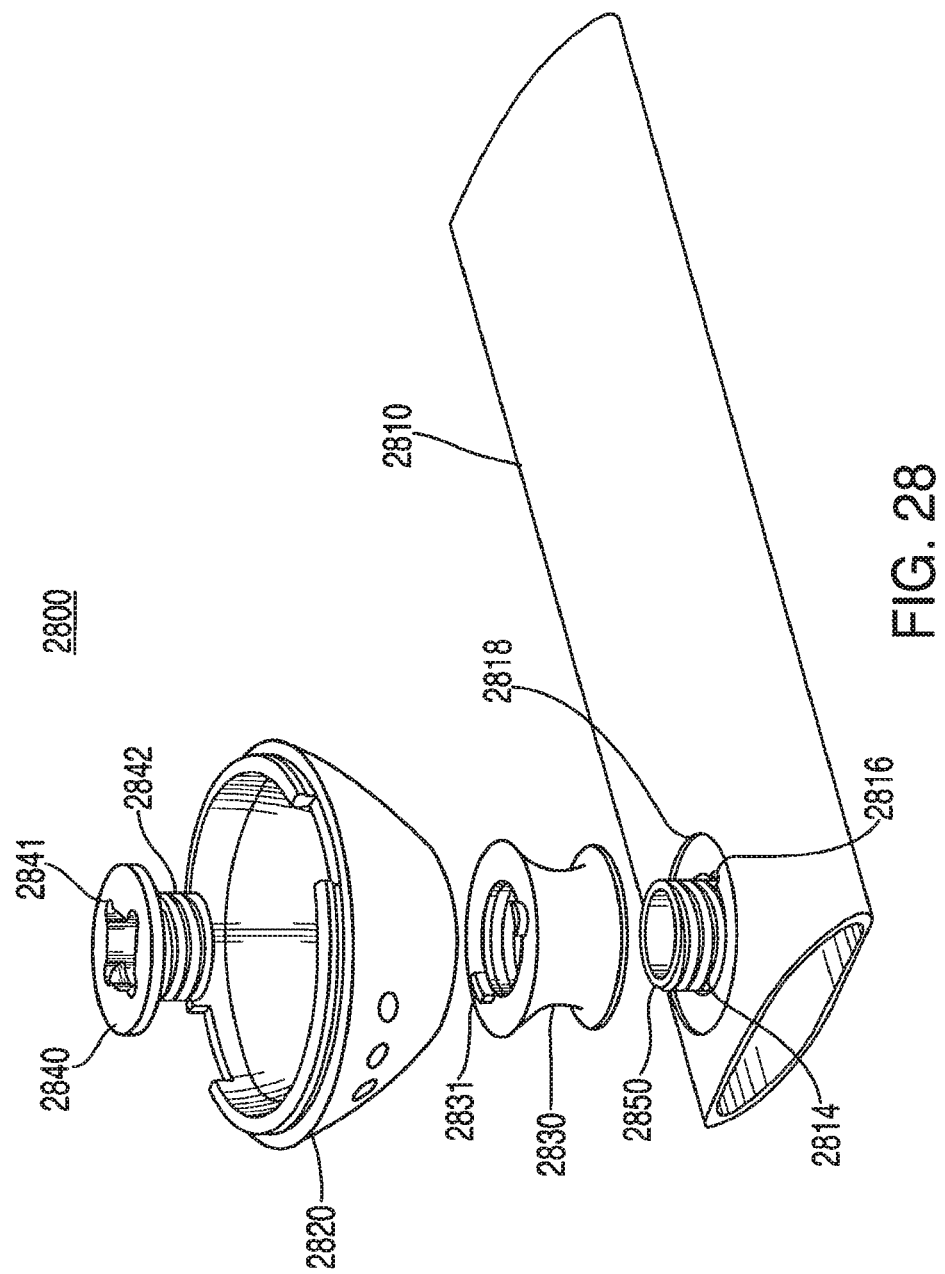
FIG. 28 is an exploded view of an attachment system in accordance with an embodiment of the present invention.

FIG. 28 shows a view of unassembled pieces of attachment system 2800 that can be used to attach earbud housing 2820 to primary housing 2810 in accordance with an embodiment of the present invention. The configuration described below can allow for a mechanically robust connection which prevents housing 2820 from rotating with respect to primary housing 2810. An additional benefit of this design is the open lumen that can be used to run wires (or flexible printed circuit boards) between the earbud and primary housing. Attachment system 2800 can, for example, correspond to device 600 of FIGS. 6A and 6B.

Attachment system 2800 can include insert 2840, earbud housing 2820, neck 2830, insert 2850 and primary housing 2810. In order to simplify manufacturing, inserts 2840 and 2850 can be substantially similar and can both include features 2841, (e.g., notches), threads 2842 and a through-hole. Features 2841 can be arranged in a pattern to promote proper interface with certain tools. A custom tool which can interface with inserts 2840 and 2850 is described in more detail in the discussion below corresponding to FIGS. 30A-30C.

Primary housing 2810 can include through hole 2814. Insert 2850 can be located in primary housing 2810 so that the threaded part of insert 2850 protrudes through through-hole 2814. A through-hole can be provided through neck 2830, and the interior can be threaded so the neck can couple with inserts 2850 and 2840. Earbud housing 2820 can include an through-hole (see e.g., through-hole 612 of FIG. 6) through which insert 2840 can pass to couple with neck 2830.

The top surface of neck 2830 can include one or more protrusions 2831 (e.g., tabs) which can interface with one or more slots (e.g., notches) in the bottom of housing 2820 to prevent the two parts from rotating independently of each other when coupled together. The slots in the bottom of housing 2820 are not shown in FIG. 28, but slots similar to slots 2816 can be provided on the neck engaging surface of earbud housing 2820 in accordance with an embodiment of the present invention. Earbud housing 2820 can have a curved exterior surface that can form a nearly seamless transition with the curved exterior surface of neck 2830.

The bottom surface of neck 2830 can include protrusions that interface with one or more slots 2816 in housing 2810 to prevent the two parts from rotating independently of each other when coupled together. The protrusions on the bottom surface of neck 2830 are not shown in FIG. 28, but protrusions similar to protrusions 2831 can be provided on the bottom surface of neck 2830 in accordance with an embodiment of the present invention. Primary housing 2810 can include recessed region 2818 so that the bottom surface of neck 2830 can be recessed below the primary exterior surface of the housing. Moreover, the exterior of neck 2830 can be shaped to provide a nearly seamless transition from earbud housing 2820 to primary housing 2810.

Neck 2830 and inserts 2840 and 2850 can be made from any suitable material (e.g., metals or polycarbonates). For example, neck 2830 can be made from aluminum and inserts 2840 and 2850 can be made from steel. The choice of materials for neck 2830 and inserts 2840 and 2850 can depend on factors such as structural strength, weight, price, ability to be machined, and cosmetic appearance.

Figure 29:
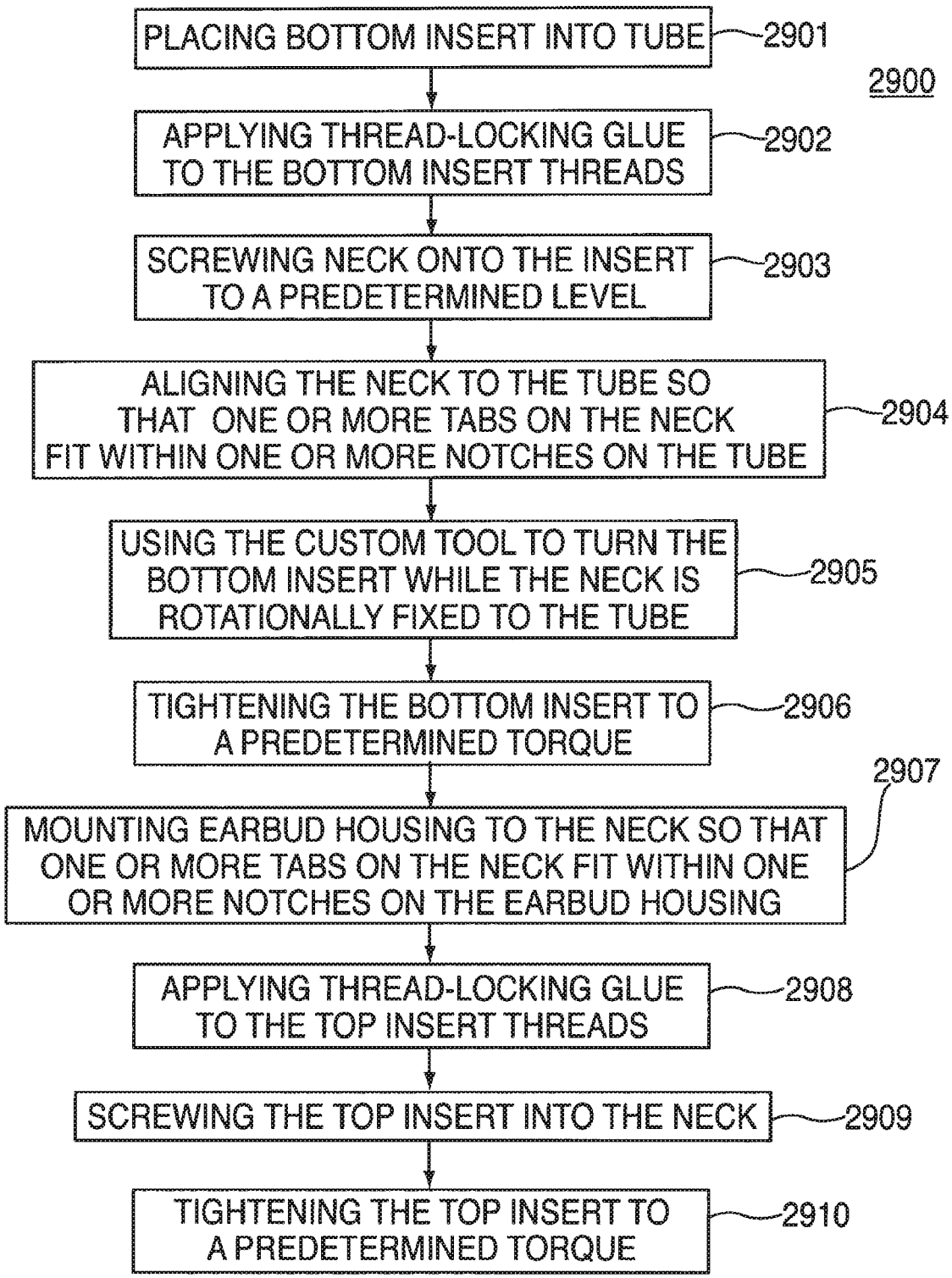
FIG. 29 is a flowchart of an illustrative process for assembling a portion of a headset in accordance with an embodiment of the present invention.

FIG. 29 shows a flowchart of process 2900 for connecting a headset earbud with a primary housing (e.g., a tube) in accordance with an embodiment of the present invention. Note that the protrusions and slots of FIG. 28 are referred to, respectively, as tabs and notches in process 2900. At step 2901, a bottom insert (such as insert 2850 of FIG. 28) can be inserted into a primary housing. The bottom insert can be inserted from either side of the primary housing and manipulated so that the threaded end is protruding from a through hole in the wall of the primary housing. At step 2902, thread-locking glue can be applied to the threads of the bottom insert. The glue can be applied so that it covers a complete circular path around the threads of the insert. Alternatively, the glue can be applied to just one section of the threads. The glue can be selected in order to prevent the insert from unscrewing itself due to external forces (e.g., vibration). In one embodiment, a sufficient quantity of glue may be applied to the threads of the insert to prevent moisture and other harmful elements from entering the inside of a headset through a seam which may exist between the neck and the primary housing. At step 2903, a neck (such as neck 2830 of FIG. 28) can be screwed onto the insert to a predetermined level. At step 2904, the neck can be aligned to the primary housing so that one or more tabs (e.g., protrusions 2831) on the neck fit within one or more notches on the primary housing. At step 2905, a custom tool can be used to turn the bottom insert while the neck is rotationally fixed to the primary housing. At step 2906, the bottom insert can be tightened to a predetermined torque. This torque measurement can be estimated by hand or performed with a calibrated torque wrench. At step 2907, an earbud housing can be mounted to the neck so that one or more tabs on the neck fit within one or more notches on the earbud housing. At step 2908, thread-locking glue can be applied to the top insert threads. The glue used on the threads of the top insert can be the same as the glue used on the threads of the bottom insert and can be applied in a similar manner. At step 2909, the top insert can be screwed into the neck. At step 2910, the top insert can be tightened to a predetermined torque.

FIGS. 30A and 30B show custom tool 3000 that can be used to manipulate an insert (e.g., insert 2840 or insert 2850) with respect to a neck (e.g., neck 2830) in accordance with an embodiment of the present invention. Tool 3000 can include two members 3010 and 3020 which can be coupled together by fastener 3030. Fastener 3030 can allow members 3010 and 3020 to rotate (or pivot) independently around the faster.

Members 3010 and 3020 can include appendages 3011 and 3021 which can be used by a user to control tool 3000. Appendages 3011 and 3021 can be an ergonomic size and shape. For example, appendages 3021 can be curved to accommodate an average human hand. Appendages 3011 and 3021 can include plastic covers 3012 and 3022 with ridges 3013 and 3023 such that a user can easily grip the appendages with his/her hands. A spring 3040 can be coupled with appendages 3011 and 3021 such that the appendages are biased to separate from each other.

Members 3010 and 3020 may control the movement of manipulators 3014 and 3024, which can interface with a part, such as an insert. For example, when appendages 3011 and 3021 are squeezed together, manipulators 3014 and 3024 may be forced apart. Manipulators 3014 and 3024 can include narrow sections 3015 and 3025 and tips 3016 and 3026.

FIG. 30B shows a detailed view of the shape of tips 3016 and 3026 in accordance with an embodiment of the present invention. Tips 3016 and 3026 can include outward facing tabs 3017 and 3027 which can interface with features (see e.g., features 2841 of FIG. 28) of inserts in order to manipulate (e.g., screw into place) the inserts. Tabs 3017 and 3027 can form the outer surface of narrow sections 3015 and 3025.

FIG. 30C shows custom tool 3000 coupling neck 3090 with primary housing 3092 in accordance with step 2905 of FIG. 29 according to an embodiment of the present invention. FIG. 30C illustrates how the narrow section of the manipulators can be of sufficient length so that tabs 3017 and 3027 can interface with features on the insert (see e.g., features 2841 of FIG. 28). Note that to preserve the structural strength of the manipulators, the narrow section may not be constructed to be substantially longer than necessary.

Extruded tubes with internal features for securing elements are useful for electronic devices. For example, such tubes can be used as a primary housing (see e.g., housing 11 of FIG. 1) or an earbud housing (see e.g., earbud 12 of FIG. 1). The following discussion describes different processes for creating a tube having an internal wall, for example, for supporting circuitry or electronic components. It will be understood, however that the processes and devices described can be used to create any suitable feature on the inner surface of a tubular structure.

FIG. 31 is a cross-sectional view of a tube having an internal wall 3104 in accordance with an embodiment of the present invention. Tube 3100 has a wall thickness 3102, and includes internal wall 3104 that extends inward perpendicular from the elongated axis of the tube. Internal wall 3104 has a thickness 3106 and a height 3108 (as measured from the outer surface of the tube). The discussion accompanying FIGS. 32-33, 34-36, 37-28, 39-40, and 41-43 respectively relate to various methods for creating tube 3100 in accordance with some embodiments of the present invention.

Known extrusion processes are unable to extrude tubes with internal features such as an internal wall (e.g., internal wall 3104). For example, known extrusion processes involve forcing a molten material through an aperture in order to create an object with a cross-sectional shape that is similar to the shape of the aperture. This type of process is incapable of producing tubes with discreet internal features because such a tube will have a cross-sectional shape that varies along the length of the tube. To overcome this limitation, existing processes require manufacturing a tube having a wall thickness equal to the required height of the feature (e.g., height 3108), and subsequently removing excess material around the feature using a machining process so that the final wall thickness meets the desired specification (e.g., thickness 3102). FIG. 32 is a cross section of an illustrative tube manufactured with a wall thickness that is thicker than the desired end product wall thickness in accordance with an embodiment of the present invention. Tube 3200 may be formed from any material (e.g., metal, plastic, or composite) using any suitable process (e.g., extrusion, impact extrusion, or progressive deep draw). Wall thickness 3202 may be selected based on the features that will be carved into tube 3200.

FIG. 33 is a perspective view of a cross section of the illustrative tube of FIG. 32 once the tube has been machined to include an internal wall in accordance with an embodiment of the present invention. To form internal wall 3204 in tube 3200, the entire inner surface 3201 of tube 3200 is machined to remove excess material around the internal wall and to reduce tube thickness 3202 to a desired wall thickness. This machining step may be time consuming, expensive, and difficult to implement, as it requires an experienced machinist and expensive tools. Furthermore, machining may also leave marks on the part, which may be undesired (e.g., for aesthetic reasons). Also, some features may include geometry or aspects that cannot be manufactured by machining (e.g., sharp angles not directly accessible from either end of the tube) or features that cannot be manufactured within the required tolerances (e.g., due to the inherent size of the machining tools).

To overcome the limitations of an entirely machined tube, a number of approaches may be used. FIG. 34 is an illustrative die and stamper for modifying the internal aspect of a tube in accordance with an embodiment of the present invention. Tube 3400 is extruded with the desired final thickness 3402 required for the tube. Tube 3400 is extruded to a slightly longer length 3403 than required for the final product, as the longer portion may be part of a cold-worked process that is used to create the internal wall. A die 3410 may be inserted in a first end of tube 3400 and inserted such that die end 3412 is aligned with a desired location of internal wall 3404 (see FIG. 36). Die 3410 may fit flush against the inside wall of tube 3400 and may be operative to maintain wall thickness 3402 when stamper 3420 is used to cold-work the tubing not in contact with die 3410. Stamper 3420 is then inserted into the second end of tube 3400, and a stamping force is applied to cold work the portion of tube 3400 located between the second end and die 3410. Stamper 3420 causes the wall thickness 3422 of tube 3400 to increase in the cold worked portion of tube 3400 by forcing the excess tube length to be cold-worked into the internal wall. The shape of stamper 3420 and the distance between the second end of tube 3400 and die end 3412 may be set to obtain the desired thickness for internal wall 3404.

FIG. 35 is an cross-sectional view of the tube of FIG. 34 after stamper 3420 and die 3410 are removed from tube 3400 in accordance with an embodiment of the present invention. After stamping, tube 3400 includes two thicknesses, thickness 3402 which is the expected final thickness of the tube, and thickness 3422, which corresponds a maximum possible height of any internal wall that may be machined from the thicker portion.

To create internal wall 3404, portions of inner surface 3401 of tube 3400 may be machined. FIG. 36 is a perspective view of the tube of FIG. 35 when the tube is machined to create an internal wall in accordance with an embodiment of the present invention. The portions of inner surface 3401 having thickness 3422 may be machined to thickness 3402 such that internal wall 3404 remains in tube 3400. Surface 3430 of FIG. 36 can identify the surfaces that are machined to complete tube 3400. An advantage of this process over the process described in FIGS. 32 and 33 is that the amount of machining required for the tube can be greatly reduced, as are costs.

Figure 37:
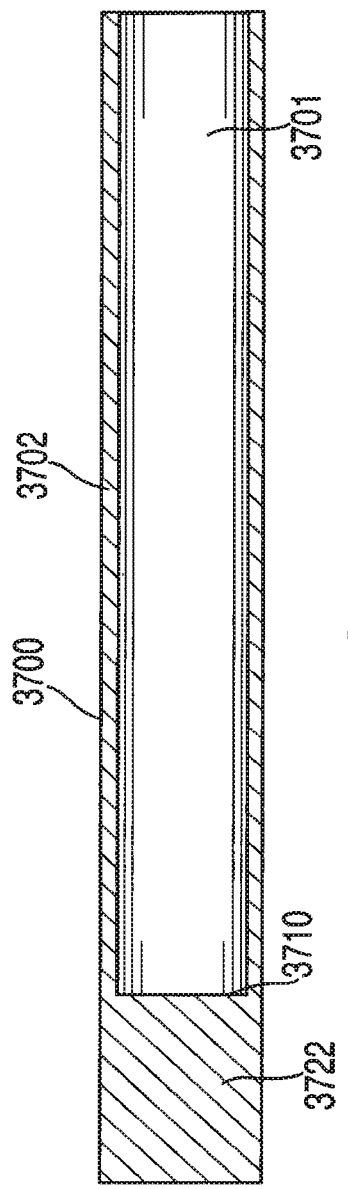
FIG. 37 is a cross-sectional view of an illustrative tube formed using a single impact extrusion in accordance with an embodiment of the present invention.

Another approach for forming features in a tube may include impact extrusion of one end of the tube. FIG. 37 is a cross section of an illustrative tube formed using impact extrusion in accordance with an embodiment of the present invention. Tube 3700 having wall thickness 3702 is formed using impact extrusion. Impact extrusion creates an indentation that extends to surface 3710, which corresponds to the surface of internal wall 3704 (FIG. 38) of tube 3700. The end of tube 3700 remains closed by material 3722.

Figure 38:
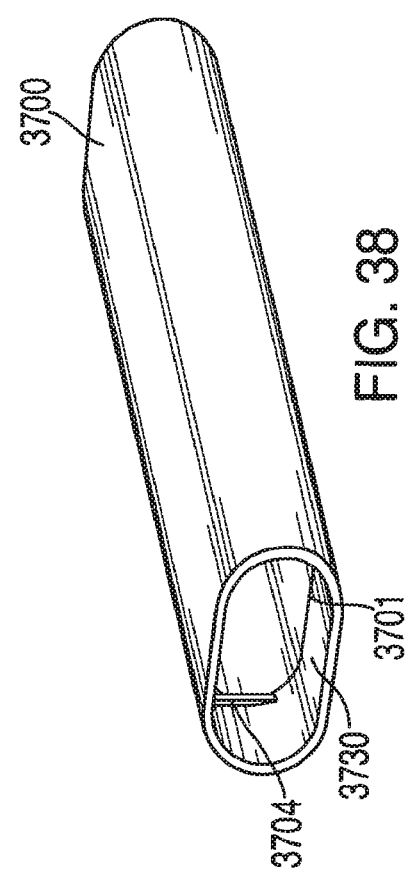
FIG. 38 is a perspective view of the tube of FIG. 37 once the tube is machined to create an internal wall in accordance with an embodiment of the present invention.

To complete tube 3700 and construct internal wall 3704, material 3722 may be machined. FIG. 38 is a perspective view of the tube of FIG. 37 when tube 3700 is machined to create an internal wall in accordance with an embodiment of the present invention. Material 3722 may be machined to leave inner surface 3701 of tube 3700 with thickness 3702, and with internal wall 3704 extending from inner surface 3701. Surface 3730 may represent the surface that is machined to create wall 3704. Similar to the process of FIGS. 34-36, this process is advantageous over the process described in FIGS. 32-33 because the amount of machining required for the tube can be greatly reduced.

Figure 39:
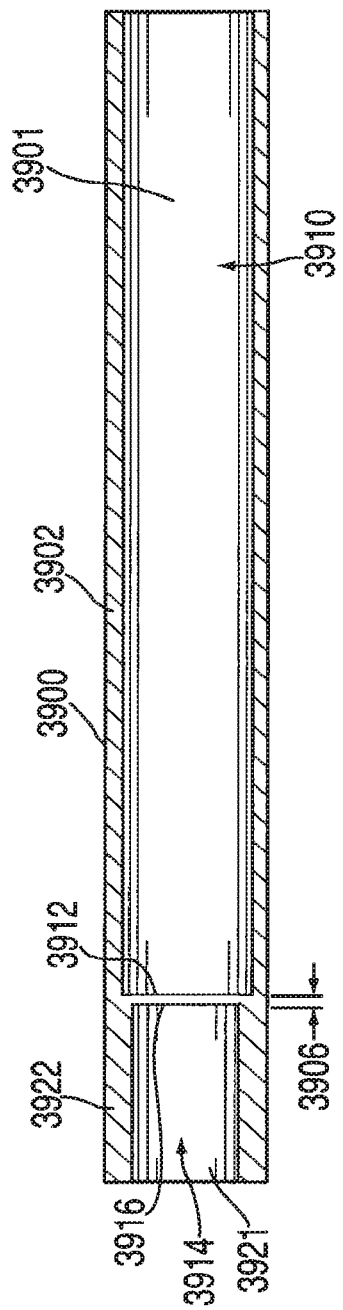
FIG. 39 is a cross-sectional view of an illustrative tube formed using a double impact extrusion in accordance with an embodiment of the present invention.

Another approach for forming features in a tube may include impact extrusion of both ends of a tube. FIG. 39 is a cross section of an illustrative tube 3900 formed using impact extrusion in accordance with an embodiment of the present invention. Tube 3900 having final wall thickness 3902 is formed using multiple impact extrusions. The impact extrusions create a first indentation 3910 that extends to surface 3912 with surrounding interior surface 3901 and a second indentation 3914 that extends to surface 3916 with surrounding interior surface 3921. The thickness of tube 3900 left by first indentation 3910 is thickness 3902, which may be the expected final thickness of the tube. The thickness of tube 3900 left by second indentation 3914 is thickness 3922. The difference between thickness 3902 and thickness 3922 may correspond to height 3908 of internal wall 3904.

In some embodiments, if internal wall 3904 is configured to be constrained between surfaces 3912 and 3916, the distance between surfaces 3912 and 3916 may correspond to the thickness 3906 of internal wall 3904.

Figure 40:
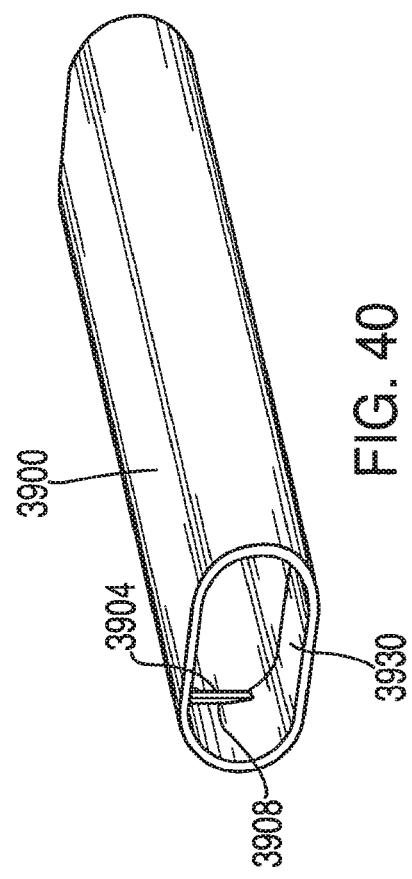
FIG. 40 is a perspective view of the tube of FIG. 39 once the tube is machined to create an internal wall in accordance with an embodiment of the present invention.

In embodiments where internal wall 3904 is constrained between surfaces 3912 and 3916, thickness 3922 may be the same as thickness 3902 (i.e., substantially the expected final thickness of tube 3900) because internal wall 3904 having height 3908 (as shown in FIG. 40) may be machined from the material left between surfaces 3912 and 3916. In such embodiments, height 3908 of internal wall 3904 may be determined by the machining process.

To complete tube 3900 and construct internal wall 3904, material between surface 3912 and 3916 may be machined. Material may also be machined from interior surface 3921. FIG. 40 is a perspective view of the tube of FIG. 39 once the tube is machined to create an internal wall in accordance with an embodiment of the present invention. In some embodiments, material may be machined to leave interior surface 3921 with thickness 3902, and with internal wall 3904 extending from interior surfaces 3901 and/or 3921. Surface 3930 of FIG. 40 identifies the surface that may be machined to complete tube 3900. Similar to the processes of FIGS. 34-36 and 37-38, this process is advantageous over the process described in FIGS. 32-33 because the amount of machining required for the tube can be greatly reduced.

Yet another approach for forming features in a tube may include a progressive deep draw process. FIG. 41 is a cross section of an illustrative tube formed using a progressive deep draw process in accordance with an embodiment of the present invention. Tube 4100 is constructed to have two consecutive indentations 4110 and 4114 having distinct wall thicknesses. Indentation 4110 has wall thickness 4102, which may be the expected final thickness of tube 4100, and indentation 4114 has wall thickness 4122. Tube 4100 may transition from indentation 4110 to indentation 4114 at plane 4112, which may correspond to the location of internal wall 4104 (FIG. 43) configured to be constructed in inner surface 4101 (FIG. 43) of tube 4100.

FIG. 42 is a perspective view of a cross section of the tube of FIG. 41 in accordance with an embodiment of the present invention. As shown in FIG. 42, tube 4100 is closed at the end of indentation 4114 by material 4124. To complete tube 4100 and construct internal wall 4104, material 4124 may be machined to open tube 4100, and indentation 4114 may be machined to reduce thickness 4122 to the thickness 4102 (e.g., the final expected thickness) while leaving internal wall 4104.

FIG. 43 is a perspective view of the tube of FIGS. 41 and 42 after the tube is machined to create an internal wall in accordance with an embodiment of the present invention. Surface 4130 of FIG. 43 identifies the surfaces that are machined to complete tube 4100. Similarly to the process of FIGS. 34-36, this process is advantageous over the process described in FIGS. 32-33 because the amount of machining required for the tube can be greatly reduced.

The following flow charts illustrate methods for forming a tube with a feature on the internal surface of the tube using embodiments of the invention described above. Internal features may include, for example, a wall, a protrusion, an aperture, a snap, a shelf, or any other suitable feature. FIG. 44 is a flow chart of an illustrative process for forming an extruded tube with a feature on the internal surface of the tube using a die and stamper in accordance with an embodiment of the present invention. Process 4400 begins at step 4410. At step 4410, a tube is extruded and cut to a length that is slightly longer than the desired finished length. At step 4420, a die is inserted in one end of the tube, such that the end of the die placed in the tube extends to a desired location where the feature is intended to exist in the tube.

At step 4430, a stamper is inserted in the second end of the tube. At step 4440, a force is applied to the stamper to force excess material into the tube, thus cold working the tube to increase the thickness of the tube in the region adjacent the stamper. At step 4450, the tube is machined to form the feature. Process 4400 then ends at step 4450.

FIG. 45 is a flow chart of an illustrative process for forming a tube with a feature on the internal surface of the tube using a single impact extrusion in accordance with an embodiment of the present invention. Process 4500 begins at step 4510. At step 4510, an indentation is formed in the material of the tube by impact extrusion such that the end of the indentation aligns with a desired location of the feature in the tube. At step 4520, the closed end of the material is machined to form the tube and the feature. Process 4500 then ends a step 4520.

FIG. 46 is a flow chart of an illustrative process for forming a tube with a feature on the internal surface of the tube using a impact extrusion on both ends of the tube in accordance with an embodiment of the present invention. Process 4600 begins at step 4610. At step 4610, a first indentation is formed in the material of the tube using a first impact extrusion. At step 4620, a second indentation opposing the first indentation is formed in the material using a second impact extrusion. The ends of the first and second indentations may be configured to align with the boundaries of the feature. At step 4630, the feature is machined in the material remaining between the first and second indentations. Process 4600 then ends at step 4630.

In an alternative embodiment of the present invention, steps 4610 and 4620 can be combined into one step, as indicated by the dotted line around steps 4610 and 4620 in FIG. 46. That is, the first and second indentations can be formed using a single impact. Advantageously, this can be more efficient than forming first and second indentations from two impacts.

FIG. 47 is a flow chart of an illustrative process for forming a tube with a feature on the internal surface of the tube using a progressive deep draw process in accordance with an embodiment of the present invention. Process 4700 begins at step 4710. At step 4710, first and second indentations are formed consecutively using a progressive deep draw process. The interface between the first and second indentations may be configured such that the feature is located at the interface. At step 4720, the material closing the tube (i.e., not removed by the progressive deep draw process) is removed. At step 4730, the feature is machined in the inner surface of the tube.

Process 4700 then ends at step 4730.

It is understood that any of the processes described above in connection with providing a wall in the inner surfaces of a tube may be used to form any other suitable feature on the inner surface of a tube. In addition, it is understood that these processes may be used for non-extruded and non-tubular components. It is also understood that any of the processes described above can be applied to a component formed from injection molded plastic or any other material.

In order to convey information, such as device status, visual indicator systems can be included in a headset. One type of indicator system can emit different colors of light to indicate what a device is doing. For example, a system in a headset can emit a green light if it is in a telephone conversation and a blinking red light if the battery power is low.

Figure 48:
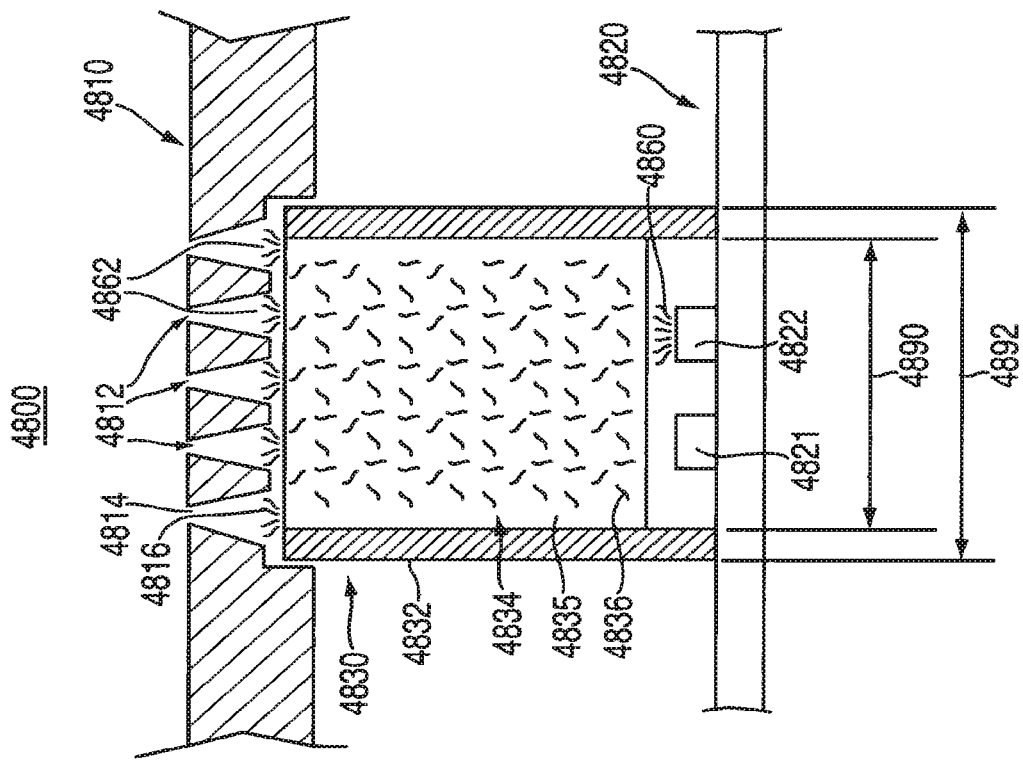
FIG. 48 is a cross-sectional view of a visual indicator system in accordance with an embodiment of the present invention.

FIG. 48 shows a simplified cross-sectional view of a visual indicator system 4800 for a headset in accordance with an embodiment of the present invention. Visual indicator system 4800 can, for example, correspond to display system 18 of FIG. 1, system 700 of FIG. 7, or display 1013 of FIG. 10. One or more light sources 4821 and 4822 can be integrated into system 4800. Light sources 4821 and 4822 can be, for example, LEDs that each emit a different color of light. Each color or combination of colors can be used to signify different information (e.g., the mode of a headset or a function the headset is performing).

Light sources 4821 and 4822 can be mounted onto circuit board 4820. Through circuit board 4820, the light sources can be electrically coupled with driver circuitry (see e.g., LED driver 1424 of FIG. 14) that is operable to activate each source individually or in combination. A detailed description of circuitry with this functionality can be found in U.S. Patent Application No. 60/878,852 entitled "Systems and Methods for Compact Multi-State Switch Networks," which is incorporated herein.

It is understood that, while the embodiment shown in FIG. 48 uses two separate light sources (e.g., light sources 4821 and 4822), any number of light sources can be provided without deviating from the spirit and scope of the present invention. In some embodiments, a single light source device can be provided that includes two LEDs such that the device can emit light from either of the LEDs or a combination of the two LEDs. For example, a light source device can be provided that includes a green LED and a red LED. Such a light source device may, for example, emit green light when activating only the green LED, red light when activating only the red LED, and amber light when activating both LEDs in combination.

Microperforations 4812 can be provided in housing 4810 so that light sources 4821 and 4822 are visible to a user. Outer apertures 4814 of microperforations can have a small diameter so that they are imperceptible to a user when light sources 4821 and 4822 are off. The diameter of inner apertures 4816 can be of a larger size so that they can guide more light through the microperforations. A detailed description of microperforations and their fabrication can be found in U.S. patent application Ser. Nos. 11/456,833 and 11/551,988 which are both entitled "Invisible, Light-Transmissive Display System," and which are both incorporated herein. For the purposes of illustration, only five microperforations are shown in FIG. 48, however a much larger number of microperforations can be used without deviating from the spirit of the present invention. It is further understood that none of the elements of FIG. 48, including microperforations 2402, are drawn to scale.

While the incorporated U.S. patent application Ser. Nos. 11/456,833 and 11/551,988, both entitled "Invisible, Light-Transmissive Display System," describe microperforations for use with display systems, microperforations can also be used as acoustic ports in accordance with the present invention. For example, one or more microperforations can be provided such that acoustic pressure can pass through the microperforations and exit a volume. For example, acoustic ports 1021 and 1022 of FIGS. 10A and 10B may be composed of a plurality of microperforations in earbud 1020.

Light diffuser 4830 can be located between circuit board 4820 and an inner wall of housing 4810. Light diffuser 4830 can, for example, be made of a polycarbonate with sections of varying opacity. Outer core 4832 of diffuser 4830 can be made from a substantially opaque material such that light from light sources 4821 cannot pass through the core. Outer core 4832 can be substantially opaque in that it can transmit 0% to 20% of light. For example, if outer core 4832 is substantially opaque it can deflect light back into inner core 4834 such that the light doesn't exit the sides of the diffuser.

Inner core 4834 can be located within the inner wall of outer core 4832. The inner core 4834 of diffuser 4830 can be made from, for example, a combination of substantially transparent or translucent substrate 4835 and diffusing particles 4836 such that the particles are suspended in the substrate. In some embodiments, substrate 4385 can be substantially transparent in that it can transmit 80% to 100% of light. In other embodiments, substrate 4385 can be translucent such that it transmits any 0% to 100% of light. Both substrate 4835 and particles 4836 can be, for example, made from polycarbonate materials of different opacities. Particles 4836 can be made from an opaque or translucent material that alters the path of light through inner core 4834. Particles 4836 can have any form (e.g., a sphere, a cylinder, a cube, a prism, or an uneven form). In some embodiments, each of particles 4836 can have a different form to simplify manufacturing. The combination of substrate 4835 and particles 4836 can thoroughly diffuse light from the light sources when it exits the top of inner core 4834. That is, the light from light sources 4821 and 4822 can be evenly spread across the top surface of inner core 4834 so that a user detects an even intensity of light exiting microperforations 4812.

It is understood that other diffusion means can be used without deviating from the spirit and scope of the present invention. For example, surface textures, coatings or labels can be applied to a light transmissive material such that any light passing through the material is substantially diffused.

Inner core 4834 can have a sufficient width 4890 so that it surrounds the footprint of light sources 4821 and 4822. In one embodiment, inner core width 4890 can be approximately 1.7 millimeters (e.g., between 1.5 millimeters and 1.9 millimeters), and the width 4892 of outer core 4832 can be approximately 2.8 millimeters (e.g., between 2.6 millimeters and 3.0 millimeters). In some embodiments, the width of the end of the diffuser proximal to circuit board 4820 can be different from the width of the end of the diffuser proximal to housing 4810. For example, diffuser 4830 can be in shape similar to a cone such that the width of the end of the diffuser proximal to housing 4810 is smaller than the width of the diffuser proximal to circuit board 4820. In other words, diffuser 4830 can, for example, be in the shape of a cone having a flattened top.

The bottom surface of outer core 4832 can extend below the bottom surface of inner core 4834 so that the outer core can be mounted to circuit board 4820 without the inner core damaging light sources 4821 and 4822. The outer core 4832 can be attached to circuit board 4820 using, for example, an adhesive or any other suitable material.

In FIG. 48, light source 4822 is activated and emitting light 4860. Because of the effect of light diffuser 4830, light 4862 can be evenly distributed as it exits the diffuser, thereby making it difficult for a person to discern whether the light is being generated by light source 4821 or light source 4822.

Figure 49:
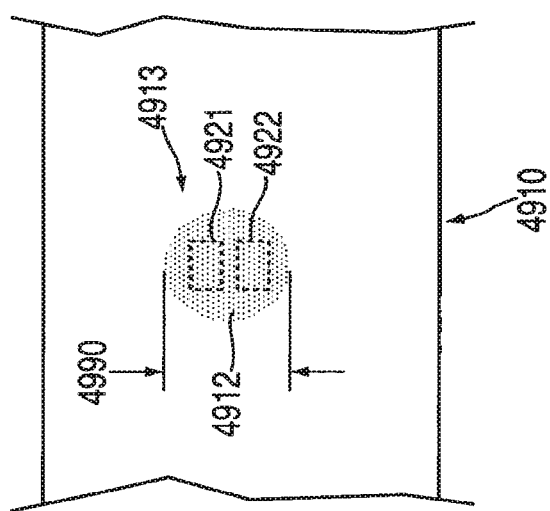
FIG. 49 is an illustration of a visual indicator system of a headset in accordance with an embodiment of the present invention.

FIG. 49 shows the exterior of an embodiment of headset 4910 that includes visual indicator 4913 in accordance with an embodiment of the present invention. Headset 4910 may correspond to headset 10 of FIG. 1, for example. The embodiment shown in FIG. 49 uses LEDs 4921 and 4922 as light sources and includes a cylindrical light diffuser. Visual indicator 4913 can include microperforations 4912 which allow a user to see light being emitted from LEDs 4921 and 4922. A light diffuser can be included between the LEDs and microperforations 4912 so that the diffused light seen by a user is equally distributed over the microperforations. The diameter 4990 of the microperforated area can be substantially similar to or smaller than the diameter of the diffuser's inner core. Diameter 4990 can be, for example, approximately 1.7 millimeters (e.g., between 1.5 millimeters and 1.9 millimeters).

Alternatively, the size and shape of the microperforated area could be different from that of the light diffuser. For example, a microperforated area with a noncircular shape can be placed over a light diffuser so that a noncircular indicator is generated. Similarly, the shape of the light diffuser can be non-cylindrical. Moreover, the light diffuser can be larger than the microperforated area so that it can cover the footprint of any other light sources that might be included.

Numerous light sources of different colors can be used in conjunction with a light diffuser as described above in order to present a visual indicator to a user. Because of the effect of the material in the light diffuser, light from each different source may appear evenly distributed over an area. In this manner, the entire indicator can appear to change colors as different light sources are activated.

FIG. 50A includes a side view of headset 5000 in accordance with an embodiment of the present invention. Connector 5040 can include primary housing 5010, connector plate 5041, contacts 5043, casing 5044 and microphone port 5050. Connector plate 5041 can include recessed groove 5042 which runs around the perimeter of connector plate 5041.

Groove 5042 can also be referred to as a recessed step in connector plate 5041. At the top of connector plate 5041, a microphone port 5050 can be located in groove 5042.

There are many benefits associated with placing microphone port 5050 along the edge of connector plate 5041. By including the microphone port near the connector plate, the microphone can be embedded in the connector which saves space inside the headset housing. The space that is saved can be used to incorporate other functionality or decrease the overall size of the headset. Moreover, locating the microphone port in the groove around the edge of the connector can hide it from view which increases the overall aesthetic appearance of the headset FIG. 40B shows a detailed view of the microphone port area of a connector in accordance with an embodiment of the present invention. The dimensions of port 5050 can include, for example, a width 5090 of approximately 2.5 millimeters and a height 5092 of approximately 0.3 millimeters. These dimensions are merely illustrative and it is understood that other dimensions may be practiced.

Figure 51:
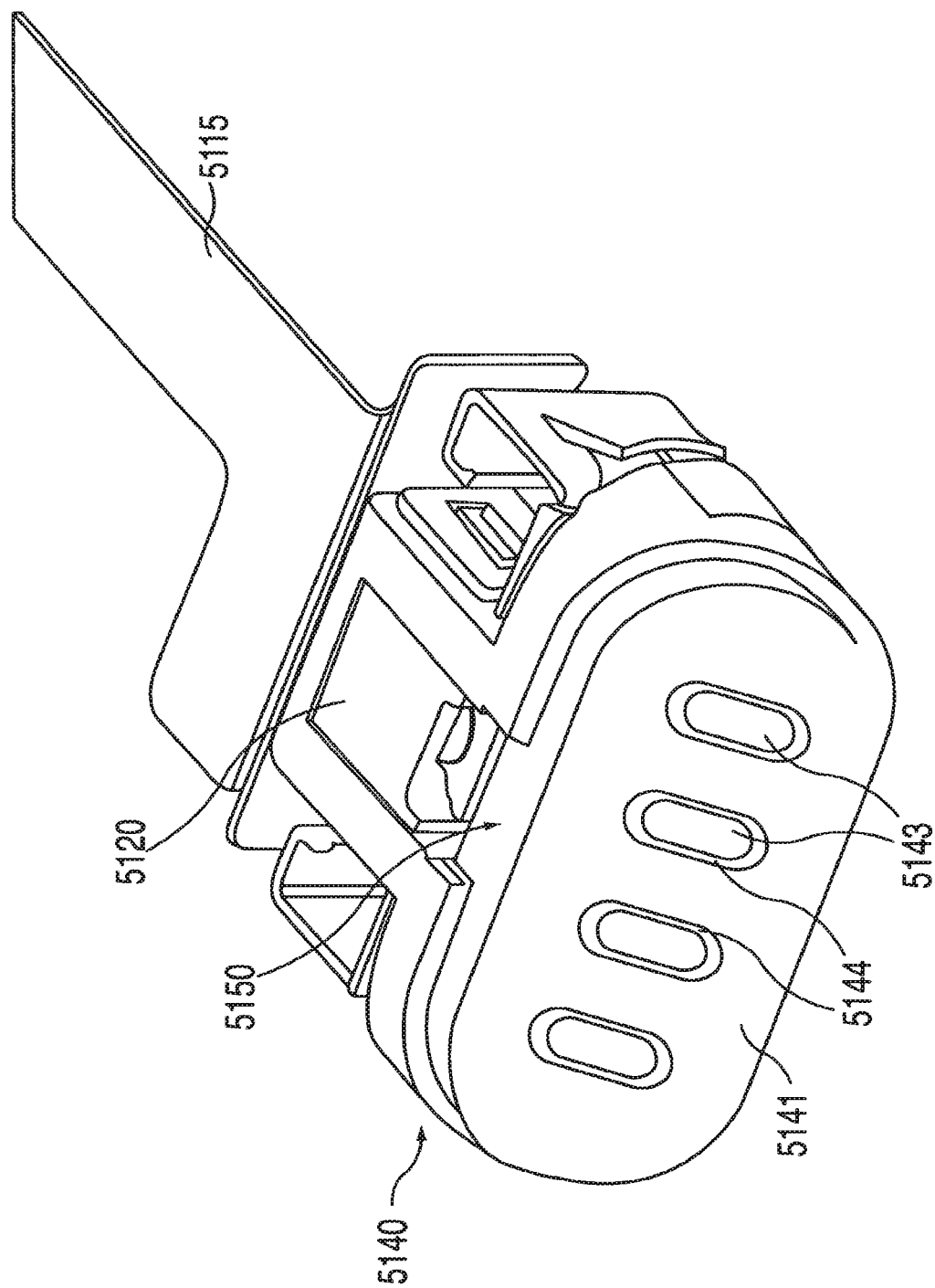
FIG. 51 is an illustration of a connector in accordance with an embodiment of the present invention.

FIG. 51 shows a view of connector 5140 with the primary housing removed in accordance with an embodiment of the present invention. Connector 5140 can, for example, correspond to connector 16 of FIG. 1, assembly 320 of FIG. 3, assembly 420 of FIG. 4, connector 1040 of FIG. 10, or connector 1140 of FIG. 11. Connector 5140 can be mounted up primary housing circuit board 5115, for example.

Connector 5140 can include connector plate 5141, contacts 5143 and accompanying casing 5144 to prevent the contacts from electrically coupling with the connector plate. Microphone port 5150 can be included in the top of connector plate 5141 to allow sound to reach microphone boot 5120. Microphone boot 5120 and a microphone contained therein can be located behind connector plate 5141. The microphone can be contained within microphone boot 5120 to, for example, protect the microphone from damage and control the flow of air into the microphone.

Figure 52:
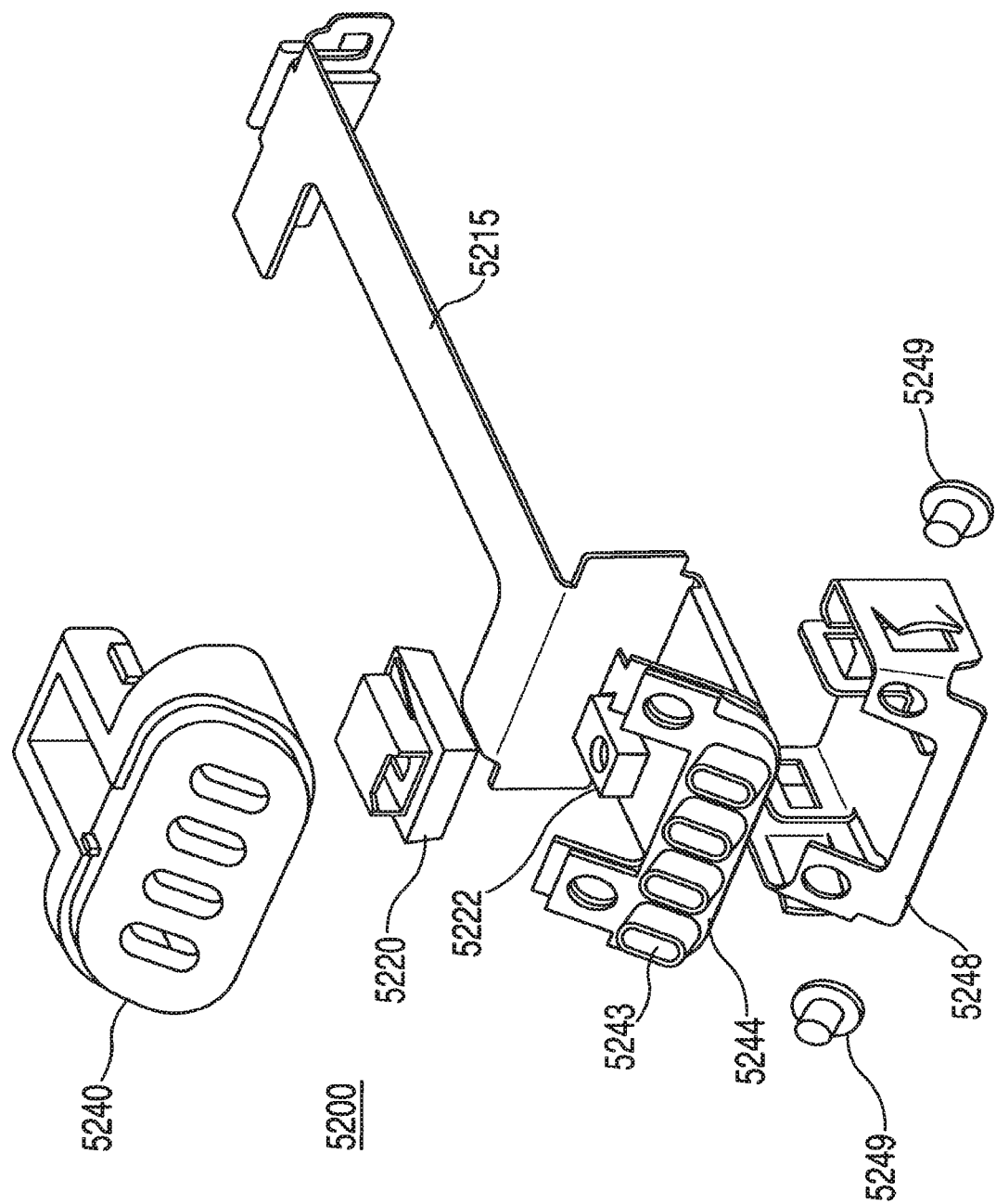
FIG. 52 is an exploded view of a connector in accordance with an embodiment of the present invention.

FIG. 52 shows an exploded view of connector 5140 of FIG. 51 which can include, for example, connector plate 5240, microphone boot 5220, microphone 5222, contacts 5243, casing 5244, bracket 5248 and screws 5249 in accordance with an embodiment of the present invention. Microphone 5222 can be a MEMs microphone and can be electrically coupled with circuit board 5215. Circuit board 5215 is similar to primary housing circuit board 1115 of FIG. 11. Microphone boot 5220 can mount over microphone 5222. Microphone boot 5220 can, for example, be made of silicon so that it can seal with surrounding parts when connector 5200 is assembled. Contacts 5243 can be included in casing 5244.

Casing 5244 can be made of a non-conductive material (e.g., polymeric) so that contacts can not be electrically coupled with connector plate 5240.

Casing 5244 can be mounted onto circuit board 5215 and include conductive elements (see e.g., shank 5707 and contact segment 5708 of FIG. 57B) which can electrically couple contacts 5243 with circuit board 5215. Bracket 5248 can couple with connector plate 5240 in order to hold connector 5200 together. Upward pressure from bracket 5248 can compress microphone boot in order to create an acoustic (e.g., substantially air-tight) seal for the passage of air into and out of microphone 5222. Circuit board 5215, casing 5244 and bracket 5248 can include one or more apertures for mounting to connector plate 5240.

Screws 5249 can be inserted through these apertures and screwed into threaded cavities (see e.g., cavities 6046) on the back of connector plate 5240.

Figure 53:
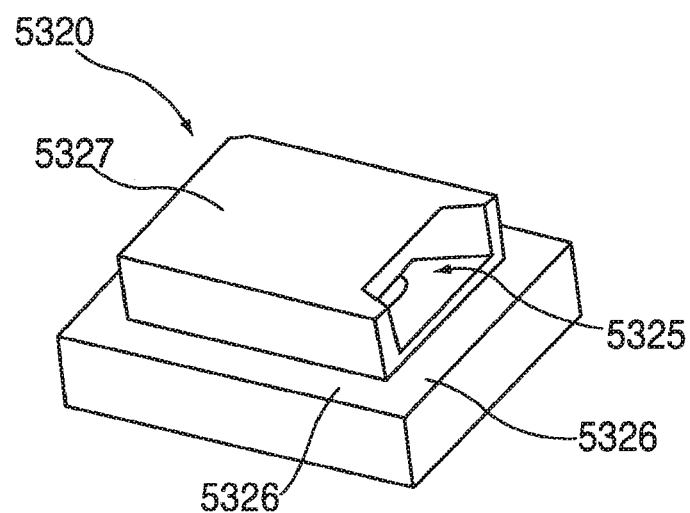
FIG. 53 is an illustration of a microphone boot in accordance with an embodiment of the present invention.

FIG. 53 shows a view of microphone boot 5320 which can include input aperture 5325 in accordance with an embodiment of the present invention. Microphone boot 5320 can, for example, correspond to microphone boot 5220 of FIG. 52. Air that flows into a headset by going around microphone boot 5320 can cause a noticeable loss in the quality of the audio signals picked up by a microphone in the boot. Therefore, microphone boot 5320 can include sealing surface 5326 to prevent air from leaking through any seams along the edge of the microphone boot. Sealing surface 5326 can be a horizontal surface of boot 5320 that extends to the perimeter of the boot's footprint. Sealing seams in this manner can direct the flow of air into aperture 5325 which can result in higher sound quality being received by the microphone.

Traditionally, the roof of a microphone boot creates a seal with the surfaces of surrounding parts. This can require a thicker roof which is structurally robust enough to support the pressure required to make an adequate seal. Because boot 5320 uses horizontal sealing surface 5326 (instead of roof 5327) to seal with surrounding parts, roof 5327 does not need to be very thick. This reduced thickness saves space in a housing and can result in a generally smaller or thinner headset.

Figure 54:
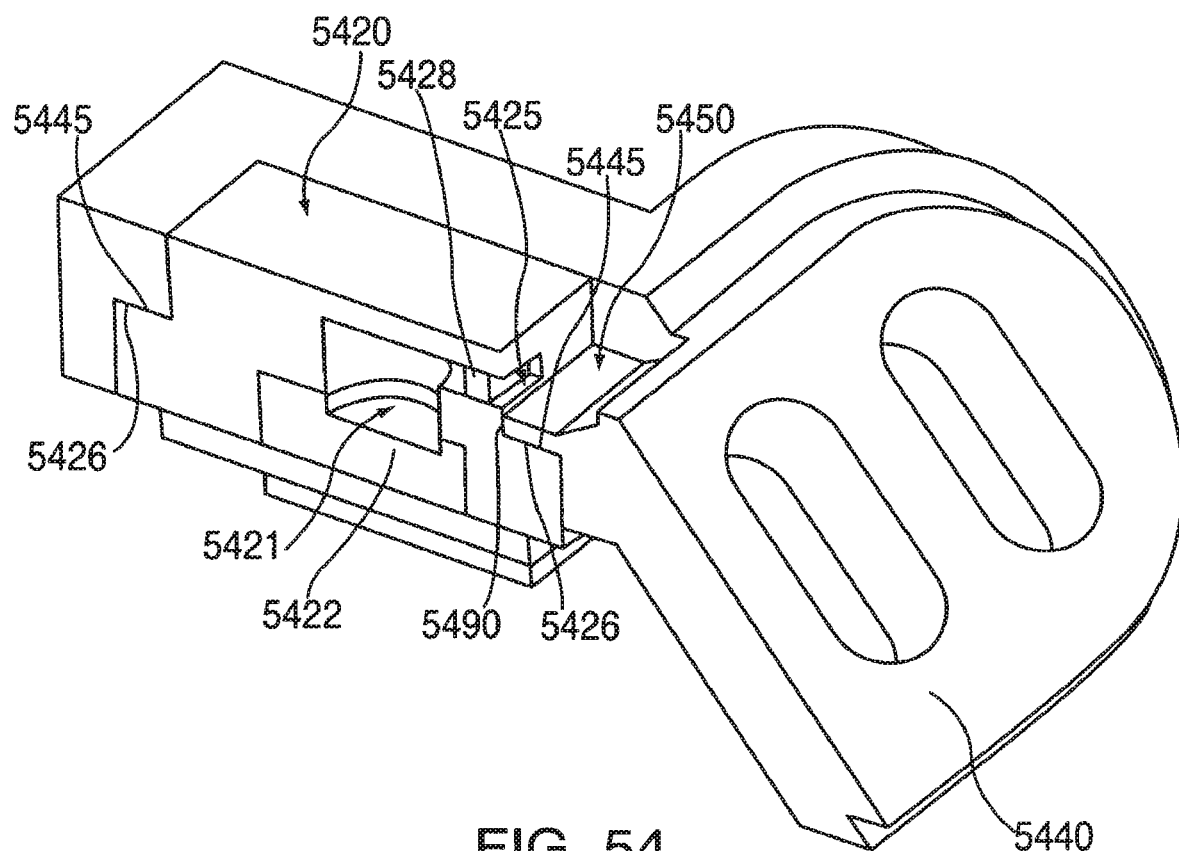
FIG. 54 is a cross-sectional view of a connector in accordance with an embodiment of the present invention.

FIG. 54 shows a perspective, cross-sectional view of connector plate 5440 which includes microphone boot 5420 and microphone 5422 in accordance with an embodiment of the present invention. Connector plate 5440, boot 5420 and microphone 5422 can, respectively, correspond to connector plate 5240, booth 5220 and microphone 5222 of FIG. 52, for example. The components shown in FIG. 54 can fit together so that air can pass through microphone port 5450, into boot aperture 5425 and reach microphone input 5421. Microphone port 5450 may, for example, be a cut-out in the recessed step of connector plate 5440. Because of other elements in the connector assembly (e.g., circuit board 5215 and bracket 5248), microphone 5422 and microphone boot 5420 can be pushed up against connector plate 5440 when installed in a headset. The pressure from this force can cause surface 5426 to form a seal with surface 5445 of connector plate 5440. This seal can prevent air from passing through seam 5490 in between connector plate 5440 and microphone boot 5420.

In some embodiments, porous plug 5428 may be provided in boot aperture 5425. Plug 5428 may be, for example, made from a porous foam (e.g., sintered polyethylene or super high-density polyethylene).

Plug 5428 can help filter out high-frequency noises such as those generated by wind blowing into microphone port 5450. The acoustical performance of plug 5428 can be a factor of its porosity which can be controlled by manufacturing. For example, plug 5428 can be manufactured by melting particles of polyethylene together. The porosity of the resulting plug can be a function of how long the particles are melted, what temperature is used to melt the particles, and the particles size. In some embodiments, it may be advantageous to only use polyethylene particles of a certain size when forming plug 5428. For example, particles with a diameter between 177 microns and 250 microns may be melted to form plug 5428.

Figure 55B:
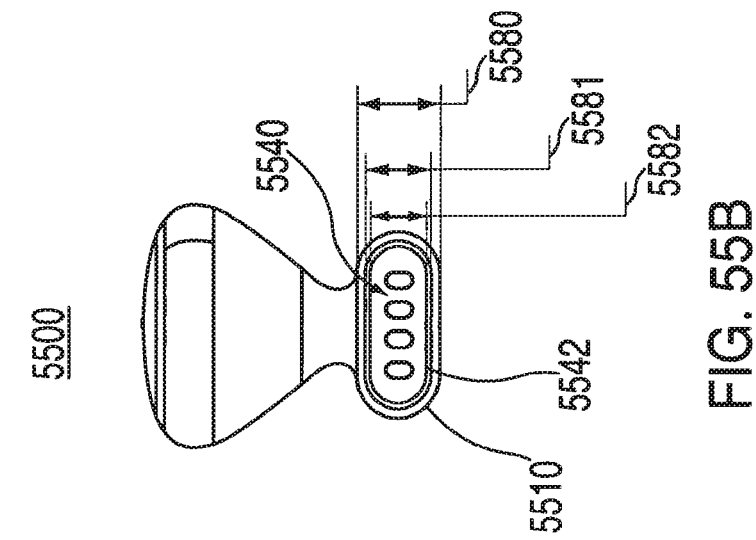
FIGS. 55A-55D are illustrations of a headset in accordance with an embodiment of the present invention.
Figure 55A:
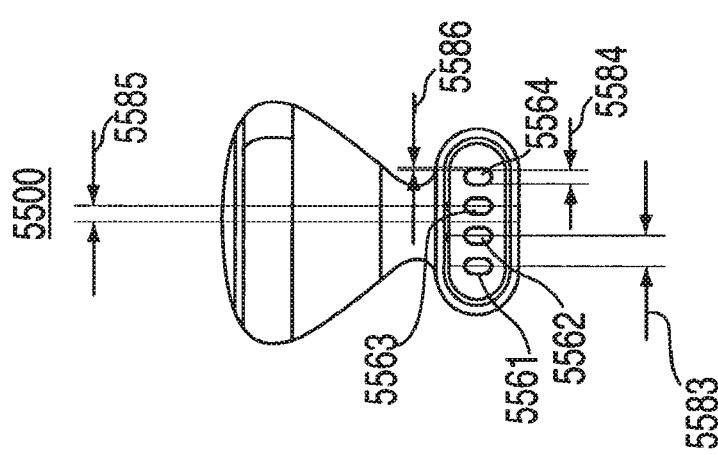

FIGS. 55A and 55B show views of the connector of headset 5500 in accordance with an embodiment of the present invention. Four contacts 5561, 5562, 5563 and 5564 can be integrated into the connector. The contacts can be of a substantially flat shape so that they are flush with the face of connector plate 5540. The contacts can, for example, be of an oval shape. The outer contacts 5561 and 5564 can be configured for coupling to either a power supply line or a ground line. The remaining inner contacts 5562 and 5563 can be configured for receiving and transmitting data.

Connector plate 5540 can be located within primary housing 5510 and can include recessed groove 5542. Height 5580 of primary housing 5510 can be approximately 5 millimeters or can be from a range between 4.7 and 5.3 millimeters. Height 5581 of the interior cavity of primary housing 5510 can be approximately 4 millimeters or can be from a range between 3.7 and 4.3 millimeters. Height 5582 of the raised face of connector plate 5540 can be approximately 3.3 millimeters or can be from a range between 3.0 and 3.6 millimeters. Heights 5580, 5581 and 5582 can be advantageous because they can provide a headset having a small form-factor yet large enough to adequately couple with a complementary connector. Heights 5581 and 5582 can also provide an adequate groove for sound from a user's voice to reach a microphone embedded in connector plate 5540 (see e.g., microphone 17 of FIG. 1). It is understood that these dimensions are merely illustrative. It is also understood that connector plate 5540 and the aperture in primary housing 5510 are angled with respect to the axis of primary housing 5510, and heights 5580, 5581 and 5582 reference the orthogonal heights of the corresponding elements.

Connector plate 5540 can include four contacts 5561, 5562, 5563 and 5564 which can be separated by pitch 5583, which can be approximately 2 millimeters or from a range between 1.75 and 2.25 millimeters. Pitch can be defined as the distance from the centerline of a contact to the centerline of the nearest contact. Pitch 5583 can be advantageous because it can allow contacts on complementary connectors (see e.g., connector 6200 of FIGS. 62A and 62B) to be sufficiently spaced apart such that magnetic components can be provided between the contacts.

Each contact can have a width 5584, which can be approximately 0.7 millimeters or from a range between 0.5 and 0.9 millimeters. The ring of exposed casing can have a width 5586 of approximately 0.2 millimeters or can be from a range between 0.12 and 0.3 millimeters. All of the rings of exposed casing can have the same width (e.g., width 5586). Width 5586 can be advantageous because it is large enough to prevent contacts 5561, 5562, 5563 and 5564 from shorting with connector plate 5540, but small enough to not impact the size of connector plate 5540. The contacts can be arranged on the face of connector plate 5540 so that they are symmetrical about the centerline of headset 5500. Dimension 5585, which represents the distance from the centerline of each contact to the centerline of the headset, can be approximately 1 millimeter. The dimensions of contacts 5561-5564 can be advantageous because the dimensions can provide a sufficient surface for coupling with a corresponding connector while maintaining a small form-factor headset. For example, if the contacts were much larger, the size of housing 5510 may need to increase.

Figure 55C:
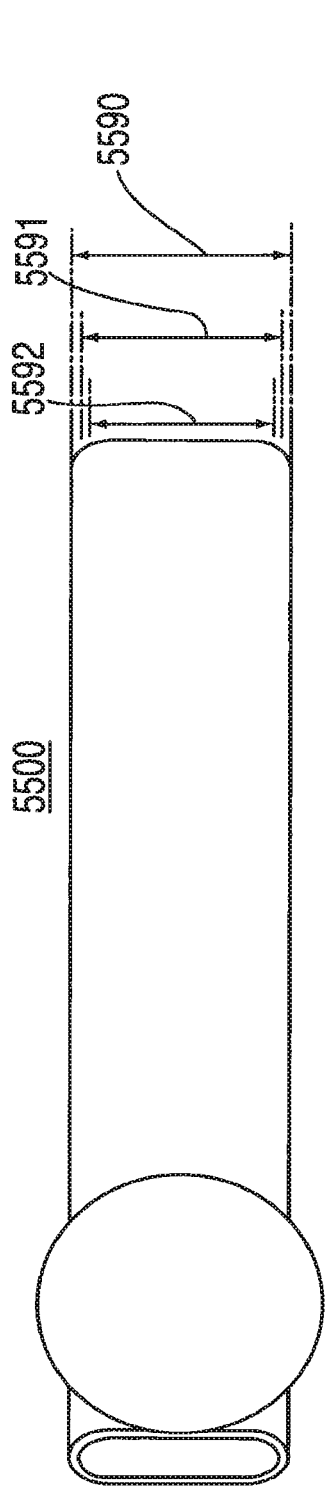

FIG. 55C includes a side view of headset 5500 in accordance with an embodiment of the present invention. The angle between the face of connector plate 5540 and the axis of primary housing 5510 can be represented by angle 5587, which can be approximately 55 degrees or from a range between 10 and 80 degrees. Angle 5587 can be advantageous because it can provide a suitable angle for mating headset 5500 with a corresponding connector. Angle 5587 may also provide an appropriate angle for reflecting sound from a user's mouth to the microphone of headset 5500 (see e.g., microphone 17 of FIG. 1). Angle 5587 can also be provided to block outside sounds from the microphone of headset 5500.

As measured along the surface of connector plate 5540, the height 5588 of each contact can be approximately 1.5 millimeters. Height 5588 can be advantageous because it provides a substantial surface area for headset 5500 to couple with corresponding headsets but does not necessarily cause an increase in the size of housing 5510.

The connector plate 5540 can be recessed in primary housing 5510 by a depth 5589 of approximately 0.25 to 0.3 millimeters. This depth can be determined by measuring the distance between the face of connector plate 5540 and a plane defined by the end of primary housing 5510 (e.g., a plane including three points on the connector end of primary housing 5510). Depth 5589 can be advantageous because it can provide a sufficient depth to strengthen the mechanical link between headset 5500 and a corresponding connector, but not be of such a large depth that it becomes difficult to align the headset with such a connector.

Figure 55D:
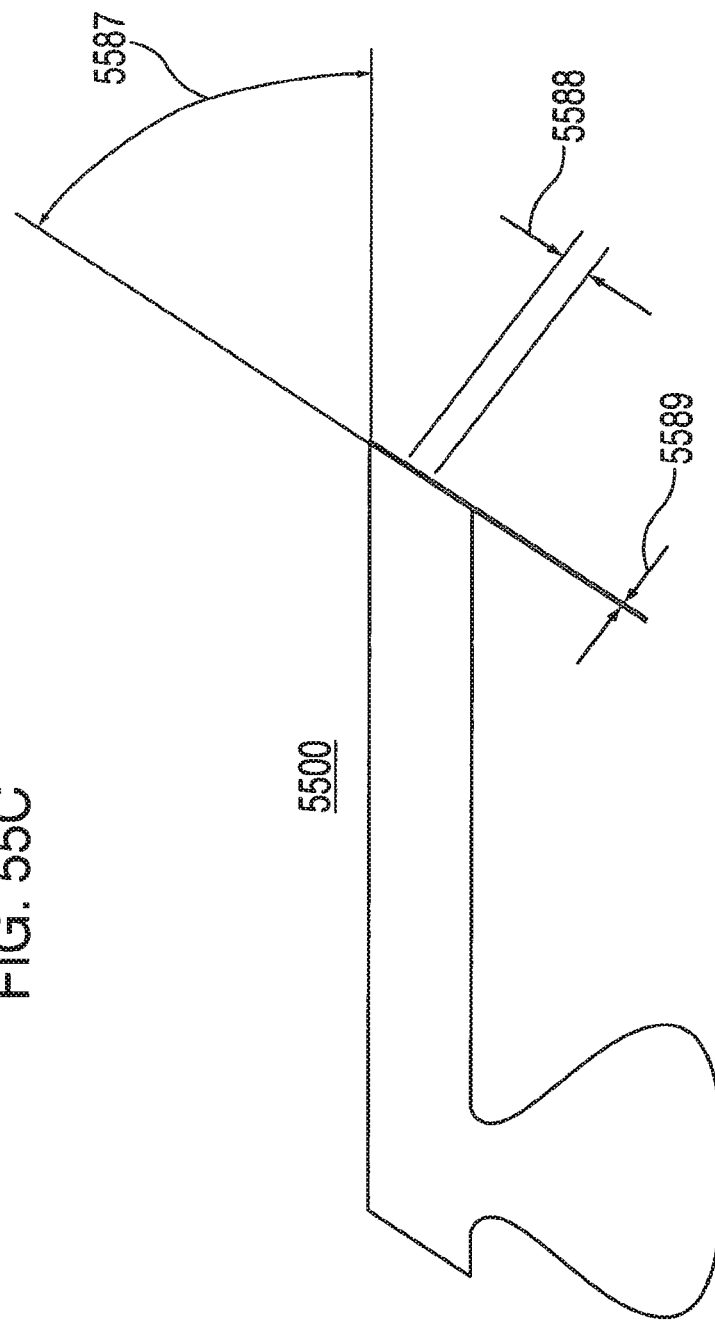

FIG. 55D includes a top view of headset 5500 in accordance with an embodiment of the present invention. Width 5590 of primary housing 5510 can be approximately 12.3 millimeters or can be from a range between 10 and 14 millimeters. Width 5591 of the interior cavity of primary housing 5510 can be approximately 11.1 millimeters or can be from a range between 7 and 13 millimeters. Width 5592 of the raised face of connector plate 5540 can be approximately 10.3 millimeters or can be from a range between 5 and 11 millimeters. Widths 5590, 5591, and 5592 can be advantageous because they can provide a large enough area for headset 5500 to securely couple with a complementary connector, while not being so large so as to prevent headset 5500 from having a small form-factor. The dimensions given above apply to the embodiments shown in 55A, 55B, 55C and 55D and it is understood that other dimensions can be used without deviating from the scope of the present invention.

Figure 56:
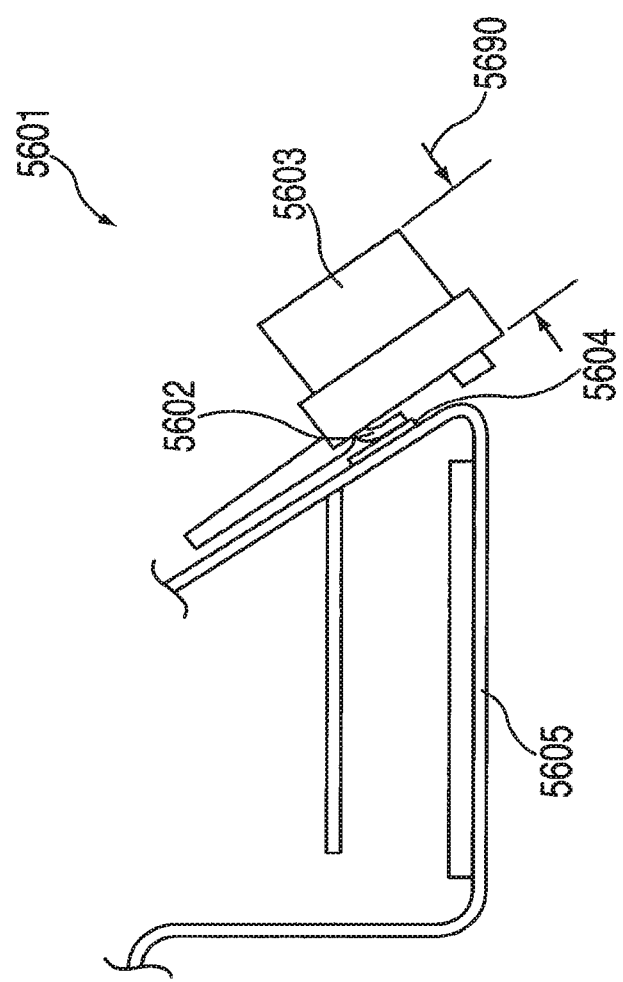
FIG. 56 is a cross-sectional view of an electrical contact assembly coupled to a circuit board in accordance with an embodiment of the present invention.

FIG. 56 illustrates an assembly of electrical contacts for connector 1040 in accordance with an embodiment of the present invention. Assembly 5601 can include plurality of electrical contacts 5602 disposed in non-conductive (e.g., polymeric) casing 5603. Casing 5603 can include protruding members such that each protruding member can extend through a cavity in a connector plate. In FIG. 52, for example, casing 5244 includes four protruding members and connector plate 5240 includes four cavities (or apertures). When casing 5244 is coupled with connector plate 5240, the casing's protruding members will fill those cavities. Accordingly, each protruding member can be referred to as a protruding cavity member as well. Electrical contacts 5602 can extend through at least a portion of depth 5690. In an assembled headset, each electrical contact 5602 can have a portion disposed in electrical contact with electrical contact 5604 of circuit board 5605, which can be flexible or rigid.

Figure 57A:
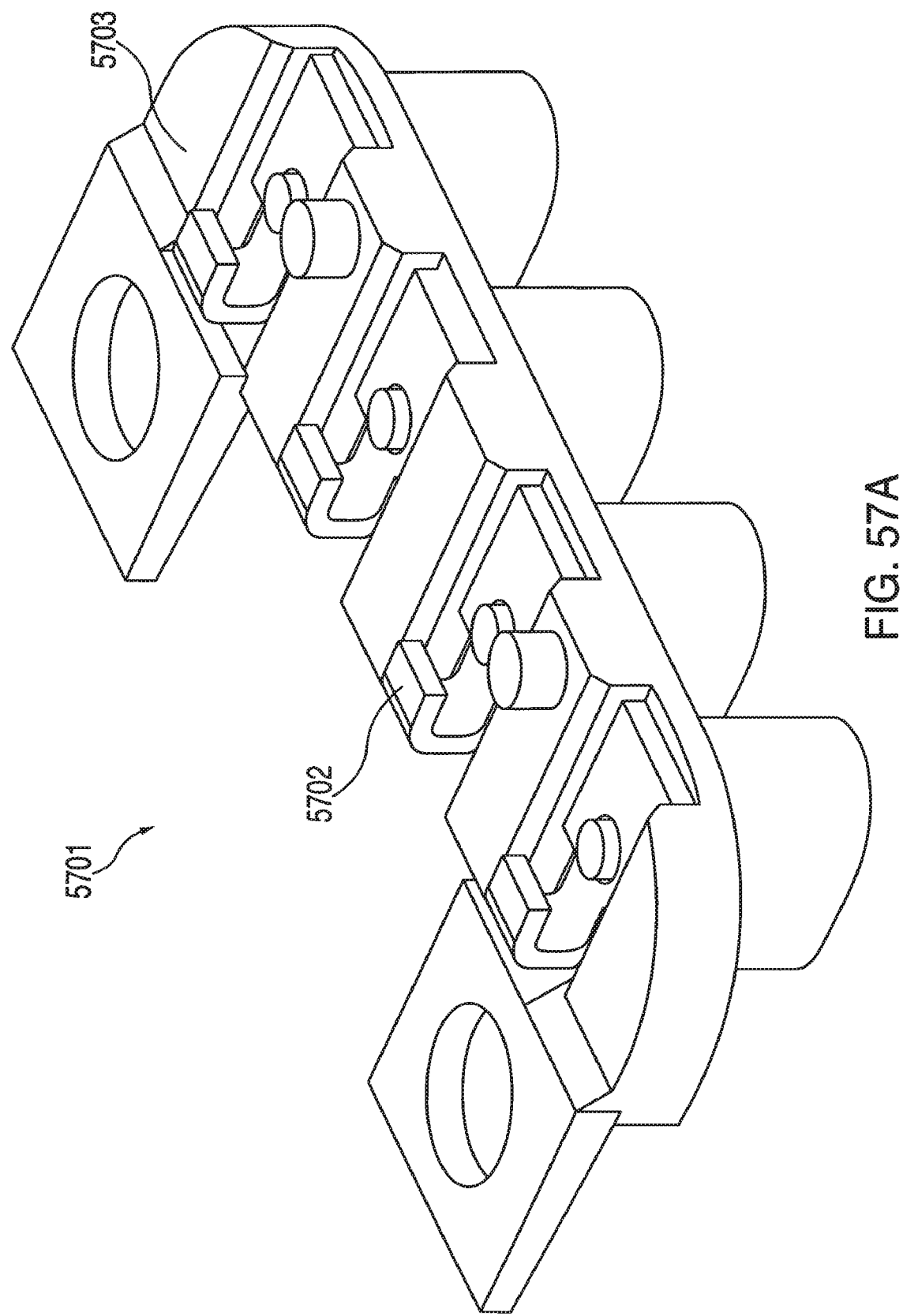
FIGS. 57A and 57B are illustrations of an electrical contact assembly in accordance with an embodiment of the present invention.
Figure 57B:
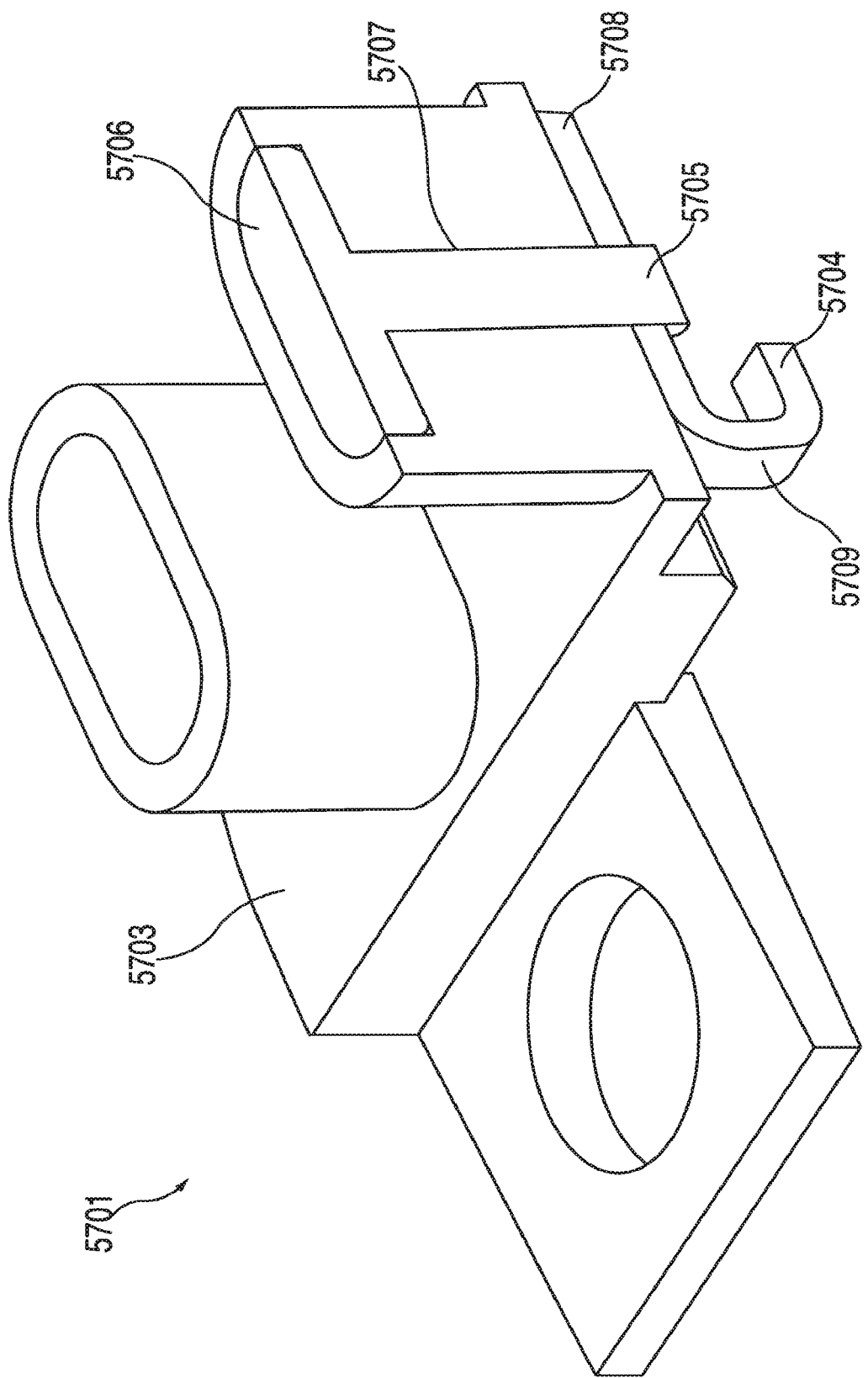

FIGS. 57A and 57B illustrate an assembly of electrical contacts in accordance with one embodiment of the present invention. Assembly 5701 can include plurality of electrical contacts 5702 disposed in non-conductive casing 5703. Each electrical contact 5702 can have first portion 5705 and second portion 5704, each of which are manufactured independently and assembled together thereafter.

First portion 5705 can have head 5706 and shank 5707. Head 5706 can have an exposed surface for engagement with an external electrical contact of, for example, a connector on a charging dock or cable. In one embodiment of the present invention, the exposed surface on head 5706 can have a conductive, durable finish that also is aesthetically appealing, for example, nickel, tin cobalt, or a blackened finish. Shank 5707 can be integrally formed with head 5706 or formed independently and then attached to head 5706 using adhesive material (e.g., glue, solder, weld, surface mount adhesion material, etc.). For example, during manufacturing, first portion 5705 can be formed from a cylindrical block of conductive material, turned to create shank 5707, and stamped or milled to shape head 5706, for example, into an oval shape.

Second portion 5704 can have engagement segment 5709 and contact segment 5708. Engagement segment 5709 can have a hole configured for accepting shank 5707 of first portion 5705 during assembly of electrical contact 5702 to casing 5703. Conductive adhesive material can be applied during manufacturing to mechanically and electrically couple first portion 5705 and second portion 5704 of electrical contact 5702. Contact segment 5708 can have an internal surface for engagement with electrical contact 5604 on circuit board 5605 (see FIG. 56) when in an assembled headset. The engagement surface of contact segment 5708 also can have a finish (e.g., gold-plating) that has good properties for adhering electrical contact 5702 to circuit board 5605, storage, and corrosion-resistance.

In one embodiment of the present invention, the center of the internal contact surface of second portion 5704 can be offset from the center of the external surface of first portion 5705 when considered in a plane substantially defined by the external contact surface of first portion 5705. This can be useful when design constraints require electrical contacts 5702 to electrically couple electronic components that are not co-linearly aligned, as in one embodiment of the present invention illustrated in FIG. 56. In one embodiment of the present invention, second portion 5704 can have a hook-shape to position the internal contact surface of second portion 5704 in an offset configuration with respect to shank 5707. In manufacturing, second portion 5704 can be stamped from sheet metal, machined from a solid block of conductive material, molded, or formed using a different method known in the art or otherwise. In one embodiment of the present invention, second portion 5704 can be stamped from sheet metal in high volume production situations to save valuable time and money.

Figure 58A:
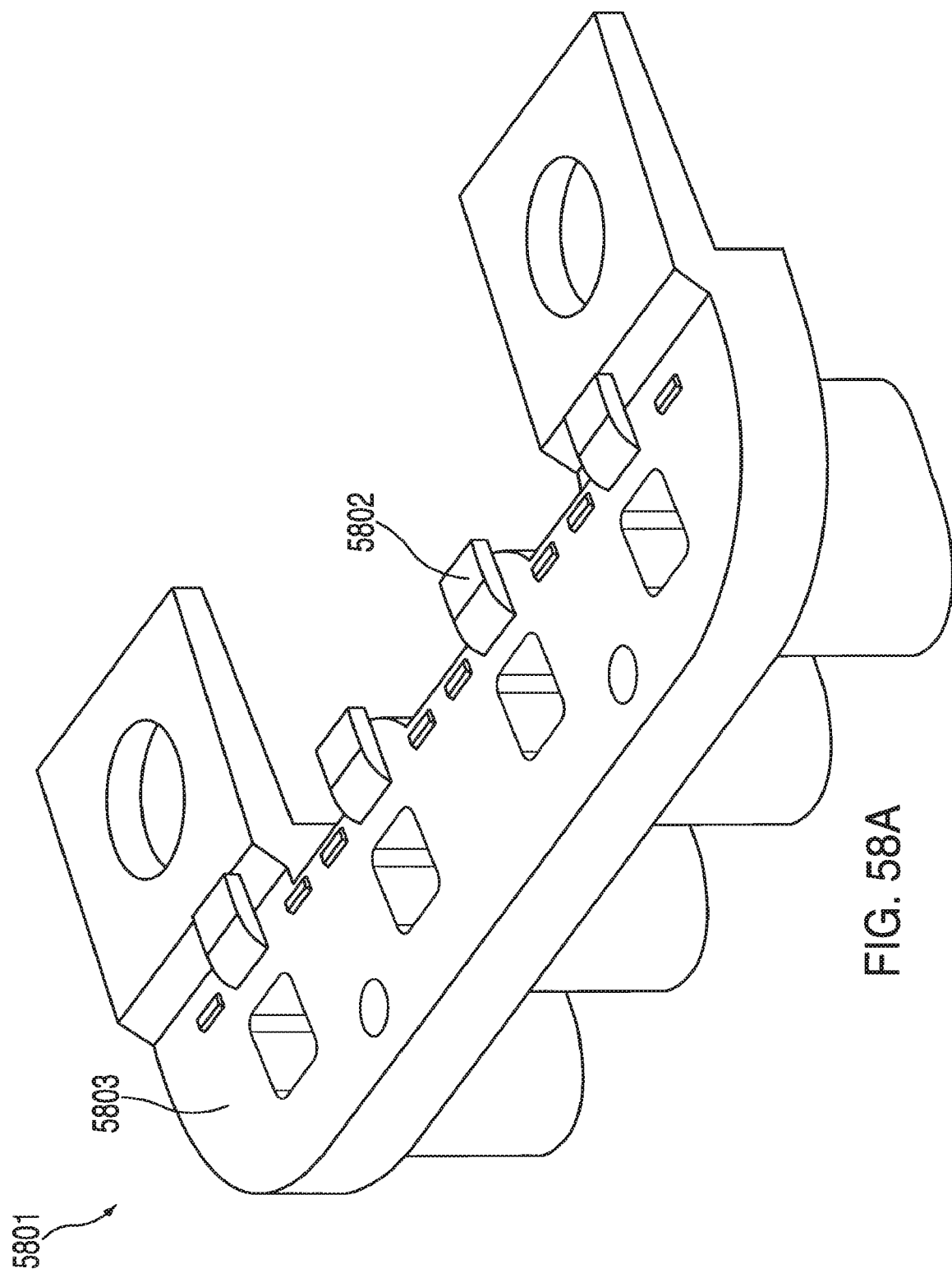
FIGS. 58A-58C are illustrations of an electrical contact assembly in accordance with an embodiment of the present invention.
Figure 58B:
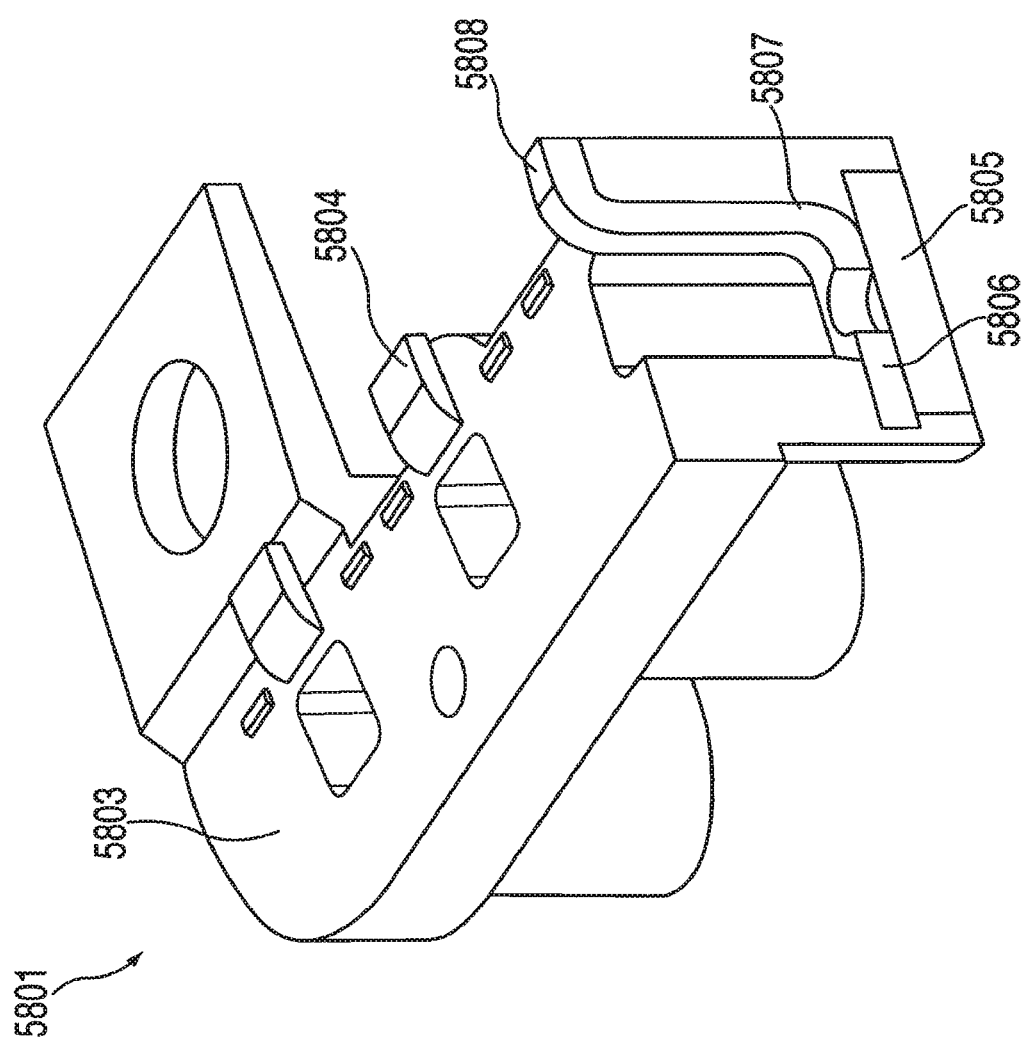
Figure 58C:
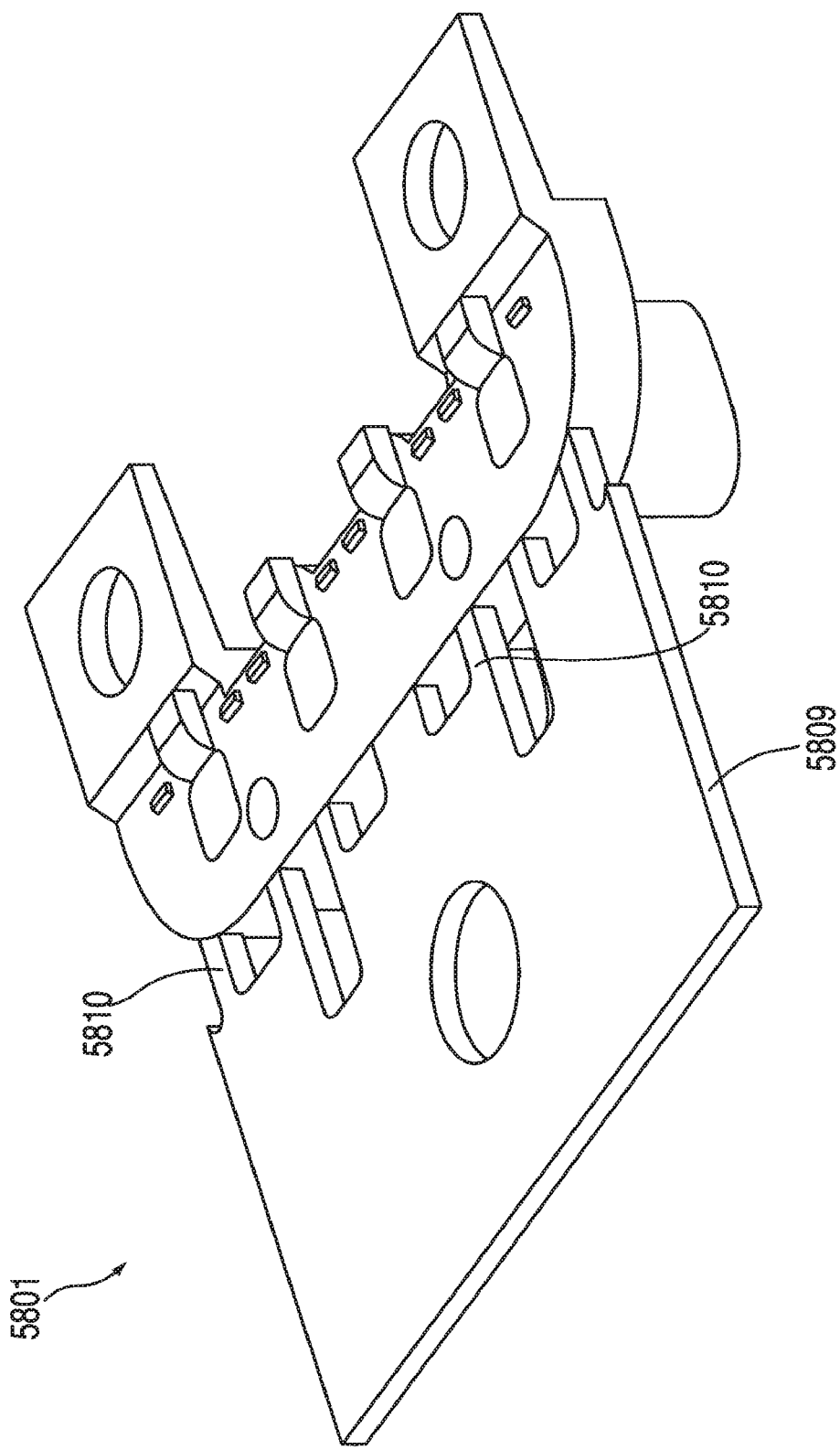

FIGS. 58A-58C illustrate an assembly of electrical contacts in accordance with another embodiment of the present invention. Assembly 5801 can include plurality of electrical contacts 5802 disposed in non-conductive casing 5803. Similar to the embodiment illustrated in FIGS. 57A-57B, each electrical contact 5802 can have first portion 5805 and second portion 5804, each of which are manufactured independently and assembled together thereafter.

First portion 5805 can have an exposed surface for engagement with an external electrical contact of, for example, a connector on a charging dock or cable. In one embodiment of the present invention, the exposed surface on first portion 5805 can have a conductive, durable finish that also is aesthetically appealing.

Second portion 5804 can have engagement segment 5806, shank 5807, and contact segment 5808. Engagement segment 5806 can be electrically and mechanically coupled to first portion 5805 using, for example, surface mount technology, solder, weld, or another conductive adhesive. Shank 5807 can couple engagement segment 5806 to contact segment 5808. Contact segment 5808 can have an internal surface for engagement with electrical contact 5604 on circuit board 5605 (see FIG. 56) when headset assembly 5801 is installed in a headset (e.g., headset 10 of FIG. 1). The engagement surface of contact segment 5808 also can have a finish that has good properties for soldering, storage, and corrosion-resistance.

In one embodiment of the present invention, the center of the internal contact surface of contact segment 5808 can be offset from the center of the external surface of first portion 5805 when considered in a plane substantially defined by the external contact surface of first portion 5805. In one embodiment of the present invention, second portion 5804 also can have a hook-shape to position the internal contact surface of second portion 5804 in an offset configuration with respect to the external contact surface of first portion 5805.

FIG. 58C illustrates how assembly 5801 can be manufactured in accordance with one embodiment of the present invention. Initially, second portions 5804 of one or more electrical contacts 5802 can be stamped from single piece of sheet metal 5809 and folded into, e.g., a hook-shape as described above. This can create fingers 5810 in sheet metal 5809 that mechanically and electrically couple all electrical contacts 5802.

First portions 5805, which also can be stamped in a separate operation, then can be adhered to engagement segments 5806 of each second portion 5804. This assembly then can be placed in an injection molding machine to injection-mold casing 5803 around the assembly. Once the injection molding procedure is complete, a blade can sever second portions 5804 of electrical contacts 5802 from the rest of sheet metal 5809, thereby mechanically and electrically decoupling each electrical contact 5802 from the other electrical contacts. Advantageously, because first portions 5805 and second portions 5804 can be formed from a stamping process, assembly 5801 can be used in high volume production situations by saving valuable time and money.

Figure 59A:
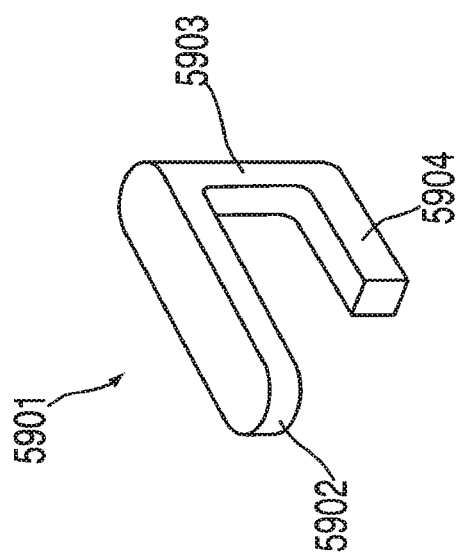
FIGS. 59A and 59B are illustrations of electrical contacts in accordance with an embodiment of the present invention.
Figure 59B:
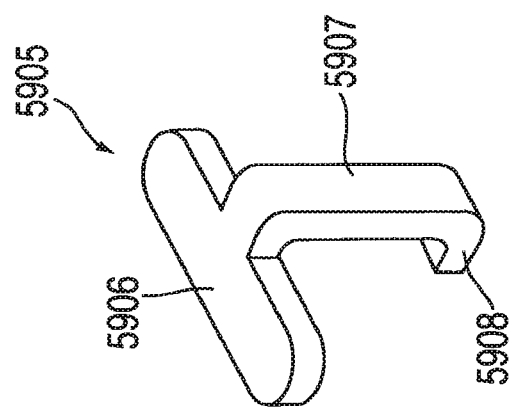

FIGS. 59A and 59B illustrate electrical contacts in accordance with further embodiments of the present invention. Electrical contacts 5901 and 5905 can be similar to that described above with respect to FIGS. 57A-58C, except that electrical contacts 5901 and 5905 can be formed as one unitary piece.

Electrical contact 5901 can have external contact portion 5902, shank 5903, and internal contact portion 5904. External contact portion 5902 can have an external surface for engagement with an external electrical contact of, for example, a connector on a charging dock or cable. Shank 5903 can couple external contact portion 5902 to internal contact portion 5904. Internal contact portion 5904 can have an internal surface for engagement with electrical contact 5604 on circuit board 5605 (see FIG. 56) when electrical contact 5901 is installed in a headset (e.g., headset 10 of FIG. 1). As in the above-described embodiments, the center of the internal contact surface of internal contact portion 5904 can be offset from the center of external contact portion 5902 when considered in a plane substantially defined by the external contact surface of external contact portion 5902. Electrical contact 5901 also can have a hook-shape to position the internal contact surface of internal contact portion 5904 in an offset configuration with respect to the center of external contact portion 5902. In one embodiment of the present invention, electrical contact 5901 can be machined from a single block of conductive material.

Similar to electrical contact 5901, electrical contact 5905 also can have external contact portion 5906, shank 5907, and internal contact portion 5908. Rather than being machined from a conductive material, however, electrical contact 5905 can be stamped from sheet metal and folded to form the hook-shape. Again, because the electrical contact can be manufactured using a stamping procedure, it can be used in high volume production situations.

Figure 60B:
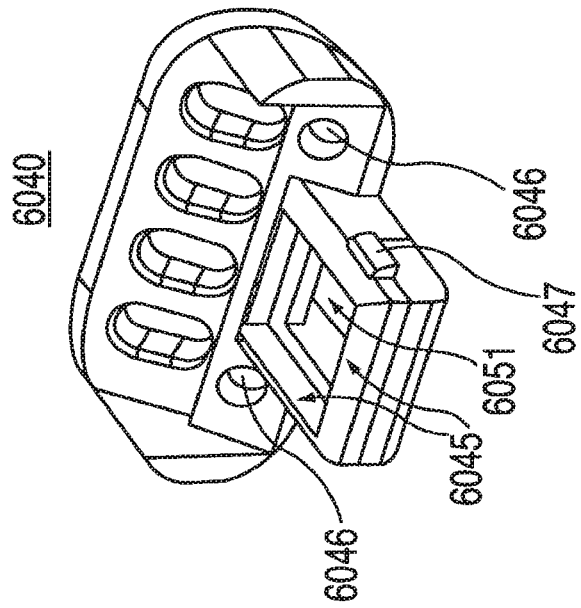
FIGS. 60A and 60B are illustrations of a connector plate in accordance with an embodiment of the present invention.
Figure 60A:
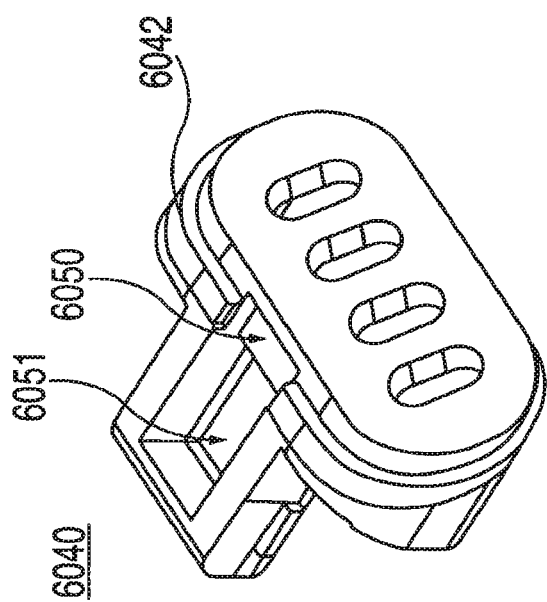

FIGS. 60A and 60B show two views of connector plate 6040 of a headset connector in accordance with an embodiment of the present invention. Recessed step 6042 can run around the edge of connector plate 6040 in order to create a groove when the plate is installed in a primary housing (see e.g., primary housing 1110 of FIG. 11). Microphone port 6050 can be cut out of step 6042 in order to create an opening for sound to reach cavity 6051 where a microphone or microphone boot (see e.g., microphone boot 5220) can be located. In FIG. 60B, surface 6045 of connector plate 6040 can be used to compress the perimeter of a microphone boot so that an airtight seal is made.

Tabs 6047 and threaded cavities 6046 can be used to mount other elements onto connector plate 6040. For example, tabs 6047 can mate with a bracket that wraps around the entire connector assembly (see e.g., bracket 5248 of FIG. 52). This same bracket can include apertures for use in conjunction with threaded cavities 6046 so that inserts (e.g., screws) can fix the bracket against connector plate 6040. Bracket 5248 of FIG. 52 is an example of a bracket that is suitable for use with connector plate 6040.

In accordance with one aspect of the present invention, connector plate 6040 can be made of a material with magnetic properties. By incorporating magnetic properties into connector plate 6040, magnetic effects can be used to enhance the coupling between connector plate 6040 and a complementary connector (see e.g., FIG. 62B). Connector plate 6040 can include, for example, a ferromagnetic material such as a steel alloy. In another embodiment, connector plate 6040 can include a permanent rare-earth magnet that produces a magnetic field. Moreover, an embodiment of connector plate 6040 can include an electromagnet which produces a magnetic field as a result of the application of electric current. In the electromagnetic embodiment, the magnetic field can be controlled (e.g., through the application of an electric current) so that it is only present when necessary. In the embodiments where connector plate 6040 includes a permanent magnet or an electromagnet, a complementary connector (see e.g., FIG. 62B) can include a ferromagnetic material or a complementarily positioned permanent magnet or electromagnet.

Figure 61B:
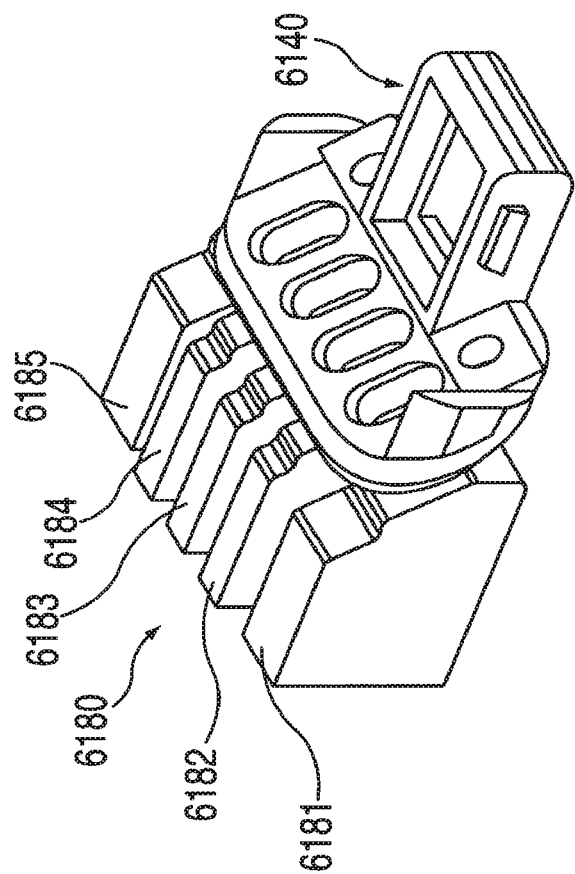
FIGS. 61A and 61B are illustrations of magnetic components of a connector in accordance with an embodiment of the present invention.
Figure 61A:
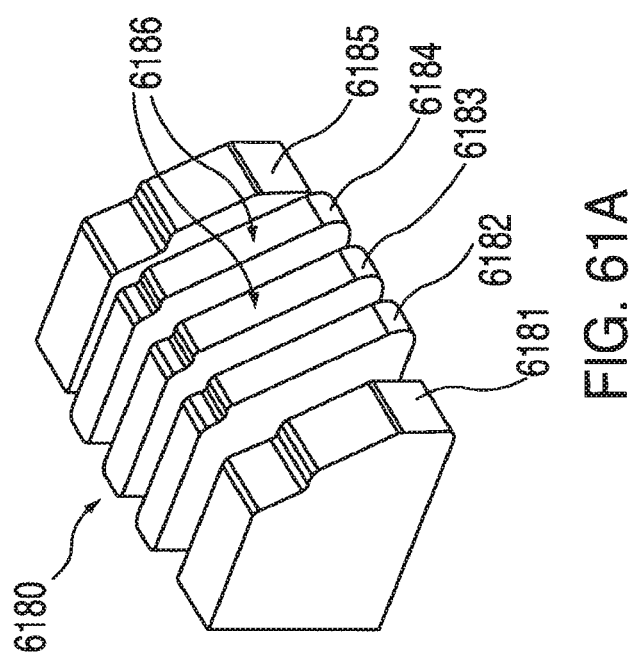

FIG. 61A shows array 6180 of magnetic components which can be embedded in a connector in accordance with an embodiment of the present invention. Array 6180 can include components 6181, 6182, 6183, 6184 and 6185 which can be made of, for example, a permanent rare-earth magnetic material. An example of a suitable material for magnetic components 6181-6185 is magnetized Neodymium and, more specifically, N50 magnets. The magnetic components 6181-6185 can be shaped so that a substantially flat mating face 6186 is formed along one side. This mating face 6186 can, for example, be at an angle complementary to the angle of a headset's connector plate (see e.g., angle 5587 of FIG. 55).

FIG. 61B shows a view of how connector plate 6140 can be used in combination with array 6180 of magnetic components in accordance with an embodiment of the present invention. If connector plate 6140 is made of a ferromagnetic material and array 6180 includes permanent magnets, the magnetic fields of array 6180 will generate magnetic forces biasing connector plate 6140 and array 6180 together. If array 6180 is embedded within a connector that mates with connector plate 6140, these magnetic forces can reinforce the connection.

In order to maximize the magnetic field generated by array 6180, it can be advantageous to arrange components 6181-6185 (e.g., magnets) so that the polarity of each component is in a particular orientation. For example, the components can be arranged so that the south pole of the outer two magnets are closest to the mating face, and the north pole of the inner three magnets are closest to the mating face. In this configuration, if one were to list the polarities encountered when passing horizontally over the mating face, the list would read south-north-north-north-south. This maximization of the magnetic field is one reason why it might be desirable to use an array of magnets as opposed to one large magnet.

While the embodiments described above include a ferromagnetic connector plate and an array of permanent magnets embedded in a complementary connector (see e.g., FIG. 62B), it is contemplated that any other magnetic configurations can be used without deviating from the spirit of the present invention. For example, an electromagnet element can be included in the connector plate and a ferromagnetic material can be located in a complementary connector. A detailed discussion about the use of electromagnetic and magnetic elements in connectors can be found in U.S. patent application Ser. No. 11/235,873 entitled "Electromagnetic Connector for Electronic Device" and U.S. patent application Ser. No. 11/235,875 entitled "Magnetic Connector for Electronic Device," which are both incorporated herein.

Figure 62A:
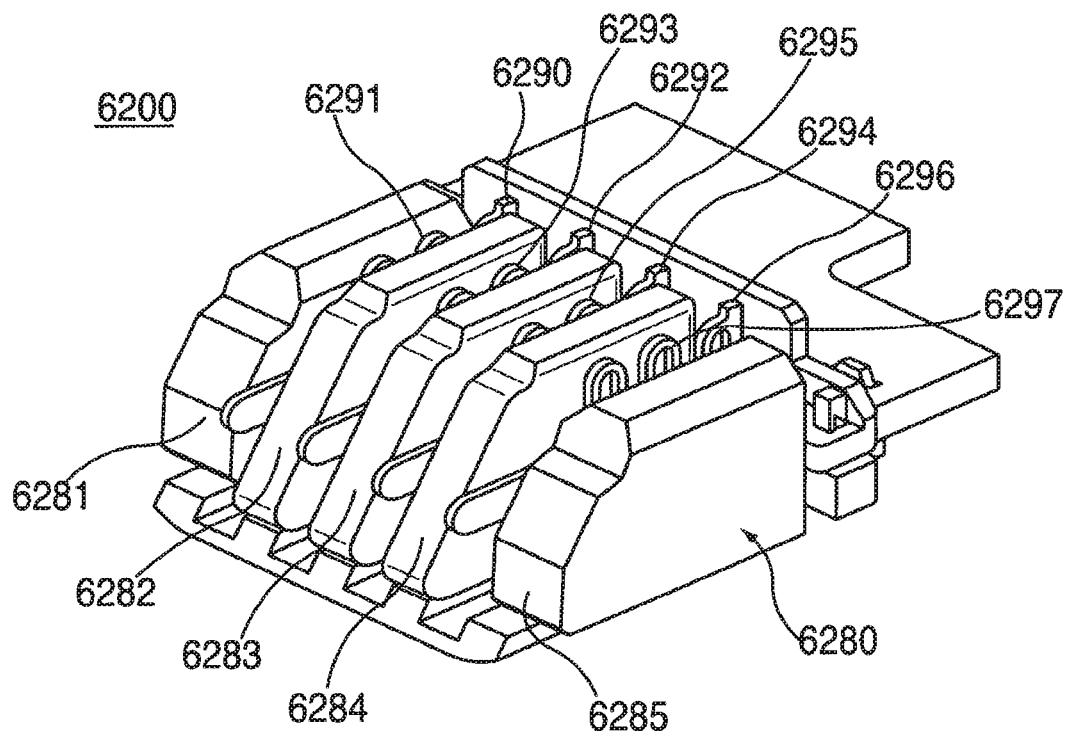
FIGS. 62A and 62B are illustrations of a connector in accordance with an embodiment of the present invention.
Figure 62B:
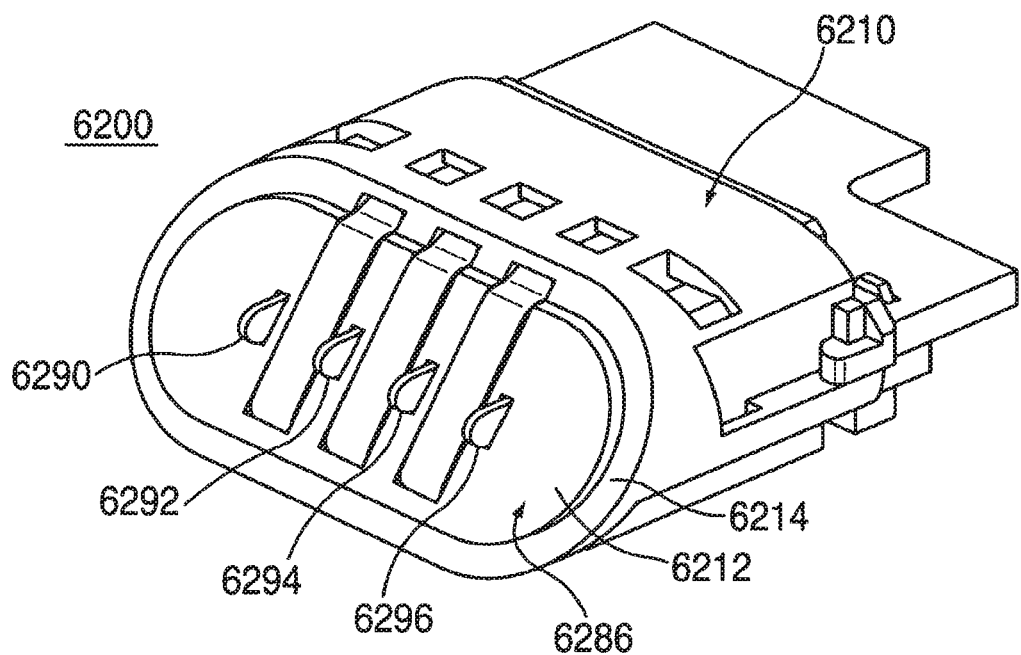

FIGS. 62A and 62B show connector 6200 that is complementary to and capable of mating with connector 1040 of FIG. 10A in accordance with an embodiment of the present invention. Connector 6200 can, for example, correspond to headset engaging connector 220 of FIG. 2. Connector 6200 can be integrated into, for example, a charger (see e.g., docking station 6400 of FIG. 64, device 6600 of FIG. 66, and docking station 6700 of FIG. 67) which charges a battery in a headset or other apparatus that facilitates the charging of the headset (such as an apparatus discussed in U.S. patent application Ser. No. 11/620,669 entitled "Apparatuses and Methods that Facilitate the Transfer of Power and Information Among Electrical Devices" which is incorporated herein).

The view of connector 6200 in FIG. 62A does not include connector housing 6210 so that magnetic array 6280 and contacts 6290, 6292, 6294 and 6296 can be seen. Array 6280 can be installed in connector 6200 such that it forms a magnetic array structure, and each magnet of the array can be separated by a gap of predetermined size. Array 6280 of magnetic components can be embedded in connector housing 6210 so that the surface of components 6282, 6283 and 6284 can be flush with mating face 6286. These exposed components can extended all of the way to the surface of a corresponding connector plate so that the strongest magnetic forces are generated. However, a connector can have no exposed magnetic elements without deviating from the spirit of the present invention. For example, it can be desirable to recess magnetic components 6281 and 6285 in order to create a smaller connector.

Contacts 6290, 6292, 6294 and 6296 can be included in connector 6200. In order to integrate the contacts with the array 6280 of magnetic components, each contact can be placed in the gaps between magnetic components. In this manner, contact 6290 can be located in between magnetic components 6281 and 6282, contact 6292 can be located between components 6282 and 6283, etc. This integrated distribution of contacts can allow for a smaller connector. This is another example of a reason why it might be desirable to use multiple magnetic components that are spaced apart as opposed to a single, large magnetic component.

Each contact can include a spring mechanism, such as coil 6297 of contact 6296. Coil 6297 can bias contact tip 6296 to extend out of connector housing 6210. The coils 6291, 6293, 6295 and 6297 included in the contacts can be substantially planar or flat. A flat coil can allow for minimal spacing between magnetic components 6281-48815. This reduced spacing can result in a generally smaller connector. However, other types of coils and contacts can be used in accordance with the principles of the present invention. For example, a cylindrical spring biasing a cylindrical contact, commonly called a "pogo pin," can be used without deviating from the spirit of the present invention.

Contacts 6290, 6292, 6294 and 6296 can be position to electrically couple with, for example, the contacts located on the face of a connector plate of a headset. Connector housing 6210 can include an elevated face 6212 which can, for example, fit into a cavity in a complementary connector. For example, if connector 6200 were to mate with headset 1000 of FIGS. 10A and 10B, the elevated face 6212 can fit against recessed connector plate 1041 while the edge of primary housing 1010 can fit against the recessed perimeter 6214 of connector 6200. In this mating configuration, contacts 6290, 6292, 6294 and 6296 can be electrically coupled with contacts 1042 of headset 1000.

Connector 6200 can include contacts or wires (not shown) on the rear of housing 6210 so that the connector can be electrically coupled with other circuitry. For example, connector 6200 can be mounted onto a circuit board that includes power supply circuitry (such as circuitry discussed in U.S. patent application Ser. No. 11/620,669 entitled "Apparatuses and Methods that Facilitate the Transfer of Power and Information Among Electrical Devices" which is incorporated herein) that can be used to transmit power to a headset through one or more contacts.

FIGS. 63A and 63B show connector 6300 that is complementary to and capable of mating with connector 1040 of FIG. 10A in accordance with an embodiment of the present invention. Connector 6300 is substantially similar to connector 6200 in FIGS. 62A and 62B. For example, magnetic components 6382, 6383 and 6384 of FIG. 63A are similar, respectively, to magnetic component 6282, 6283, and 6284 of FIG. 62A.

Connector 6300 can include four contact tips 6390, 6392, 6394 and 6396 that can be biased to extend from housing 6310. Each contact tip can have a width 6303 of approximately 0.5 millimeters. Width 6303 may be advantageously sized to be large enough to easily connect with connectors on headsets (e.g., connector 16 of FIG. 1) while not being so large that contact tips 6390, 6392, 6394, and 6396 are stiff and cannot be depressed by a headset coupling with connector 6300.

The centerline of each contact tip can be separated from the centerline of an adjacent contact tip by pitch 6302. Pitch 6302 can be chosen so that the contacts of connector 6300 are capable of electrically coupling with the contacts of a headset connector (e.g., connector 1040 of FIG. 10A). Accordingly, pitch 6302 can be approximately 1.97 millimeters so that it corresponds to pitch 5583 shown in FIG. 55A. Moreover, pitch 6302 can be selected from a range between 1.75 and 2.25 millimeters. The size of pitch 6302 may also be advantageous for placing magnetic components (e.g., components 6382, 6383, and 6384) in between the contacts of connector 6300. The centerline of outer contact tips 6390 and 6396 can be separated by width 6301, which can be approximately 5.1 millimeters or from a range between 4.7 millimeters and 5.4 millimeters. Width 6301 can be selected such that contact tips 6390 and 6394 can couple with the outer contacts of a headset (see e.g., contacts 5561 and 5564 of FIG. 55). In some embodiments, the outer contacts of a headset may be configured to receive power, and a connector, similar to connector 6300 but not including contact tips 6392 and 6394, can be provided to transmit only power to the headset. Such a connector may be easier to manufacture and cheaper than connector 6200.

Connector 6300 can have a raised face 6312 that is capable of coupling with a headset connector (e.g., connector 1040 of FIG. 10A). The housing 6310 of connector 6300 can have a total height 6304, which can be approximately 5.1 millimeters or from a range between 4.9 millimeters and 5.3 millimeters. The total height 6304 of a connector may be advantageously selected to corresponding with the total height of a headset's primary housing (see e.g., height 5580 of FIG. 55) such that connector 6300 can receive a headset's primary housing. The raised face 6312 of housing 6310 can have a height 6305, which can be approximately 3.43 millimeters or from a range between 3.2 and 3.7 millimeters. Height 6305 can be selected such that it is less than the height of an internal cavity inside of a headset's primary housing (see e.g., height 5581) such that connector 6300 can easily couple with a headset. In summary, heights 6304 and 6305 can be selected in order to complement heights 5580 and 5581 of FIG. 55B. Thereby allowing headset 5500 to mate with connector 6300. It is understood that the mating face of connector 6300 is angled with respect to the rest of the connector. This angle can, for example, range from ten to thirty degrees. Heights 6304 and 6305 reference the orthogonal heights of the corresponding elements. This is similar to the radial dimensions that are shown in FIG. 55B.

In order to apply pressure to the contacts of a complementary connector, the contact tips 6390, 6392, 6394 and 6396 can be biased to extend from connector housing 6310. When no complementary connector is present, contact tips 6390, 6392, 6394 and 6396 can extend from the housing by distance 6306 of approximately 0.7 millimeters. Distance 6306 can be selected such that the contact tips can advantageously apply enough pressure to a headphone's contacts such that the tips can reliably couple with the headphone's contacts.

Connector 6300 can also include contacts or wires (not shown) that allow the connector to route electrical signals from contact tips 6390, 6392, 6394 and 6396 to other circuitry. The dimensions given above apply to the embodiments shown in 63A and 63B and it is understood that other dimensions can be used without deviating from the scope of the present invention.

FIG. 64 shows a view of headset 6498 coupled with connector 6499 in accordance with an embodiment of the present invention. Headset 6498 can be substantially similar to headset 1000 of FIGS. 10A and 10B and can include the features shown on connector 1040. Connector 6499 can be installed in, for example, docking station 6400 which can include a socket in which a headset can be inserted. Docking stations substantially similar to or the same as docking station 6400 are discussed in U.S. patent application Ser. No. 11/620,669 entitled "Apparatuses and Methods that Facilitate the Transfer of Power and Information Among Electrical Devices" which is incorporated herein. The socket in docking station 6400 can be shaped to align headset 6498 properly with respect to connector 6499.

Connector 6499 can include raised face 6412 and lower perimeter 6414 to further align headset 6498. Raised face 6412 can extend into the cavity created by a recessed headset connector while the headset's primary housing abuts perimeter 6414.

This alignment can result in the contacts of headset 6498 (see e.g., contacts 1042 of FIG. 10A) being approximately centered over the tip of contact 6490. Contact 6490 can be biased to extend beyond raised face 6412 by coil 6491. This bias can be represented by a force exerted in the direction of arrow 6401. Additionally, arrow 6402 can represent the magnetic force generated by the proximity of the connector plate of headset 6498 (see e.g., connector plate 1041 of FIG. 10A) to the array of magnetic components of connector 6499 (see e.g., array 6180 of FIG. 61). This magnetic force can cause contact 6490 to electrically couple with a contact on headset 6498. Connector 6499 can include additional contacts (see e.g., contacts 6290, 6292, 6294 and 6296) which can couple with the remaining contacts of headset 6498. Connector 6499 can be mounted on circuit board 6480 in docking station 6400 such that circuit board 6480 can route signals to and from headset 6498 when it is coupled with connector 6499.

FIG. 65 shows graph 6500 which depicts the approximate change of the two forces described above as the separation between the magnetic components and the connector plate varies in accordance with an embodiment of the present invention. In graph 6500, x-axis 6502 can represent the approximate force, and y-axis 6504 can represent the distance between the magnetic components and the connector plate. The separation where the x-axis intercepts the y-axis is zero, and this point can represent when the connector plate is in contact with the magnetic components. As the separation increases, approximate force 6508 from spring contacts pushing on a connector plate in a headset can decrease linearly because of the substantially linear nature of coil springs. While the spring force decreases linearly, the approximate magnetic force 6506 can decrease exponentially due to the behavior of magnetic materials.

It can be desirable to choose magnetic components (e.g., magnets, connector plates) and design spring components (e.g., contact coils) such that the magnetic force biasing a headset's connector plate to a complementary connector is greater than the force of the spring contacts pushing back on the connector plate at all possible distances of separation between the two parts. If there are situations where the spring force is greater than the magnetic force, it might be necessary to apply an external force in order to properly couple a headset with a complementary connector. Applying this external force might require intervention from a user, and therefore, it can be desirable to design a connection system so that the magnetic force is always greater that the spring force.

Figure 66:
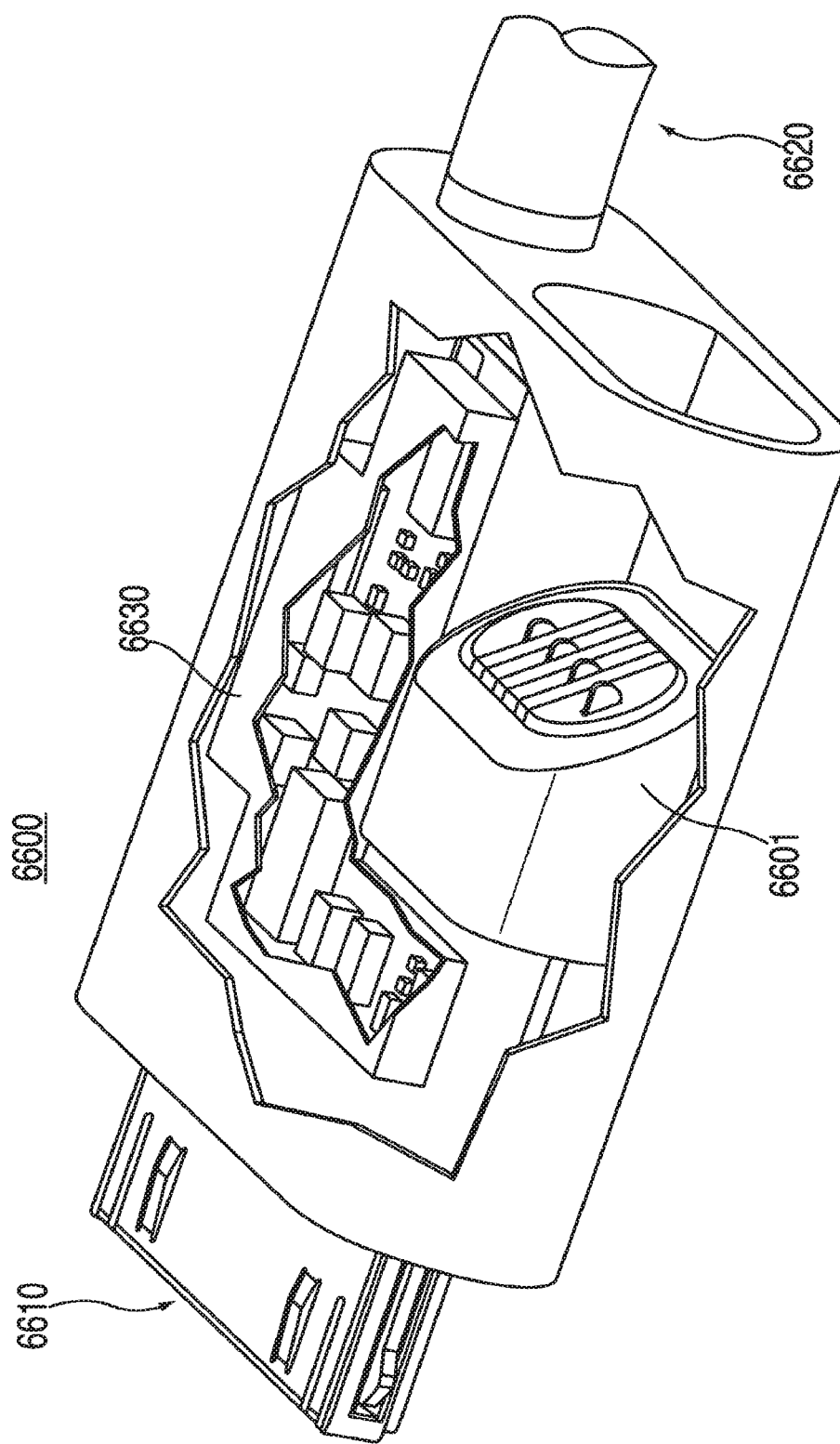
FIG. 66 is an illustration of a docking device that can receive a headset in accordance with an embodiment of the present invention.

FIG. 66 shows charging device 6600 that can be used in conjunction with a headset in accordance with an embodiment of the present invention. In some embodiments, connector 6601 can be integrated into device 6600, thereby allowing device 6600 to be electrically coupled with a headset. Connector 6601 is similar to the connectors discussed in connection with FIGS. 61-65.

In some embodiments, auxiliary connector 6610 can be integrated into charging device 6600. As such, auxiliary connector 6610 can be used to couple an additional device, such as a cellular phone which can be used with a headset, to device 6600. In order to connect a headset or additional device to an external power supply (e.g., wall outlet or computer), device 6600 can include cable 6620. Circuitry 6630 can be integrated into device 6600 to facilitate charging of both a headset and an additional device.

Circuitry 6630 can also provide a communications interface for data to be shared between a headset and an additional device. An example of a charging device similar to device 6600 is discussed in detail within U.S. patent application Ser. No. 11/620,669 entitled "Apparatuses and Methods that Facilitate the Transfer of Power and Information Among Electrical Devices," which is incorporated herein.

FIGS. 67A and 67B show connector 6710 in accordance with an embodiment of the present invention. The face of connector 6710 can be shaped to include peak 6711. By incorporating peak 6711 into the connector face, connector 6710 is capable of mating with a headset in two different interface orientations (e.g., physical orientations). When connector 6710 is installed in docking station 6700 (see FIG. 67B), peak 6711 creates cavities 6702 and 6704 which can each accept the long side 6721 of headset 6720. In the interface orientation shown in FIG. 67B, side 6721 of headset 6720 is in cavity 6704. However, if headset 6720 were inserted in another orientation, long side 6721 of the headset may be in cavity 6702. In either of these orientations, the contacts of connector 6710 can be electrically coupled with the contacts on headset 6720.

In some embodiments, switching circuitry can be included in headset 6720 to compensate for these different interface orientations. Such switching circuitry can determine the interface orientation of headset 6720 and connector 6710 and route signals received from the connector to pathways inside the headset (e.g., electrical traces) based on the determined orientation. In other embodiments, switching circuitry can be provided in docking station 6700 that can determine the interface orientation of connector 6710 and headset 6720 and route signals to the connector based on the determined orientation. A detailed discussion of similar switching circuitry can be found in U.S. patent application Ser. No. 11/650,130 entitled "Systems and Methods for Determining the Configuration of Electronic Connections," which is incorporated herein.

Similar to the elevated face 6212 and recessed perimeter 6214 shown in FIG. 62B, raised face 6712 and recessed perimeter 6714 can be advantageous when coupling a headset (see e.g., headset 1000 of FIGS. 10A and 10B) to connector 6710. For example, raised face 6712 and recessed perimeter 6714 can provide structural features that strengthen the mechanical coupling of connector 6710 and a headset.

FIG. 68 shows chart 6800 listing exemplary modes and functions of a communications system in accordance with an embodiment of the present invention. With regards to chart 6800, a communications system can include a headset (e.g., headset 10 of FIG. 1) and a host device (e.g., a cellular telephone, a laptop computer, etc.). Further defining the communications system referenced in chart 6800, the headset can be in communication with the host device and the host device can be communicating with other devices through a cellular network or other communications network (e.g., Voice over Internet Protocol).

Chart 6800 includes rows describing exemplary modes and functions of the system and columns identifying inputs and outputs that correspond to each mode or function. Some of the functions listed in column 6810 typically occur when a system is in a certain mode, and therefore, these functions can be listed under their respective modes. For example, the answer call function 6812 and the reject call function 6813 are typically executed when a system is in incoming call mode 6811 and chart 6800 can reflect this by listing functions 6812 and 6813 directly under incoming call mode 6811.

For each row corresponding to a function, column 6820 can be used to identify an input that can cause that function to occur. For example, column 6820 may identify a manner in which a user can press a single button on a headset (see e.g., button 14 of FIG. 1) to initiate a corresponding function. It is understood that the initiated function may further depend on the mode in which a headset is in. For example, a long button press may initiate the reject call function 6813 if a system is in incoming call mode 6811, while the same type of button press may initiate function 6814 if the system is in another mode. Examples of using a single button to control an electronic device can be found in U.S. Provisional Patent Application No. 60/936,965 entitled "Single User Input Mechanism for Controlling Electronic Device Operations," which is incorporated herein.

Outputs can be associated with each mode or function so that, for example, a user can be aware of a system's operation. Such outputs may be provided through a headset display system (see e.g., display system 18 of FIG. 1), a headset audio system (e.g., speaker system 13 of FIG. 1), and/or host device user interface (UI). A display screen and a speaker on a host device can, for example, be part of a host device UI used to provide outputs. Column 6830 lists outputs that can be provided by a headset display system to correspond with modes or functions listed in column 6810. For example, if a headset's display system includes an indicator that can output different colors using LEDs, column 6830 can include different colors and/or flashing patterns that the indicator can output based on the communication systems mode or function. Column 6840 lists outputs that can be provided by a headset audio system (e.g., a speaker) based on the communication system's mode or function. Column 6840 can, for example, include beeps, tones, or other noises that can be used to notify the operation of the communications system. Column 6850 lists outputs that can be provided by a Host Device UI. For example, column 6850, may include outputs that can be presented through a display screen on a host device.

In summary, chart 6800 identifies the inputs and outputs corresponding to various exemplary modes and functions of a communications system in accordance with an embodiment of the present invention. For example, when a communications system is in incoming call mode 6811, the system's headset (e.g., headset 10 of FIG. 1) can display a slow blinking green light and output two beeps while the system's host device can display an incoming call screen (e.g., a graphic displaying information about the incoming call). Continuing the example, if a user presses a button on the headset (e.g., button 14 of FIG. 1) for a short amount of time, the system can answer the call while the headset displays a green light and outputs a short low tone followed by a short high tone. While the system is answering the call, the host device can display a call answer screen. It is understood that the modes and functions shown in FIG. 68 and discussed above are merely exemplary and that communication systems can operate using other modes and functions without deviating from the spirit and scope of the present invention.

Additional embodiments of the present invention are directed to apparatuses, systems, methods and computer readable media that can facilitate the charging of a battery of at least one device as well as the transfer of information among different types of devices and platforms. The following is a description of various apparatuses and methods that can be used in accordance with various embodiments of the present invention.

Figure 69:
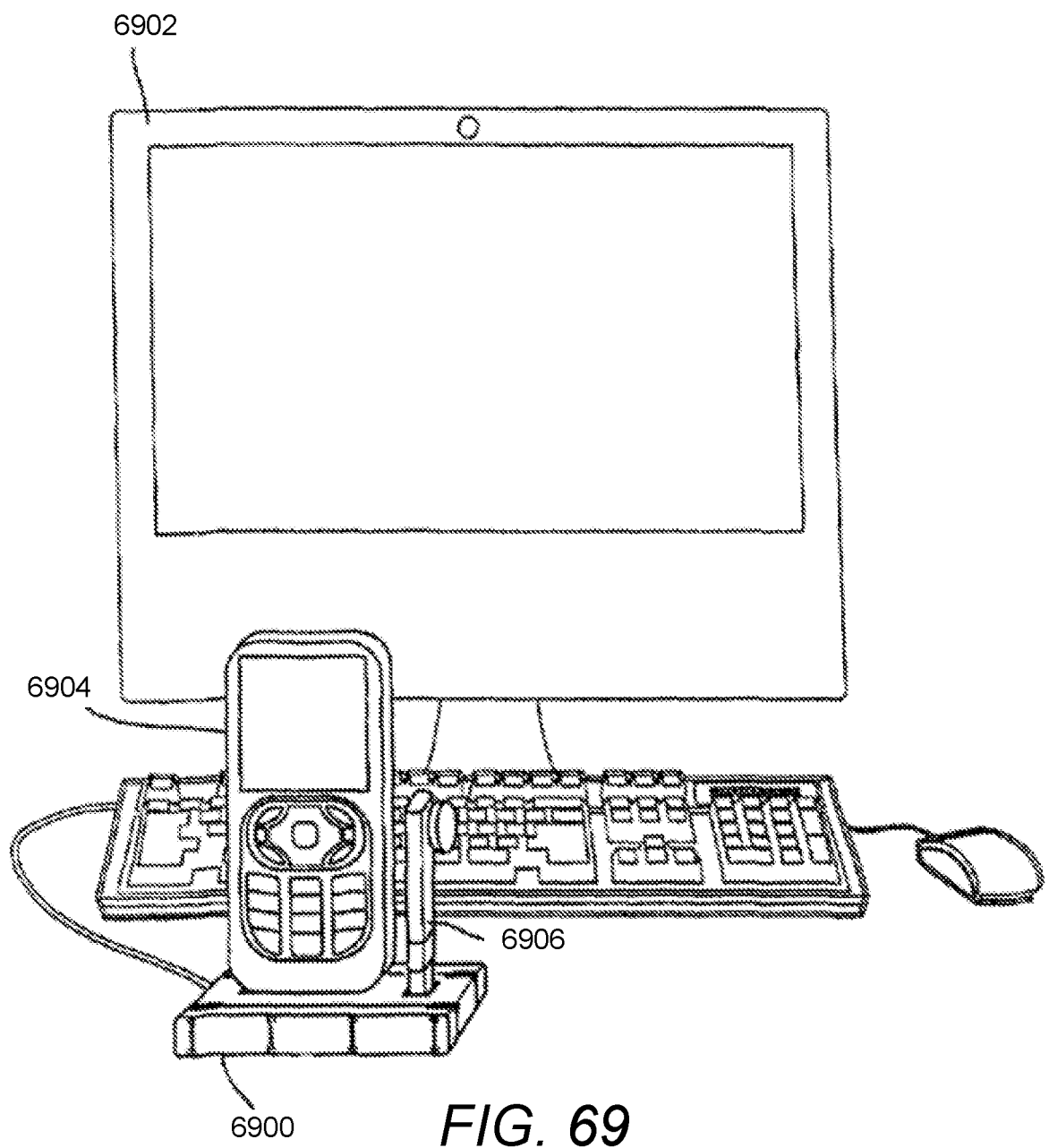
FIG. 69 shows an illustrative system that incorporates the present invention.

FIG. 69 illustrates docking station 6900, which is electrically coupled to three devices. The three devices are iMac 6902, cellular telephone 6904 and wireless headset 6906. Docking station 6900 enables information and power to be exchanged among the devices. In at least one embodiment, docking station 6900 communicates, identifies and authenticates each device before power is transferred to or from each device. Docking station 6900 can also be used to facilitate the transfer of additional information among the devices.

Although the present inventions described below generally relate to portable, battery powered devices, iMac 6902 is a line-powered device which receives power from a power cord and requires no batteries. Other examples of line-powered devices include devices that receive power from, for example, a solar panel, a generator, or any means other than a battery.

Cellular telephone 6904 and wireless headset 6906 are portable, battery powered devices. Battery powered devices, as referred to herein, include devices that have a self-contained battery or draw power from a battery located externally to the device. Docking station 6900 can, for example, facilitate the charging of the battery of wireless headset 6906 with power that is from the battery of cellular telephone 6904. Similarly, power from iMac 6902 can be used to charge cellular telephone 6904 and/or wireless headset 6906. In some embodiments, wireless headset 6906 is the same or substantially similar to the wireless headset discussed in commonly assigned U.S. Provisional Patent Application No. 60/879,177, filed Jan. 6, 2007 entitled "Wireless Headset" and U.S. Provisional Patent Application No. 60/879,195, filed Jan. 6, 2007, entitled "Connector with Magnetic Detent", which are hereby incorporated by reference in their entireties.

The configuration shown in FIG. 69 is merely illustrative of one way the present invention may be implemented. Additional configurations of a docking system that may be used to charge and transfer information to an electronic accessory (such as a wireless headset) from another electronic device (such as a cellular phone) are discussed in the Ser. No. 60/879,177 Application. Many other possible configurations for the invention will be apparent to those skilled in the art having the benefit of the disclosure contained herein. The description of FIGS. 70-72, like FIG. 69, will therefore be understood to be illustrative and not limiting.

Figure 70:
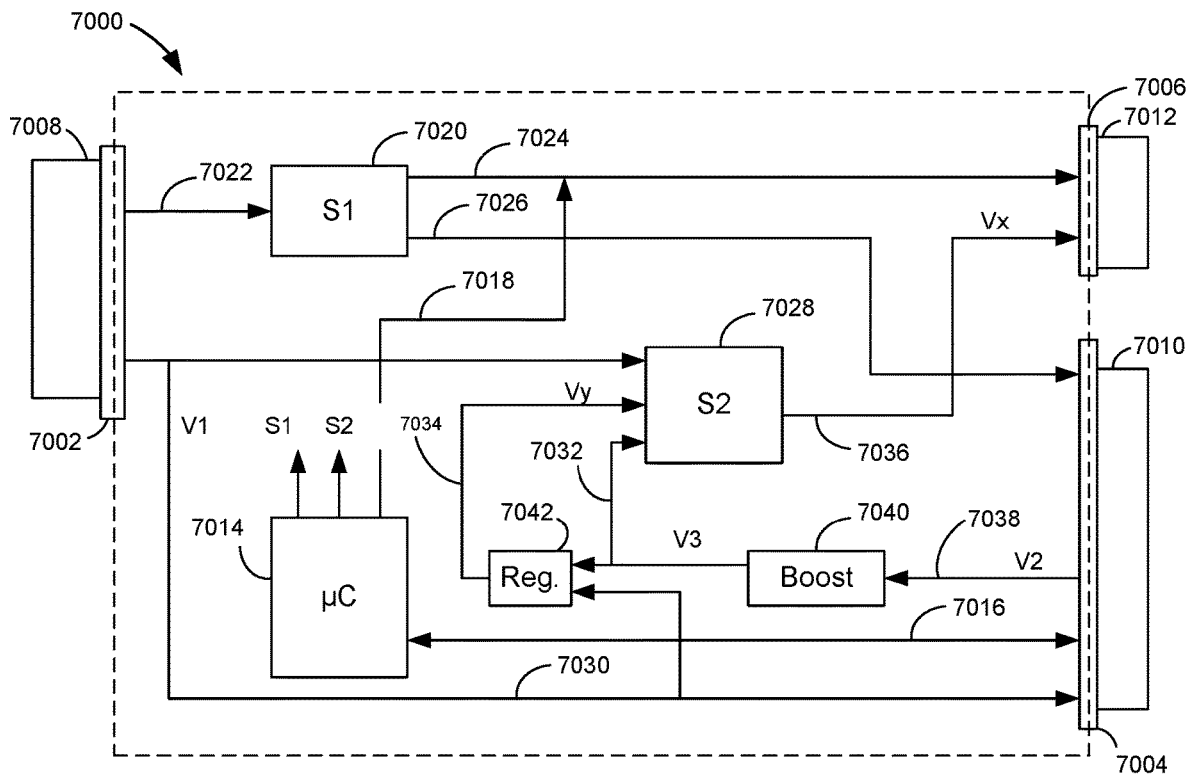
FIG. 70 shows a simplified schematic block diagram of an illustrative embodiment of circuitry in accordance with the present invention.

FIG. 70 a simplified schematic block diagram of circuitry that is located in apparatus 7000. In some embodiments, apparatus 7000 is substantially similar to docking station 6900 of FIG. 69. Apparatus 7000 is typically (although not necessarily) implemented using a single integrated circuit. Alternatively, apparatus 7000 could be implemented, for example, using a multi-chip module including two or more separate integrated circuits.

Apparatus 7000 can include port 7002, port 7004, and port 7006, which enable devices 7008, 7010 and 7012 to be coupled to apparatus 7000. Devices 7008, 7010 and 7012, which are discussed further below, can be similar to or the same as iMac 6902, cellular telephone 6904 and wireless headset 6906, respectively. Apparatus 7000 can also include microcontroller 7014, line 7016, line 7018, switch 7020, input 7022, output 7024, output 7026, switch 7028, line 7030, line 7032, line 7034, output 7036, line 7038, boost 7040 and regulator 7042, which are also discussed in more detail below.

Ports 7002, 7004 and 7006 are electrically coupled together by connections (i.e., wires, nodes, etc.) and/or other components of apparatus 7000 that are described herein. Ports 7002, 7004 and 7006 can be any type of port (e.g., wireless or wired), including those that receive any type of physical connector that can be used to couple apparatus 7000 to any type of device, apparatus, cable, and/or component of a device or other apparatus. Ports 7002, 7004 and 7006 can, for example, be used to couple either a male or female connector to apparatus 7000. For example, port 7002 can be a female USB connector, port 7004 can be a male 30-pin connector, and port 7006 can be symmetrical 4-pin connector, such as the connector described in the Ser. No. 60/879,195 Application. For example, as discussed in the Ser. No. 60/879,195 Application, port 7002 can have magnetic properties and each of the four pins (referred to as contacts in the Ser. No. 60/879,195 Application) are about 0.7 millimeters wide and are equally spaced about 1.0 millimeter apart.

In alternative embodiments, ports 7002, 7004 and/or 7006 can be removed and other ports (not shown) inserted. This would allow apparatus 7000 to be coupled with various combinations of devices and/or cables. For example, if port 7002 is a female USB connector, port 7002 can be removed and replaced by a port that is a male USB connector (or any other type of connector).

One skilled in the art will also appreciate that there can be any number of ports included in apparatus 7000. Despite FIG. 70 showing apparatus 7000 as including three ports, an apparatus in accordance with the principles of the present invention can include more or less than three ports, thereby allowing any number of devices to be coupled to the apparatus at any given time. In embodiments where the apparatus includes only one port, the apparatus may also include its own source of power, such as battery, solar panel, etc. which allows any component of the apparatus to function when there are no devices coupled to the apparatus.

In alternative embodiments, apparatus 7000 could facilitate the exchange of information and power among devices that are not physically coupled to apparatus 7000. As such, devices can be electrically coupled to apparatus 7000 wirelessly and information and/or power can be wirelessly exchanged through ports 7002, 7004 and/or 7006.

The illustrative embodiment of FIG. 70 shows device 7008 coupled to port 7002, device 7010 coupled to port 7004, and device 7012 coupled to port 7006. Devices 7008, 7010 and 7012 can be any battery powered or line-powered device. For example, devices 7008, 7010 and 7012 can be any type of portable, fixed, and/or mobile device, including but not limited to a laptop computer, a desktop computer, an audio player (e.g., Walkman, compact disc player, etc.), a video player, a media player (e.g., Apple's iPod, etc.), a set top box, a portable video game system (e.g., Sony's PSP, Nintendo's Game Boy, etc.), an electronic book, a cellular telephone, wireless telephone, a hand held computer, a GPS device, a flashlight, a personal digital assistant (PDA) (e.g., Palm's Pilot, etc.), a wireless headset for a telephone, a satellite radio, a remote control, an automobile key fob, a printer, an automobile radio, an automobile computing system, an automobile cigarette lighter (or other mobile power source, such as an airplane cigarette lighter), a camera, an accessory devices for a computer (e.g., wireless mouse, wireless keyboard, etc.), a watch, a surge protector, an AC/DC converter, etc.

Devices 7008, 7010 and 7012 can also be any device that can serve as a source of power such as, for example, one or more batteries, a generator, a solar panel, a cable (USB cable, serial cable, FireWire, power cord, etc.), a capacitor, an inductor, or any other electrical or mechanical device (such as a winding device) that can be used to provide electricity to apparatus 7000. In one embodiment of the present invention, at least two of devices 7008, 7010 and 7012 are portable, battery powered devices.

In one embodiment, apparatus 7000 includes microcontroller 7014. Microcontroller 7014 can use control lines (not shown) to communicate with any other component of apparatus 7000 (described below) and/or any device coupled to apparatus 7000 (e.g., devices 7008, 7010 and 7012). In some embodiments, each control line can be a multiple-wire bus, which allows microcontroller 7014 to communicate more efficiently with the components of apparatus 7000 and devices 7008, 7010 and 7012.

Microcontroller 7014 can also include or have access to one or more computer readable media. Microcontroller 7014 can provide intelligence to apparatus 7000 by, for example, controlling the flow of power to and from ports 7002, 7004 and 7006, communicating with the devices 7008, 7010 and 7012 via the appropriate lines and ports (which are discussed further below), facilitating communications among devices 7008, 7010 and 7012, determining how many and what types of devices are coupled to apparatus 7000, prioritizing the devices that are coupled to apparatus 7000, and monitoring the entire system for faults.

Microcontroller 7014 can control the power transferred among devices 7008, 7010 and 7012 by, for example, controlling the flow of power to and from ports 7002, 7004 and 7006. When devices 7008 and 7010 are coupled to apparatus 7000, microcontroller 7014 can cause power to be transferred from device 7008 to device 7010 (and vice versa). The transferred power can be used to, e.g., charge the battery of device 7010, to allow device 7010 to operate more efficiently, to allow device 7008 to communicate with device 7010 (or vice versa), etc. Microcontroller 7014 can also control the transfer of power from, for example, device 7008 to device 7012 (and vice versa), device 7010 to device 7012 (and vice versa), device 7008 to devices 7010 and 7012 (and vice versa), and device 7010 to devices 7008 and 7012 (and vice versa), and from device 7012 to devices 7010 and 7012 (and vice versa). Methods for transferring power among multiple devices, which are in accordance with the present invention, are discussed in more detail in connection with FIGS. 7-14 of U.S. patent application Ser. No. 11/620,669, filed Jan. 6, 2007, entitled "Apparatuses and Methods that Facilitate the Transfer of Power and Information Among Electrical Devices".

Microcontroller 7014 can use a communications path (which are discussed further below) to negotiate the transfer of powers among the devices. Negotiating the transfer of power involves determining how much power should be provided to and/or from a device and can involve, for example, resetting a device. In some embodiments, microcontroller 7014 can perform a hard reset on a device, which restarts the hardware of the device, and/or a soft reset that restarts the software of a device. One skilled in the art would appreciate that any other type reset can also be performed (such as a reset that resets the polarity of the ports of a device).

In addition to resetting a device, negotiating the transfer of power can include other communications between microcontroller 7014 and a device. For example, after microcontroller 7014 identifies a device (which is discussed further below), microcontroller 7014 may communicate with the device in order to place the device in a high power mode. The high power mode can be unique to a particular device and will allow a device to give more power to one or more other devices. For example, some ipods have a high power mode that allows the ipod to output a given voltage at a higher current (compared to when the device is in a default mode). Some devices only enter a high power mode after the appropriate handshaking (i.e., identification, authentication, etc.) occurs.

Microcontroller 7014 can consider any number of variables in determining which devices provide power and which receive power. For example, microcontroller 7014 can base that determination on the priority of the ports of apparatus 7000 (which is discussed below in more detail in connection with, for example, FIGS. 8-15 of U.S. patent application Ser. No. 11/620,669) or the priority of the devices (which is also discussed in the '669 Application).

Microcontroller 7014 can also determine which devices give and receive power based on, for example, the amount of excess power each device has available. For example, microcontroller 7014 can transfer power from the device(s) with more excess power to the device(s) with less excess power. To gauge the amount of excess power a device has, microcontroller 7014 can consider, for example, the remaining battery power, the length of time a battery powered device can run before the battery needs to be charged, and/or whether or not a device is coupled to another source of power (such as a wall outlet, a large back-up battery, a generator, a solar panel, etc.).

Microcontroller 7014 can also, for example, direct the flow of power through apparatus 7000 in response to receiving a user indication via a user interface. The user can, for example, select one or more physical buttons on apparatus 7000 (not shown). Microcontroller 7014 may also direct the flow of power in response to interactions the user has with the user interface(s) of device(s) 7008, 7010 and/or 7012 (not shown).

In addition to controlling the power provided and received by each device coupled to apparatus 7000, microcontroller 7014 can communicate with any other component of apparatus 7000 or any device coupled to apparatus 7000 via the control lines (not shown) that were discussed above. Microcontroller 7014 can also facilitate the transfer of information among the devices coupled to apparatus 7000 using the components and wires described below.

In some embodiments, the information transferred from a first device to a second device may include, for example, software or a firmware update for the second device. A first device (such as a cellular telephone or computer) can be used to update the firmware or provide additional software to a second device (such as a wireless headset). For example, a firmware update for a wireless headset may be downloaded onto a computer (via the internet and into, e.g., iTunes) or cellular telephone (via the cellular telephone network) from a central server (such as the Apple server). When computer or cellular telephone and the wireless headset are coupled to apparatus 7000, the information may be relayed from the computer or cellular telephone to the wireless headset via apparatus 7000. In some other embodiments, apparatus 7000 may facilitate the transfer of the information outside of apparatus 7000, which is discussed in more detail below.

Information can be passed between devices directly or indirectly through apparatus 7000. When microcontroller 7014 establishes direct communications between two devices, the signal can be routed through various components of apparatus 7000 (e.g., ports 7002, 7004 and/or 7006, switch 7020, etc.), but the communications are not routed through microcontroller 7014. An example of a direct communications path between device 7008 and device 7010 is port 7002 to input 7022 to switch 7020 to output 7026 to port 7004 (and vice versa). When microcontroller 7014 facilitates the transfer of information via an indirect communications path, the information passes through microcontroller 7014 (via the control lines (not shown), line 7016 and/or line 7018).

When using an indirect communications path, microcontroller 7014 can, for example, monitor the information (for, e.g., faults, clarity, viruses, content, etc.). An indirect communications path may also allow microcontroller 7014 to approve the information (based on, for example, parental restrictions, etc.) and/or save the information to internal or external memory, which may be RAM, ROM, flash memory, etc. (not shown). The information and/or an indication that information is being exchanged may also be displayed on a user interface (such as one or more light emitting diodes ("LEDs")) or any other interface device apparatus 7000 has access to, which are not shown). Microcontroller 7014 may also encode/decode the information, and/or utilize the information in any other way. An example of an indirect communications path between devices 7010 and 7012 is port 7004 to line 7016 to microcontroller 7014 to line 7018 to line 7024 to port 7006 (or vice versa), all of which are discussed further below.

Communication paths are used to exchange information among the devices. Microcontroller 7014 can also use a communications path between microcontroller 7014 and any device. For example, before establishing a communications path between device 7008 and device 7010, microcontroller 7014 can establish a communications path between microcontroller 7014 and device 7008. Microcontroller 7014 may then use that communications path to, for example, identify and authenticate device 7008. After communicating with device 7008, microcontroller 7014 can, for example, determine that device 7008 has information for device 7010. Microcontroller 7014 can then establish a communications path with device 7010, determine which communications protocol(s) can be used, identify device 7010, authenticate device 7010, and determine whether or not device 7010 should communicate with device 7008. If microcontroller 7014 determines that device 7008 can be permitted to communicate directly with device 7010, microcontroller 7014 will then establish a direct connection between device 7008 and device 7010, thereby enabling devices 7008 and 7010 to exchange information.

In some embodiments of the invention, when a device is coupled to a port of apparatus 7000, microcontroller 7014 receives a signal from the port via a control line (not shown) indicating that a device has been coupled to the port. In some embodiments, microcontroller 7014 can monitor each port of apparatus 7000 and detect when a device is coupled to port 7002, port 7004 and port 7006. In response to receiving an indication from a port or detecting that a device is coupled to a port, microcontroller 7014 automatically establishes a communications protocol (between the device and microcontroller 7014 and/or the other devices), identifies the device, and authenticates the device.

For example, if a computer is coupled to port 7002, microcontroller 7014 can communicate with the computer and identify different characteristics of the computer (such as the computer's brand, model, name, operating system, communication protocol, etc.). As another example, if a cellular telephone is coupled to port 7004, microcontroller 7014 can communicate with the cellular telephone and identify the model, brand, and other characteristics of the cellular telephone. In this manner, microcontroller 7014 is able to determine how many and what types of devices are coupled to apparatus 7000.

In addition to controlling the components of apparatus 7000 via the control lines (not shown), microcontroller 7014 can also exchange information with any of the components of apparatus 7000 as well as devices 7008, 7010 and 7012. For example, microcontroller 7014 can exchange information (or facilitate indirect communications) with device 7010 via line 7016 and port 7004. As another example, microcontroller 7014 can exchange information (or facilitate indirect communications) with device 7012 via line 7018, which ties directly into output 7024 (discussed below), and port 7006. Lines 7016 and 7018 are preferably bidirectional multi-wire buses that carry information using at least two wires, but in some alternative embodiments either or both of lines 7016 and 7018 can be a single wire.

As mentioned above, before microcontroller 7014 facilitates communications among the devices, microcontroller 7014 can create a communications path. Creating a communications path can include suggesting or determining the protocol and/or standard (e.g., USB, serial, etc.) that is used to transmit information to/from each device that is coupled to apparatus 7000. When three or more devices are coupled to apparatus 7000, microcontroller 7014 can facilitate communications using different types of communication protocols between different pairs of devices and/or between a device and microcontroller 7014.

For example, when microcontroller 7014 detects that devices 7008, 7010 and 7012 are coupled to the ports 7002, 7004 and 7006, respectively, microcontroller 7014 can create a direct communications path (e.g., via switch 7020) between devices 7008 and 7010 in which information is exchanged using a USB protocol. Microcontroller 7014 can also, for example, concurrently facilitate indirect communications between devices 7010 and 7012 (via, e.g., line 7016, line 7018, and output 7024), using a different serial data transfer standard.

In some embodiments, microcontroller 7014 can specify which type of communications protocol is being used by providing, for example, a specific voltage to the device (e.g., 5 volts can indicate USB, 3 volts can indicate serial, etc.). This is discussed further below.

The present invention can use multiple communications standards and/or protocols concurrently when different devices and components are communicating. For example, when device 7008 is a USB compatible device, a USB communications protocol can be used. When device 7010 is also a USB compatible device, microcontroller 7014 can facilitate direct communications between devices 7008 and 7010 (via switch 7020).

In alternative embodiments, when device 7010 is unable to communicate directly with device 7008, microcontroller 7014 can facilitate indirect communications between devices 7008 and 7010. For example, when device 7010 is not USB compatible and device 7008 may only communicate using a USB protocol, microcontroller 7014 can facilitate indirect communications between devices 7008 and 7010. Microcontroller 7014 can, for example, receive information from device 7008 using a USB protocol and then relay the information to device 7010 using another protocol.

Some devices can communicate with multiple devices and/or multiple communications protocols at the same time. For example, port 7004 can be a 30-pin connector, which would enable device 7010 to communicate indirectly with device 7012 using a first communications protocol while device 7010 communicates directly with device 7008 using the first or a second communications protocol.

In some embodiments, microcontroller 7014 facilitates all the communications among the devices coupled to apparatus 7000. In some embodiments, the type of communications path (i.e., the communications protocol used, direct or indirect, etc.) that is established between devices can be based on, for example, the priority of the port to which each device is coupled, the type of device, the type and/or number of communications protocols each device is compatible with, etc.

In addition it may be desirable for microcontroller 7014 to facilitate the transfer of communications and/or power based on a relative priority of ports 7002, 7004 and 7006. The priority of ports 7002, 7004 and 7006 can be based on, for example, how apparatus 7000 is hardwired and/or the software running on microcontroller 7014. In some embodiments, microcontroller 7014 may automatically determine the priority of ports 7002, 7004 and 7006 in response to the various information available to microcontroller 7014 (e.g., the types of ports currently included in apparatus 7000, the other components included in apparatus 7000, etc.).

The relative priority of ports 7002, 7004 and 7006, in some embodiments, can control which devices provide power and which devices receive power. For example, when devices 7008, 7010 and 7012 are coupled to ports 7002, 7004 and 7006, respectively, device 7008 can be the lowest priority device (because, e.g., port 7002 is the lowest priority port) and device 7012 can be the highest priority device (because, e.g., port 7006 is the highest priority port). Microcontroller 7014 can facilitate the transfer of power from device 7008 (which is coupled to the lowest priority port) to the higher priority ports (e.g., ports 7004 and 7006), thereby allowing the devices coupled to the higher priority ports (i.e., devices 7010 and 7012) to be charged by device 7008.

When the lowest priority port is not connected to a device (e.g., when device 7008 is not coupled to port 7002), microcontroller 7014 can assign another port (e.g., port 7004) the lowest priority. Microcontroller 7014 can route power from the device coupled to that port (e.g., device 7010) to at least one device coupled to at least one higher priority port (e.g., device 7012). As used herein, the terms "low priority" and "high priority" are not intended to suggest anything more than "which device(s) should provide power" and "which device(s) should receive power," respectively.

In alternative embodiments, microcontroller 7014 can assign priority to the devices coupled to apparatus 7000 (e.g., devices 7008, 7010 and/or 7012) as opposed to ports 7002, 7004 and 7006. Microcontroller 7014 can use the information available to the microcontroller to prioritize the one or more devices coupled to apparatus 7000. For example, when prioritizing the devices, microcontroller 7014 may consider the number of devices coupled to apparatus 7000, the types of devices coupled to apparatus 7000, information the user provides to apparatus 7000 via a user interface (not shown), the chronological order in which the devices are coupled to apparatus 7000, etc.

The priority of the devices, similar to the priority of the ports, can be used to control the flow of power (and, in some embodiments, the flow of information) among the devices coupled to apparatus 7000. For example, when devices 7008, 7010 and 7012 are coupled to apparatus 7000, device 7008 can be assigned the lowest priority and device 7012 can be assigned the highest priority, regardless as to which port each device is coupled to. Microcontroller 7014 can, for example, direct power from the power supply of at least one lower priority device to the power supply of at least one higher priority device, thereby charging the higher priority device (e.g., devices 7010 and 7012) with power provided by the lower priority device.

When the lowest priority device (e.g., device 7008) is disconnected or otherwise decoupled from apparatus 7000, another device (e.g., device 7010) can now be assigned the lowest priority. Microcontroller 7014 can once again route power from the lowest priority device (e.g., device 7010) to at least one higher priority device (e.g., device 7012).

Microcontroller 7014 can also monitor apparatus 7000 and any device coupled to apparatus 7000 for faults. In response to detecting a fault, microcontroller 7014 can attempt to repair the fault and/or report the fault (to, for example, one or more of the devices coupled to apparatus 7000, to a user interface of apparatus 7000 (not shown), etc.). One skilled in the art would understand that microcontroller 7014 can take any other appropriate action.

In some embodiments microcontroller 7014 can facilitate communications between two or more devices that take place wirelessly or with a wired connection outside of apparatus 7000. Microcontroller 7014 can facilitate communications between two devices by first, for example, identifying and authenticating the two devices that are coupled to apparatus 7000, and then establishing a communications protocol, which can be wireless, between the two devices. Information may then be exchanged between the two devices wirelessly.

For example, apparatus 7000 can be used to automatically pair two devices together, which can alleviate the need for a user to enter, for example, a device code. One example of a device code is the code used to program a universal remote control. Another, more complicated device code is a Bluetooth pin, which allows Bluetooth enabled devices to be paired together, forming a trusted relationship, while preventing the devices from being paired with other devices that happen to be nearby. In some embodiments, after exchanging the device code via the components and wires of apparatus 7000, the pairing process may continue wirelessly between the devices. In other embodiments, microcontroller 7014 may facilitate the entire pairing process using the wires and components of apparatus 7000. Automatically pairing two devices together is discussed in more detail below in connection with FIG. 72.

In some embodiments, apparatus 7000 can include a wireless emitter and/or receiver (not shown) which can allow microcontroller 7014 to, for example, communicate wirelessly with a device. In some embodiments, microcontroller 7014 may access and use a wireless emitter and/or receiver that is built into a device (such as a cellular telephone) that is coupled to apparatus 7000.

In alternative embodiments, microcontroller 7014 can be omitted from apparatus 7000. In yet other alternative embodiments, microcontroller 7014 can be replaced by a component that provides only some of the functionality of microcontroller 7014 that is described herein.

Regardless as to whether or not an embodiment of the present invention includes microcontroller 7014, a microcontroller that provides less functionality than described herein, or no microcontroller at all, power and information could still be transferred from a first device to a second device. For example, two devices can communicate via an additional wire (not shown), wirelessly (e.g., using a Bluetooth standard and protocol (i.e., IEEE 802.15.1), a WiFi standard and protocol (i.e., any of the IEEE 802.11 standards), etc.), or by any other means. (One skilled in the art would appreciate that the term wire as used throughout this invention disclosure is not intended to limit the present invention to using threads of metal, but rather is intended to encompass any and every means for electrically coupling two electrical components together.) As such, communications among the devices that do not pass through apparatus 7000 can, for example, preserve some or all of the functionality provided by microcontroller 7014 in embodiments of the present invention that omit a microcontroller or include microcontrollers that have less functionality than microcontroller 7014.

In some embodiments of the present invention, apparatus 7000 can include one or more switches. For example, apparatus 7000 can include switch 7020 and switch 7028, which receive input control signals from microcontroller 7014 (via the control lines that are not shown).

In some embodiments of the present invention, switch 7020 controls the flow of information from the device coupled to port 7002 to the devices coupled to ports 7004 and 7006. Preferably, switch 7020 receives information from port 7002 via input 7022. Input 7022 can carry, for example, information signals, power, ground, etc. Input 7022 is preferably a multiple-wire bus (e.g., a four-wire bus, a twisted pair, etc.).

One skilled in the art would appreciate that in alternative embodiments of the present invention, switch 7020 can receive at least one additional input (e.g., a two-wire bus, a single wire input, a larger bus, etc.) (not shown) from any other component of apparatus 7000 (e.g., from port 7004, port 7006, etc.). When, for example, switch 7020 receives an input from port 7004, device 7010 can also serve as a source of information. Switch 7020 can then be used to provide the information from device 7010 to components of apparatus 7000 and/or other devices. For example, a two-wire bus from port 7004 to switch 7020 would allow apparatus 7000 to establish a direct communications path between devices 7010 and 7012, thereby allowing a master-slave relationship to be initiated (such as the Bluetooth pairing process) between device 7010 and device 7012.

In some embodiments, input 7022 can provide information to switch 7020 using any protocol and/or standard. For example, information sent via a USB protocol or any other protocol(s) can be accepted and/or understood by apparatus 7000. For simplicity, the present invention is described herein as using only two data transfer standards, i.e., the USB standard and another serial data transfer standard which is referred to herein as the serial standard. The choice of this language is not meant to limit the present invention to such standards, but rather to simplify the discussion of the present invention. One skilled in the art would appreciate that a number of other standards and/or protocols can be used to send signals and/or transfer data among ports 7002, 7004, 7006, other components of apparatus 7000, and devices 7008, 7010, and 7012. The standards and/or protocols used to communicate with each device coupled to apparatus 7000 can be based on, for example, the priority of the devices, the type of devices, the components of apparatus 7000 (e.g., the types of parts of apparatus 7000, etc.), etc.

In some embodiments of the present invention, switch 7020 has two outputs, i.e., output 7024 and output 7026. Outputs 7024 and 7026 can be single wires or multiple wire buses. Output 7026 is preferably a two-wire bus to port 7004. Output 7024 is preferably a two-wire bus to port 7006. Switch 7020 can couple input 7022 with output 7024 and/or output 7026 in response to the control signal that microcontroller 7014 sends to switch 7020. For example, switch 7020 can couple input 7022 to output 7026, output 7024, or both, thereby allowing electricity (which may or may not contain information) to flow from device 7008 to port 7004, port 7006, or both, respectively.

In alternative embodiments that include a second input (such as, e.g., an input from a wireless receiver, port 7004, etc.), switch 7020 can couple, for example, input 7022 to output 7026 and the second input to output 7024, thereby allowing information to flow from device 7008 to device 7010 and from the second input to device 7012.

It is desirable for input 7022, output 7024 and output 7026 to carry information using multiple standards and/or protocols (e.g., USB, etc.). In alternative embodiments, input 7022, output 7024 and output 7026 can carry power that charges a device.

As discussed above, microcontroller 7014 can assign a relative priority to ports 7002, 7004 and 7006 (as opposed to assigning a priority to devices 7008, 7010 and 7012). FIG. 70 illustrates an embodiment in accordance with the present invention, which includes components and connections that would improve the efficiency of the flow of power based on the prioritization of the ports. For example, apparatus 7000 includes line 7030, which allows power to automatically flow from port 7002 to port 7004 when device 7008 is coupled to apparatus 7000. As another example, when device 7008 is coupled to apparatus 7000, line 7030 is intended to maintain a particular DC voltage, which is referred to herein as V1 (e.g., 5 volts, 4.7 volts, etc.). As such, line 7030 can be used to charge device 7010.

In some embodiments, microcontroller 7014 can monitor the voltage provided by, for example, device 7008 and facilitate the transfer of power between, for example, ports 7002 and 7004 on line 7030. When device 7008 (or any other device) is unable to provide a particular amount of power (because its power supply is running low) on a wire (such as line 7030), microcontroller 7014 can restrict the flow of power on the wire (or any other connector). Restricting the flow of power on a wire can prevent a device (e.g., device 7008) from being drained of power by another device (e.g., device 7010).

In alternative embodiments, power can be transferred from port 7002 to port 7004 without microcontroller 7014 being involved (e.g., when line 7030 is hard-wired to do so). Also, some alternative embodiments (e.g., embodiments wherein microcontroller 7014 prioritizes each device, wherein apparatus 7000 is designed to distribute the net available power from all of the devices evenly among each of the devices, etc.), microcontroller 7014 can allow power to flow in both directions on line 7030.

The embodiment of the present invention also includes switch 7028. Switch 7028 can be included in apparatus 7000 for a number of reasons. It is desirable to use switch 7028 to facilitate the charging of device 7012 (i.e., the device coupled to the highest priority port), device 7010 (i.e., the device coupled to the medium priority port), or both devices 7010 and 7012 with power from device 7008.

In some embodiments, in addition to a control line from microcontroller 7014 (not shown), switch 7028 receives line 7030, line 7032, and line 7034 as inputs. Line 7030, as mentioned above, allows power to flow from port 7002 and, preferably, maintains a particular voltage referred to herein as V1. Line 7032 is a wire that allows power to flow from port 7004 via line 7038 and boost 7040. Preferably, line 7032 maintains a particular DC voltage, which is referred to herein as V2 (e.g., 3 volts, 3.3 volts, etc.). Line 7034 is a wire that allows power to flow from ports 7002 and/or 7004 (via line 7030 and/or line 7038 and boost 7040, respectively) through regulator 7042 to switch 7028. Apparatus 7000 can maintain a particular DC voltage on line 7034 referred to herein as V3 (e.g., 4.7 volts, 4.5 volts, etc.), which is preferably less than V1 but greater than V2.

In some embodiments, output 7036 is a wire that allows power to flow from switch 7028 to port 7006 (i.e., the highest priority port). As such, switch 7028 allows device 7012 to receive power when at least one of devices 7008 and 7010 are coupled to apparatus 7000. Microcontroller 7014 can cause switch 7028 to couple line 7030, line 7032 or line 7034 to output 7036. FIGS. 8-15 discuss some examples of how microcontroller 7014 determines which input line is coupled to output 7036.

In addition to charging a device, the voltage on any wire of apparatus 7000 can be used to provide information to any device coupled to apparatus 7000. For example, the voltage on output 7036, i.e., Vx, can indicate to device 7012 the type of communication protocol (e.g., USB, serial, etc.) that is being or will be used to provide device 7012 information. As another example, apparatus 7000 can cause device 7012 to reset or recalibrate, for example, the polarity of the ports of device 7012 in response to a particular voltage or range of voltages being maintained on output 7036. Systems and methods for resetting the polarity of the ports of a device are discussed in commonly assigned U.S. Pat. No. 7,589,536, entitled "Systems and Methods for Determining the Configuration of Electronic Connections", which is hereby incorporated by reference in its entirety. As such, microcontroller 7014 can use, for example, switch 7028 to notify device 7012 the type of data transfer protocol that device 7012 should expect from output 7024 and/or which wires of output 7024 (when output 7024 is a multi-wire bus) will be carrying information to device 7012.

In some embodiments, apparatus 7000 would include both boost 7040 and regulator 7042. Boost 7040 can increase the voltage maintained on line 7038 to a higher voltage (e.g., V3), which is then maintained on line 7032. Regulator 7042 can decrease the voltage on line 7030 and/or line 7032 to be any voltage, which is referred to herein as Vy.

The embodiment includes boost 7040 and regulator 7042 because different devices are charged more efficiently with different amounts of power. For example, an ipod can be charged most efficiently if 5 volts is provided to it, whereas an accessory device (e.g., a remote control, Bluetooth headset, etc.) can be charged most efficiently when 4.7 volts is provided to it. One skilled in the art would understand that the present invention can facilitate the transfer of power at any voltage or any range of voltages (e.g., 4.7 volts, 4.6-4.8 volts, 4.9-5.1 volts, 3.1-3.3 volts, 0-5.0 volts, 5-12 volts, etc.) and at any current or any range of currents.

In alternative embodiments, boost 7040 and/or regulator 7042 can be omitted from apparatus 7000. One skilled in the art would also appreciate that V3 can be the same voltage as V1 or V2. Similarly, in alternative embodiments, V1 can be the same voltage as V2.

Figure 71:
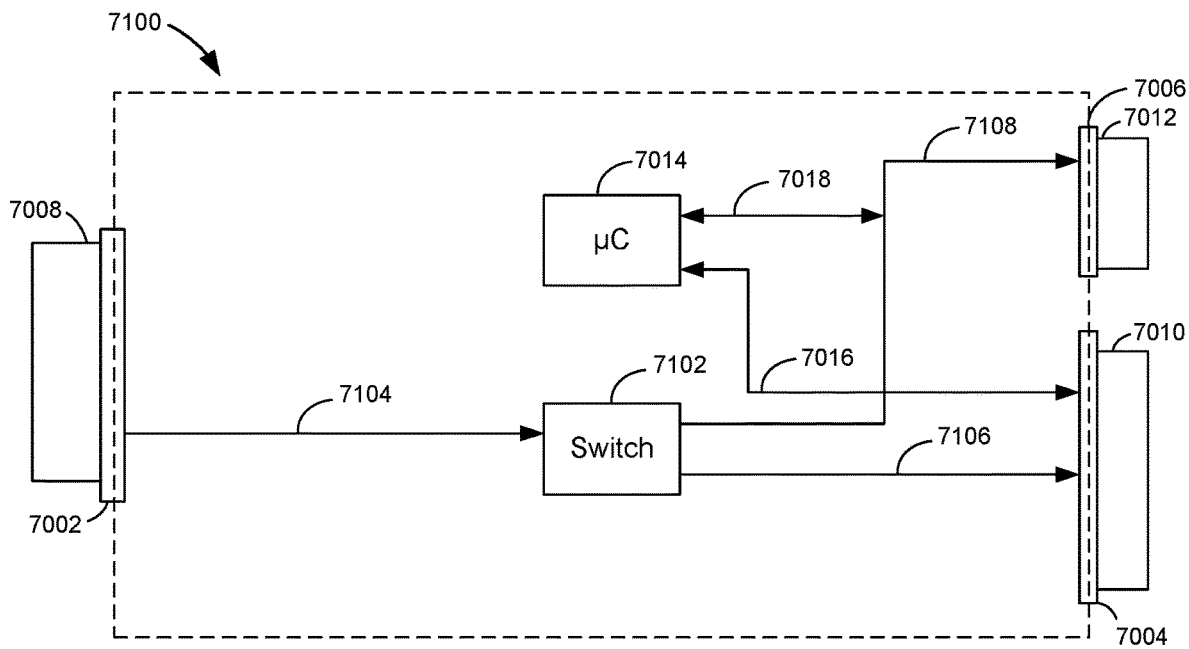
FIG. 71 shows a simplified schematic block diagram of an illustrative alternative embodiment of circuitry in accordance with the present invention.

FIG. 71 shows a simplified schematic block diagram of circuitry implemented in apparatus 7100, which is an illustrative example of an alternative embodiment of the present invention. The circuitry implemented in apparatus 7100 is similar to the circuitry implemented in apparatus 7000 of FIG. 70 in that both apparatus 7000 and apparatus 7100 can facilitate the transfer of information and power among the devices coupled to them. Persons skilled in the art will appreciate that, in various embodiments of the present invention, similar or identical components can be utilized to perform similar or identical functions. Particularly, components 2XX of FIG. 71 are similar or the same as components 2XX of FIG. 70.

Apparatus 7100 includes port 7002, port 7004, port 7006, device 7008, device 7010, device 7012, microcontroller 7014, line 7016, line 7018, switch 7102, input 7104, output 7106 and output 7108. Apparatus 7100 is different than apparatus 7000 in that apparatus 7100 includes fewer components than apparatus 7000.

Switch 7102 receives input 7104 as an input. Input 7104 can be a multi-wire bus (e.g., 2, 3, 4, etc. wire bus) that carries information and power from device 7008 (via port 7002) to switch 7102. The functionality of line 7104 can be similar to the combined functionality of lines 7022 and 7030 of FIG. 70.

Switch 7102 is illustrated as having two outputs, i.e., outputs 7106 and 7108. Output 7106 allows switch 7102 to transfer information and power to device 7010 via port 7004. Output 7108 allows switch 7102 to transfer information and power to device 7012 via port 7006. Switch 7102 can couple input 7104 with either output 7106 and/or output 7108 based on the instructions microcontroller 7014 sends to switch 7102 via a control line (not shown). The control lines of apparatus 7100 are similar to or the same as the control lines described above in connection with apparatus 7000.

As mentioned above, this discussion is intended to illustrate exemplary embodiments of the present invention and is not intended to limit the present invention in any manner. For example, one skilled in the art would appreciate that additional components and connectors can be added to the embodiments described herein without departing from the spirit of the present invention. For example, one or more LEDs can be included in any embodiment of the present invention. One skilled in the art would also appreciate that the functionality of multiple components and/or wires described herein can be combined or divided. For example, input 7104 can be divided into multiple inputs (e.g., a power input and an information input), which would enable, for example, switch 7102 to provide information from device 7008 to device 7010 and power from device 7008 to device 7012 independently.

Figure 72:
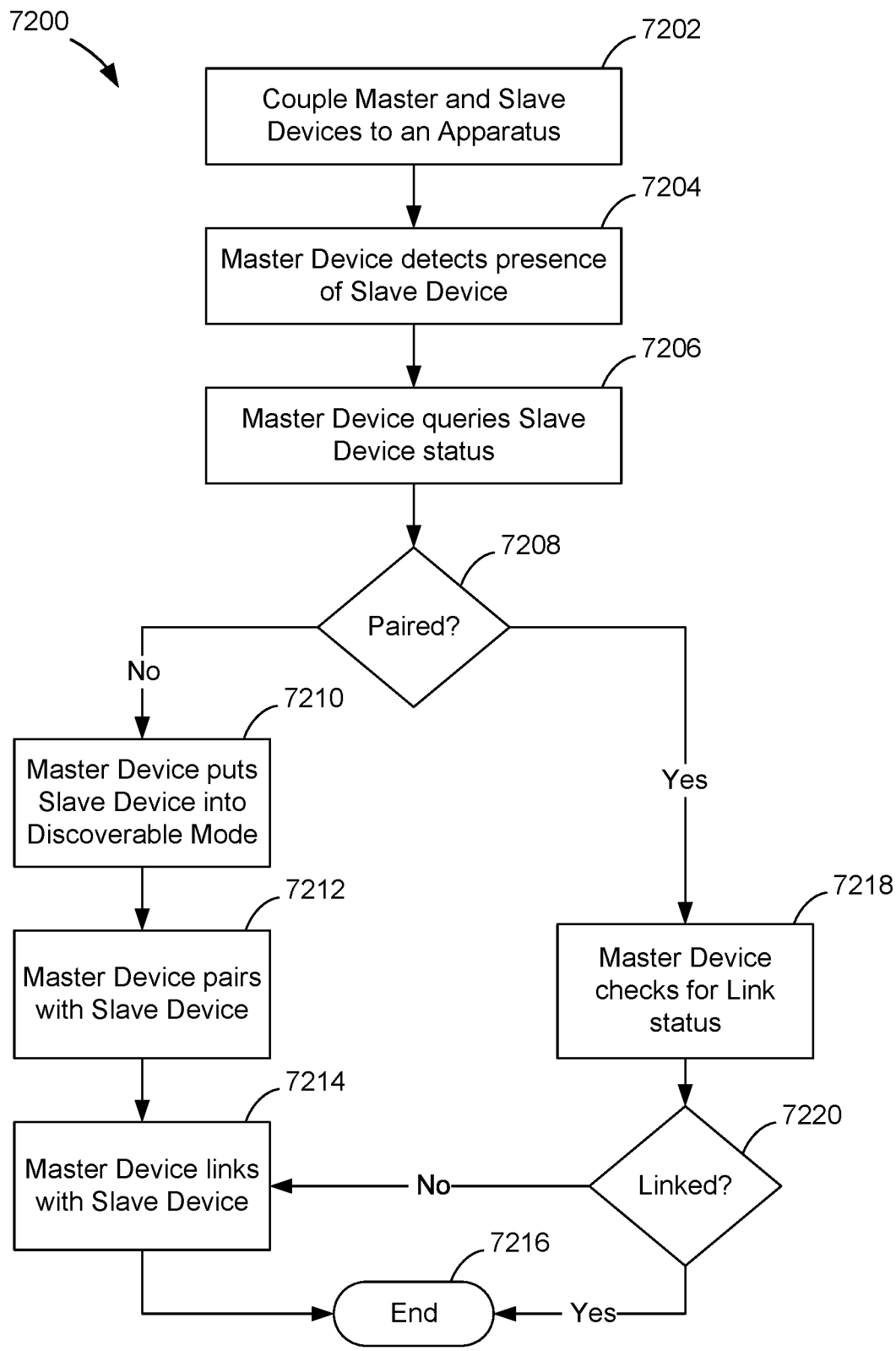
FIG. 72 shows a simplified flow chart of an illustrative mode of operation of circuitry of the type shown in FIGS. 70 and 71.

Further to the automatic Bluetooth pairing discussion above, FIG. 72 shows process 7200. Process 7200 is an illustrative mode of operation that can be partially or entirely performed by the circuitry of an apparatus (such apparatus 7000 or 7100 shown in FIGS. 2 and 3, respectively) to automatically pair two devices together in accordance with a Bluetooth protocol. As such, the circuitry of the apparatus can act as a pairing manager, which is discussed in more detail in commonly assigned U.S. patent application Ser. No. 11/513,692, filed Aug. 30, 2006 (now U.S. Patent Publication No. 2008-0070501), entitled "Pairing of Wireless Devices Using a Wired Medium" (hereinafter "the '692 Application).

Process 7200 begins at step 7202. In step 7202, two devices, a master device and a slave device, can be electrically coupled to an apparatus. The apparatus can be similar to or the same as, for example, apparatus 7000 or 7100 described above. The master device (which is sometimes referred to as a host device) can be, for example, a cellular telephone, computer, or any other device that satisfies the Bluetooth specification's definition of a master device (i.e., controlling the traffic on a piconet physical channel by a polling scheme). The slave device (which is sometimes referred to as a client device) can be, for example, a wireless headset (such as those described above) or any other device that satisfies the Bluetooth specification's definition of a slave device.

In response to the master and slave devices being electrically and/or physically coupled to the apparatus, the microcontroller of the apparatus (e.g., microcontroller 7014) may perform any function, including the functions discussed herein. The microcontroller of the apparatus can, for example, identify each device, authenticate each device, establish a communications path between the devices, place a device in a high power mode, reset the ports of a device, charge the battery of at least one of the devices (e.g., transfer power from the master device to the slave device), etc.

In step 7204, the master device detects the presence of the slave device. In some embodiments, the circuitry in the apparatus is used by the master device to detect the slave device. For example, the microcontroller of the apparatus can provide the master device information about the slave device (e.g., the identity of the slave device, the fact that the slave device is electrically coupled to the apparatus, etc.). In alternative embodiments, the master device can detect the slave device without the assistance of the apparatus (e.g., wirelessly).

After step 7204, the process advances to step 7206. In step 7206, the master device queries the status of the slave device. The master device may use the circuitry of the apparatus to query the status of the slave device. In alternative embodiments, the master device may query the slave device without using the circuitry of the apparatus (e.g., wirelessly).

In step 7208, a determination is made as to whether or not the slave device is already paired to the master device. When the master and slave devices are not currently paired together, the process advances to step 7210.

In step 7210, the master device puts the slave device into a discoverable mode. The master device may use the circuitry of the apparatus to place the slave device in the discoverable mode. For example, the master device may request that the microcontroller of the apparatus place the slave device in the discoverable mode. In some embodiments, the master device may place the slave device in a discoverable mode without using the circuitry of the apparatus (e.g., wirelessly). In alternative embodiments (not pictured), the master device may not put the slave device in the discoverable mode, but rather rely on the microcontroller of the apparatus to automatically put the slave device in the discoverable mode.

In step 7212, the master and slave devices can pair with each other in accordance with a Bluetooth protocol. In some other embodiments, the circuitry of the apparatus facilitates a portion of the pairing process and allows the other portion of the pairing process to take place outside the apparatus. For example, the apparatus may determine the Bluetooth pin of the slave device, provide the Bluetooth pin to the master device, and then allow the master device and slave device to pair together wirelessly. As another example, the master device begins the pairing process outside the apparatus (e.g., by determining the Bluetooth pin of the slave device) and then completes the pairing process using the internal circuitry of the apparatus. Using a wired connection in combination with a wireless connection to pair two devices together are discussed in more detail in the '692 Application.

The apparatus or master device may determine the Bluetooth pin of the slave device. The Bluetooth pin of the slave device can be determined by, for example, trial and error (e.g., trying different Bluetooth pins until the correct pin is determined by selecting a first Bluetooth pin; providing the first Bluetooth pin to the second device; receiving an indication from the second device as to whether the first Bluetooth pin is the same as the Bluetooth pin of the first device; in response to the second device indicating that the first Bluetooth pin is different from the Bluetooth pin of the first device, repeating the steps again with another Bluetooth pin until the correct Bluetooth pin for the slave device is determined). The Bluetooth pin of the slave device can also be determined by, for example, receiving the Bluetooth pin from the slave device via a hard-wired communications path (i.e., the slave device provides its Bluetooth pin to another device or apparatus after a hard-wired communications path is established), or any other method or combination of methods apparent to one skilled in the art.

In alternative embodiments, the entire pairing process of step 7212 takes place outside the apparatus (e.g., wirelessly between the master and slave devices). In other alternative embodiments, the entire pairing process is facilitated by the circuitry of the apparatus.

After the master and slave devices are paired together in step 7212, the master device links with the slave device in step 7214. Once an authorized link is established, process 7200 ends at step 7216.

Returning to step 7208, when the master device is already paired with the slave device, the process advances to step 7218. In step 7218, the master device checks its link status with respect to the slave device. In alternative embodiments, the microcontroller of the apparatus checks the link status between the master and slave devices. A determination is made in step 7220 as to whether or not the master device is linked with the slave device. When the master device and/or the apparatus determines that the master device is already linked to the slave device, process 7200 proceeds to step 7216 and ends.

When the master device and/or the apparatus determines that the master device is not already linked to the slave device, process 7200 proceeds to step 7214. In step 7214, the master device links with the slave device and then the process ends at step 7216.

One skilled in the art would appreciate that any of the steps of process 7200 can require a user interaction before proceeding. For example, before the two devices are paired together in step 7212, the master device may prompt the user to accept or decline the master device being paired with the slave device.

The foregoing discussion of automatic Bluetooth pairing is not meant to be an exhaustive discussion. For a more detailed explanation of automatic Bluetooth pairing, please see U.S. patent application Ser. No. 11/513,616, filed Aug. 30, 2006 (now U.S. Patent Publication No. 2008-0057890), entitled "Automated Pairing of Wireless Accessories with Host Devices".

Although particular embodiments of the present invention have been described above in detail, it will be understood that this description is merely for purposes of illustration. Alternative embodiments of those described herein are also within the scope of the present invention. For example, while one embodiment can include a Bluetooth headset, one or more features of the present invention also can be incorporated into headsets employing other wired and/or wireless communication protocols. Also, while some embodiments of the present invention can include headsets configured for communication with a cellular phone and/or personal media device (e.g., a portable media player similar to that sold under the trademark iPod® by Apple Inc. of Cupertino, Calif.), one or more features of the present invention can also be incorporated into headsets configured for communication with any electronic device. Furthermore, while one embodiment illustratively described above can include a headset and methods for fabricating the same, one or more features of the present invention can also be incorporated into other electronic devices that require, e.g., circuit boards distributed within small acoustic volumes, symmetric connectors, extruded housings having one or more internal features, microperforations, co-located microphones and connectors, magnetic connectors, or any combination thereof.

Various configurations described herein may be combined without departing from the present invention. The above described embodiments of the present invention are presented for purposes of illustration and not of limitation. The present invention also can take many forms other than those explicitly described herein. Accordingly, it is emphasized that the invention is not limited to the explicitly disclosed methods, systems and apparatuses, but is intended to include variations to and modifications thereof which are within the spirit of the following claims.

We claim:

1. An earbud comprising:
 a device housing including a speaker housing and an elongated tube integrally formed with and protruding away from the speaker housing;
 a first acoustic port at one end of the speaker housing;
 a speaker disposed in the speaker housing and aligned to emit sound through the first acoustic port;
 a second acoustic port at a distal end of the elongated tube;
 a microphone disposed in the elongated tube and operatively coupled to receive sound through the second acoustic port;
 a third acoustic port formed through the speaker housing to provide a path for acoustic pressure to vent;
 a rechargeable battery disposed within the device housing;
 a wireless antenna disposed within the device housing;
 battery charging circuitry coupled to the rechargeable battery and positioned within the device housing, the battery charging circuitry operable to charge the rechargeable battery when connected to an external power supply; and
 a plurality of electrical contacts disposed at an exterior surface of the device housing, the plurality of electrical contacts including at least one contact coupled to the battery charging circuitry.

2. The earbud of claim 1 wherein the wireless antenna is disposed within the elongated tube.

3. The earbud of claim 1 further comprising RF circuitry configured to input and output RF signals for wireless communications.

4. The earbud of claim 1 wherein the speaker housing comprises a base portion and a cap, wherein the base portion is integrally formed with the elongated tube and the cap is coupled to the base portion at an end of the speaker housing, and wherein the first acoustic port is formed through the cap.

5. The earbud of claim 4 further comprising a gasket disposed between the cap and the base portion of the speaker housing, wherein the gasket is positioned to form an acoustic seal between the cap and the base portion.

6. The earbud of claim 4 wherein the cap is attached to the base portion with a notch and rib configuration.

7. The earbud of claim 4 wherein the cap is attached to the base portion with an adhesive.

8. The earbud of claim 1 further comprising a mesh screen disposed across the first acoustic port.

9. The earbud of claim 1 wherein the speaker forms at least part of a barrier between a front volume and rear volume formed within the speaker housing.

10. The earbud of claim 9 wherein the earbud further comprises an internal acoustic port between the front and rear volumes.

11. The earbud of claim 9 wherein the third acoustic port provides a path for acoustic pressure to vent from the rear volume to an environment external to the device housing.

12. The earbud of claim 1 further comprising a circuit board disposed within the device housing and having first and second rigid portions connected by a flexible portion.

13. The earbud of claim 1 wherein the speaker housing is a primary support mechanism for securing the earbud to a user's ear.

14. An in-ear listening device comprising:
 a device housing having a speaker housing and a tubular portion protruding away from the speaker housing;
 an audio port formed through the speaker housing;
 a speaker disposed in the speaker housing and aligned to emit sound through the audio port;
 a microphone aperture positioned on the tubular portion;
 a microphone disposed within the tubular portion and operatively coupled to receive sound through the microphone aperture;
 a rechargeable battery disposed within the device housing;
 a wireless antenna disposed within the device housing;
 battery charging circuitry coupled to the rechargeable battery and positioned within the device housing; and a plurality of electrical contacts disposed at an exterior surface of the device housing, the plurality of electrical contacts including at least one contact coupled to the battery charging circuitry.

15. The in-ear listening device of claim 14 further comprising at least one acoustic vent formed through the speaker housing to provide a path for acoustic pressure to vent and wherein the microphone aperture is positioned at a distal end of the tubular portion.

16. The in-ear listening device of claim 14 wherein the tubular portion comprises a radio transparent material.

17. The in-ear listening device of claim 16 wherein the speaker housing includes a base portion and a cap coupled to the base portion, and wherein the base portion is integrally formed with a first end of the tubular portion.

18. An in-ear listening device comprising:
 a device housing comprising a speaker housing and a tubular section extending away from the speaker housing, wherein the speaker housing includes a base portion integrally formed with a first end of the tubular section and a cap coupled to the base portion;
 an audio port formed through the cap;
 a mesh screen coupled to the cap and disposed across the audio port;
 a speaker disposed in the speaker housing and aligned to emit sound through the audio port;
 a microphone disposed at a second end of the tubular section opposite the first end;
 at least one acoustic vent formed through a side surface of the speaker housing to provide a path for acoustic pressure to vent;
 a rechargeable battery disposed within the device housing;
 a wireless antenna disposed within the device housing;
 battery charging circuitry coupled to the rechargeable battery and positioned within the device housing; and
 a plurality of electrical contacts disposed at an exterior surface of the device housing, the plurality of electrical contacts including at least one contact coupled to the battery charging circuitry.

19. The in-ear listening device of claim 18 further comprising a user-interface touch control positioned along the tubular section and operable to control a function of the in-ear listening device, the user-interface touch control comprising a sensor that detects motion and position of a user's finger along a touch control region of the tubular section.

20. The in-ear listening device of claim 19 wherein the user-interface touch control comprises a touch pad.

* * * * *